(12) United States Patent
Ho et al.

(10) Patent No.: US 12,155,481 B2
(45) Date of Patent: *Nov. 26, 2024

(54) PACKET CODING BASED NETWORK COMMUNICATION

(71) Applicant: Strong Force IOT Portfolio 2016, LLC, Fort Lauderdale, FL (US)

(72) Inventors: Tracey Ho, Pasadena, CA (US); John Segui, Costa Mesa, CA (US); Chun Meng, South Pasadena, CA (US); Steven Blumenthal, Lexington, MA (US)

(73) Assignee: Strong Force IOT Portfolio 2016, LLC, Fort Lauderdale, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/538,113

(22) Filed: Nov. 30, 2021

(65) Prior Publication Data

US 2022/0166543 A1    May 26, 2022

Related U.S. Application Data

(63) Continuation of application No. 17/245,922, filed on Apr. 30, 2021, which is a continuation of application
(Continued)

(51) Int. Cl.
*H04L 1/00* (2006.01)
*H03M 13/00* (2006.01)
(Continued)

(52) U.S. Cl.
CPC .......... *H04L 1/0076* (2013.01); *H03M 13/05* (2013.01); *H03M 13/13* (2013.01);
(Continued)

(58) Field of Classification Search
CPC ... H04L 1/0076; H04L 1/0002; H04L 1/0041; H04L 1/1614; H04L 1/187; H04L 47/27;
(Continued)

(56) References Cited

U.S. PATENT DOCUMENTS 5,809,427 A   9/1998 Perreault et al.
5,870,474 A   2/1999 Wasilewski et al.
(Continued)

FOREIGN PATENT DOCUMENTS

EP   1010287 B1   3/2012
EP   2782281 A1   9/2014
(Continued)

OTHER PUBLICATIONS

U.S. Appl. No. 17/446,179, filed Aug. 27, 2021, Ho et al.
(Continued)

*Primary Examiner* — Jael M Ulysse
(74) *Attorney, Agent, or Firm* — RMCK Law Group, PLC

(57) ABSTRACT

A method for data communication between a first node and a second node includes forming one or more redundancy messages from data messages at the first node using an error correcting code and transmitting first messages from the first node to the second node over a data path, the transmitted first messages including the data messages and the one or more redundancy messages. Second messages are received at the first node from the second node, which are indicative of: (i) a rate of arrival at the second node of the first messages, and (ii) successful and unsuccessful delivery of the first messages. A transmission rate limit and a window size are maintained according to the received second messages. Transmission of additional messages from the first node to the second node is limited according to the maintained transmission rate limit and window size.

16 Claims, 29 Drawing Sheets

Related U.S. Application Data

No. 16/780,275, filed on Feb. 3, 2020, now Pat. No. 10,999,012, which is a continuation-in-part of application No. 16/733,921, filed on Jan. 3, 2020, now abandoned, and a continuation-in-part of application No. 16/456,543, filed on Jun. 28, 2019, now Pat. No. 11,057,310, and a continuation-in-part of application No. 16/456,471, filed on Jun. 28, 2019, now Pat. No. 11,108,665, and a continuation-in-part of application No. 16/277,055, filed on Feb. 15, 2019, now Pat. No. 10,924,216, and a continuation-in-part of application No. 16/176,718, filed on Oct. 31, 2018, now Pat. No. 10,623,143, and a continuation-in-part of application No. 16/165,041, filed on Oct. 19, 2018, now Pat. No. 10,659,378, and a continuation-in-part of application No. 16/164,022, filed on Oct. 18, 2018, now Pat. No. 10,715,454, said application No. 16/456,543 is a continuation of application No. 15/972,800, filed on May 7, 2018, now Pat. No. 10,560,388, said application No. 16/780,275 is a continuation-in-part of application No. 15/972,849, filed on May 7, 2018, now Pat. No. 10,666,567, and a continuation-in-part of application No. 15/972,898, filed on May 7, 2018, now Pat. No. 10,749,809, said application No. 16/456,471 is a continuation of application No. 15/972,767, filed on May 7, 2018, now Pat. No. 10,425,306, said application No. 16/277,055 is a continuation of application No. 15/818,171, filed on Nov. 20, 2017, now Pat. No. 10,333,651, said application No. 15/972,800 is a continuation of application No. 15/061,211, filed on Mar. 4, 2016, now Pat. No. 9,979,664, said application No. 16/733,921 is a continuation of application No. 15/060,877, filed on Mar. 4, 2016, now Pat. No. 10,530,700, said application No. 15/972,898 is a continuation of application No. 15/061,043, filed on Mar. 4, 2016, now Pat. No. 9,992,128, said application No. 16/780,275 is a continuation-in-part of application No. 15/061,267, filed on Mar. 4, 2016, now Pat. No. 10,554,565, said application No. 16/164,022 is a continuation of application No. 15/060,908, filed on Mar. 4, 2016, now Pat. No. 10,135,746, said application No. 16/165,041 is a continuation of application No. 15/060,925, filed on Mar. 4, 2016, now Pat. No. 10,129,159, said application No. 15/818,171 is a continuation of application No. 14/935,966, filed on Nov. 9, 2015, now Pat. No. 9,825,733, said application No. 15/972,849 is a continuation of application No. 14/936,049, filed on Nov. 9, 2015, now Pat. No. 9,992,126, said application No. 15/972,767 is a continuation of application No. 14/935,885, filed on Nov. 9, 2015, now Pat. No. 9,992,088, said application No. 16/176,718 is a continuation of application No. 14/936,010, filed on Nov. 9, 2015, now Pat. No. 10,320,526.

(60) Provisional application No. 62/189,509, filed on Jul. 7, 2015, provisional application No. 62/076,709, filed on Nov. 7, 2014, provisional application No. 62/076,612, filed on Nov. 7, 2014, provisional application No. 62/076,595, filed on Nov. 7, 2014, provisional application No. 62/076,583, filed on Nov. 7, 2014.

(51) Int. Cl.
| | |
|---|---|
| *H03M 13/05* | (2006.01) |
| *H03M 13/13* | (2006.01) |
| *H03M 13/37* | (2006.01) |
| *H04L 1/1607* | (2023.01) |
| *H04L 1/1867* | (2023.01) |
| *H04L 47/27* | (2022.01) |

(52) U.S. Cl.
CPC ..... *H03M 13/373* (2013.01); *H03M 13/3761* (2013.01); *H03M 13/611* (2013.01); *H03M 13/6547* (2013.01); *H04L 1/0002* (2013.01); *H04L 1/0041* (2013.01); *H04L 1/1614* (2013.01); *H04L 1/187* (2013.01); *H04L 47/27* (2013.01)

(58) Field of Classification Search
CPC . H03M 13/13; H03M 13/373; H03M 13/3761
See application file for complete search history.

(56) References Cited

U.S. PATENT DOCUMENTS

| | | | |
|---|---|---|---|
| 6,345,301 | B1 | 2/2002 | Burns et al. |
| 6,480,497 | B1 | 11/2002 | Flammer et al. |
| 7,570,589 | B1 | 8/2009 | Apostolopoulos et al. |
| 7,620,483 | B2 * | 11/2009 | Florentin ............. G05D 1/0022 701/25 |
| 7,882,253 | B2 | 2/2011 | Pardo-Castellote et al. |
| 8,130,776 | B1 | 3/2012 | Sundararajan et al. |
| 8,583,820 | B2 | 11/2013 | Harrang et al. |
| 8,644,296 | B1 | 2/2014 | Croak et al. |
| 8,780,693 | B2 | 7/2014 | Kim et al. |
| 8,819,520 | B1 | 8/2014 | Slavetsky |
| 9,148,274 | B2 | 9/2015 | Balakrishnan et al. |
| 9,215,082 | B2 | 12/2015 | Liu et al. |
| 9,537,759 | B2 | 1/2017 | Calmon et al. |
| 9,705,675 | B2 | 7/2017 | Painchault et al. |
| 9,825,733 | B1 * | 11/2017 | Ho ..................... H03M 13/6547 |
| 9,979,664 | B2 | 5/2018 | Ho et al. |
| 10,333,651 | B2 * | 6/2019 | Ho ........................ H04L 1/0041 |
| 10,498,359 | B2 | 12/2019 | Vafin et al. |
| 10,530,700 | B2 | 1/2020 | Ho et al. |
| 10,560,388 | B2 | 2/2020 | Ho et al. |
| 10,623,143 | B2 | 4/2020 | Ho |
| 10,715,454 | B2 | 7/2020 | Ho et al. |
| 10,903,853 | B2 | 1/2021 | Vafin et al. |
| 10,999,012 | B2 * | 5/2021 | Ho ........................ H04L 1/1614 |
| 11,799,586 | B2 | 10/2023 | Ho et al. |
| 11,817,954 | B2 | 11/2023 | Ho et al. |
| 11,817,955 | B2 | 11/2023 | Ho et al. |
| 2001/0023445 | A1 | 9/2001 | Sundqvist |
| 2002/0046382 | A1 | 7/2002 | Yang |
| 2002/0150048 | A1 | 10/2002 | Ha et al. |
| 2002/0163933 | A1 | 11/2002 | Benveniste |
| 2002/0178273 | A1 | 11/2002 | Pardo-Castellote et al. |
| 2003/0067877 | A1 * | 4/2003 | Sivakumar ............. H04L 45/30 370/235 |
| 2003/0123481 | A1 | 7/2003 | Neale et al. |
| 2003/0128672 | A1 * | 7/2003 | Komandur ............. H04L 47/10 370/324 |
| 2004/0153534 | A1 * | 8/2004 | Gibart ..................... H04L 69/40 709/248 |
| 2004/0160943 | A1 | 8/2004 | Cain |
| 2004/0174816 | A1 | 9/2004 | Stewart et al. |
| 2004/0193871 | A1 | 9/2004 | Seshadri |
| 2004/0252700 | A1 | 12/2004 | Anandakumar et al. |
| 2005/0013246 | A1 | 1/2005 | Miyake et al. |
| 2005/0058151 | A1 | 3/2005 | Yeh |
| 2005/0088986 | A1 | 4/2005 | Sun et al. |
| 2005/0181739 | A1 | 8/2005 | Krasny et al. |
| 2005/0243059 | A1 * | 11/2005 | Morris .................. H04W 52/04 345/158 |
| 2006/0104340 | A1 | 5/2006 | Walton et al. |
| 2006/0215592 | A1 | 9/2006 | Tomoe et al. |
| 2006/0250949 | A1 | 11/2006 | Ramakrishnan et al. |
| 2006/0250964 | A1 | 11/2006 | Vasseur et al. |
| 2006/0251011 | A1 | 11/2006 | Ramakrishnan et al. |
| 2007/0079223 | A1 | 4/2007 | Mondin et al. |

(56) References Cited

U.S. PATENT DOCUMENTS

| | | |
|---|---|---|
| 2007/0091927 A1 | 4/2007 | Apostolopoulos et al. |
| 2007/0157060 A1 | 7/2007 | Ganga et al. |
| 2007/0192812 A1 | 8/2007 | Pickens et al. |
| 2007/0206615 A1 | 9/2007 | Plamondon et al. |
| 2007/0211633 A1 | 9/2007 | Gunawardena et al. |
| 2007/0211810 A1 | 9/2007 | Bohnke et al. |
| 2007/0233896 A1 | 10/2007 | Hilt et al. |
| 2008/0049624 A1 | 2/2008 | Ray et al. |
| 2008/0065890 A1 | 3/2008 | Lundsgaard |
| 2008/0117930 A1 | 5/2008 | Chakareski et al. |
| 2008/0144493 A1 | 6/2008 | Yeh |
| 2008/0170513 A1 | 7/2008 | Niranjan et al. |
| 2008/0304483 A1 | 12/2008 | Williams et al. |
| 2008/0304491 A1 | 12/2008 | Scott et al. |
| 2008/0317017 A1 | 12/2008 | Wiemann et al. |
| 2009/0016265 A1 | 1/2009 | Katayama et al. |
| 2009/0080332 A1 | 3/2009 | Mizrachi et al. |
| 2009/0094353 A1 | 4/2009 | Isobe |
| 2009/0097563 A1 | 4/2009 | Brown et al. |
| 2009/0147738 A1 | 6/2009 | Larsson et al. |
| 2009/0196294 A1 | 8/2009 | Black et al. |
| 2009/0268662 A1 | 10/2009 | Larsson et al. |
| 2009/0276686 A1 | 11/2009 | Liu et al. |
| 2010/0067401 A1 | 3/2010 | Medvedev et al. |
| 2010/0142437 A1 | 6/2010 | Gin et al. |
| 2010/0246474 A1 | 9/2010 | Zhang et al. |
| 2010/0260176 A1 | 10/2010 | Hartwich |
| 2010/0268775 A1 | 10/2010 | Doppler et al. |
| 2010/0274871 A1 | 10/2010 | Harrang et al. |
| 2010/0299526 A1 | 11/2010 | Wiseman et al. |
| 2011/0029632 A1 | 2/2011 | Siemens |
| 2011/0103379 A1 | 5/2011 | Kim et al. |
| 2011/0110264 A1 | 5/2011 | Froelich et al. |
| 2011/0200045 A1 | 8/2011 | Baehre |
| 2011/0258510 A1 | 10/2011 | Watson et al. |
| 2011/0268200 A1 | 11/2011 | Yonge, I et al. |
| 2011/0276699 A1 | 11/2011 | Pedersen |
| 2012/0072340 A1 | 3/2012 | Amron |
| 2012/0128009 A1 | 5/2012 | Yang et al. |
| 2012/0182860 A1* | 7/2012 | Liu .................... H04L 1/0076 370/216 |
| 2012/0188949 A1 | 7/2012 | Salkintzis et al. |
| 2012/0192031 A1 | 7/2012 | Liu et al. |
| 2012/0210199 A1 | 8/2012 | Gale et al. |
| 2012/0218891 A1 | 8/2012 | Sundararajan et al. |
| 2012/0236809 A1 | 9/2012 | Senoo |
| 2012/0236870 A1 | 9/2012 | Klein |
| 2012/0269062 A1 | 10/2012 | Cho |
| 2012/0314648 A1 | 12/2012 | Zhang et al. |
| 2012/0331160 A1 | 12/2012 | Tremblay et al. |
| 2013/0019025 A1 | 1/2013 | Chaturvedi et al. |
| 2013/0044183 A1 | 2/2013 | Jeon et al. |
| 2013/0051377 A1 | 2/2013 | Seferoglu et al. |
| 2013/0117796 A1 | 5/2013 | Qi |
| 2013/0135523 A1 | 5/2013 | Ramalho et al. |
| 2013/0195106 A1 | 8/2013 | Calmon et al. |
| 2013/0235843 A1 | 9/2013 | Gohari et al. |
| 2014/0006631 A1 | 1/2014 | Meskauskas et al. |
| 2014/0010088 A1* | 1/2014 | Stewart ................ H04L 47/263 370/237 |
| 2014/0115094 A1 | 4/2014 | Dao et al. |
| 2014/0146676 A1 | 5/2014 | Howes et al. |
| 2014/0157009 A1 | 6/2014 | Kherani |
| 2014/0162680 A1 | 6/2014 | Kotecha et al. |
| 2014/0207845 A1 | 7/2014 | Han et al. |
| 2014/0310566 A1 | 10/2014 | Balakrishnan et al. |
| 2015/0078160 A1 | 3/2015 | Rankin |
| 2015/0100858 A1 | 4/2015 | Zhovnirnovsky et al. |
| 2015/0109942 A1 | 4/2015 | Nguyen et al. |
| 2015/0117468 A1 | 4/2015 | Shin et al. |
| 2015/0146526 A1 | 5/2015 | Kulkarni |
| 2015/0172883 A1 | 6/2015 | Cili et al. |
| 2015/0181460 A1 | 6/2015 | Subramanian et al. |
| 2015/0189009 A1 | 7/2015 | Bemmel |
| 2015/0229490 A1 | 8/2015 | Brandstätter |
| 2015/0295692 A1 | 10/2015 | Gowda et al. |
| 2015/0326940 A1 | 11/2015 | Deiss et al. |
| 2016/0065475 A1 | 3/2016 | Hilt et al. |
| 2016/0066222 A1 | 3/2016 | Makinen et al. |
| 2016/0234298 A1 | 8/2016 | Takeda et al. |
| 2016/0286003 A1 | 9/2016 | Pessis et al. |
| 2016/0366099 A1 | 12/2016 | Jordan |
| 2017/0012868 A1 | 1/2017 | Ho et al. |
| 2017/0195231 A1 | 7/2017 | Serrano et al. |
| 2019/0181984 A1* | 6/2019 | Ho .................... H03M 13/373 |
| 2019/0394136 A1 | 12/2019 | Ho et al. |
| 2020/0177311 A1 | 6/2020 | Ho et al. |
| 2022/0210076 A1 | 6/2022 | Stalling et al. |

FOREIGN PATENT DOCUMENTS

| | | |
|---|---|---|
| EP | 2890179 A1 | 8/2019 |
| WO | 2004082227 | 9/2004 |
| WO | 2005034474 | 4/2005 |
| WO | 2005055556 A1 | 6/2005 |

OTHER PUBLICATIONS

U.S. Appl. No. 17/245,922, filed Apr. 30, 2021, Ho et al.
U.S. Appl. No. 17/538,097, filed Nov. 30, 2021, Ho et al.
U.S. Appl. No. 17/538,128, filed Nov. 30, 2021, Ho et al.
U.S. Appl. No. 17/538,140, filed Nov. 30, 2021, Ho et al.
U.S. Appl. No. 17/538,155, filed Nov. 30, 2021, Ho et al.
U.S. Appl. No. 17/538,184, filed Nov. 30, 2021, Ho et al.
Chakravorty, R. et al., "Optimizing Web Delivery Over Wireless Links: Design, Implementation, and Experiences," IEEE Journal on Selected Areas in Communications, vol. 23, No. 2, Feb. 2005, pp. 402-416.
Cloud, J. et al., "Multi-Path TCP with Network Coding for Mobile Devices in Heterogeneous Networks," IEEE, 2013, 5 pages.
Li, M. et al., "Multipath Transmission for the Internet: A Survey," IEEE Communications Surveys & Tutorials, vol. 18, No. 4, Fourth Quarter 2016, pp. 2887-2925.
Li, M. et al., "Network Coding Based Multipath TCP," Global Internet Symposium 2012, pp. 25-30.
Xia et al., A Multipath TCP based on Network Coding in Wireless Mesh Networks, IEEE, 5 pages, 2009.
Ali, F.A. et al., "Bandwidth Efficient Adaptive Forward Error Correction Mechanism with Feedback Channel," Journal of Communications and Networks, vol. 16, No. 3, Jun. 2014, pp. 322-334.
IEEE Standards Association, "IEEE Standard for Information Technology—Telecommunication and information exchange between systems, Local and metropolitan area networks—Specific Requirements—Part 11: Wirless LAN Medium Access Control (MAC) and Physical Layer (PHY) Specifications," IEEE Computer Society, Mar. 2012, 2793 pages.
Lamoriniere, C. et al., "Dynamic Switching Between Adaptive FEC Protocols For Reliable Multi-Source Streaming," IEEE "Globecom" 2009 Proceedings, 6 pages.

\* cited by examiner

PACKET CODING BASED NETWORK COMMUNICATION

CROSS-REFERENCE TO RELATED APPLICATIONS

This application is a continuation of U.S. patent application Ser. No. 17/245,922, filed Apr. 30, 2021, which is a continuation of U.S. patent application Ser. No. 16/780,275, filed Feb. 3, 2020, now U.S. Pat. No. 10,999,012, which is a continuation-in-part of U.S. patent application Ser. No. 15/061,267, filed Mar. 4, 2016, now U.S. Pat. No. 10,554,565, which claims the benefit of U.S. Provisional Application No. 62/189,509, filed Jul. 7, 2015.

U.S. patent application Ser. No. 16/780,275, filed Feb. 3, 2020 is a continuation-in-part of U.S. patent application Ser. No. 16/277,055, filed Feb. 15, 2019, now U.S. Pat. No. 10,924,216, which is a continuation of U.S. patent application Ser. No. 15/818,171, filed Nov. 20, 2017, now U.S. Pat. No. 10,333,651, which is a continuation of U.S. patent application Ser. No. 14/935,966, now U.S. Pat. No. 9,825,733, filed on Nov. 9, 2015, which claims the benefit of U.S. Provisional Application No. 62/076,595, filed Nov. 7, 2014.

U.S. patent application Ser. No. 16/780,275, filed Feb. 3, 2020 is a continuation-in-part of U.S. application Ser. No. 16/456,471, filed Jun. 28, 2019, which is a continuation of U.S. application Ser. No. 15/972,767, filed May 7, 2018, now U.S. Pat. No. 10,425,306, which is a continuation of U.S. application Ser. No. 14/935,885, filed Nov. 9, 2015, now U.S. Pat. No. 9,992,088, which claims the benefit of U.S. Provisional Application No. 62/076,583, filed Nov. 7, 2014.

U.S. patent application Ser. No. 16/780,275, filed Feb. 3, 2020 is a continuation-in-part of U.S. application Ser. No. 16/176,718, filed Oct. 31, 2018, now U.S. Pat. No. 10,623,143, which is a continuation of U.S. patent application Ser. No. 14/936,010, filed Nov. 9, 2015, now U.S. Pat. No. 10,320,526, which claims the benefit of U.S. Provisional Application No. 62/076,612, filed Nov. 7, 2014.

U.S. patent application Ser. No. 16/780,275, filed Feb. 3, 2020 is a continuation-in-part of U.S. application Ser. No. 16/456,543, filed Jun. 28, 2019, which is a continuation of U.S. application Ser. No. 15/972,800, filed May 7, 2018, now U.S. Pat. No. 10,560,388, which is a continuation of U.S. application Ser. No. 15/061,211, filed Mar. 4, 2016, now U.S. Pat. No. 9,979,664, which claims the benefit of U.S. Provisional Application No. 62/189,509, filed Jul. 7, 2015.

U.S. patent application Ser. No. 16/780,275, filed Feb. 3, 2020 is a continuation-in-part of U.S. application Ser. No. 15/972,849, filed, May 7, 2018, now U.S. Pat. No. 10,666,567, which is a continuation of U.S. application Ser. No. 14/936,049, filed Nov. 9, 2015, now U.S. Pat. No. 9,992,126, which claims the benefit of U.S. Provisional Application No. 62/076,709, filed Nov. 7, 2014.

U.S. patent application Ser. No. 16/780,275, filed Feb. 3, 2020 is a continuation-in-part of U.S. application Ser. No. 15/972,898, filed May 7, 2018, now U.S. Pat. No. 10,749,809, which is a continuation of U.S. application Ser. No. 15/061,043, filed Mar. 4, 2016, now U.S. Pat. No. 9,992,128, which claims the benefit of U.S. Provisional Application No. 62/189,509, filed Jul. 7, 2015.

U.S. patent application Ser. No. 16/780,275, filed Feb. 3, 2020 is a continuation-in-part of U.S. application Ser. No. 16/733,921, filed Jan. 3, 2020, which is a continuation of U.S. application Ser. No. 15/060,877, filed Mar. 4, 2016, now U.S. Pat. No. 10,530,700, which claims the benefit of U.S. Provisional Application No. 62/189,509, filed Jul. 7, 2015.

U.S. patent application Ser. No. 16/780,275, filed Feb. 3, 2020 is a continuation-in-part of U.S. application Ser. No. 16/164,022, filed Oct. 18, 2018, now U.S. Pat. No. 10,715,454, which is a continuation of U.S. application Ser. No. 15/060,908, filed Mar. 4, 2016, now U.S. Pat. No. 10,135,746, which claims the benefit of U.S. Provisional Application No. 62/189,509, filed Jul. 7, 2015.

U.S. patent application Ser. No. 16/780,275, filed Feb. 3, 2020 is a continuation-in-part of U.S. application Ser. No. 16/165,041, filed Oct. 19, 2018, now U.S. Pat. No. 10,659,378, which is a continuation of U.S. application Ser. No. 15/060,925, filed Mar. 4, 2016, now U.S. Pat. No. 10,129,159, which claims the benefit of U.S. Provisional Application No. 62/189,509, filed Jul. 7, 2015.

The entire disclosures of each of the above applications are incorporated herein by reference.

BACKGROUND

This document relates to protocols for communicating over data networks, and more specifically, in at least some examples, to the use of packet coding based protocols for communication over packet switched networks, for instance, over the Internet.

Data communication has benefitted from the near-universal use of the Internet Protocol (IP) on the interconnection of networks that form the Internet. The endpoints of communication connections or sessions set-up over the Internet may include servers, which may be in data centers co-located on "backbones" of the Internet, user devices on wired or wireless local area networks, and mobile devices on various generations of cellular telephone technology (e.g. 3G, 4G, LTE). Local area networks may be coupled to high-speed backbones of the Internet via facilities of Internet Service Providers (ISPs), with "last mile" technologies ranging from digital subscriber loop (DSL) to hybrid-fiber coax to all-optical networks. In some cases, networks may include satellite communication links which may have very different delay characteristics than, for example, terrestrial optical networks.

The communications paths that data packets follow in travelling from where they originate to their destination(s) may typically traverse multiple different types of links and/or networks. Each link and/or network may be supported by operating equipment such as servers, buffers, transmission links and the like, and may be characterized by parameters such as capacity, congestion, delay, packet loss, timing of data transfer and the like. Furthermore, transition points, also sometimes referred to as "peering points" between types of networks may impose some restrictions on how data may flow through the networks.

In addition to characteristics that are inherent in the network designs, policy characteristics imposed by network operators may affect how traffic flows across networks. For example, certain types of traffic and/or connections may be prioritized and potentially assigned more resources, while other types of traffic may be throttled or blocked. Assigned resources and/or policies may be variable and may change throughout the day, throughout the year, based on congestion, service agreements and the like.

The vast majority of connection-based or session-based traffic on the Internet today makes use of the Transmission Control Protocol (TCP). TCP is popular at least in part because it generally provides reliable and fair delivery of data. That is, the information that is sent by a sender is eventually received at a receiver and no one sender that adheres to generally adopted fairness aspects of Internet protocols can utilize more than their fair share of the bandwidth on average. However, even though TCP has evolved over the last decades, there are aspects of the protocol that are not well matched to the characteristics, and more particularly to the variability of characteristics, of today's Internet. As examples, primary reliance on retransmission and use of windowing algorithms for congestion control are not always well matched to the real-time requirements and dynamic nature of communication channels that may have relatively rapidly varying characteristics, for example, periodic delay of the delivery of packets or rapidly changing link capacity.

As a result, applications running over today's Internet may be plagued by long delays in transferring large data files, by pauses or interruptions in video or audio streaming, by low audio or picture quality and/or by slow response times for real-time interactive content. These problems may be accompanied by and/or the result of an inefficient use of the underlying network bandwidth due to overly restrictive congestion control and/or to the large numbers of end-to-end packet retransmissions.

One technology that has been proposed to address some of the limitations of TCP for communication over today's Internet is Random Linear Network Coding (RLNC), which involves a combination of using random linear codes for error correction and recoding of packets at intermediate nodes in the network. However, RLNC alone has not provided a complete solution to limitations imposed by network characteristics. Other proposed technologies based on new codes, forward error correction codes, data encryption techniques, and the like, also have not been shown to provide complete solutions. Therefore, there is a need for a new protocol to ensure high-speed uninterrupted delivery of data packets over networks that comprises many different types of equipment, operated by many different operators, over many different types of wired and wireless links.

Also proposed has been the use of the user datagram protocol (UDP), which can speed up data delivery times but at the expense of reliable data delivery. While some users and/or applications may be able to tolerate lost and/or out-of-order data packets at a receiver, network operators have been known to impose policies that limit or block the amount of UDP traffic that may flow over their networks at any given time. These restrictions are at least partially motivated by the fact that many of the current proprietary protocols running over UDP are believed to be unfair, meaning they may consume as much bandwidth and/or network resources as they can in order to deliver their data very quickly.

Thus there is a need for a new protocol that can reliably deliver data packets over today's Internet faster than TCP but not at the expense of fairness.

SUMMARY

In a general aspect, a method for data communication between a first node and a second node over a data path coupling the first node and the second node, includes determining one or more redundancy messages from data messages at the first node using an error correcting code, transmitting messages from the first node to the second node over the data path, the transmitted messages including the data messages and the one or more redundancy messages, receiving messages at the first node from the second node, including receiving messages indicative of a rate of arrival at the second node of the messages transmitted from the first node, and receiving messages indicative of successful and unsuccessful delivery of the messages transmitted from the first node to the second node, maintaining a first transmission limit according to the received messages, maintaining a second transmission limit according to the received messages; and inhibiting transmission of messages from the first node to the second node, including limiting transmission of messages according to the maintained first transmission limit, and according to the second transmission limit.

Aspects may include one or more of the following features.

Maintaining the first transmission limit may include maintaining a transmission rate limit, and wherein limiting transmission of the messages according to the first transmission limit includes limiting a transmission rate of said messages. Maintaining the second transmission limit may include maintaining a window size, and wherein limiting transmission of the messages according to the second transmission limit may include limiting a number of messages not yet acknowledged as successfully delivered to the second node according to the window size. The window size may include a congestion control window size.

Receiving messages indicative of the rate of arrival may include receiving acknowledgment messages from the second node, wherein a rate of arrival of said acknowledgment messages may be indicative of the rate of arrival of the messages at the second node. The rate of arrival of the acknowledgment may include a rate of acknowledgment of packets. At least some of the messages indicative of a rate of arrival and some of the messages indicative of successful and unsuccessful delivery of the message may be same messages. The error correcting code may be a linear error correcting code.

In another general aspect, a communication apparatus includes a first device having an interface for passing messages to and from a second device over a communication path coupling the first device to the second device. The first device includes a communication controller configured to determine one or more redundancy messages from data messages at the first node using an error correcting code, transmit messages from the first node to the second node over the data path, the transmitted messages including the data messages and the one or more redundancy messages, receive messages at the first node from the second node, including receiving messages indicative of a rate of arrival at the second node of the messages transmitted from the first node, and receiving messages indicative of successful and unsuccessful delivery of the messages transmitted from the first node to the second node, maintain a first transmission limit according to the received messages maintain a second transmission limit according to the received messages, and inhibit transmission of messages from the first node to the second node, including limiting transmission of messages according to the maintained first transmission limit, and according to the second transmission limit.

Aspects may include one or more of the following features.

Maintaining the first transmission limit may include maintaining a transmission rate limit, and wherein limiting transmission of the messages according to the first transmission limit may include limiting a transmission rate of said messages. Maintaining the second transmission limit may include maintaining a window size, and wherein limiting transmission of the messages according to the second transmission limit may include limiting a number of messages not yet acknowledged as successfully delivered to the second node according to the window size. The window size may include a congestion control window size. Receiving messages indicative of the rate of arrival may include receiving acknowledgment messages from the second node, wherein a rate of arrival of said acknowledgment messages may be indicative of the rate of arrival of the messages at the second node. The rate of arrival of the acknowledgments may include a rate of acknowledgment of packets. At least some of the messages indicative of a rate of arrival and some of the messages indicative of successful and unsuccessful delivery of the message may be same messages. The error correcting code may be a linear error correcting code.

In a general aspect, a method for data communication between a first node and a second node over a data path coupling the first node and the second node includes determining one or more redundancy messages from data messages at the first node using an error correcting code, transmitting messages from the first node to the second node over the data path, the transmitted messages including the data messages and redundancy messages, receiving messages at the first node from the second node, including receiving messages indicative of successful and unsuccessful delivery of the messages transmitted from the first node to the second node, maintaining an estimate of a rate at which loss events occur over the communication path based on the messages received from the second node, including updating the estimate to incorporate a single loss event when one or more of the messages received from the second node indicate an unsuccessful delivery of a single packet to the second data node, and updating the estimate to incorporate a single loss event when one or more of the messages received from the second node indicate an unsuccessful delivery of a number of consecutively transmitted packets to the second data node, and adjusting a rate of redundancy messages transmitted from the first node based on the estimate of the rate at which loss events occur.

Aspects may include one or more of the following features.

Adjusting the rate of redundancy messages transmitted from the first node based on the estimate of the rate at which loss events occur may include adjusting a ratio of the rate of redundancy messages transmitted from the first node to the estimate of the rate at which loss events occur. The error correcting code used to determine the one or more redundancy messages may be chosen based at least in part on an estimated rate of loss events where a number of consecutive messages unsuccessfully delivered to the second data node is less than a predetermined threshold. The second error correcting code may include a burst error correcting code.

In another general aspect, a communication apparatus includes a first device having an interface for passing messages to and from a second device over a communication path coupling the first device to the second device. The first device includes a communication controller configured to determine one or more redundancy messages from data messages at the first node using an error correcting code, transmit messages from the first node to the second node over the data path, the transmitted messages including the data messages and redundancy messages, receive messages at the first node from the second node, including receiving messages indicative of successful and unsuccessful delivery of the messages transmitted from the first node to the second node, maintain an estimate of a rate at which loss events occur over the communication path based on the messages received from the second node, including updating the estimate to incorporate a single loss event when one or more of the messages received from the second node indicate an unsuccessful delivery of a single packet to the second data node, and updating the estimate to incorporate a single loss event when one or more of the messages received from the second node indicate an unsuccessful delivery of a number of consecutively transmitted packets to the second data node, and adjusting a rate of redundancy messages transmitted from the first node based on the estimate of the rate at which loss events occur.

Aspects may include one or more of the following features.

Adjusting the rate of redundancy messages transmitted from the first node based on the estimate of the rate at which loss events occur may include adjusting a ratio of the rate of redundancy messages transmitted from the first node to the estimate of the rate at which loss events occur. The error correcting code used to determine the one or more redundancy messages may be chosen based at least in part on an estimated rate of loss events where a number of consecutive messages unsuccessfully delivered to the second data node is less than a predetermined threshold. The second error correcting code may include a burst error correcting code.

In a general aspect, a method for data communication from a first node to a second node over a data channel coupling the first node and the second node includes receiving messages at the first node from the second node, including receiving messages comprising data that depend at least in part of characteristics of the channel coupling the first node and the second node, transmitting messages from the first node to the second node, including applying forward error correction according to parameters determined from the received messages, the parameters determined from the received messages including at least two of a block size, an interleaving factor, and a code rate.

Aspects may include one or more of the following features.

The method may include selecting parameters for forward error correction for transmission of messages from the first node to the second node. The selecting of the parameters may be performed at the first node. The selecting of the parameters may be performed at the second node. The received messages from the second node may include data representing the parameters. The method may include selecting the parameters for forward error correction at the second node, and forming the data representing said parameters at the second node.

In another general aspect, a method for data communication from a first node to a second node over a data channel coupling the first node and the second node includes transmitting messages from the second node to the first node, including transmitting a message to the first node comprising data that depends at least in part on measured or expected characteristics of the channel coupling the first node and the second node, receiving messages at the second node from the first node, the messages comprising forward error correction applied at the first node according to the data of the message transmitted from the second node to the first node.

Aspects may include one or more of the following features.

The data that depends at least in part on measured or expected characteristics may include data that specifies characteristics of the forward error correction. The data that specifies the characteristics of the forward error correction may include data specifying at least two of a block size, an interleaving factor, a code rate, a pacing rate, and a window size. The data that depends at least in part on measured or expected characteristics may include data characterizing a pattern of message erasure on the channel. The data characterizing a pattern of message erasure may include data representing an erasure rate.

The method may include computing at the second node characteristics of forward error correction for application to messages at the first node prior to their transmission to the second node. Computing the characteristics of the forward error correction may include using measured or expected characteristics of the channel coupling the first node and the second node. Computing the characteristics of the forward error correction may include using a state of a consumer of the message received from the first node at the second node. The state may include a state related to an amount of buffered messages for the consumer of the messages.

In another general aspect, a communication apparatus includes a first device having an interface for passing messages to and from a second device over a communication path coupling the first device to the second device. The communication apparatus is configured to receive messages at the first device from the second device, including receiving messages comprising data that depend at least in part of characteristics of the channel coupling the first device and the second device and transmit messages from the first device to the second device, including applying forward error correction according to parameters determined from the received messages, the parameters determined from the received messages including at least two of a block size, an interleaving factor, and a code rate.

Aspects may include one or more of the following features.

The apparatus may be configured to select parameters for forward error correction for transmission of messages from the first device to the second device. The selecting of the parameters may be performed at the first device. The selecting of the parameters may be performed at the second device. The received messages from the second device may include data representing the parameters. The communication apparatus may be configured to select the parameters for forward error correction at the second device, and form the data representing said parameters at the second device.

In another general aspect, a communication apparatus includes a first device having an interface for passing messages to and from a second device over a communication path coupling the first device to the second device. The communication apparatus is configured to transmit messages from the second device to the first device, including transmit a message to the first device comprising data that depends at least in part on measured or expected characteristics of the channel coupling the first device and the second device, and receive messages at the second device from the first device, the messages comprising forward error correction applied at the first device according to the data of the message transmitted from the second device to the first device.

Aspects may include one or more of the following features.

The data that depends at least in part on measured or expected characteristics may include data that specifies characteristics of the forward error correction. The data that specifies the characteristics of the forward error correction may include data specifying at least two of a block size, an interleaving factor, a code rate, a pacing rate, and a window size. The data that depends at least in part on measured or expected characteristics may include data characterizing a pattern of message erasure on the channel. The data characterizing a pattern of message erasure may include data representing an erasure rate.

The apparatus may be configured to compute at the second device characteristics of forward error correction for application to messages at the first device prior to their transmission to the second device. Computing the characteristics of the forward error correction may include using measured or expected characteristics of the channel coupling the first device and the second device. Computing the characteristics of the forward error correction may include using a state of a consumer of the message received from the first device at the second device. The state may include a state related to an amount of buffered messages for the consumer of the messages.

In a general aspect, a method for data communication between a first node and a second node over a number of data paths coupling the first node and the second node includes transmitting messages between the first node and the second node over the number of data paths including transmitting at least some of the messages over a first data path of the number of data paths using a first communication protocol, and transmitting at least some of the messages over a second data path of the number of data paths using a second communication protocol and determining that the first data path is altering a flow of messages over the first data path due to the messages being transmitted using the first communication protocol, and in response to the determining, adjusting a number of messages sent over the number of data paths including decreasing a number of the messages transmitted over the first data path and increasing a number of messages transmitted over the second data path.

Aspects may include one or more of the following features.

Determining that the first data path is altering the flow of messages over the first data path may include determining that the first data path is limiting a rate of messages transmitted using the first communication protocol. Determining that the first data path is altering the flow of messages over the first data path may include determining that the first data path is dropping messages transmitted using the first communication protocol at a higher rate than a rate at which the second data path is dropping messages transmitted using the second communication protocol. The first communication protocol may be the User Datagram Protocol (UDP). The second communication protocol may be the Transmission Control Protocol (TCP).

The messages may be initially equally divided across the first data path and the second data path using a load balancing technique. The messages may be initially divided across the first data path and the second data path according to a division of the messages across the first data path and the second data path in one or more prior data communication connections. The messages may be initially divided across the first data path and the second data path based on a probability that the first data path will alter a flow of messages over the first data path due to the messages being transmitted using the first communication protocol.

The messages may be divided across the first data path and the second data path based on message type. The message type may include one or more of acknowledgment messages, forward error correction messages, retransmission messages, and original data messages. Decreasing a number of the messages transmitted over the first data path and increasing a number of messages transmitted over the second data path may include sending all of the messages over the second path and sending none of the messages over the first path.

At least some of the number of data paths may share a common physical data path. The first data path and the second data path may share a common physical data path. The adjusting of the number of messages sent over the number of data paths may occur during an initial phase of the transmission of the messages. The adjusting of the number of messages sent over the number of data paths may repeatedly occur over a duration of the transmission of the messages. The adjusting of the number of messages sent over the number of data paths may include increasing a number of the messages transmitted over the first data path and decreasing a number of messages transmitted over the second data path.

In another general aspect, a system for data communication over a number of data paths includes a first node and a second node coupled by the number of data paths and configured to transmit messages therebetween over the number of data paths including transmitting at least some of the messages over a first data path of the number of data paths using a first communication protocol, and transmitting at least some of the messages over a second data path of the number of data paths using a second communication protocol and determine that the first data path is altering a flow of messages over the first data path due to the messages being transmitted using the first communication protocol, and in response to the determining, adjusting a number of messages sent over the number of data paths including decreasing a number of the messages transmitted over the first data path and increasing a number of messages transmitted over the second data path.

Aspects may include one or more of the following features.

Determining that the first data path is altering the flow of messages over the first data path may include determining that the first data path is limiting a rate of messages transmitted using the first communication protocol. Determining that the first data path is altering the flow of messages over the first data path may include determining that the first data path is dropping messages transmitted using the first communication protocol at a higher rate than a rate at which the second data path is dropping messages transmitted using the second communication protocol. The first communication protocol may be the User Datagram Protocol (UDP). The second communication protocol may be the Transmission Control Protocol (TCP).

The messages may be initially equally divided across the first data path and the second data path using a load balancing technique. The messages may be initially divided across the first data path and the second data path according to a division of the messages across the first data path and the second data path in one or more prior data communication connections. The messages may be initially divided across the first data path and the second data path based on a probability that the first data path will alter a flow of messages over the first data path due to the messages being transmitted using the first communication protocol. The messages may be divided across the first data path and the second data path based on message type. The message type may include one or more of acknowledgment messages, forward error correction messages, retransmission messages, and original data messages. Decreasing a number of the messages transmitted over the first data path and increasing a number of messages transmitted over the second data path may include sending all of the messages over the second path and sending none of the messages over the first path.

At least some of the number of data paths may share a common physical data path. The first data path and the second data path may share a common physical data path. The adjusting of the number of messages sent over the number of data paths may occur during an initial phase of the transmission of the messages. The adjusting of the number of messages sent over the number of data paths may repeatedly occur over a duration of the transmission of the messages. The adjusting of the number of messages sent over the number of data paths may include increasing a number of the messages transmitted over the first data path and decreasing a number of messages transmitted over the second data path.

In another general aspect, software stored on non-transitory computer-readable media comprising instructions for causing one or more processors to execute a data communication method for data communication between a number of nodes over a number of data paths coupling the number of nodes including transmitting messages between the first node and the second node over the number of data paths including transmitting at least some of the messages over a first data path of the number of data paths using a first communication protocol, and transmitting at least some of the messages over a second data path of the number of data paths using a second communication protocol and determining that the first data path is altering a flow of messages over the first data path due to the messages being transmitted using the first communication protocol, and in response to the determining, adjusting a number of messages sent over the number of data paths including decreasing a number of the messages transmitted over the first data path and increasing a number of messages transmitted over the second data path.

Aspects may have one or more of the following advantages.

In some examples, the parallel transmission over TCP and UDP is handled differently from conventional load balancing techniques because TCP and UDP 1) share a low-level data path and 2) have very different protocol characteristics.

In some examples, approaches respond to instantaneous network behavior and learn the network's data handling policy and state by probing for changes. Unlike conventional load-balancers which assume each data path is unique and does not affect the other, approaches recognize that TCP and UDP share a low-level data path and directly affect each other. Additionally, TCP provides in-order delivery and retransmits data (along with flow control, congestion control, etc.) whereas UDP does not. This uniqueness requires additional logic that maps specific message types to each communication protocol based at least in part on the different properties of the protocols (e.g. expect longer jitter over TCP, expect out-of-order delivery on UDP). For example, the system does not code over packets sent through TCP since it is reliable, but sends forward error correction exclusively over UDP to add redundancy and save bandwidth. In some examples, a larger ACK interval is used for ACKing TCP data.

By employing the techniques described herein, approaches distribute data over TCP and UDP data paths to achieve optimal or near-optimal throughput when network provider's policies treat UDP unfairly as compared to conventional systems, which simply use UDP if possible and fallback to TCP if not.

In a general aspect, a method for data communication between a first node and a second node over a data path coupling the first node and the second node including transmitting messages from the first node to the second node over the data path, receiving messages at the first node from the second node, including receiving messages indicative of successful and unsuccessful delivery of the messages transmitted from the first node to the second node, maintaining a transmission limit according to the received messages indicative of successful and unsuccessful delivery of messages, the maintaining including decreasing the transmission limit when the received messages indicate an unsuccessful delivery of a message transmitted from the first node to the second node, increasing the transmission limit according to an increase function while the received messages indicate that no messages were unsuccessfully delivered to the second node, and wherein the increase function includes a first parameter for controlling a shape of a first portion of the increase function and a second parameter for controlling a shape of a second portion of the increase function, and inhibiting transmission of messages from the first node to the second node, including limiting transmission of messages according to the maintained transmission limit.

Aspects may include one or more of the following features.

Maintaining the second transmission limit may include maintaining a window size, and limiting transmission of the messages according to the second transmission limit may include limiting a number of messages not yet successfully delivered to the second node according to the window size. The window size may include a congestion control window size. Decreasing the transmission limit may include decreasing the window size. Increasing the transmission limit may include increasing the window size. The first portion of the increase function may have a convex shape. The second portion of the increase function may have a concave shape. The first portion of the increase function may be defined as:

$$W_1(t) = W_{max} + c_1(t-k)^3$$

where $W_{max}$ is a transmission limit threshold, $c_1$ is the first parameter, and k is defined as:

$$k = \sqrt[3]{\frac{W_{max} - W}{c_1}}.$$

The second portion of the increase function may be defined as $$W_2(t) = W_{max} + c_2(t-k)^3$$

where $W_{max}$ is a transmission limit threshold, $c_2$ is the second parameter, and k is defined as:

$$k = \sqrt[3]{\frac{W_{max} - W}{c_1}}.$$

The first portion of the increase function may be used to increase transmission limit up to a transmission limit threshold and the second portion of the increase function may be used to increase the transmission limit beyond the transmission limit threshold.

In another general aspect, a communication apparatus includes a first device having an interface for passing messages to and from a second device over a communication path coupling the first device to the second device. The first device includes a communication controller configured to transmit messages from the first node to the second node over the data path, receive messages at the first node from the second node, including receive messages indicative of successful and unsuccessful delivery of the messages transmitted from the first node to the second node, maintain a transmission limit according to the received messages indicative of successful and unsuccessful delivery of messages, the maintaining including decreasing the transmission limit when the received messages indicate an unsuccessful delivery of a message transmitted from the first node to the second node, increasing the transmission limit according to an increase function while the received messages indicate that no messages were unsuccessfully delivered to the second node, and wherein the increase function includes a first parameter for controlling a shape of a first portion of the increase function and a second parameter for controlling a shape of a second portion of the increase function, and inhibit transmission of messages from the first node to the second node, including limiting transmission of messages according to the maintained transmission limit.

Aspects may include one or more of the following features.

Maintaining the second transmission limit may include maintaining a window size, and limiting transmission of the messages according to the second transmission limit may include limiting a number of messages not yet successfully delivered to the second node according to the window size. The window size may include a congestion control window size. Decreasing the transmission limit may include decreasing the window size. Increasing the transmission limit may include increasing the window size. The first portion of the increase function may have a convex shape. The second portion of the increase function may have a concave shape.

The first portion of the increase function may be defined as $$W_1(t) = W_{max} + c_1(t-k)^3$$

where $W_{max}$ is a transmission limit threshold, $c_1$ is the first parameter, and k is defined as:

$$k = \sqrt[3]{\frac{W_{max} - W}{c_1}}$$

The second portion of the increase function may be defined as $$W_2(t) = W_{max} + c_2(t-k)^3$$

where $W_{max}$ is a transmission limit threshold, $c_2$ is the second parameter, and k is defined as:

$$k = \sqrt[3]{\frac{W_{max} - W}{c_1}}$$

The first portion of the increase function may be used to increase transmission limit up to a transmission limit threshold and the second portion of the increase function may be used to increase the transmission limit beyond the transmission limit threshold.

In a general aspect, a method for data communication between a first node and a second node over a data path coupling the first node and the second node includes transmitting a segment of data from the first node to the second node over the data path as a number of messages, the number of messages being transmitted according to a transmission order. A degree of redundancy associated with each message of the number of messages is determined based on a position of said message in the transmission order.

Aspects may include one or more of the following features.

The degree of redundancy associated with each message of the number of messages may increase as the position of the message in the transmission order is non-decreasing. Determining the degree of redundancy associated with each message of the number of messages based on the position (i) of the message in the transmission order is further based on one or more of delay requirements for an application at the second node, a round trip time associated with the data path, a smoothed loss rate (P) associated with the channel, a size (N) of the data associated with the number of messages, a number ($a_i$) of acknowledgment messages received from the second node corresponding to messages from the number of messages, a number ($f_i$) of in-flight messages of the number of messages, and an increasing function (g(i)) based on the index of the data associated with the number of messages.

The degree of redundancy associated with each message of the number of messages may be defined as: $(N+g(i)-a_i)/(1-p)-f_i$. g(i) may be defined as a maximum of a parameter m and N−i. g(i) may be defined as N−p(i) where p is a polynomial, with integer rounding as needed. The method may include receiving, at the first node, a feedback message from the second node indicating a missing message at the second node and, in response to receiving the feedback message, sending a redundancy message to the second node to increase a degree of redundancy associated with the missing message. The method may include maintaining, at the first node, a queue of preemptively computed redundancy messages and, in response to receiving the feedback message, removing some or all of the preemptively computed redundancy messages from the queue and adding the redundancy message to the queue for transmission. The redundancy message may be generated and sent on-the-fly in response to receipt of the feedback message.

The method may include maintaining, at the first node, a queue of preemptively computed redundancy messages for the number of messages and, in response to receiving a feedback message indicating successful delivery of the number of messages, removing any preemptively computed redundancy messages associated with the number of messages from the queue of preemptively computed redundancy messages. The degree of redundancy associated with each of the messages may characterize a probability of correctability of an erasure of the message. The probability of correctability may depend on a comparison of between the degree of redundancy and a loss probability.

In another general aspect, a system for data communication between a number of nodes over a data path coupling the number of nodes includes a first node configured to transmit a segment of data to a second node over the data path as a number of messages, the number of messages being transmitted according to a transmission order. A degree of redundancy associated with each message of the number of messages is determined based on a position of said message in the transmission order.

In another general aspect, software stored on non-transitory computer-readable media comprising instructions for causing one or more processors to execute a data communication method for data communication between a number of nodes over a data path coupling the number of nodes including transmitting a segment of data from the first node to the second node over the data path as a number of messages, the number of messages being transmitted according to a transmission order. A degree of redundancy associated with each message of the number of messages is determined based on a position of said message in the transmission order.

In another general aspect, a method for data communication between a first node and a second node over a data path coupling the first node and the second node includes transmitting messages between the first node and the second node over the data path, the messages including data messages formed from a segment of data and redundancy messages formed for the segment of data, the transmitting including maintaining, at the first node, a queue for storing the redundancy messages prior to transmission, receiving, at the first node, feedback messages characterizing a delivery status of the messages from the second node. Maintaining the queue of the redundancy messages includes adding redundancy messages to the queue or removing redundancy messages from the queue based on the received feedback messages.

Aspects may include one or more of the following features.

Receiving feedback messages may include receiving a message characterizing a degree of successful delivery of the messages at the second node and, in response to receiving the feedback message, adding a redundancy message to the queue for transmission to the second node. The method may include removing some or all redundancy messages from the queue prior to adding the redundancy message to the queue. Receiving feedback messages may include receiving a feedback message from the second node indicating a degree of successful delivery of one or more messages at the second node and, in response to receiving the feedback message, removing any redundancy messages associated with the one or more messages from the queue.

In another general aspect, a system for data communication between a number of nodes over a data path coupling the number of nodes includes a first node configured to transmit messages to a second node over the data path, the messages including data messages formed from a segment of data and redundancy messages formed for the segment of data, the transmitting including maintaining, at the first node, a queue for storing the redundancy messages prior to transmission and receive feedback messages characterizing a delivery status of the messages from the second node. Maintaining the queue of the redundancy messages includes adding redundancy messages to the queue or removing redundancy messages from the queue based on the received feedback messages.

In another general aspect, software stored on non-transitory computer-readable media comprising instructions for causing one or more processors to execute a data communication method for data communication between a number of nodes over a data path coupling the number of nodes, including transmitting messages between the first node and the second node over the data path, the messages including data messages formed from a segment of data and redundancy messages formed for the segment of data, the transmitting including maintaining, at the first node, a queue for storing the redundancy messages prior to transmission, receiving, at the first node, feedback messages characterizing a delivery status of the messages from the second node. Maintaining the queue of the redundancy messages includes adding redundancy messages to the queue or removing redundancy messages from the queue based on the received feedback messages.

In a general aspect, a method for data communication from a first node to a second node over a data channel coupling the first node and the second node includes receiving data messages at the second node, the messages belonging to a set of data messages transmitted in a sequential order from the first node, sending feedback messages from the second node to the first node, the feedback messages characterizing a delivery status of the set of data messages at the second node, including maintaining a set of one or more timers according to occurrences of a number of delivery order events, the maintaining including modifying a status of one or more timers of the set of timers based on occurrences of the number of delivery order events, and deferring sending of said feedback messages until expiry of one or more of the set of one or more timers.

Aspects may include one or more of the following features.

The set of one or more timers may include a first timer and the first timer may be started upon detection of a first delivery order event, the first delivery order event being associated with receipt of a first data message associated with a first position in the sequential order prior to receipt of one or more missing messages associated with positions preceding the first position in the sequential order. The method may include sending the feedback messages indicating a successful delivery of the set of data messages at the second node upon detection of a second delivery order event, the second delivery order event being associated with receipt of the one or more missing messages prior to expiry of the first timer. The method may include sending said feedback messages indicating an unsuccessful delivery of the set of data messages at the second node upon expiry of the first timer prior to any of the one or more missing messages being received. The set of one or more timers may include a second timer and the second timer is started upon detection of a second delivery order event, the second delivery order event being associated with receipt of some but not all of the missing messages prior to expiry of the first timer. The method may include sending feedback messages indicating an unsuccessful delivery of the set of data messages at the second node upon expiry of the second timer prior to receipt of the missing messages. The method may include sending feedback messages indicating a successful delivery of the set of data messages at the second node upon detection of a third delivery order event, the third delivery order event being associated with receipt of the missing messages prior to expiry of the second timer.

In another general aspect, a system for data communication over a data channel coupling a number of nodes includes a second node of the number of nodes configured to receive data messages, the data messages belonging to a set of data messages transmitted in a sequential order from a first node, send feedback messages to the first node, the feedback messages characterizing a delivery status of the set of data messages at the second node, including maintaining a set of one or more timers according to occurrences of a number of delivery order events, the maintaining including modifying a status of one or more timers of the set of timers based on occurrences of the number of delivery order events, and deferring sending of said feedback messages until expiry of one or more of the set of one or more timers.

In another general aspect, software stored on non-transitory computer-readable media including instructions for causing a second node in a data communication system to receive data messages at the second node, the messages belonging to a set of data messages transmitted in a sequential order from the first node, send feedback messages from the second node to the first node, the feedback messages characterizing a delivery status of the set of data messages at the second node, including maintaining a set of one or more timers according to occurrences of a number of delivery order events, the maintaining including modifying a status of one or more timers of the set of timers based on occurrences of the number of delivery order events, and deferring sending of said feedback messages until expiry of one or more of the set of one or more timers.

In another general aspect, a method for data communication from a first node to a second node over a data channel coupling the first node and the second node includes receiving, at the first node, feedback messages indicative of a delivery status of a set of data messages transmitted in a sequential order to the second node from the second node, maintaining a size of a congestion window at the first node including maintaining a set of one or more timers according to occurrences of a number of feedback events, the maintaining including modifying a status of one or more timers of the set of timers based on occurrences of the number of feedback events, and delaying modification of the size of the congestion window until expiry of one or more of the set of one or more timers.

Aspects may include one or more of the following features.

The set of one or more timers may include a first timer and the first timer may be started upon detection of a first feedback event, the first feedback event being associated with receipt of a first feedback message indicating successful delivery of a first data message having first position in the sequential order prior to receipt of one or more feedback messages indicating successful delivery of one or more other data messages having positions preceding the first position in the sequential order. The method may include cancelling modification of the congestion window upon detection of a second feedback event, the second feedback event being associated with receipt of one or more feedback messages indicating successful delivery of the one or more other data messages prior to expiry of the first timer. The method may include modifying the congestion window upon expiry of the first timer prior to receipt of any feedback message indicating successful delivery of the one or more other data messages.

The set of one or more timers may include a second timer and the second timer may be started upon detection of a third feedback event, the third feedback event being associated with receipt of one or more feedback messages indicating successful delivery of some but not all of the one or more other data messages prior to expiry of the first timer. The method may include modifying the size of the congestion window upon expiry of the second timer prior to receipt of one or more feedback messages indicating successful delivery of the one or more other data messages. The method may include cancelling modification of the size of the congestion window upon detection of a fourth feedback event, the fourth feedback event being associated with receipt one or more feedback messages indicating successful delivery of the one or more other data messages prior to expiry of the second timer.

In another general aspect, a system for data communication between a number of nodes over a data channel coupling the number of nodes includes a first node of the number of nodes configured to receive, at the first node, feedback messages indicative of a delivery status of a set of data messages transmitted in a sequential order to the second node from the second node, maintain a size of a congestion window at the first node including maintaining a set of one or more timers according to occurrences of a number of feedback events, the maintaining including modifying a status of one or more timers of the set of timers based on occurrences of the number of feedback events, and delaying modification of the size of the congestion window until expiry of one or more of the set of one or more timers.

In another general aspect, software stored on non-transitory computer-readable media includes instructions for causing a first node in a data communication system to receive, at the first node, feedback messages indicative of a delivery status of a set of data messages transmitted in a sequential order to the second node from the second node, maintain a size of a congestion window at the first node including maintaining a set of one or more timers according to occurrences of a number of feedback events, the maintaining including modifying a status of one or more timers of the set of timers based on occurrences of the number of feedback events, and delaying modification of the size of the congestion window until expiry of one or more of the set of one or more timers.

In a general aspect, a method for data communication over a data channel on a data path between a first node and a second node includes maintaining data characterizing one or more current or previous data communication connections traversing the data channel and initiating a new data communication connection between the first node and the second node including configuring the new data communication connection at least in part according to the maintained data.

Aspects may include one or more of the following features.

The maintained data may characterize one or more data channels on one or more data paths between the first node and the second node over which said one or more current or previous data communication connections pass. The maintained data may characterize an error rate of the one or more data channels. The maintained data may characterize a bandwidth of the one or more data channels. The maintained data may characterize a round trip time of the one or more data channels. The maintained data may characterize communication protocol parameters of the one or more current or previous data communication connections.

The communication protocol parameters may include one or more of a congestion window size, a block size, an interleaving factor, a port number, a pacing interval, a round trip time, and a timing variability. The communication protocol parameters may include two or more of a congestion window size, a block size, an interleaving factor, a port number, a pacing interval, a round trip time, and a timing variability.

The maintained data may characterize forward error correction parameters associated with the one or more current or previous data communication connections. The forward error correction parameters may include a code rate. Initiating the new data communication connection may include configuring the new data communication connection according to first data of the maintained data, the first data is maintained at the first node, and initiating the new data communication connection includes providing the first data from the first node to the second node for configuring the new data communication connection.

Initiating the new data communication connection may include configuring the new data communication connection according to first data of the maintained data, the first data is maintained at the first node, and initiating the new data communication connection includes accessing first data at the first node for configuring the new data communication connection.

Initiating the new data communication connection may include configuring the new data communication connection according to first data of the maintained data, the first data being maintained at the first node, and initiating the new data communication connection includes accepting a request from the first node for establishing the new data communication connection between the first node and the second node, including receiving, at the second node, at least one message from the first node comprising the first data for configuring said connection. The method may include maintaining the new data communication connection between the first node and the second node, including maintaining communication parameters, including initializing said communication parameters according the first data received in the at least one message from the first node.

Maintaining the new data communication connection may include adapting the communication parameters according to feedback from the first node. The feedback from the first node may include feedback messages received from the first node. The feedback may include feedback derived from a plurality of feedback messages received from the first node.

In another general aspect, a system for data communication over a data channel on a data path between a first node and a second node includes a data store for maintaining data characterizing one or more current or previous data communication connections traversing the data channel and a connection initiation module for initiating a new data communication connection between the first node and the second node including configuring the new data communication connection at least in part according to the maintained data.

In another general aspect, software stored on non-transitory computer-readable media comprising instructions for causing one or more processors to execute a data communication method for data communication between a first node and a second node over a data path coupling the first node and the second node includes maintaining data characterizing one or more current or previous data communication connections traversing the data channel and initiating a new data communication connection between the first node and the second node including configuring the new data communication connection at least in part according to the maintained data.

In some examples, one or more training communication connections over a data channel on a data path are employed prior to establishment of data communication connections over the data channel on the data path. The training communication connections are used to collect information about the data channel which is then used when establishing the data communication connections. In other examples, no training communication connections are employed and information about the data channel is obtained from one or more previous or current data communication connection over the data channel on the data path.

In a general aspect, a method for data communication between a first node and a second node over a number of data paths coupling the first node and the second node includes transmitting messages between the first node and the second node over the number of data paths including transmitting a first subset of the messages over a first data path of the number of data paths, and transmitting a second subset of the messages over a second data path of the number of data paths. The first data path has a first latency and the second data path has a second latency substantially larger than the first latency, and messages of the first subset of the messages are chosen to have first message characteristics and messages of the second subset are chosen to have second message characteristics, different from the first message characteristics.

Aspects may include one or more of the following features.

Messages having the first message characteristics may include time critical messages. The first subset of the messages and the second subset of the messages may be determined from a portion of the messages available at the first node at a time of transmission. At a subsequent time of transmission, additional messages made available to the first node may be divided into the first subset and the second subset based on message characteristics associated with the additional messages. Messages having the first message characteristics may be associated with an initial subset of a data set and messages having the second message characteristics may be associated with a subsequent subset of the data set. The messages of the second subset may include messages that are at most n messages ahead of a last acknowledged message in a sequential transmission order associated with the messages, wherein n is determined based on a buffer size at one of the first and second nodes.

Messages having the first message characteristics may include acknowledgment messages and messages having the second message characteristics may include data messages. Messages having the first message characteristics may include supplemental data messages. The supplemental data messages include data messages may include redundancy data and messages having the second message characteristics include original data messages. The first data path may include a terrestrial data path and the second data path may include a satellite data path. The terrestrial data path may include one or more of a cellular data path, a digital subscriber line (DSL) data path, a fiber optic data path, a cable internet based data path, and a wireless local area network data path. The satellite data path may include one or more of a low earth orbit satellite data path, a medium earth orbit satellite data path, and a geostationary earth orbit satellite data path. The first data path may include a medium earth orbit satellite data path or a low earth orbit satellite data path and the second data path may include a geostationary orbit satellite data path.

The method may further include, for each path of the number of data paths, maintaining an indication of successful and unsuccessful delivery of the messages over the data path and adjusting a congestion window for the data path based on the indication. The method may further include, for each path of the number of data paths, maintaining, at the first node, an indication of whether a number of messages received at the second node is sufficient to decode data associated with the messages, wherein the indication is based on feedback received at the first node over the number of data paths.

In another general aspect, a system for data communication between a number of nodes over a number of data paths coupling the number of nodes includes a first node configured to transmit messages between to a second node over the number of data paths including transmitting a first subset of the messages over a first data path of the number of data paths, and transmitting a second subset of the messages over a second data path of the number of data paths. The first data path has a first latency and the second data path has a second latency substantially larger than the first latency, and messages of the first subset of the messages are chosen to have first message characteristics and messages of the second subset are chosen to have second message characteristics, different from the first message characteristics.

Aspects may include one or more of the following features.

Messages having the first message characteristics may include time critical messages. The first subset of the messages and the second subset of the messages may be determined from a portion of the messages available at the first node at a time of transmission. At a subsequent time of transmission, additional messages made available to the first node may be divided into the first subset and the second subset based on message characteristics associated with the additional messages. Messages having the first message characteristics may be associated with an initial subset of a data set and messages having the second message characteristics may be associated with a subsequent subset of the data set.

The messages of the second subset may include messages that are at most n messages ahead of a last acknowledged message in a sequential transmission order associated with the messages, wherein n is determined based on a receive buffer size at the second node. Messages having the first message characteristics may include acknowledgment messages and messages having the second message characteristics may include data messages. Messages having the first message characteristics may include supplemental data messages. The supplemental data messages may include data messages including redundancy data and messages having the second message characteristics may include original data messages.

The first data path may include a terrestrial data path and the second data path may include a satellite data path. The terrestrial data path may include one or more of a cellular data path, a digital subscriber line (DSL) data path, a fiber optic data path, a cable internet based data path, and a wireless local area network data path. The satellite data path may include one or more of a low earth orbit satellite data path, a medium earth orbit satellite data path, and a geostationary earth orbit satellite data path. The first data path may include a medium earth orbit satellite data path or a low earth orbit satellite data path and the second data path may include a geostationary orbit satellite data path.

The first node may be further configured to, for each path of the number of data paths, maintain an indication of successful and unsuccessful delivery of the messages over the data path and adjust a congestion window for the data path based on the indication. The first node may be further configured to maintain an aggregate indication of whether a number of messages received at the second node over the number of data paths is sufficient to decode data associated with the messages and to transmit supplemental messages based on the aggregate indication, wherein the aggregate indication is based on feedback from the second node received at the first node over the number of data paths.

In another general aspect, software stored on non-transitory computer-readable media comprising instructions for causing one or more processors to execute a data communication method for data communication between a number of nodes over a data path coupling the number of nodes including transmitting messages between a first node and a second node over the number of data paths including transmitting a first subset of the messages over a first data path of the number of data paths, and transmitting a second subset of the messages over a second data path of the number of data paths. The first data path has a first latency and the second data path has a second latency substantially larger than the first latency, and messages of the first subset of the messages are chosen to have first message characteristics and messages of the second subset are chosen to have second message characteristics, different from the first message characteristics.

In a general aspect, a method for modifying redundancy information associated with encoded data passing from a first node to a second node over a number of data paths includes receiving first encoded data including first redundancy information at an intermediate node from the first node via a first channel connecting the first node and the intermediate node, the first channel having first channel characteristics and transmitting second encoded data including second redundancy information from the intermediate node to the second node via a second channel connecting the intermediate node and the second node, the second channel having second channel characteristics. A degree of redundancy associated with the second redundancy information is determined by modifying the first redundancy information based on one or both of the first channel characteristics and the second channel characteristics without decoding the first encoded data.

Aspects may include one or more of the following features.

Modifying the first redundancy information may include adding redundancy information to the first redundancy information. Modifying the first redundancy information may include removing redundancy information from the first redundancy information. The second redundancy information may be further formed by modifying the first redundancy information based on feedback from the second node indicative of successful or unsuccessful delivery of the encoded data to the second node. The first encoded data and the second encoded data may be encoded using a random linear network code. Modifying the first redundancy information based on one or both of the first channel characteristics and the second channel characteristics may include modifying the first redundancy information based on one or more of a block size, a congestion window size, and a pacing rate associated with the first channel characteristics and/or the second channel characteristics.

The method may include sending a feedback message from the intermediate node to the first node acknowledging receipt of one or more messages at the intermediate node. The method may include receiving a feedback message from the second node at the intermediate node and, in response to receiving the feedback message, transmitting additional redundancy information to the second node.

In another general aspect, a system for modifying redundancy information associated with encoded data passing from a first node to a second node over a number of data paths includes an intermediate node configured to receive first encoded data including first redundancy information from the first node via a first channel connecting the first node and the intermediate node, the first channel having first channel characteristics and transmit second encoded data including second redundancy information from the intermediate node to the second node via a second channel connecting the intermediate node and the second node, the second channel having second channel characteristics. A degree of redundancy associated with the second redundancy information is determined by modifying the first redundancy information based on one or both of the first channel characteristics and the second channel characteristics without decoding the first encoded data.

Aspects may include one or more of the following features.

Modifying the first redundancy information at the intermediate node may include adding redundancy information to the first redundancy information. Modifying the first redundancy information at the intermediate node may include removing redundancy information from the first redundancy information. The second redundancy information may be further formed by the intermediate node by modifying the first redundancy information based on feedback from the second node indicative of successful or unsuccessful delivery of the encoded data to the second node. The first encoded data and the second encoded data may be encoded using a random linear network code. Modifying the first redundancy information at the intermediate node based on one or both of the first channel characteristics and the second channel characteristics may include modifying the first redundancy information based on one or more of a block size, a congestion window size, and a pacing rate associated with the first channel characteristics and/or the second channel characteristics.

The system may send a feedback message from the intermediate node to the first node acknowledging receipt of one or more messages at the intermediate node. The system may receive a feedback message from the second node at the intermediate node and, in response to receiving the feedback message, transmit additional redundancy information to the second node.

In another general aspect, software stored on non-transitory computer-readable media includes instructions for causing an intermediate node in a data communication system to modify redundancy information associated with encoded data passing from a first node to a second node over a number of data paths including receiving first encoded data including first redundancy information at the intermediate node from the first node via a first channel connecting the first node and the intermediate node, the first channel having first channel characteristics and transmitting second encoded data including second redundancy information from the intermediate node to the second node via a second channel connecting the intermediate node and the second node, the second channel having second channel characteristics. A degree of redundancy associated with the second redundancy information is determined by modifying the first redundancy information based on one or both of the first channel characteristics and the second channel characteristics without decoding the first encoded data.

Figure 1:
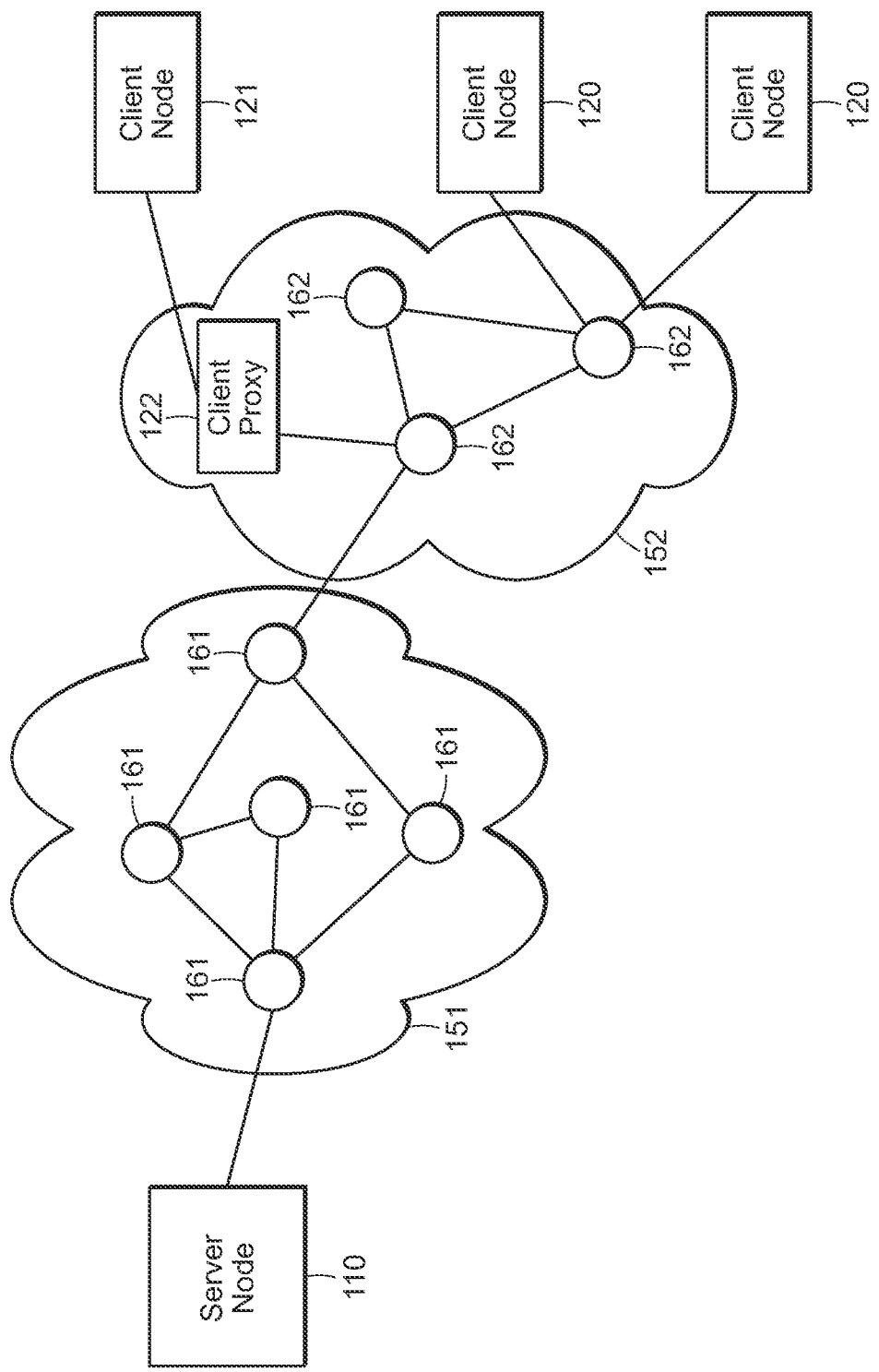
FIG. 1 is a schematic of a data network including server and client nodes coupled by intermediate networks.

| Table of Contents | | |
|---|---|---|
| CROSS-REFERENCE TO RELATED APPLICATIONS | | 1 |
| BACKGROUND | | 2 |
| SUMMARY | | 5 |
| DESCRIPTION OF DRAWINGS | | 30 |
| Table of Contents | | 32 |
| DETAILED DESCRIPTION | | 33 |
| 1 | Overview | 33 |
| 2 | Architectures and applications | 37 |
| 2.1 | Transport layer architectures | 37 |
| 2.1.1 | Kernel implementation | 37 |
| 2.1.2 | Alternative software implementations | 38 |
| 2.2 | Proxy architectures | 39 |
| 2.2.1 | Conventional proxy node | 39 |
| 2.2.2 | First alternative proxy node | 39 |
| 2.2.3 | Integrated proxy | 40 |
| 2.2.4 | Second alternative proxy node | 41 |
| 2.3 | Intermediate proxy | 42 |
| 2.4 | Recoding node | 43 |
| 2.5 | Multipath transmission | 44 |
| 2.5.1 | Single endpoint pair | 44 |

| Table of Contents -continued | | |
|---|---|---|
| 2.5.2 | Distributed source | 47 |
| 2.5.3 | Distributed content delivery | 47 |
| 2.6 | Multicast | 48 |
| 2.7 | Further illustrative examples | 49 |
| 3 | Packet Coding (PC) | 52 |
| 3.1 | Data characteristics | 52 |
| 3.2 | Channel Characteristics | 54 |
| 3.3 | Inter-packet coding | 55 |
| 3.3.1 | Forward error correction and repair retransmission | 56 |
| 3.3.2 | Random linear coding | 57 |
| 3.4 | Batch transmission | 59 |
| 3.5 | Protocol parameters | 67 |
| 3.6 | Transmission control | 68 |
| 3.6.1 | Congestion control | 68 |
| 3.6.2 | Transmission rate control | 69 |
| 3.7 | Error control | 74 |
| 3.7.1 | Packet reordering | 76 |
| 3.7.2 | Acknowledgments | 77 |
| 3.8 | Parameter control | 78 |
| 3.8.1 | Initialization | 78 |
| 3.8.2 | Tunable coding | 78 |
| 3.8.3 | Cross-session parameter control | 83 |
| 3.9 | Multi-path | 86 |
| 4 | Alternatives and implementations | 89 |
| What is claimed is: | | 195 |
| ABSTRACT | | 200 |

DETAILED DESCRIPTION

1 Overview

Various embodiments described in this document relate to communication protocols that improve aspects of communication between nodes on a data network. These aspects include, for instance, average, worst case, or variability in communication delay, channel utilization, and/or error rate. These embodiments are primarily described in the context of packet switched networks, and more particularly in the context of Internet Protocol (IP) based packet switched networks. However, it should be understood that at least some of the embodiments are more generally applicable to data communication that does not use packet switching or IP, for instance based on circuit-switched of other forms of data networks.

Furthermore, various embodiments are described in the context of data being sent from a "server" to a "client." It should be understood that these terms are used very broadly, roughly analogous to "data source" and "data destination". Furthermore, in at least some applications of the techniques, the nodes are peers, and may alternate roles as "server" and "client" or may have both roles (i.e., as data source and data destination) concurrently. However, for the sake of exposition, examples where there is a predominant direction of data flow from a "server" node to a "client" node are described with the understanding that the techniques described in these examples are applicable to many other situations.

One example for a client-server application involves a server passing multimedia (e.g., video and audio) data, either recorded or live, to a client for presentation to a user. Improved aspects of communication from the client to the server in such an example can reduced communication delay, for instance providing faster startup, reduced instances of interrupted playback, reduced instances of bandwidth reduction, and/or increased quality by more efficient channel utilization (e.g., by avoiding use of link capacity in retransmissions or unnecessary forward error correction). This example is useful for exposition of a number of embodiments. However, it must be recognized that this is merely one of many possible uses of the approaches described below.

FIG. 1 shows a high-level block diagram of some components that may be interconnected on a portion of a data network. A general example of a communication connection or session arranged on today's Internet may be represented as a client node 120 (e.g., a client computer) communicating with a server node 110 (e.g., a server computer) over one network or an interconnection of multiple networks 151-152. For example, the client and server nodes may communicate over the public Internet using the Internet Protocol (IP).

Figure 2:
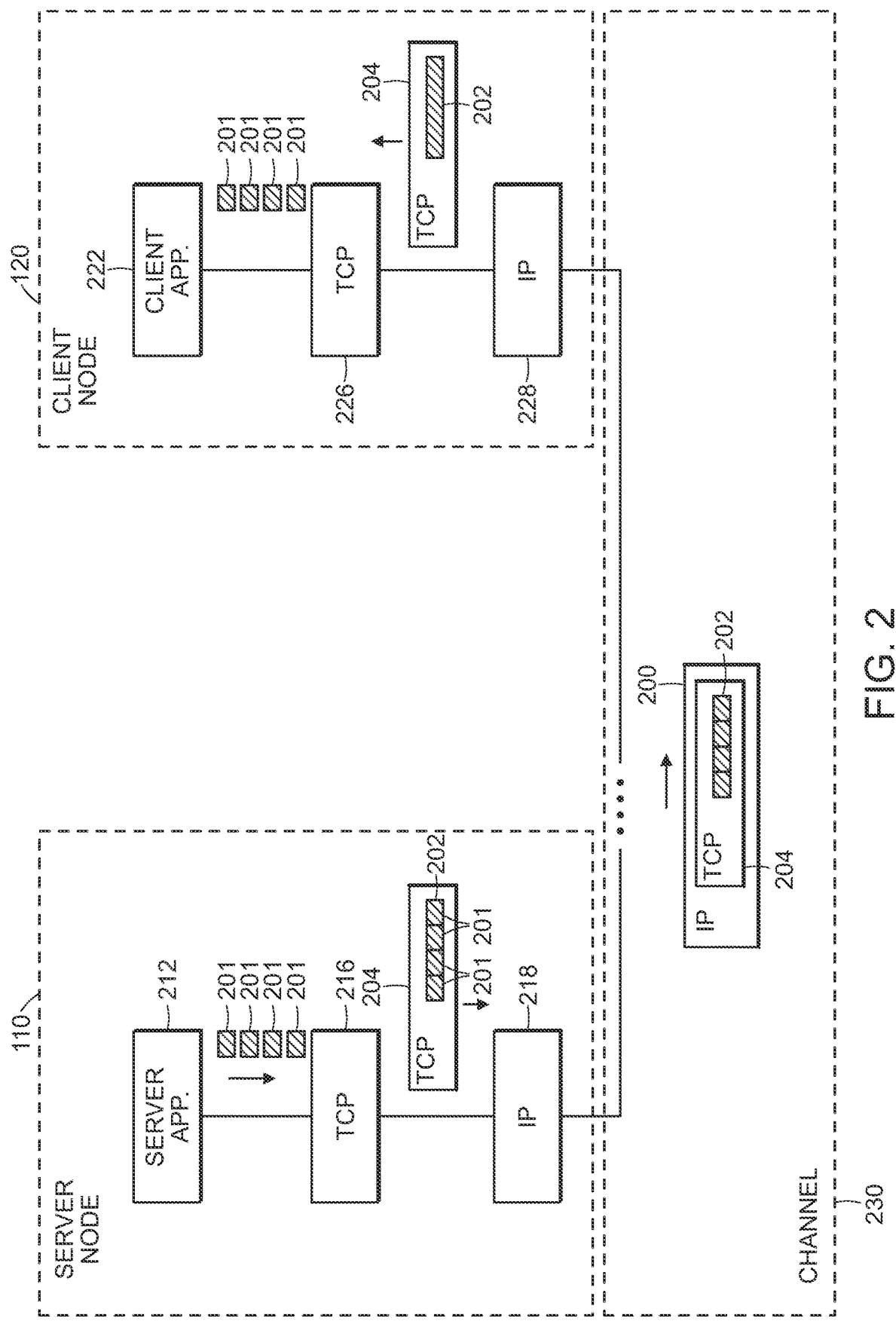
FIG. 2 is a block diagram illustrating the modules that implement TCP-based communication between a client node and a server node.

Referring to FIG. 2, in an example involving conventional communication techniques, a client node 120 hosts a client application 222, which communicates with a TCP module 226 that implements a Transmission Control Protocol (TCP). The TCP module 226 communicates with an IP module 228 that implements an Internet Protocol for communicating between nodes on the interconnection of networks. The communication passes between nodes of the networks over a channel 230 (i.e., an abstraction of the path comprising physical links between equipment interconnecting the nodes of the network). Similarly, the server node 110 hosts a server application 212, a TCP module 216, and an IP module 218. When the server application 110 and the client application 222 communicate, for example, with data being passed from the server application to the client application, TCP module 216 at the server node 110 and the TCP layer 226 at the client node 120 interact to implement the two endpoints for the Transmission Control Protocol (TCP).

Generally, data units 201 (e.g., encoding of multimedia frames or other units of application data) generated by the server application 212 are passed to the TCP module 216. The TCP module assembles data payloads 202, for example, concatenating multiple data units 201 and/or by dividing data units 201 into multiple data payloads 202. In the discussion below, these payloads are referred to in some instances as the "original" or "uncoded" "packets" or original or uncoded "payloads", which are communicated to the client (i.e., destination) node in the network. Therefore, it should be understood that the word "packet" is not used with any connotation other than being a unit of communication. In the TCP embodiment illustrated in FIG. 2, each data payload 202 is "wrapped" in a TCP packet 204, which is passed to the IP module 218, which further wraps the TCP packet 204 in an IP packet 206 for transmission from the server node 110 to the client node 120, over what is considered to be a IP layer channel 230 linking the server node 110 and the client node 120. Note that at lower layers, such as at a data link layer, further wrapping, unwrapping, and/or rewrapping of the IP packet 206 may occur, however, such aspects are not illustrated in FIG. 2. Generally, each payload 202 is sent in at least one TCP packet 204 and a corresponding IP packet 206, and if not successfully received by the TCP module 226 at the client node 120, may be retransmitted again by the TCP module 216 at the server node 110 to result in successful delivery. The data payloads 202 are broken down into the data units 201 originally provided by the server application 212 and are then delivered in the same order to the client application 222 as they were provided by the server application 212.

TCP implements a variety of features, including retransmission of lost packets, maintaining order of packets, and congestion control to avoid congestion at nodes or links along the path through the network and to provide fair allocation of the limited bandwidth between and within the networks at intermediate nodes. For example, TCP implements a "window protocol" in which only a limited number (or range of sequence numbers) of packets are permitted to be transmitted for which end-to-end acknowledgments have not yet been received. Some implementations of TCP adjust the size of the window, for example, starting initially with a small window ("slow start") to avoid causing congestion. Some implementations of TCP also control a rate of transmission of packets, for example, according to the round-trip-time and the size of the window.

The description below details one or more alternatives to conventional TCP-based communication as illustrated in FIG. 2. In general, these alternatives improve one or more performance characteristics, for example, one or more of overall throughput, delay, and jitter. In some applications, these performance characteristics are directly related to application level performance characteristics, such as image quality in a multimedia presentation application. Referring to FIG. 1, in a number of examples, these alternatives are directed to improving communication between a server node 110 and at least one client node 120. One example of such communication is streaming media from the server node 110 to the client nodes 120, however, it should be recognized that this is only one of many examples where the described alternatives can be used.

It should also be understood that the network configuration illustrated in FIG. 1 is merely representative of a variety of configurations. A number of these configurations may have paths with disparate characteristics. For example, a path from the server node 110 to a client node 120 may pass over links using different types of equipment and with very different capacities, delays, error rates, degrees of congestion, etc. In many instances, it is this disparity that presents challenges to achieving end-to-end communication that achieves high rate, low delay and/or low jitter. As one example, the client node 120 may be a personal communication device on a wireless cellular network, the network 152 in FIG. 1 may be a cellular carrier's private wired network, and network 151 may be the public Internet. In another example, the client node 120 may be a "WiFi" node of a private wireless local area network (WLAN), network 152 may be a private local area network (LAN), and network 151 may be the public Internet.

A number of the alternatives to conventional TCP make use of a Packet Coding (PC) approach. Furthermore, a number of these approaches make use of Packet Coding essentially at the Transport Layer. Although different embodiments may have different features, these implementations are generically referred to below as Packet Coding Transmission Control Protocol (PC-TCP). Other embodiments are also described in which the same or similar PC approaches are used at other layers, for instance, at a data link layer (e.g., referred to as PC-DL), and therefore it should be understood that in general features described in the context of embodiments of PC-TCP may also be incorporated in PC-DL embodiments.

Before discussing particular features of PC-TCP in detail, a number of embodiments of overall system architectures are described. The later description of various embodiments of PC-TCP should be understood to be applicable to any of these system architectures, and others.

Figure 3:
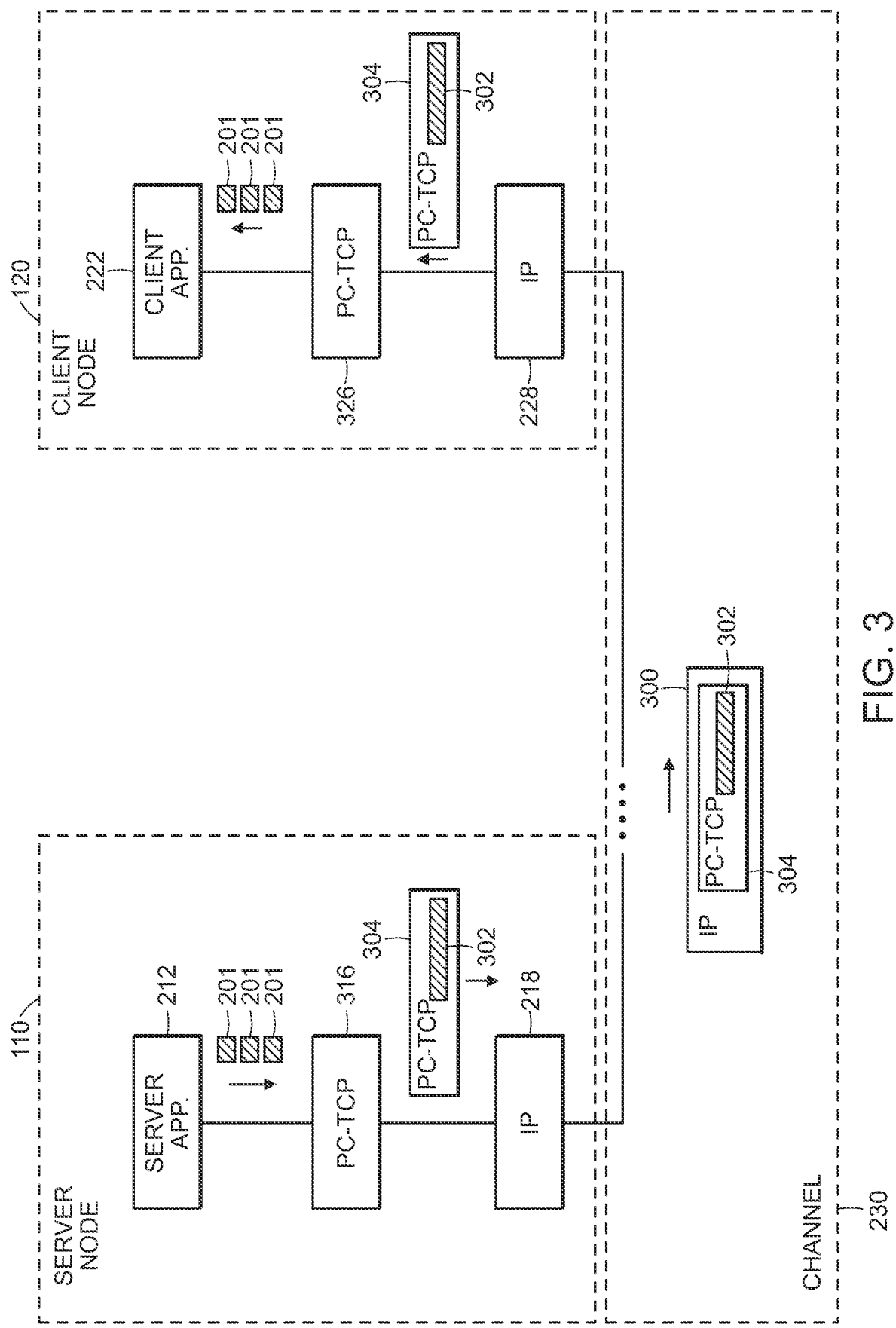
FIG. 3 is a block diagram illustrating the modules that implement Packet Coding Transmission Communication Protocol (PC-TCP) based communication between a client node and a server node.

2 Architectures and Applications 2.1 Transport Layer Architectures 2.1.1 Kernel Implementation Referring to FIG. 3, in one architecture, the TCP modules at the server node 110 and the client node 120 are replaced with PC-TCP modules 316 and 326, respectively. Very generally, the PC-TCP module 316 at the server accepts data units 201 from the server application 212 and forms original data payloads 202 (i.e., "uncoded packets", formed internally to the PC-TCP module 316 and not illustrated). Very generally, these data payloads 202 are transported to and/or reconstructed at the PC-TCP module 326 at the client node 120, where the data units 201 are extracted and delivered to the client application 222 in the same order as provided by the server application 212. As described in substantially more detail below, at least some embodiments of the PC-TCP modules make use of Random Linear Coding (RLC) for forming packets 304 for transmission from the source PC-TCP module to the destination PC-TCP module, with each packet 304 carrying a payload 302, which for at least some packets 304 is formed from a combination of multiple original payloads 202. In particular, at least some of the payloads 202 are formed as linear combinations (e.g., with randomly generated coefficients in a finite field) of original payloads 202 to implement Forward Error Correction (FEC), or as part of a retransmission or repair approach in which sufficient information is not provided using FEC to overcome loss of packets 304 on the channel 230. Furthermore, the PC-TCP modules 316 and 326 together implement congestion control and/or rate control to generally coexist in a "fair" manner with other transport protocols, notably conventional TCP.

One software implementation of the PC-TCP modules 316 or 326, is software modules that are integrated into the operating system (e.g., into the "kernel", for instance, of a Unix-based operating system) in much the same manner that a conventional TCP module is integrated into the operating system. Alternative software implementations are discussed below.

Figure 4:
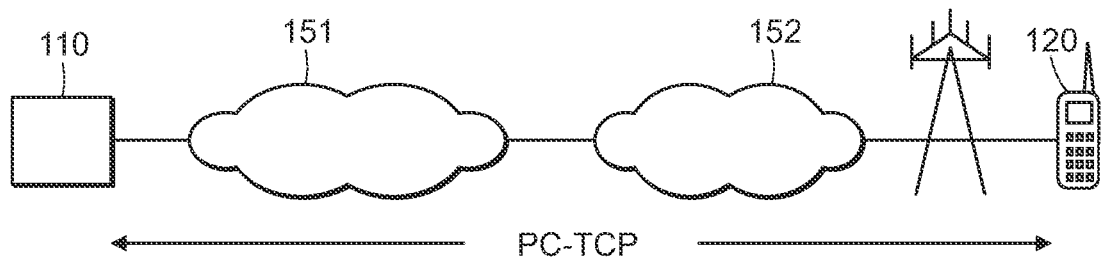
FIG. 4 is a schematic diagram of a use of the approach shown in FIG. 3 for communication between a server and a module device on a cellular network.

Referring to FIG. 4, in an example in which a client node 120 is a smartphone on a cellular network (e.g., on an LTE network) and a server node 110 is accessible using IP from the client node, the approach illustrated in FIG. 3 is used with one end-to-end PC-TCP session linking the client node 120 and the server node 110. The IP packets 300 carrying packets 304 of the PC-TCP session traverse the channel between the nodes using conventional approaches without requiring any non-conventional handling between the nodes at the endpoints of the session.

2.1.2 Alternative Software Implementations

The description above includes modules generically labeled "PC-TCP". In the description below, a number of different implementations of these modules are presented. It should be understood that, in general, any instance of a PC-TCP module may be implemented using any of the described or other approaches.

Figure 5:
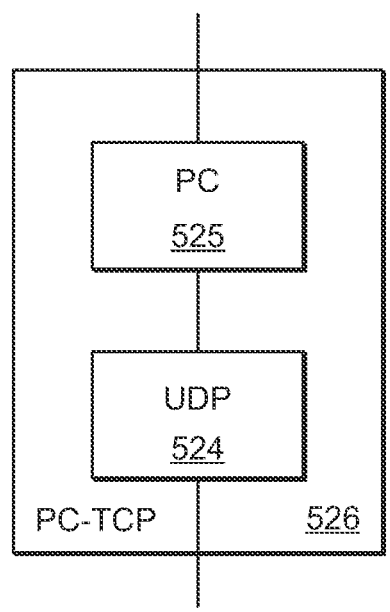
FIG. 5 is a block diagram of a PC-TCP module that uses a conventional UDP module.

Referring to FIG. 5, in some embodiments, the PC-TCP module 326 (or any other instance of PC-TCP module discussed in this document) is implemented as a PC-TCP module 526, which includes a Packet Coding (PC) module 525 that is coupled to (i.e., communicates with) a convention User Datagram Protocol (UDP) module 524. Essentially each PC-TCP packet described above consists of a PC packet "wrapped" in a UDP packet. The UDP module 524 then communicates via the IP modules in a conventional manner. In some implementations, the PC module 525 is implemented as a "user space" process, which communicates with a kernel space UDP module, while in other implementations, the PC module 525 is implement in kernel space.

Figure 6:
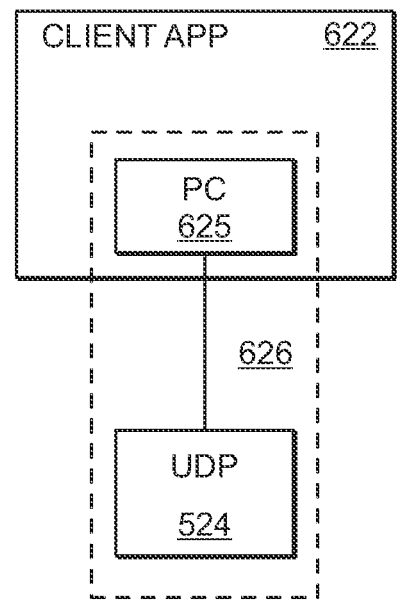
FIG. 6 is a block diagram of a PC-TCP module that is partially integrated into a client application and partially implemented using a conventional UDP module.

Referring to FIG. 6, in some embodiments, the PC module 625, or its function, is integrated into a client application 622, which then communicates directly with the conventional UDP module 524. The PC-TCP module 626 therefore effectively spans the client application 622 and the kernel implementation of the UDP module 524. While use of UDP to link the PC modules at the client and at the server has certain advantages, other protocols may be used. One advantage of UDP is that reliable transmission through use of retransmission is not part of the UDP protocol, and therefore error handling can be carried out by the PC modules.

Figure 7:
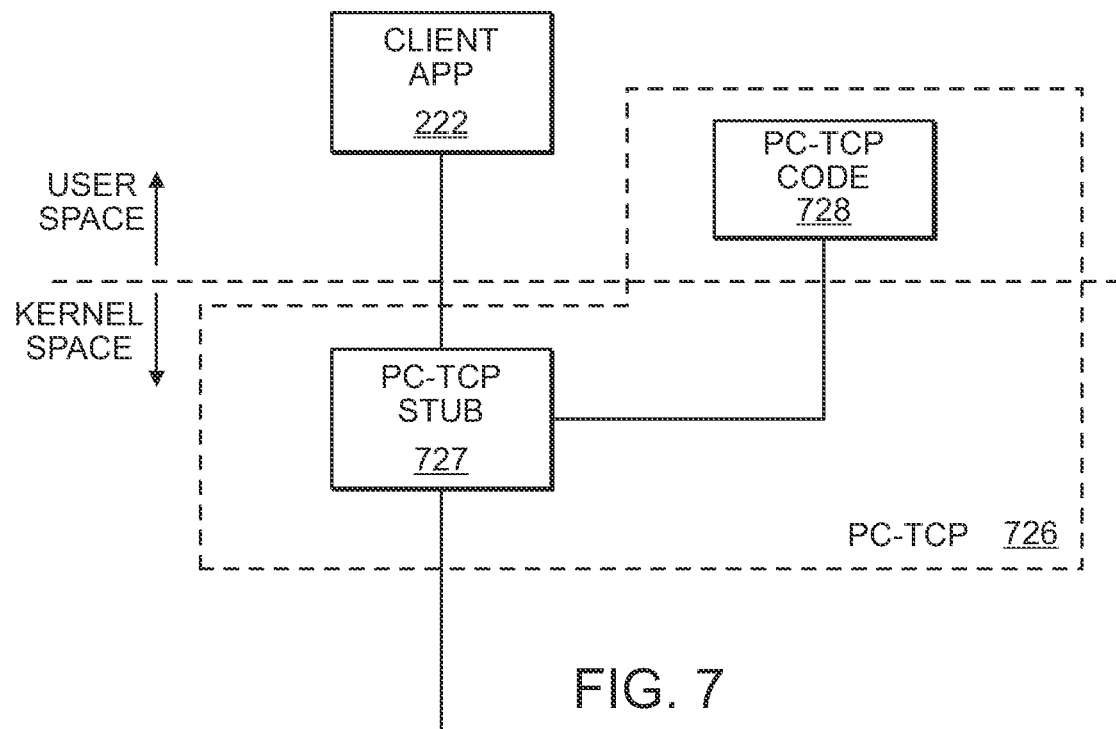
FIG. 7 is a block diagram of a PC-TCP module that is split with user space and kernel space components.

Referring to FIG. 7, in some implementations, a PC-TCP module 726 is divided into one part, referred to as a PC-TCP "stub" 727, which executes in the kernel space, and another part, referred to as the PC-TCP "code" 728, which executes in the user space of the operating system environment. The stub 727 and the code 728 communicate to provide the functionality of the PC-TCP module.

It should be understood that these software implementations are not exhaustive. Furthermore, as discussed further below, in some implementations, a PC-TCP module of any of the architectures or examples described in this document may be split among multiple hosts and/or network nodes, for example, using a proxy architecture.

2.2 Proxy Architectures 2.2.1 Conventional Proxy Node

Figure 8:
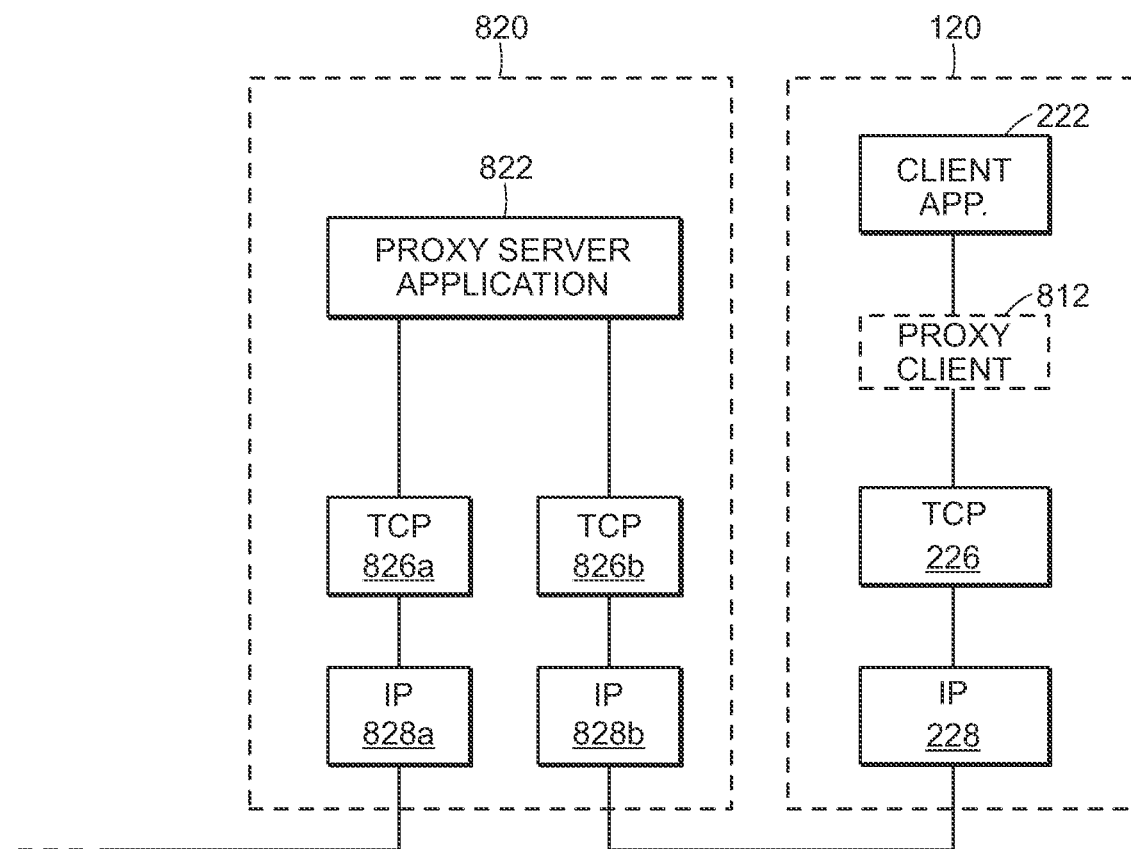
FIG. 8 is a block diagram of a proxy architecture.

Referring to FIG. 8, certain conventional communication architectures make use of proxy servers on the communication path between a client node 120 and a server node 110. For example, a proxy node 820 hosts a proxy server application 822. The client application 222 communicates with the proxy server application 822, which acts as an intermediary in communication with the server application 212 (not shown in FIG. 8). It should be understood that a variety of approaches to implementing such a proxy are known. In some implementations, the proxy application is inserted on the path without the client node necessarily being aware. In some implementations, a proxy client 812 is used at the client node, in some cases forming a software "shim" between the application layer and the transport layer of the software executing at the client node, with the proxy client 812 passing communication to the proxy server application. In a number of proxy approaches, the client application 222 is aware that the proxy is used, and the proxy explicitly acts as an intermediary in the communication with the server application. A particular example of such an approach makes use of the SOCKS protocol, in which the SOCKS proxy client application (i.e., an example of the proxy client 812) communicates with a SOCKS proxy server application (i.e., an example of the proxy server application 822). The client and server may communicate over TCP/IP (e.g., via TCP and IP modules 826b and 828b, which may be implemented together in one TCP module), and the SOCKS proxy server application fulfills communication requests (i.e., with the server application) on behalf of the client application (e.g., via TCP and IP modules 826a and 828a). Note that the proxy server application may also perform functions other than forwarding communication, for example, providing a cache of data that can be used to fulfill requests from the client application.

2.2.2 First Alternative Proxy Node

Figure 9:
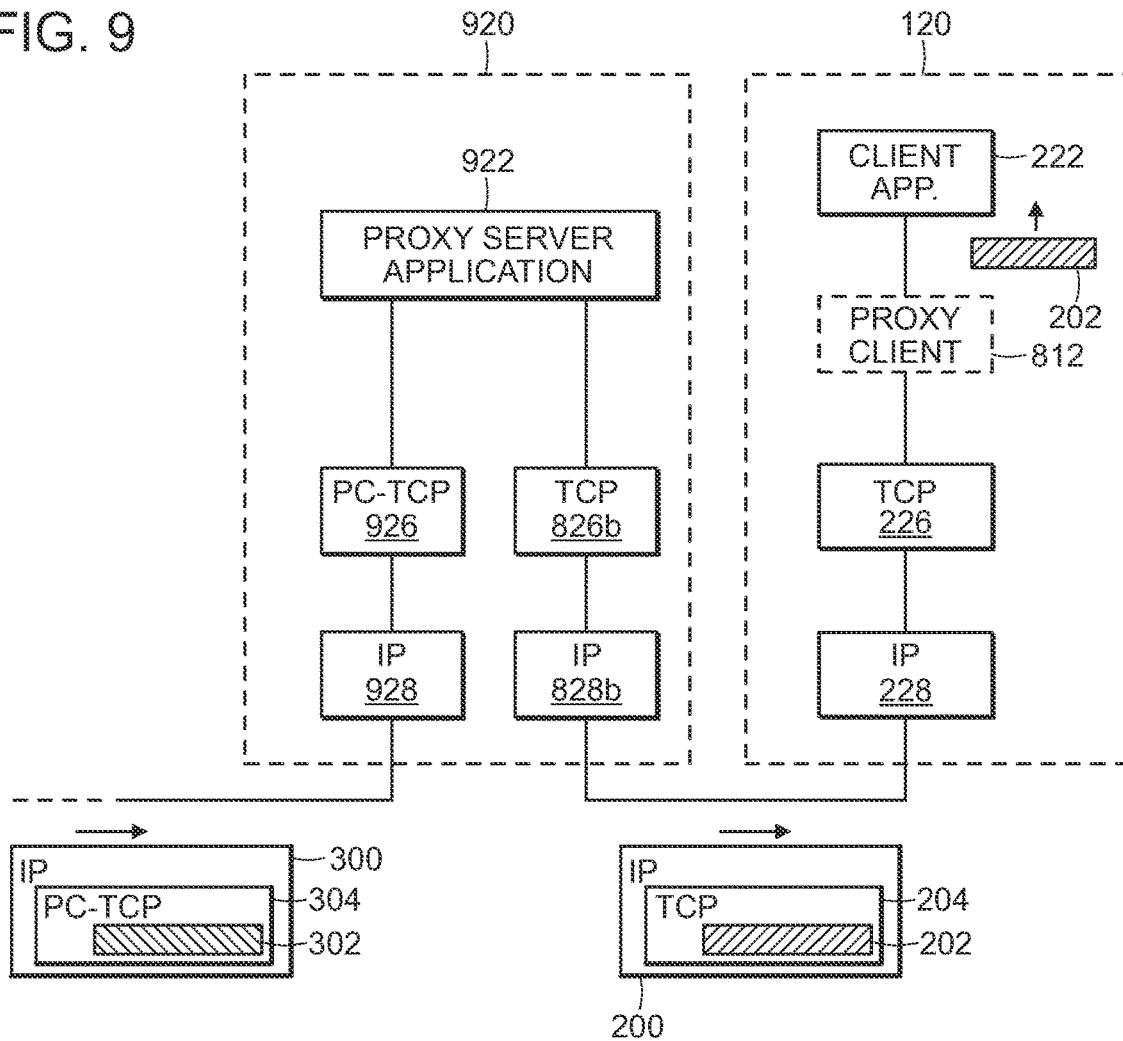
FIG. 9 is a block diagram of a PC-TCP based proxy architecture in which a proxy node communicates using both PC-TCP and conventional TCP.

Referring to FIG. 9, in an alternative proxy architecture, a proxy node 920 hosts a proxy server application 922, which is similar to the proxy server application 822 of FIG. 8. The client application 222 communicates with the proxy server application 922, for example as illustrated using conventional TCP/IP, and in some embodiments using a proxy client 812 (e.g., as SOCKS proxy client), executing at the client node 120. As illustrated in FIG. 9, the proxy server application 922 communicates with a server application using a PC-TCP module 926, which is essentially the same as the PC-TCP module 326 shown in FIG. 3 for communicating with the PC-TCP module 316 at the server node 110.

In some embodiments, the communication architecture of FIG. 9 and the conventional communication architecture of FIG. 2 may coexist in the communication between the client application and the server application may use PC-TCP, conventional TCP, or concurrently use both PC-TCP and TCP. The communication approach may be based on a configuration of the client application and/or based on dialog between the client and server applications in establishing communication between them.

Figure 10:
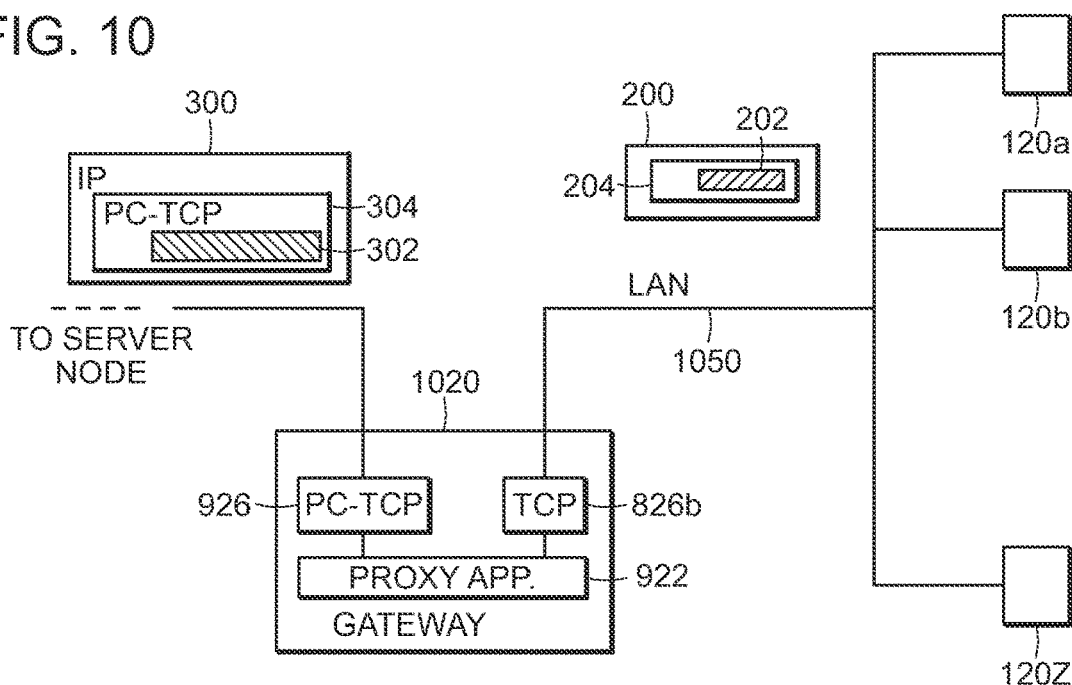
FIG. 10 is a block diagram of a proxy-based architecture of FIG. 9 embodied using a gateway device.

Referring to FIG. 10, in an example of the architecture shown in FIG. 9, the proxy application 922 is hosted in a gateway 1020 that links a local area network (LAN) 1050 to the Internet. A number of conventional client nodes 120a-z are on the LAN, and make use of the proxy server application to communicate with one or more server applications over the Internet. Various forms of gateway 1020 may be used, for instance, a router, firewall, modem (e.g., cable modem, DSL modem, etc.). In such examples, the gateway 1020 may be configured to pass conventional TCP/IP communication between the client nodes 120a-z and the Internet, and for certain server applications or under certain conditions (e.g., determined by the client, the server, or the gateway) use the proxy to make use of PC-TCP for communication over the Internet.

It should be understood that the proxy architecture shown in FIG. 9 may be equally applied to server nodes 110 that communicate with a proxy node using TCP/IP, with the proxy providing PC-TCP communication with client nodes, either directly or via client side proxies. In such cases, the proxy server application serving the server nodes may be hosted, for instance, in a gateway device, such as a load balancer (e.g., as might be used with a server "farm") that links the servers to the Internet. It should also be understood that in some applications, there is a proxy node associated with the server node as well as another proxy associated with the client node.

2.2.3 Integrated Proxy

Figure 11:
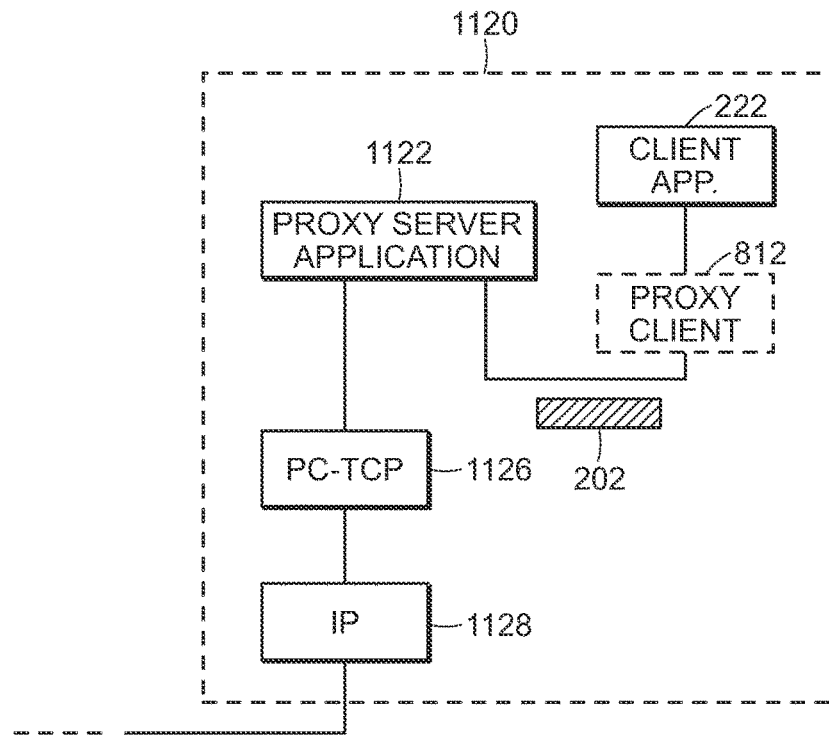
FIG. 11 is a block diagram of an alternative proxy architecture embodied within a client node.
Figure 11:
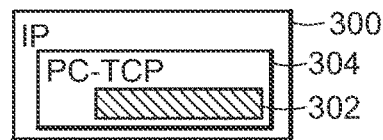

Referring to FIG. 11, in some examples, a proxy server application 1122, which provides essentially the same functionality as the proxy server application 922 of FIG. 9, is resident on the client node 1120 rather than being hosted on a separate network node as illustrated in FIG. 9. In such an example, the connection between the client application 222 and the proxy server application 1122 is local, with the communication between them not passing over a data network (although internally it may be passed via the IP software "stack"). For example, a proxy client 812 (e.g., a SOCKS client) interacts locally with the proxy server application 1122, or the functions of the proxy client 812 and the proxy server application 1122 are integrated into a single software component.

2.2.4 Second Alternative Proxy Node

In examples of the first alternative proxy node approach introduced above, communication between the client node and the proxy node uses conventional techniques (e.g., TCP/IP), while communication between the proxy node and the server node (or its proxy) uses PC-TCP. Such an approach may mitigate congestion and/or packet error or loss on the link between the server node and the proxy node, however, it would not generally mitigate issues that arise on the link between the proxy node and the client node. For example, the client node and the proxy node may be linked by a wireless channel (e.g., WiFi, cellular, etc.), which may introduce a greater degree of errors than the link between the server and the proxy node over a wired network.

Figure 12:
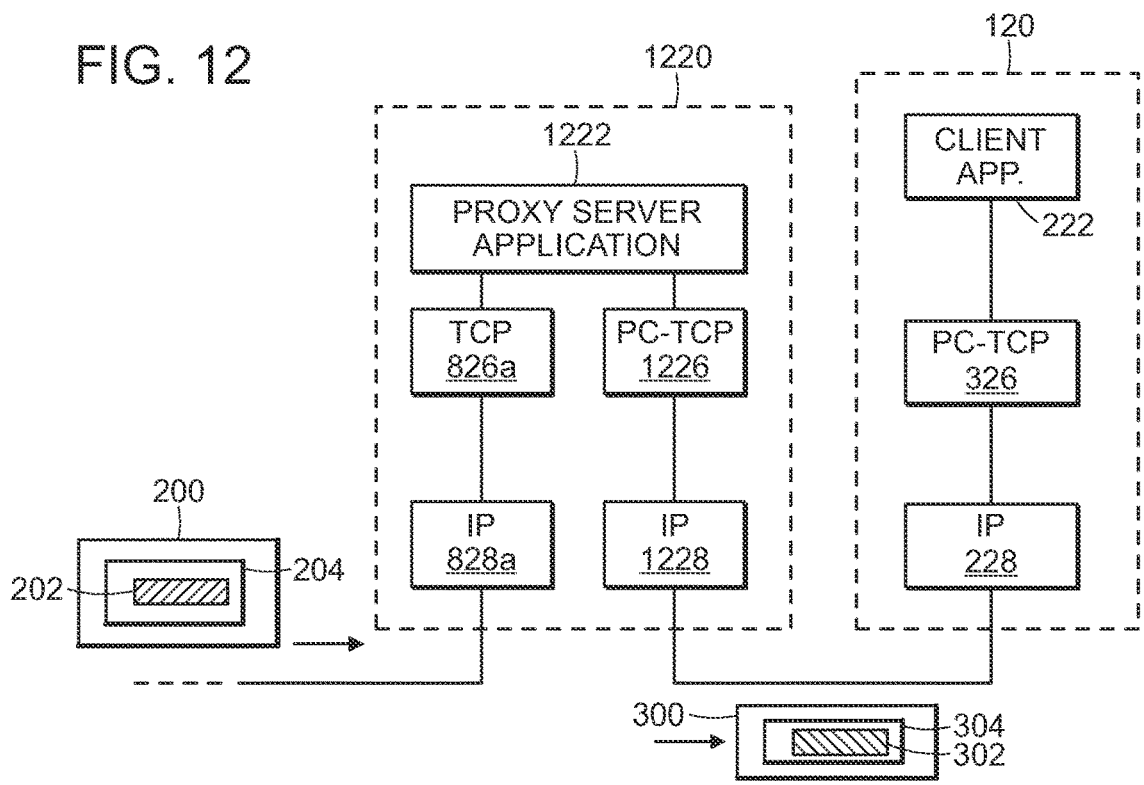
FIG. 12 is a block diagram of a second PC-TCP based proxy architecture in which a proxy node communicates using both PC-TCP and conventional TCP.

Referring to FIG. 12, in a second proxy approach, the client node 120 hosts a PC-TCP module 326, or hosts or uses any of the alternatives of such a module described in this document. The client application 222 makes use of the PC-TCP module 326 at the client node to communication with a proxy node 1220. The proxy node essentially translates between the PC-TCP communication with the client node 120 and conventional (e.g., TCP) communication with the server node. The proxy node 1220 includes a proxy server application 1222, which makes use of a PC-TCP module 1226 to communicate with the client node (i.e., forms transport layer link with the PC-TCP module 326) at the client node, and uses a conventional TCP module 826a to communicate with the server.

Figure 13:
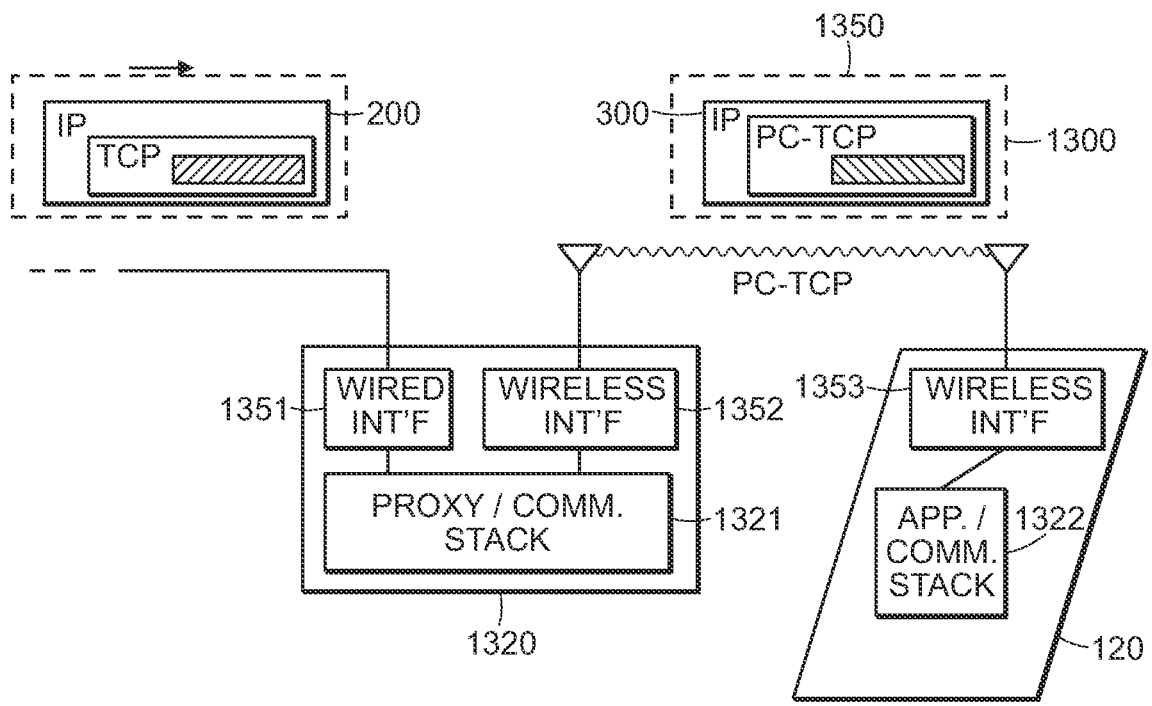
FIG. 13 is a block diagram of a proxy-based architecture of FIG. 12 embodied using a wireless access device.
Figure 14:
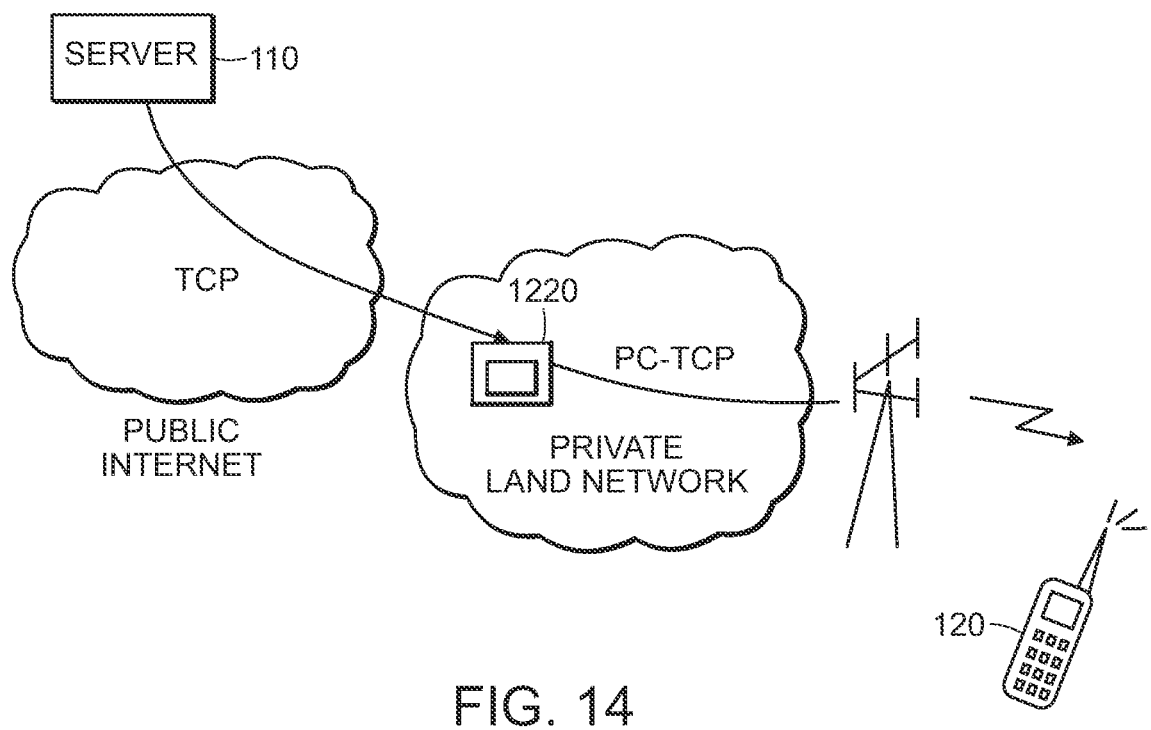
FIG. 14 is a block diagram of a proxy-based architecture of FIG. 12 embodied cellular network.
Figure 15:
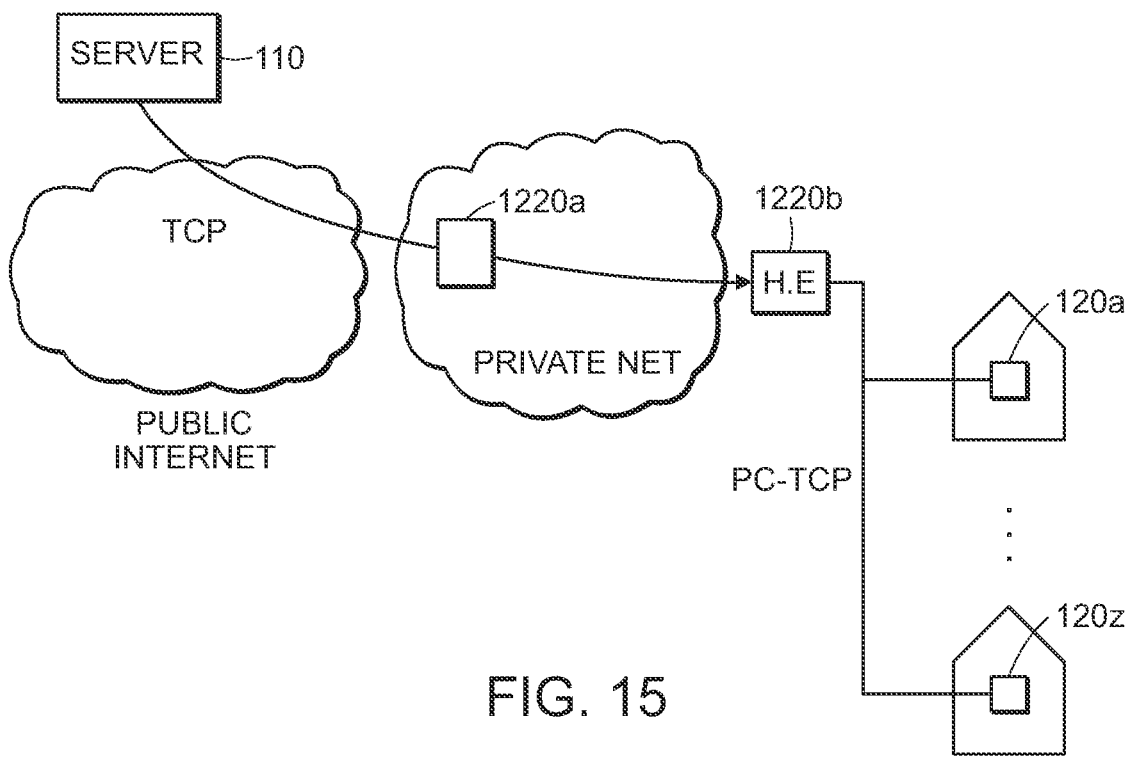
FIG. 15 is a block diagram of a proxy-based architecture of FIG. 12 embodied cable television based data network.

Examples of such a proxy approach are illustrated in FIGS. 13-15. Referring to FIG. 13, an example of a proxy node 1220 is integrated in a wireless access device 1320 (e.g., a WiFi access point, router, etc.). The wireless access device 1320 is coupled to the server via a wired interface 1351 and coupled to a wireless client node 120 via a wireless interface 1352 at the access device and a wireless interface 1353 at the client node. The wireless access device 1320 includes a proxy and communication stack implementation 1321, which includes the modules illustrated for the proxy 1220 in FIG. 12, and the wireless client node 120 includes an application and communication stack implementation 1322, which includes the modules illustrated for the client node 120 in FIG. 12. Note that the IP packets 300 passing between the access device 1320 and the client node 120 are generally further "wrapped" using a data layer protocol, for example, in data layer packets 1350. As introduced above, in some implementations, rather than implementing the Packet Coding at the transport layer, in a modification of the approach shown in FIG. 13, the Packet Coding approaches are implemented at the data link layer.

Referring to FIG. 14, a proxy node 1220 is integrated in a node of a private land network of a cellular service provider. In this example, communication between a server 110 and the proxy node 1220 use conventional techniques (e.g., TCP) over the public Internet, while communication between the proxy node and the client node use PC-TCP. It should be understood that the proxy node 1220 can be hosted at various points in the service provider's network, including without limitation at a gateway or edge device that connects the provider's private network to the Internet (e.g. a Packet Data Network Gateway of an LTE network), and/or at an internal node of the network (e.g., a serving gateway, base station controller, etc.). Referring to FIG. 15, a similar approach may be used with a cable television-based network. PC-TCP communication may pass between a head end device and a distribution network (e.g., a fiber, coaxial, or hybrid fiber-coaxial network) to individual homes. For example, each home may have devices that include PC-TCP capabilities themselves, or in some example, a proxy node (e.g., a proxy node integrated in a gateway 1010 as shown in FIG. 10) terminates the PC-TCP connections at each home. The proxy node that communicates with the server 110 using conventional approaches, while communicating using PC-TCP over the distribution network is hosted in a node in the service provider's private network, for instance at a "head end" device 1220b of the distribution network, or in a gateway device 1220a that links the service provider's network with the public Internet.

2.3 Intermediate Proxy

Figure 16:
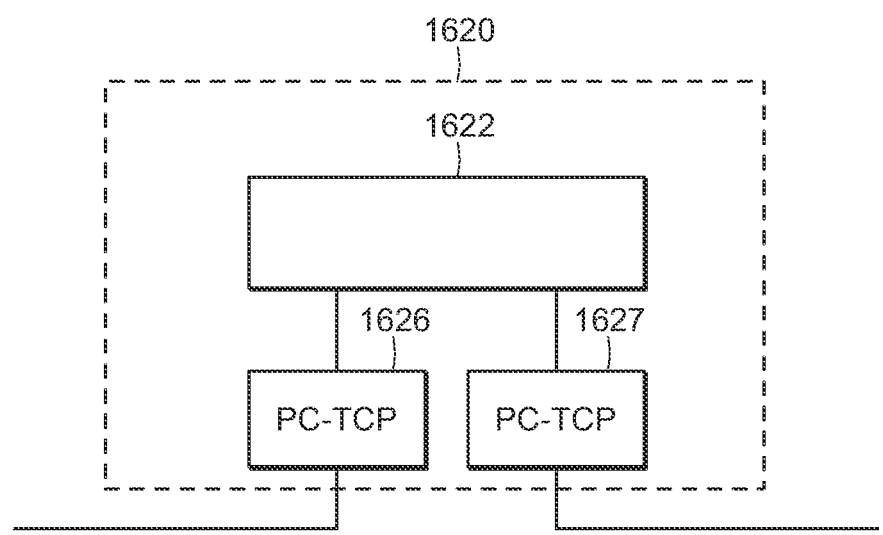
FIG. 16 is a block diagram of an intermediate proxy that communicates with a client node and with a server node using separate PC-TCP connections.

Referring to FIG. 16, in another architecture, the channel between a server node and a client node is broken into independent tandem PC-TCP links. An intermediate node 1620 has two instances of a PC-TCP module 1626 and 1627. One PC-TCP module 1626 terminates a PC-TCP channel and communicates with a corresponding PC-TCP module at the server (e.g., hosted at the server node or at a proxy associated with the server node). The other PC-TCP module 1627 terminates a PC-TCP channel and communicates with a corresponding PC-TCP module at the client (e.g., hosted at the client node or at a proxy associated with the client node). The two PC-TCP modules 1626 and 1627 are coupled via a routing application 1622, which passes decoded data units provided by one of the PC-TCP modules (e.g., module 1626 from the server node) and to another PC-TCP module for transmission to the client.

Note that parameters of the two PC-TCP channels that are bridged at the intermediate node 1620 do not have to be the same. For example, the bridged channels may differ in their forward error correction code rate, block size, congestion window size, pacing rate, etc. In cases in which a retransmission protocol is used to address packet errors or losses that are not correctable with forward error correction coding, the PC-TCP modules at the intermediate node request or service such retransmission requests.

In FIG. 16, only two PC-TCP modules are shown, but it should be understood that the intermediate node 1620 may concurrently provide a link between different pairs of server and client nodes.

Figure 17:
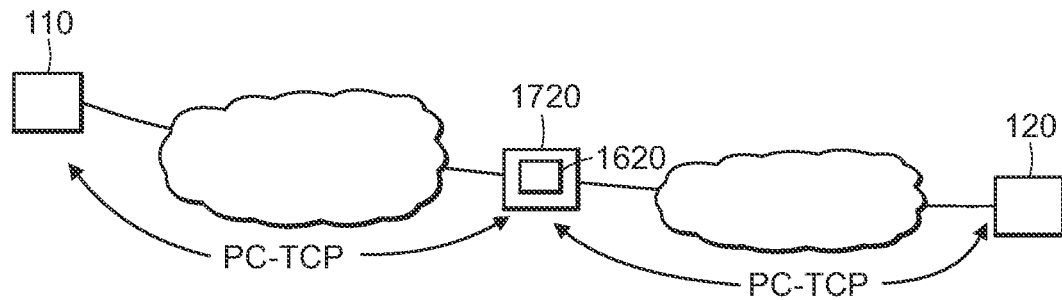
FIG. 17 is a block diagram of a proxy-based architecture of FIG. 16 embodied in a network device.

Referring to FIG. 17, an example of this architecture may involve a server node 110 communicating with an intermediate node 1620, for example, hosted in a gateway device 1720 of a service provider network with the intermediate node 1620 also communicating with the client node 120 via a second PC-TCP link.

2.4 Recoding Node

Figure 18:
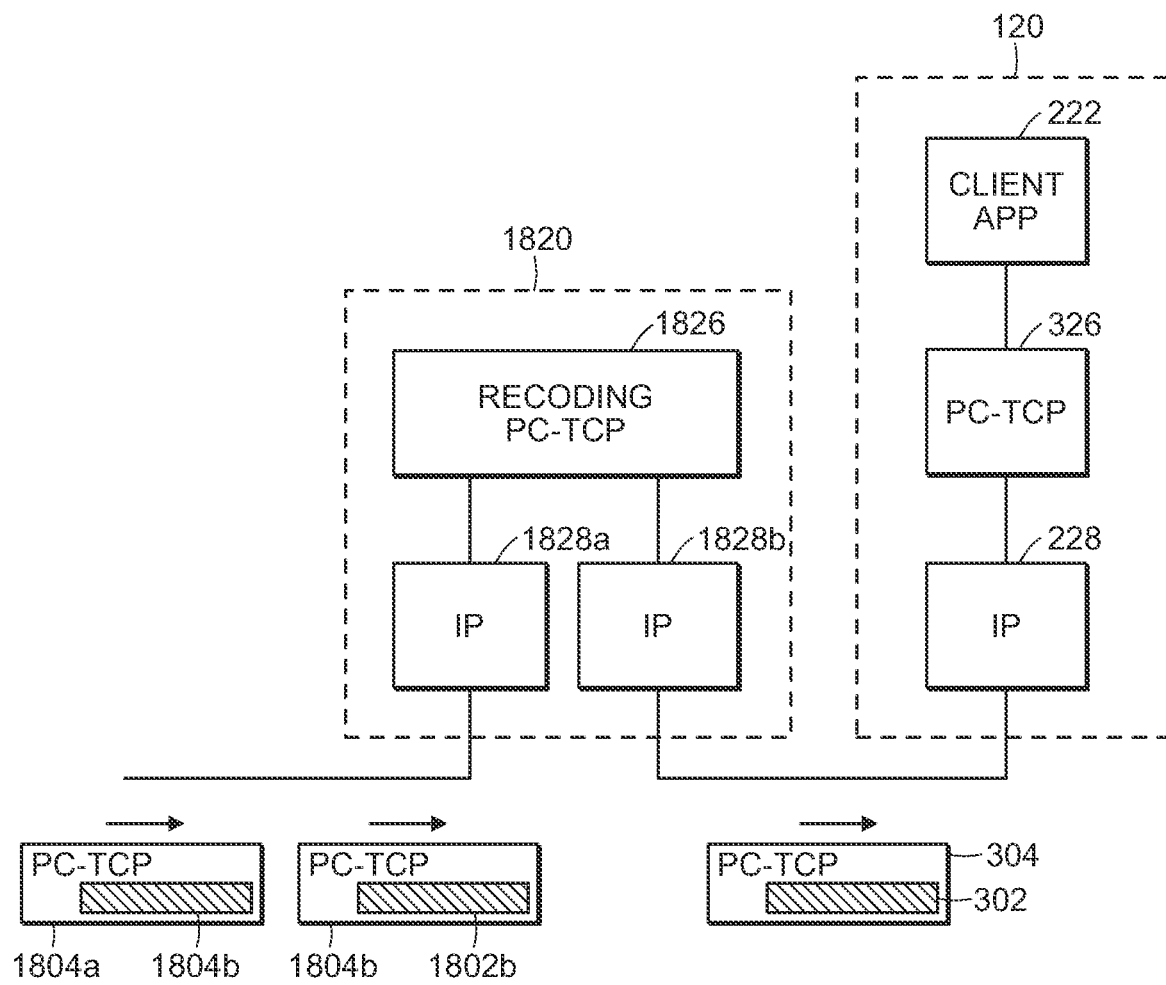
FIG. 18 is a block diagram of an intermediate proxy that recodes communication between a client node and with a server node.

Referring to FIG. 18, another architecture is similar to the one shown in FIG. 16 in that an intermediate node 1820 is on a path between a server node 110 and a client node 120, with PC-TCP communication passing between it and the server node and between it and the client node.

In FIG. 16, the PC-TCP modules 1626, 1627 fully decode and encode the data passing through the node. In the approach illustrated in FIG. 18, such complete decoding is not necessary. Rather, a recoding PC-TCP module 1822 receives payloads 1802*a-b* from PC-TCP packets 1804*a-b*, and without decoding to reproduce the original uncoded payloads 202 (not shown), the module uses the received PC-TCP packets to send PC-TCP packets 304, with coded payloads 302, toward the destination. Details of various recoding approaches are described further later in this document. However, in general, the processing by the recoding PC-TCP module includes one or more of the following functions: forwarding PC-TCP packets without modification to the destination; "dropping" received PC-TCP packets without forwarding, for example, if the redundancy provided by the received packets are not needed on the outbound link; generating and transmitting new PC-TCP packets to provide redundancy on the outbound link. Note that the recording PC-TCP module may also provide acknowledgment information on the inbound PC-TCP link (e.g., without requiring acknowledgment from the destination node), for example, to the server, and process received acknowledgments on the outbound link. The processing of the received acknowledgments may include causing transmission of additional redundant information in the case that the originally provided redundancy information was not sufficient for reconstruction of the payload data.

In general, the recoding PC-TCP module maintains separate communication characteristics on the inbound and outbound PC-TCP channels. Therefore, although it does not decode the payload data, it does provide control and, in general, the PC-TCP channels may differ in their forward error correction code rate, block size, congestion window size, pacing rate, etc.

2.5 Multipath Transmission

2.5.1 Single Endpoint Pair

In examples described above, a single path links the server node 110 and the client node 120. The possibility of using conventional TCP concurrently with PC-TCP between two nodes was introduced. More generally, communication between a pair of PC-TCP modules (i.e., one at the server node 110 and one at the client node 120) may follow different paths.

Internet protocol itself supports packets passing from one node to another following different paths and possibly being delivered out of order. Multiple data paths or channels can link a pair of PC-TCP modules and be used for a single session. Beyond native multi-path capabilities of IP networks, PC-TCP modules may use multiple explicit paths for a particular session. For example, without intending to be exhaustive, combinations of the following types of paths may be used:

- Uncoded TCP and PC over UDP
- PC over conventional TCP and UDP
- PC-TCP over wireless LAN (e.g., WIFI, 802.11) and cellular data (e.g., 3G, LTE)
- PC-TCP concurrently over multiple wireless base stations (e.g., via multiple wireless LAN access points)

In some examples, Network Coding is used such that the multiple paths from a server node to a client node pass through one or more intermediate nodes at which the data is recoded, thereby causing information for different data units to effectively traverse different paths through the network.

One motivation for multipath connection between a pair of endpoints addresses possible preferential treatment of TCP traffic rather than UDP traffic. Some networks (e.g. certain public Wi-Fi, cable television networks, etc.) may limit the rate of UDP traffic, or drop UDP packets preferentially compared to TCP (e.g., in the case of congestion). It may be desirable to be able to detect such scenarios efficiently without losing performance. In some embodiments, a PC-TCP session initially establishes and divides the transmitted data across both a TCP and a UDP connection. This allows comparison of the throughput achieved by both connections while sending distinct useful data on each connection. An identifier is included in the initial TCP and UDP handshake packets to identify the two connections as belonging to the same coded PC-TCP session, and non-blocking connection establishment can be employed so as to allow both connections to be opened at the outset without additional delay. The transmitted data is divided across the two connections using e.g. round-robin (sending alternating packets or runs of packets on each connection) or load-balancing/back pressure scheduling (sending each packet to the connection with the shorter outgoing data queue). Such alternation or load balancing can be employed in conjunction with techniques for dealing with packet reordering. Pacing rate and congestion window size can be controller separately for the UDP and the TCP connection, or can be controlled together. By controlling the two connections together (e.g., using only a single congestion window to regulate the sum of the number of packets in flight on both the TCP and UDP connections) may provide a greater degree of "fairness" as compared to separate control.

In some examples, the adjustment of the fraction of messages transmitted over each data path/protocol is determined according to the relative performance/throughput of the data paths/protocols. In some examples, the adjustment of allocation of messages occurs only during an initial portion of the transmission. In other examples, the adjustment of allocation of messages occurs on an ongoing basis throughout the transmission. In some examples, the adjustment reverses direction (e.g., when a data path stops preferentially dropping UDP messages, the number of messages transmitted over that data path may increase).

In some examples, the adjustment of the fraction of messages transmitted over each data path/protocol is determined for one data communication session/connection and is re-used for a number of subsequent data communication sessions/connections. A re-test interval may be used to specify the number of subsequent sessions/connections that can pass without retesting and adjusting the fraction of messages, since a performance hit is associated with re-testing. In some examples, an initial fraction of messages transmitted over each data path/protocol is determined based on a probability of a client running on a throttled network.

In some embodiments, the PC-TCP maintains both the UDP based traffic and the TCP based traffic for the duration of the session. In other embodiments, the PC-TCP module compares the behavior of the UDP and TCP traffic, for example over a period specified in terms of time interval or number of packets, where these quantities specifying the period can be set as configuration parameters and/or modified based on previous coded TCP sessions, e.g. the comparison period can be reduced or eliminated if information on relative TCP/UDP performance is available from recent PC-TCP sessions. If the UDP connection achieves better throughput, the PC-TCP session can shift to using UDP only. If the TCP connection achieves better throughput, the PC-TCP session can shift to using TCP. In some embodiments, different types of traffic are sent over the TCP link rather than the UDP link. In one such example, the UDP connection is used to send some forward error correction for packets where it is beneficial to reduce retransmission delays, e.g. the last block of a file or intermediate blocks of a stream. In this example, the uncoded packets may be sent over a TCP stream with forward error correction packets sent over UDP. If the receiver can use the forward error correction packets to recover from erasures in the TCP stream, a modified implementation of the TCP component of the receiver's PC-TCP module may be able to avoid using a TCP-based error recovery procedure. On the other hand, non-delivery of a forward error correction packet does not cause an erasure of the data that is to be recovered at the receiver, and therefore unless there is an erasure both on the UDP path and on the TCP path, dropping of a UDP packet does not cause delay.

2.5.2 Distributed Source

In some examples, multiple server nodes communicate with a client node. One way this can be implemented is with there being multiple communication sessions each involving one server node and one client node. In such an implementation, there is little or no interaction between a communication session between one server node and the client node and another communication session between another server node and the client node. In some examples, each server node may have different parts of a multimedia file, with each server providing its parts for combination at the client node.

2.5.3 Distributed Content Delivery

In some examples, there is some relationship between the content provided by different servers to the client. One example of such a relationship is use of a distributed RAID approach in which redundancy information (e.g., parity information) for data units at one or more servers is stored at and provided from another server. In this way, should a data unit not reach the client node from one of the server nodes, the redundancy information may be preemptively sent or requested from the other node, and the missing data unit reconstructed.

In some examples, random linear coding is performed on data units before they are distributed to multiple server nodes as an alternative to use of distributed RAID. Then each server node establishes a separate communication session with the client node for delivery of part of the coded information. In some of these examples, the server nodes have content that has already been at least partially encoded and then cached, thereby avoiding the necessity of repeating that partial encoding for different client nodes that will receive the same application data units. In some examples, the server nodes may implement some of the functionality of the PC modules for execution during communication sessions with client nodes, for example, having the ability to encode further redundancy information in response to acknowledgment information (i.e., negative acknowledgment information) received from a client node.

In some implementations, the multiple server nodes are content delivery nodes to which content is distributed using any of a variety of known techniques. In other implementations, these multiple server nodes are intermediary nodes at which content from previous content delivery sessions was cached and therefore available without requiring re-delivery of the content from the ultimate server node.

In some examples of distributed content delivery, each server to client connection is substantially independent, for example, with independently determined communication parameters (e.g., error correction parameters, congestion window size, pacing rate, etc.). In other examples, at least some of the parameters are related, for example, with characteristics determined on one server-to-client connection being used to determine how the client node communicates with other server nodes. For example, packet arrival rate, loss rate, and differences in one-way transmission rate, may be measured on one connections and these parameters may be used in optimizing multipath delivery of data involving other server nodes. One manner of optimization may involve load balancing across multiple server nodes or over communication links on the paths from the server nodes to the client nodes.

In some implementations, content delivery from distributed server nodes making use of PC-TCP, either using independent sessions or using coordination between sessions, may achieve the performance of conventional distributed content delivery but requiring a smaller number of server nodes. This advantage may arise due to PC-TCP providing lower latency and/or lower loss rates than achieved with conventional TCP.

2.6 Multicast

Figure 19:
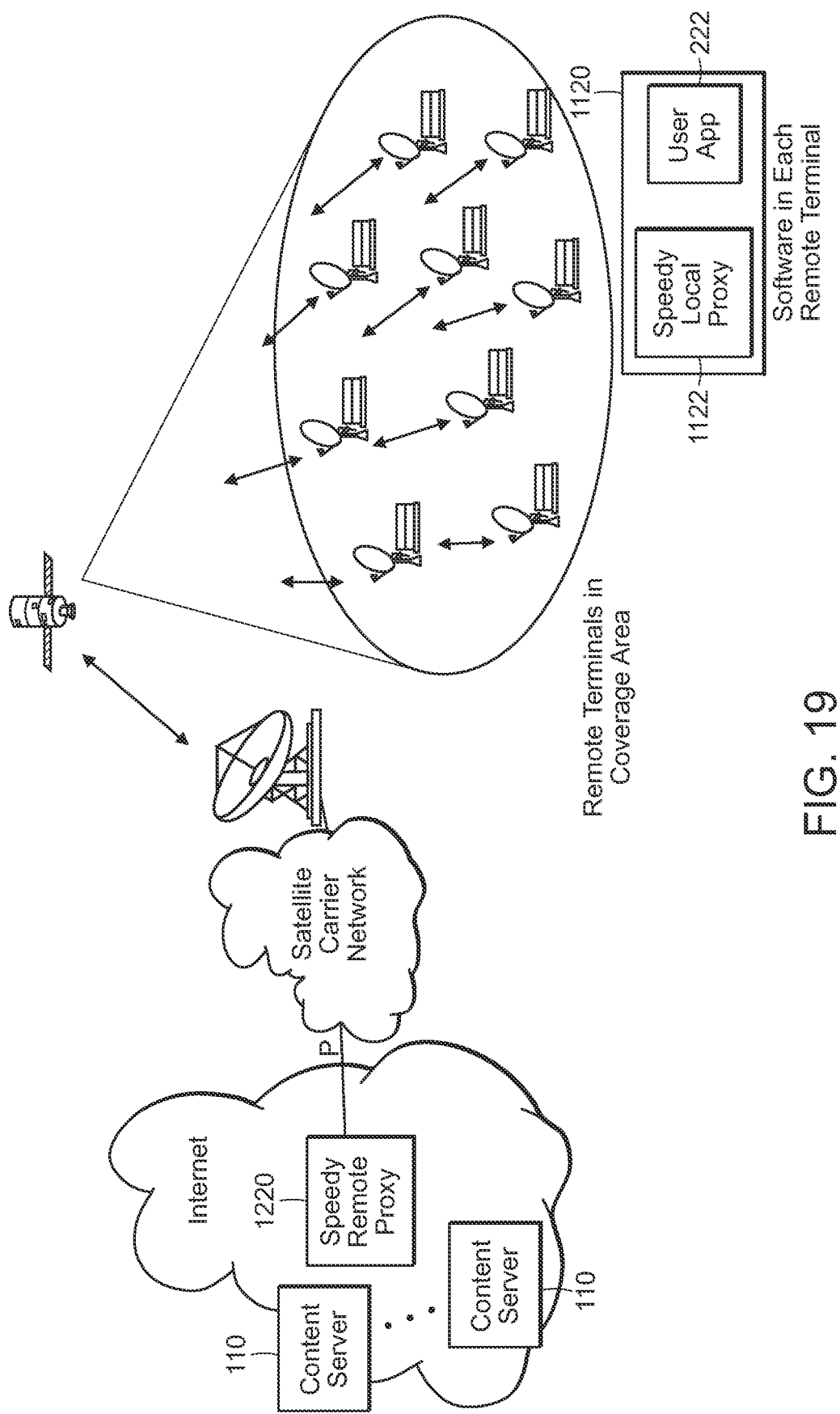
FIGS. 19-20 are diagrams that illustrate delivery of common content to multiple destinations.
Figure 20:
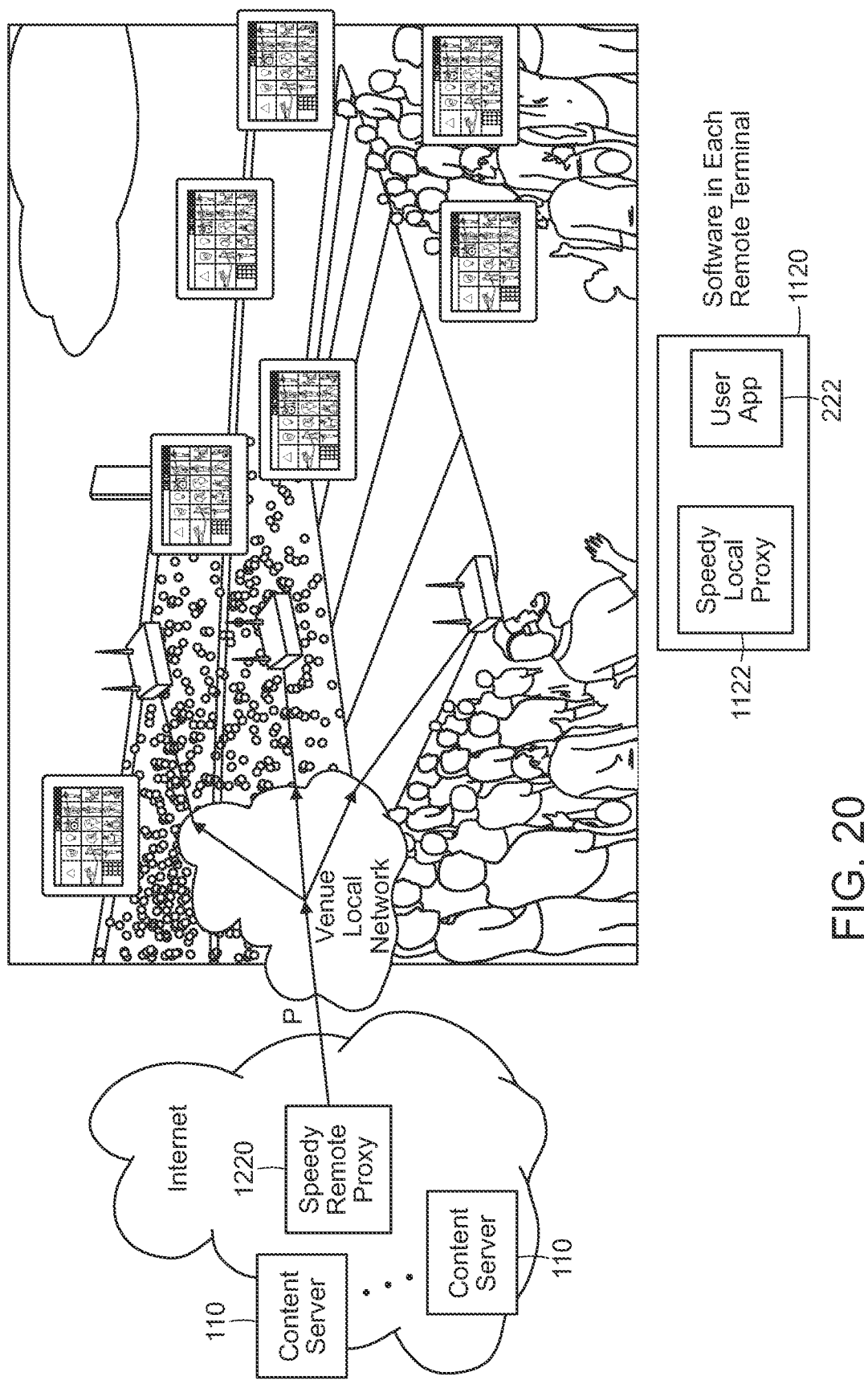

FIGS. 19-20 show two examples of delivery of common content to multiple destination nodes simultaneously via multicast connections. The advantage of multicast is that a single packet or block of N packets has to be sent by the source node into the network and the network will attempt to deliver the packets to all destination nodes in the multicast group. If the content needs to be delivered reliably, then TCP will most likely be used as the transport layer protocol. To achieve reliability, TCP requires destination nodes to respond with acknowledgments and specify the packets that each destination node is missing. If there are 10s of thousands or 100s of thousands of receivers, and each destination node is missing a different packet or set of packets, the number of different retransmissions to the various receivers will undercut the advantages of the simultaneous transmission of the content to all destination nodes at once. With network coding and forward error correction, a block of N packets can be sent to a large number of multicast destination nodes at the same time. The paths to these multiple destination nodes can be similar (all over a large WiFi or Ethernet local area network) or disparate (some over WiFi, some over cellular, some over fiber links, and some over various types of satellite networks). The algorithms described above that embody transmission and congestion control, forward error correction, sender based pacing, receiver based pacing, stream based parameter tuning, detection and correction for missing and out of order packets, use of information across multiple connections, fast connection start and stop, TCP/UDP fallback, cascaded coding, recoding by intermediate nodes, and coding of the ACKs can be employed to improve the throughput and reliability of delivery to each of the multicast destination node. When losses are detected and coding is used, the extra coded packets can be sent to some or all destination nodes. As long as N packets are received at each destination node, the missing packets at each destination node can be reconstructed from the coded packets if the number of extra coded packets match or exceed the number of packets lost at all of the receivers. If fewer than N packets are received at any of the destination nodes, any set of different coded packets from the block of N packets can be retransmitted and used to reconstruct any missing packet in the block at each of the destination nodes. If some destination nodes are missing more than one packet, then the maximum number of coded packets to be retransmitted will be equal to the largest number of packets that are missing by any of the destination nodes. These few different coded packets can be used to reconstruct the missing packets at each of the destination nodes. For example, if the most packets missing at any destination node are four, then any four different coded packets can be retransmitted.

2.7 Further Illustrative Examples

FIGS. 21A-21K show exemplary embodiments of data communication systems and devices and highlight various ways to implement the novel PC-TCP described herein. These configurations identify some of the possible network devices, configurations, and applications that may benefit from using PC-TCP, but there are many more devices, configurations and applications that may also benefit from PC-TCP. The following embodiments are described by way of example, not limitation.

Figure 21A:
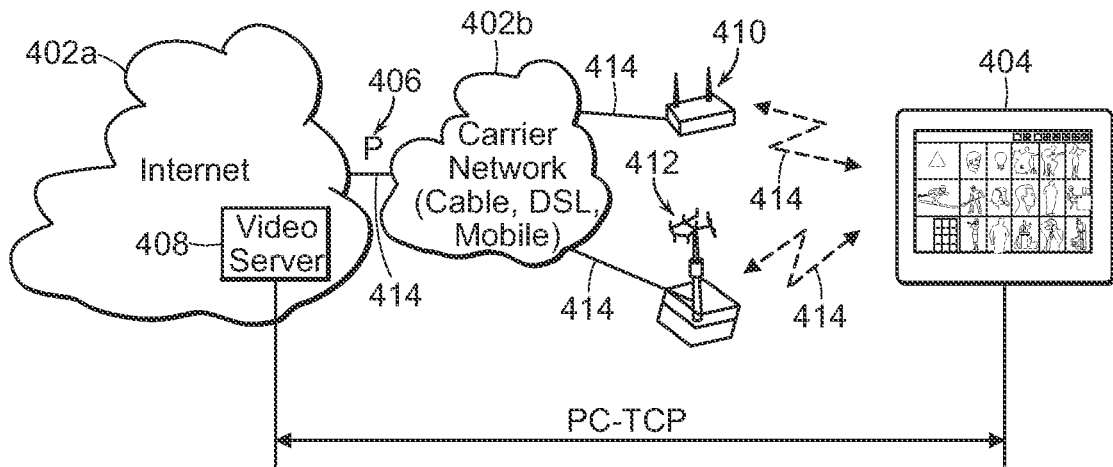
FIGS. 21A-K are schematic diagrams of various embodiments of PC-TCP communication approaches.

In an exemplary embodiment depicted in FIG. 21A, a user device 404 such as a smartphone, a tablet, a computer, a television, a display, an appliance, a vehicle, a home server, a gaming console, a streaming media box and the like, may include a PC-TCP proxy that may interface with applications running in the user device 404. The application on the user device 404 may communicate with a resource in the cloud 402a such as a server 408. The server 408 may be a file server, a web server, a video server, a content server, an application server, a collaboration server, an FTP server, a list server, a telnet server, a mail server, a proxy server, a database server, a game server, a sound server, a print server, an open source server, a virtual server, an edge server, a storage device and the like, and may include a PC-TCP proxy that may interface with applications and/or processes running on the server 408. In embodiments, the server in the cloud may terminate the PC-TCP connection and interface with an application on the server 408 and/or may forward the data on to another electronic device in the network. In embodiments, the data connection may travel a path that utilizes the resources on a number of networks 402a, 402b. In embodiments, PC-TCP may be configured to support multipath communication such as for example from a video server 408 through a peering point 406, though a carrier network 402b, to a wireless router or access point 410 to a user device 404 and from a video server 408 through a peering point 406, though a carrier network 402b, to a cellular base station or cell transmitter 412 to a user device 404. In embodiments, the PC-TCP may include adjustable parameters that may be adjusted to improve multipath performance. In some instances, the exemplary embodiment shown in FIG. 21A may be referred to as an over-the-top (OTT) embodiment.

Figure 21B:
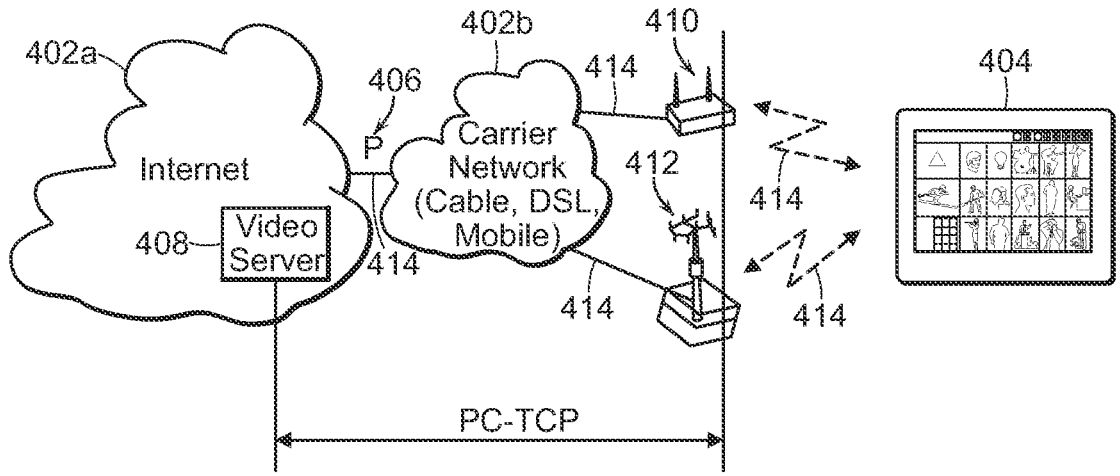
Figure 21C:
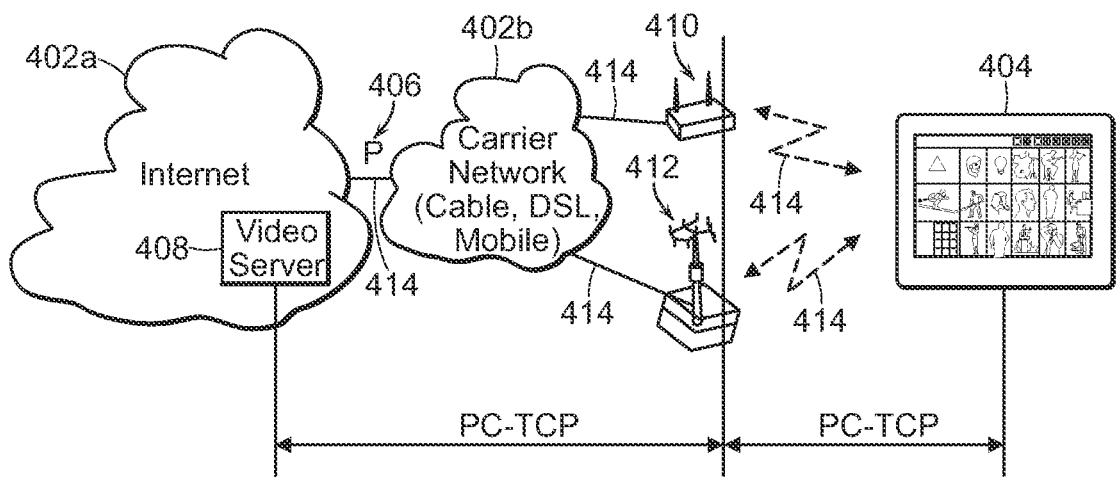

In embodiments, such as the exemplary embodiments shown in FIG. 21B and FIG. 21C, other devices in the network may comprise PC-TCP proxies. For example, the wireless access point or router 410 and the base station or cell transmitter 412 may comprise PC-TCP proxies. In embodiments, the user device 404 may also comprise a PC-TCP proxy (FIG. 21C) or it may not (FIG. 21B). If the user device does not comprise a PC-TCP proxy, it may communicate with the access point 410 and/or base station 412 using a wireless or cellular protocol and/or conventional TCP or UDP protocol. The PC-TCP proxy in either or both the access point 410 and base station 412 may receive data packets using these conventional communications and may convert these communications to the PC-TCP for a connection to video server 408. In embodiments, if conventional TCP provides the highest speed connection between the end user device 404 and/or the access point 410 or the base station 412, then the PC-TCP proxy may utilize only some or all of the features in PC-TCP that may be compliant with and may complement conventional TCP implementations and transmit the data using the TCP layer.

Figure 21D:
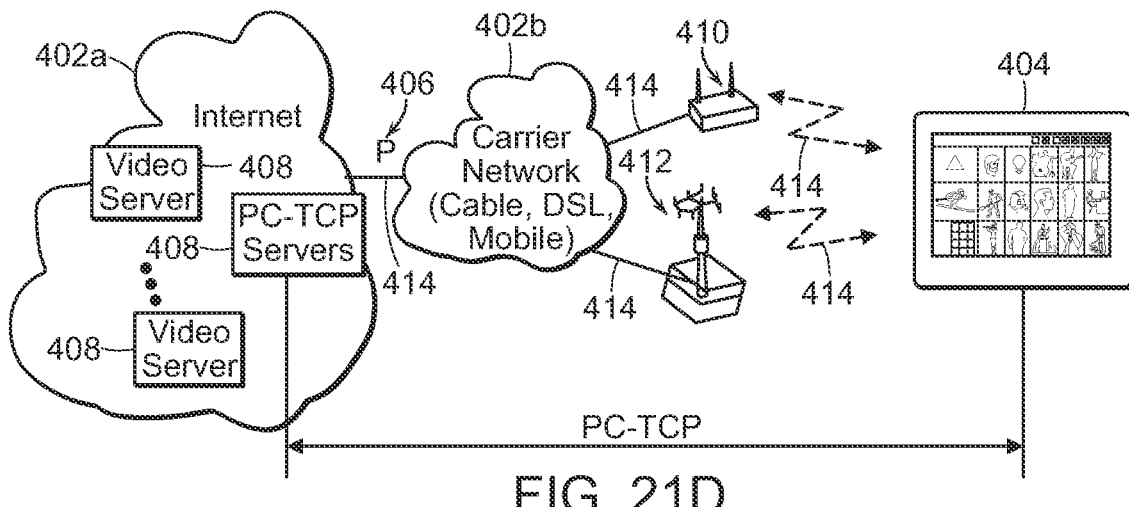

FIG. 21D shows an exemplary embodiment where a user device may comprise a PC-TCP proxy and may communicate with a PC-TCP proxy server 408 on an internet. In this embodiment, an entity may provide support for high speed internet connections by renting, buying services from, or deploying at least one server in the network and allowing other servers or end user devices to communicate with it using PC-TCP. The at least one server in the network running PC-TCP may connect to other resources in the network and/or end users using TCP or UDP.

Figure 21E:
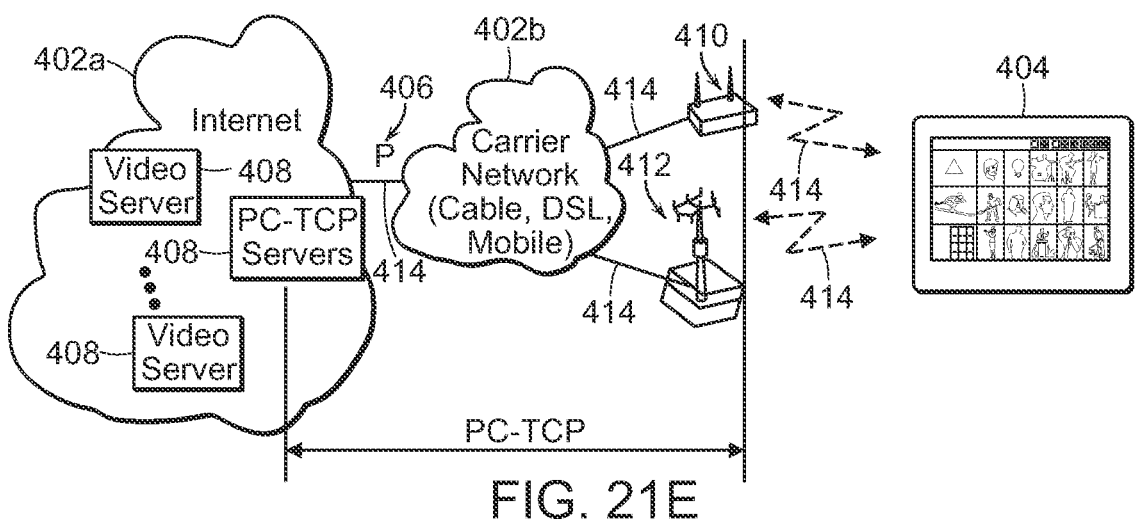
Figure 21F:
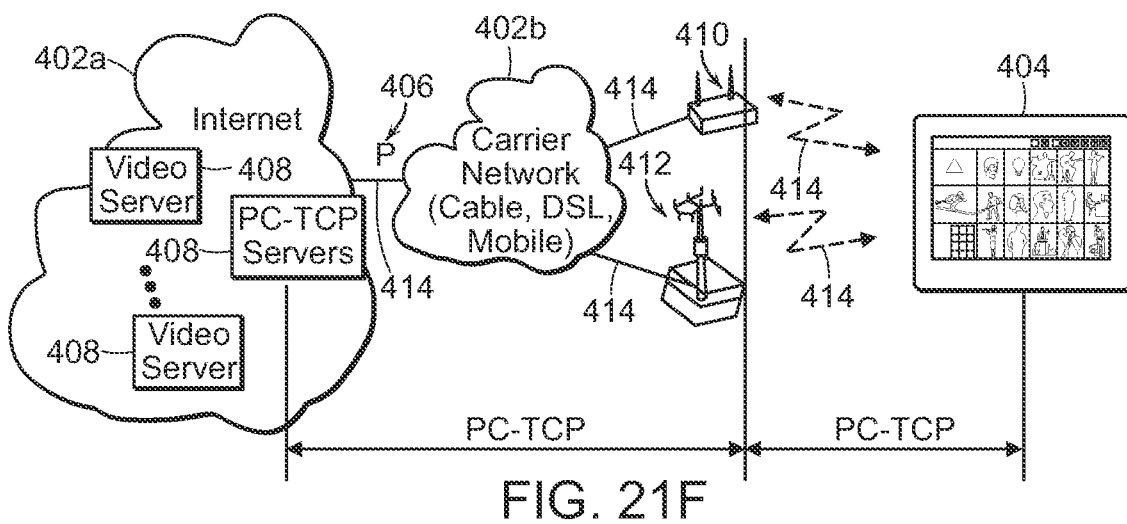

In embodiments, such as the exemplary embodiments shown in FIG. 21E and FIG. 21F, other devices in the network may comprise PC-TCP proxies. For example, the wireless access point or router 410 and the base station or cell transmitter 412 may comprise PC-TCP proxies. In embodiments, the user device 404 may also comprise a PC-TCP proxy (FIG. 21F) or it may not (FIG. 21E). If the user device does not comprise a PC-TCP proxy, it may communicate with the access point 410 and/or base station 412 using a wireless or cellular protocol and/or conventional TCP or UDP protocol. The PC-TCP proxy in either or both the access point 410 and base station 412 may receive data packets using these conventional communications and may convert these communications to the PC-TCP for a connection to PC-TCP server 408. In embodiments, if conventional TCP provides the highest speed connection between the end user device 404 and/or the access point 410 or the base station 412, then the PC-TCP proxy may utilize only some or all of the features in PC-TCP that may be compliant with and may complement conventional TCP implementations and transmit the data using the TCP layer.

In embodiments, at least some network servers 408 may comprise PC-TCP proxies and may communicate with any PC-TCP servers or devices using PC-TCP. In other embodiments, network servers may communicate with PC-TCP servers or devices using conventional TCP and/or other transport protocols running over UDP.

Figure 21G:
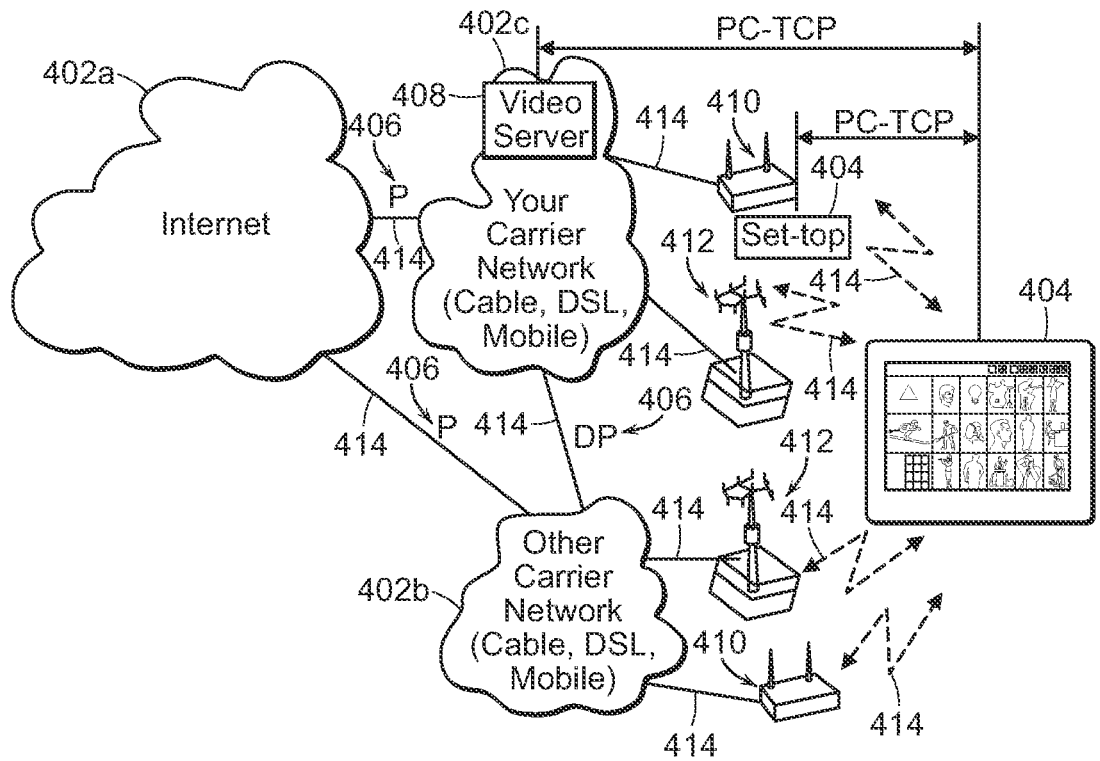
Figure 21H:
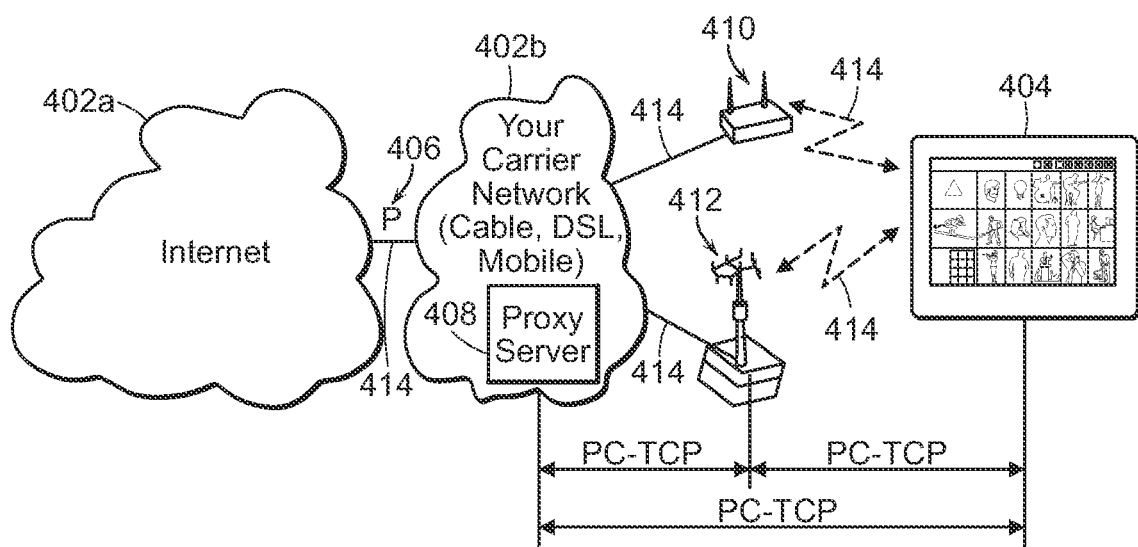
Figure 21I:
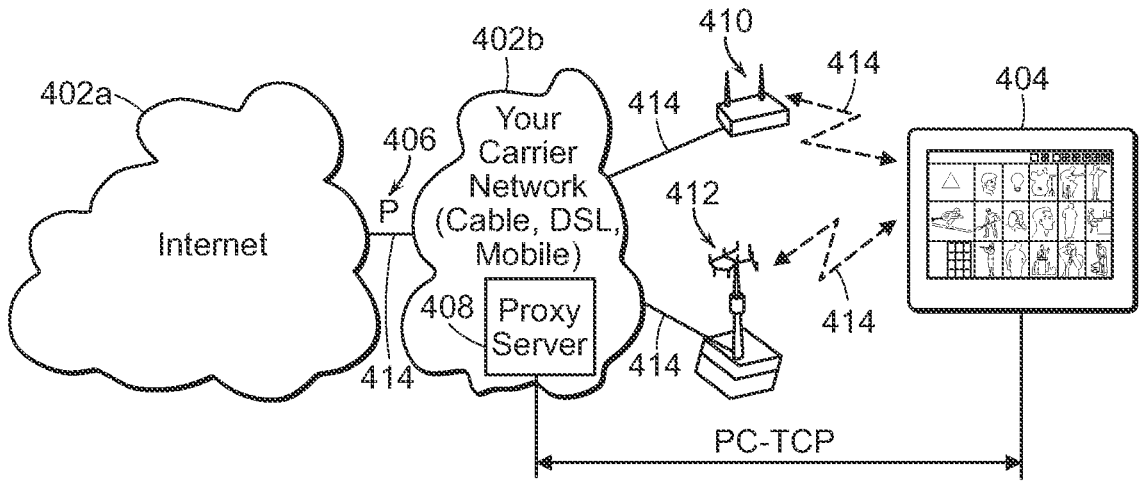
Figure 21J:
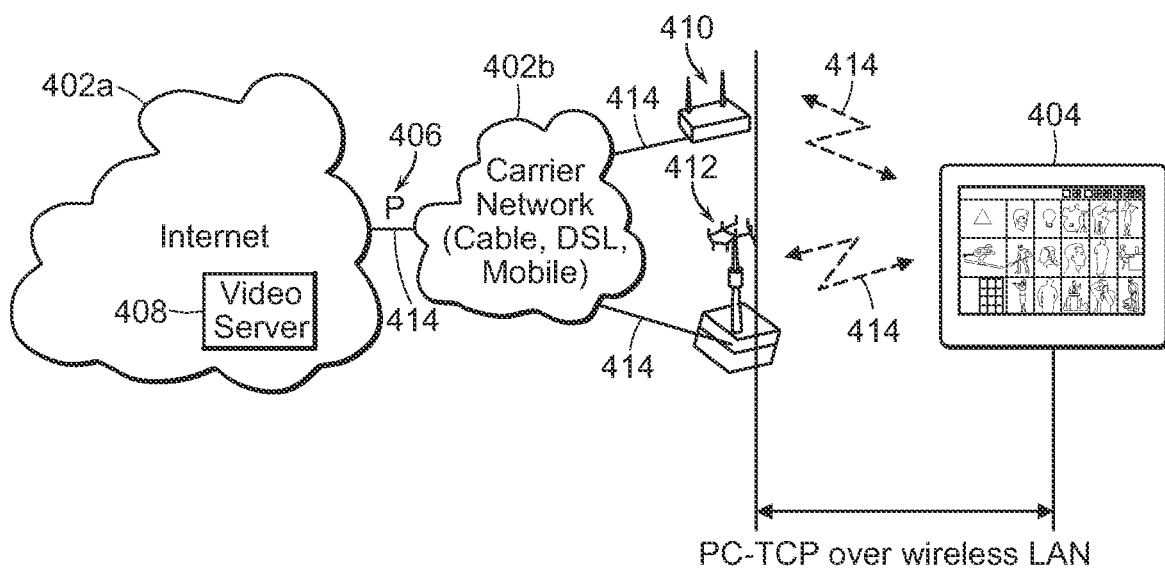
Figure 21K:
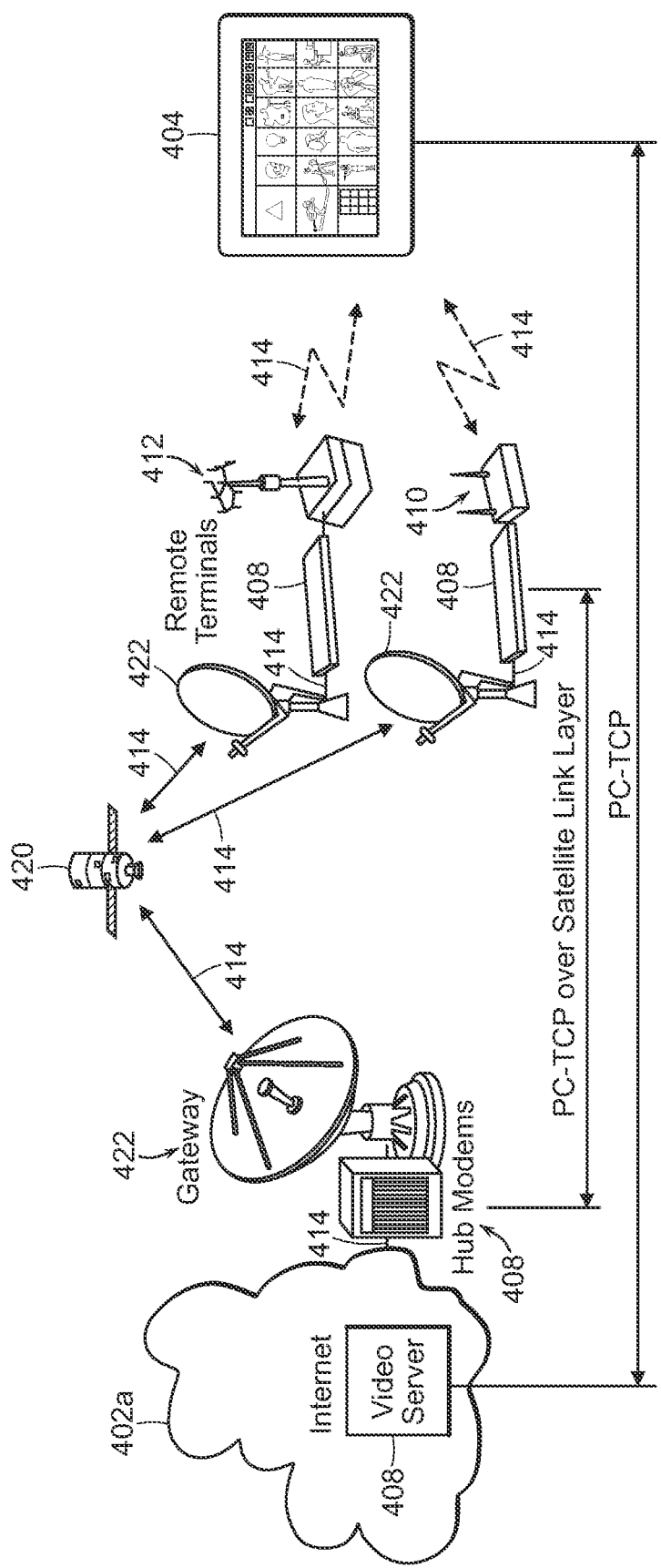

In exemplary embodiments as depicted in FIG. 21G, ISPs and/or carriers may host content on one or more servers that comprise PC-TCP proxies. In embodiments, devices such as set-top boxes, cable boxes, digital video recorders (DVRs), modems, televisions, smart televisions, internet televisions, displays, and the like may comprise PC-TCP proxies. A user device 404 such as described above, may include a PC-TCP proxy that may interface with applications running in the user device 404. The application on the user device 404 may communicate with a resource in the cloud 402c such as a server 408. The server 408 may be any type of communications server as describe above, and may include a PC-TCP proxy that may interface with applications and/or processes running on the server 408. In embodiments, the server in the cloud may terminate the PC-TCP connection and interface with an application on the server 408 and/or may forward the data on to another electronic device in the network. In embodiments, the data connection may travel a path that utilizes the resources on a number of networks 402a, 402b, 402c. In embodiments PC-TCP may be configured to support multipath communication such as for example from a video server 408 through a direct peering point (DP) 406, to a wireless router or access point 410 or a base station 412 to a user device 404 and from a video server 408 directly to an access point 410 and/or to a cellular base station or cell transmitter 412 to a user device 404. In embodiments, the PC-TCP may include adjustable parameters that may be adjusted to improve multipath performance.

The exemplary placements of networking devices in the communication scenarios described above should not be taken as limitations. It should be recognized that PC-TCP proxies can be placed in any network device and may support any type of data connection. That is, any type of end-user device, switching device, routing device, storage device, processing device and the like, may comprise PC-TCP proxies. Also, PC-TCP proxies may reside only in the end-nodes of a communication path and/or only at two nodes along a connection path. However, PC-TCP proxies may also reside in more than two nodes of a communication path and may support multi-cast communications and multipath communications. PC-TCP proxies may be utilized in point-to-point communication networks, multi-hop networks, meshed networks, broadcast networks, storage networks, and the like.

3 Packet Coding (PC)

The description above focuses on architectures in which a packet coding approach is deployed, and in particular architectures in which a transport layer PC-TCP approach is used. In the description below, a number of features of PC-TCP are described. It should be understood that in general, unless otherwise indicated, these features are compatible with one another and can be combined in various combinations to address particular applications and situations.

3.1 Data Characteristics

As introduced above, data units (e.g., audio and/or video frames) are generally used to form data packets, for example, with one data unit per data packet, with multiple data units per data packet, or in some instances separating individual data units into multiple data packets. In some applications, the data units and associated data frames form a stream (e.g., a substantially continuous sequence made available over time without necessarily having groupings or boundaries in the sequence), while in other applications, the data units and associated data frames form one or more batches (e.g., a grouping of data that is required as a whole by the recipient).

In general, stream data is generated over time at a source and consumed at a destination, typically at a substantially steady rate. An example of a stream is a multimedia stream associated with person-to-person communication (e.g., a multimedia conference). Delay (also referred to as latency) and variability in delay (also referred to as jitter) are important characteristics of the communication of data units from a source to a destination.

An extreme example of a batch is delivery of an entire group of data, for example, a multiple gigabyte sized file. In some such examples, reducing the overall time to complete delivery (e.g., by maximizing throughput) of the batch is of primary importance. One example of batch delivery that may have very sensitive time (and real-time update) restraints is database replication.

In some applications, the data forms a series of batches that require delivery from a source to a destination. Although delay in start of delivery and/or completion of delivery of a batch of data units may be important, in many applications overall throughput may be most important. An example of batch delivery includes delivery of portions of multimedia content, for instance, with each batch corresponding to sections of viewing time (e.g., 2 seconds of viewing time or 2 MB per batch), with content being delivered in batches to the destination where the data units in the batches are buffered and used to construct a continuous presentation of the content. As a result, an important consideration is the delivery of the batches in a manner that provides continuity between batches for presentation, without "starving" the destination application because a required batch has not arrived in time. In practice, such starving may cause "freezing" of video presentation in multimedia, which is a phenomenon that is all too familiar to today's users of online multimedia delivery. Another important consideration is reduction in the initial delay in providing the data units of the first batch to the destination application. Such delay is manifested, for example, in a user having to wait for initial startup of video presentation after selecting multimedia for online delivery. Another consideration in some applications is overall throughput. This may arise, for example, if the source application has control over a data rate of the data units, for example, being able to provide a higher fidelity version of the multimedia content if higher throughput can be achieved. Therefore, an important consideration may be providing a sufficiently high throughput in order to enable delivery of a high fidelity version of the content (e.g., as opposed to a greatly compressed version or a backed-off rate of the content resulting in lower fidelity).

Various packet coding approaches described below, or selection of configuration parameters of those approaches, address considerations that are particularly relevant to the nature of the characteristics of the data being transported. In some examples, different approaches or parameters are set in a single system based on a runtime determination of the nature of the characteristics of the data being transported.

3.2 Channel Characteristics

In general, the communication paths that link PC-TCP source and destination endpoints exhibit both relatively stationary or consistent channel characteristics, as well as transient characteristics. Relatively stationary or consistent channel characteristics can include, for example, capacity (e.g., maximum usable throughput), latency (e.g., transit time of packets from source to destination, variability in transit time), error rate (e.g., average packet erasure or error rate, burst characteristics of erasures/errors). In general, such relatively stationary or consistent characteristics may depend on the nature of the path, and more particularly on one or more of the links on the path. For example, a path with a link passing over a 4G cellular channel may exhibit very different characteristics than a path that passes over a cable television channel and/or a WiFi link in a home. As discussed further below, at least some of the approaches to packet coding attempt to address channel characteristic differences between types of communication paths. Furthermore, at least some of the approaches include aspects that track relatively slow variation in characteristics, for example, adapting to changes in average throughput, latency, etc.

Communication characteristics along a path may also exhibit substantial transient characteristics. Conventional communication techniques include aspects that address transient characteristics resulting from congestion along a communication path. It is well known that as congestion increases, for example at a node along a communication path, it is important that traffic is reduced at that node in order to avoid an unstable situation, for instance, with high packet loss resulting from buffer overruns, which then further increases data rates due to retransmission approaches. One common approach to addressing congestion-based transients uses an adaptive window size of "in flight" packets that have not yet been acknowledged by their destinations. The size of the window is adapted at each of the sources to avoid congestion-based instability, for example, by significantly reducing the size of the window upon detection of increased packet erasure rates.

In addressing communication over a variety of channels, it has been observed that transients in communication characteristics may not be due solely to conventional congestion effects, and that conventional congestion avoidance approaches may not be optimal or even desirable. Some effects that may affect communication characteristics, and that may, therefore, warrant adaptation of the manner in which data is transmitted can include one or more of the following:

- Effects resulting from cell handoff in cellular systems, including interruptions in delivery of packets or substantial reordering of packets delivered after handoff;
- Effects resulting from "half-duplex" characteristics of certain wireless channels, for example, in WiFi channels in which return packets from a destination may be delayed until the wireless channel is acquired for upstream (i.e., portable device to access point) communication;
- Effects of explicit data shaping devices, for example, intended to throttle certain classes of communication, for instance, based on a service provider's belief that that class of communication is malicious or is consuming more than a fair share of resources.

Although transient effects, which may not be based solely on congestion, may be tolerated using conventional congestion avoidance techniques, one or more of the approaches described below are particularly tailored to such classes of effects with the goal of maintaining efficient use of a channel without undue "over-reaction" upon detection of a transient situation, while still avoiding causing congestion-based packet loss.

3.3 Inter-Packet Coding

In general, the coding approaches used in embodiments described in this document make use of inter-packet coding in which redundancy information is sent over the channel such that the redundancy information in one packet is generally dependent on a set of other packets that have been or will be sent over the channel. Typically, for a set of N packets of information, a total of N+K packets are sent in a manner that erasure or any K of the packets allows reconstruction of the original N packets of information. In general, a group of N information packets, or a group of N+K packets including redundancy information (depending on context), is referred to below as a "block" or a "coding block". One example of such a coding includes N information packets without further coding, and then K redundancy packets, each of which depends on the N information packets. However, it should be understood more than K of the packets (e.g., each of the N+K packets) may in some embodiments depend on all the N information packets.

3.3.1 Forward Error Correction and Repair Retransmission

Inter-packet coding in various embodiments described in this document use one or both of pre-emptive transmission of redundant packets, generally referred to as forward error correction (FEC), and transmission of redundant packets upon an indication that packets have or have a high probability of having been erased based on feedback, which is referred to below as repair and/or retransmission. The feedback for repair retransmission generally comes from the receiver, but more generally may come from a node or other channel element on the path to the receiver, or some network element having information about the delivery of packets along the path. In the FEC mode, K redundant packets may be transmitted in order to be tolerant of up to K erasures of the N packets, while in the repair mode, in some examples, for each packet that the transmitter believes has been or has high probability of having been erased, a redundant packet is transmitted from the transmitter, such that if in a block of N packets, K packets are believed to have been erased based on feedback, the transmitter sends at least an additional K packets.

As discussed more fully below, use of a forward error correction mode versus a repair mode represents a tradeoff between use of more channel capacity for forward error correction (i.e., reduced throughout of information) versus incurring greater latency in the presence of erasures for repair retransmission. As introduced above, the data characteristics being transmitted may determine the relative importance of throughput versus latency, and the PC-TCP modules may be configured or adapted accordingly.

If on average the packet erasure rate E is less than $K/(N+K)$, then "on average" the N+K packets will experience erasure of K or fewer of the packets and the remaining packets will be sufficient to reconstruct the original N. Of course even if E is not greater than $K/(N+K)$, random variability, non-stationarity of the pattern of erasures, etc. results in some fraction of the sets of N+K packets having greater than K erasures, so that there is insufficient information to reconstruct the N packets at the destination. Therefore, even using FEC, at least some groups of N information packets will not be reconstructable. Note, for example, with E=0.2, N=8, and K=2, even though only 2 erasures may be expected on average, the probability of more than 2 erasures is greater than 30%, and even with E=0.1 this probability is greater than 7%, therefore the nature (e.g., timing, triggering conditions etc.) of the retransmission approaches may be significant, as discussed further below. Also as discussed below, the size of the set of packets that are coded together is significant. For example, increasing N by a factor of 10 to K+N=100 reduces the probability of more than the average number of 20 erasures (i.e., too many erasures to reconstruct the N=80 data packets) from over 7% to less than 0.1%.

Also as discussed further below, there is a tradeoff between use of large blocks of packets (i.e., large N) versus smaller blocks. For a particular code rate R=N/(N+K), longer blocks yield a higher probability of being able to fully recover the N information packets in the presence of random errors. Accordingly, depending on the data characteristics, the PC-TCP modules may be configured to adapt to achieve a desired tradeoff.

In general, in embodiments that guarantee delivery of the N packets, whether or not FEC is used, repair retransmission approaches are used to provide further information for reconstructing the N packets. In general, in preferred embodiments, the redundancy information is formed in such a manner that upon an erasure of a packet, the redundancy information that is sent from the transmitter does not depend on the specific packets that were erased, and is nevertheless suitable for repairing the erasure independent of which packet was erased.

3.3.2 Random Linear Coding

In general, a preferred approach to inter-packet coding is based on Random Linear Network Coding (RLNC) techniques. However, it should be understood that although based on this technology, not all features that may be associated with this term are necessarily incorporated. In particular, as described above in the absence of intermediate nodes that perform recoding, there is not necessarily a "network" aspect to the approach. Rather, redundancy information is generally formed by combining the information packets into coded packets using arithmetic combinations, and more specifically, as sums of products of coefficients and representation of the information packets over arithmetic fields, such as finite fields (e.g., Galois Fields of order $p^n$). In general, the code coefficients are chosen from a sufficiently large finite field in a random or pseudo-random manner, or in another way that the combinations of packets have a very low probability or frequency of being linearly dependent. The code coefficients, or a compressed version (e.g., as a reference into a table shared by the transmitter and receiver), are included in each transmitted combination of data units (or otherwise communicated to the receiver) and used for decoding at the receiver. Very generally, the original information packets may be recovered at a receiver by inverting the arithmetic combinations. For example, a version of Gaussian Elimination may be used to reconstruct the original packets from the coded combinations. A key feature of this approach is that for a set of N information packets, as soon as the receiver has at least N linearly independent combinations of those information packets in received packets, it can reconstruct the original data units. The term "degree of freedom" is generally used below to refer to a number of independent linear combinations, such that if N degrees of freedom have been specified for N original packets, then the N original packets can be reconstructed; while if fewer than N degrees of freedom are available, it may not be possible to fully reconstruct any of the N original packets. If N+K linearly independent linear combinations are sent, then any N received combinations (i.e., N received degrees of freedom) are sufficient to reconstruct the original information packets.

In some examples, the N+K linearly independent combinations comprise N selections of the N "uncoded" information packets (essentially N−1 zero coefficients and one unit coefficient for each uncoded packet), and K coded packets comprising the random arithmetic combination with N non-zero coefficients for the N information packets. The N uncoded packets are transmitted first, so that in the absence of erasures they should be completely received as soon as possible. In the case of one erasure of the original N packets, the receiver must wait for the arrival of one redundant packet (in addition to the N−1 original packets), and once that packet has arrived, the erased packet may be reconstructed. In the case of forward error correction, the K redundant packets follow (e.g., immediately after) the information packets, and the delay incurred in reconstructing the erased information packet depends on the transmission time of packets. In the case of repair retransmission, upon detection of an erasure or high probability of an erasure, the receiver provides feedback to the transmitter, which sends the redundancy information upon receiving the feedback. Therefore, the delay in being able to reconstruct the erased packet depends on the round-trip-time from the receiver to the transmitter and back.

As discussed in more detail below, feedback from the receiver to the transmitter may be in the form of acknowledgments sent from the receiver to the transmitter. This feedback in acknowledgments at least informs the transmitter of a number of the N+K packets of a block that have been successfully received (i.e., the number of received degrees of freedom), and may provide further information that depends on the specific packets that have been received at the receiver although such further information is not essential.

As introduced above, packets that include the combinations of original packets generally also include information needed to determine the coefficients used to combine the original packets, and information needed to identify which original packets were used in the combination (unless this set, such as all the packets of a block, is implicit). In some implementations, the coefficients are explicitly represented in the coded packets. In some embodiments, the coefficients are encoded with reference to shared information at the transmitter and the receiver. For instance, tables of pre-generated (e.g., random, pseudo random, or otherwise selected) coefficients, or sets of coefficients, may be stored and references into those tables are used to determine the values of the coefficients. The size of such a table determines the number of parity packets that can be generated while maintaining the linear independence of the sets of coefficients. It should be understood that yet other ways may be used to determine the coefficients.

Another feature of random linear codes is that packets formed as linear combinations of data units may themselves be additively combined to yield combined linear combinations of data units. This process is referred to in some instances as "recoding", as distinct from decoding and then repeating encoding.

There are alternatives to the use of RLNC, which do not necessarily achieve similar optimal (or provably optimum, or near optimal) throughput as RLNC, but that give excellent performance in some scenarios when implemented as described herein. For example, various forms of parity check codes can be used. Therefore, it should be understood that RLNC, or any particular aspect of RLNC, is not an essential feature of all embodiments described in this document.

3.4 Batch Transmission

As introduced above, in at least some applications, data to be transmitted from a transmitter to a receiver forms a batch (i.e., as opposed to a continuous stream), with an example of a batch being a file or a segment (e.g., a two second segment of multimedia) of a file.

In an embodiment of the PC-TCP modules, the batch is transferred from the transmitter to the receiver as a series of blocks, with each block being formed from a series of information packets. In general, each block has the same number of information packets, however, use of same size blocks is not essential.

The transmitter PC-TCP module generally receives the data units from the source application and forms the information packets of the successive blocks of the batch. These information packets are queued at the transmitter and transmitted on the channel to the receiver. In general, at the transmitter, the dequeueing and transmission of packets to the receiver makes use of congestion control and/or rate control mechanisms described in more detail below. The transmitter PC-TCP also retains the information packets (or sufficient equivalent information) to construct redundancy information for the blocks. For instance, the transmitter PC-TCP buffers the information packets for each block for which there remains the possibility of an unrecovered erasure of a packet during transit from the transmitter to the receiver.

In general, the receiver provides feedback to the transmitter. Various approaches to determining when to provide the feedback and what information to provide with the feedback are described further below. The feedback provides the transmitter with sufficient information to determine that a block has been successfully received and/or reconstructed at the receiver. When such success feedback for a block has been received, the transmitter no longer needs to retain the information packets for the block because there is no longer the possibility that redundancy information for the block will need to be sent to the receiver.

The feedback from the receiver to the transmitter may also indicate that a packet is missing. Although in some cases the indication that a packet is missing is a premature indication of an erasure, in this embodiment the transmitter uses this missing feedback to trigger sending redundant information for a block. In some examples, the packets for a block are numbered in sequence of transmission, and the feedback represents the highest number received and the number of packets (i.e., the number of degrees of freedom) received (or equivalently the number of missing packets or remaining degrees of freedom needed) for the block. The transmitter addresses missing packet feedback for a block through the transmission of redundant repair blocks, which may be used by the receiver to reconstruct the missing packets and/or original packets of the block.

As introduced above, for each block, the transmitter maintains sufficient information to determine the highest index of a packet received at the receiver, the number of missing packets transmitted prior to that packet, and the number of original or redundancy packets after the highest index received that have been transmitted (i.e., are "in flight" unless erased in transit) or queued for transmission at the transmitter.

When the transmitter receives missing packet feedback for a block, if the number of packets for the block that are "in flight" or queue would not be sufficient if received successfully (or are not expected to be in view of the erasure rate), the transmitter computes (or retrieves precomputed) a new redundant packet for the block and queues it for transmission. Such redundancy packets are referred to as repair packets. In order to reduce the delay in reconstructing a block of packets at the receiver, the repair packets are sent preferentially to the information packets for later blocks. For instance, the repair packets are queued in a separate higher-priority queue that is used to ensure transmission of repair packets preferentially to the queue of information packets.

In some situations, feedback from the receiver may have indicated that a packet is missing. However, that packet may later arrive out of order, and therefore a redundant packet for that block that was earlier computed and queued for transmission is no longer required to be delivered to the receiver. If that redundant packet has not yet been transmitted (i.e., it is still queued), that packet may be removed from the queue thereby avoiding wasted use of channel capacity for a packet that will not serve to pass new information to the receiver.

In the approach described above, redundancy packets are sent as repair packets in response to feedback from the receiver. In some examples, some redundancy packets are sent pre-emptively (i.e., as forward error correction) in order to address possible packet erasures. One approach to send such forward error correction packets for each block. However, if feedback has already been received at the transmitter that a sufficient number of original and/or coded packets for a block have been received, then there is no need to send further redundant packets for the block.

In an implementation of this approach, the original packets for all the blocks of the batch are sent first, while repair packets are being preferentially sent based on feedback from the receiver. After all the original packets have been transmitted, and the queue of repair packets is empty, the transmitter computes (or retrieves precomputed) redundancy packets for blocks for which the transmitter has not yet received feedback that the blocks have been successfully received, and queues those blocks as forward error correction packets for transmission in the first queue. In general, because the repair blocks are sent with higher priority than the original packets, the blocks for which success feedback has not yet been received are the later blocks in the batch (e.g., a trailing sequence of blocks of the batch).

In various versions of this approach, the number and order of transmission of the forward error correction packets are determined in various ways. A first way uses the erasure rate to determine how many redundant packets to transmit. One approach is to send at least one redundant packet for each outstanding block. Another approach is to send a number of redundancy packets for each outstanding block so that based on an expectation of the erasure rate of the packets that are queued and in flight for the block will yield a sufficient number of successfully received packets in order to reconstruct the block. For example, if a further n packets are needed to reconstruct a block (e.g., a number n<N packets of the original N packets with N−n packets having been erased), then n+k packets are sent, for instance, with n+k≥n/E, where E is an estimate of the erasure rate on the channel.

Another way of determining the number and order of forward error correction packets addresses the situation in which a block transmission time is substantially less than the round-trip-time for the channel. Therefore, the earliest of the blocks for which the transmitter has not received success feedback may, in fact, have the success feedback in flight from the receiver to the transmitter, and therefore sending forward error correction packets may be wasteful. Similarly, even if feedback indicating missing packet feedback for a block is received sufficiently early, the transmitter may still send a repair packet without incurring more delay in complete reconstruction of the entire batch than would be achieved by forward error correction.

In an example, the number of forward error correction packets queued for each block is greater for later blocks in the batch than for earlier ones. A motivation for this can be understood by considering the last block of the batch where it should be evident that it is desirable to send a sufficient number of forward error correction packets to ensure high probability of the receiver having sufficient information to reconstruct the block without the need from transmission of a repair packet and the associated increase in latency. On the other hand, it is preferable to send fewer forward error correction packets for the previous (or earlier) block because, in the face of missing packet feedback from the receiver, the transmitter may be able to send a repair packet before forward error correction packets for all the later blocks have been sent, thereby not incurring a delay in overall delivery of the batch.

In one implementation, after all the original packets have been sent, and the transmitter is in the forward error correction phase in which it computes and sends the forward error correction packets, if the transmitter receives a missing packet feedback from the receiver, it computes and sends a repair packet for the block in question (if necessary) as described above, and clears the entire queue of forward error correction packets. After the repair packet queue is again empty, the transmitter again computes and queues forward error correction packets for the blocks for which it has not yet received success feedback. In an alternative somewhat equivalent implementation, rather than clearing the forward error correction queue upon receipt of a missing packet feedback, the transmitter removes forward error correction packets from the queue as they are no longer needed based on feedback from the receiver. In some examples, if success feedback is received for a block for which there are queued forward error correction packets, those forward error correction packets are removed from the queue. In some examples, the feedback from the receiver may indicate that some but not all of the forward error correction packets in the queue are no longer needed, for example, because out-of-order packets were received but at least some of the original packets are still missing.

An example of the way the transmitter determines how many forward error correction packets to send is that the transmitter performs a computation:

$$(N+g(i)-a_i)/(1-p)-f_i$$

where
p=smoothed loss rate,
N=block size,
i=block index defined as number of blocks from last block,
$a_i$=number of packets acked from block i,
$f_i$=packets in-flight from block i, and
g(i)=a decreasing function of i,
to determine the number of FEC packets for a block.

In some examples, g(i) is determined as a maximum of a configurable parameter, m and N−i. In some examples, g(i) is determined as N−p(i) where p is a polynomial, with integer rounding as needed.

It should be understood that in some alternative implementations, at least some forward error correction packets may be interspersed with the original packets. For example, if the erasure rate for the channel is relatively high, then at least some number of redundancy packets may be needed with relatively high probability for each block, and there is an overall advantage to preemptively sending redundant FEC packets as soon as possible, in addition to providing the mechanism for feedback based repair that is described above.

It should be also understood that use of subdivision of a batch into blocks is not necessarily required in order to achieve the goal of minimizing the time to complete reconstruction of the block at the receiver. However, if the forward error correction is applied uniformly to all the packets of the batch, then the preferential protection of later packets would be absent, and therefore, latency caused by erasure of later packets may be greater than using the approach described above. However, alternative approaches to non-uniform forward error protection (i.e., introduction of forward error correction redundancy packets) may be used. For example, in the block based approach described above, packets of the later blocks each contribute to a greater number of forward error correction packets than do earlier ones, and an alternative approach to achieving this characteristic maybe to use a non-block based criterion to construction of the redundancy packets in the forward error correction phase. However, the block based approach described above has advantages of relative simplicity and general robustness, and therefore even if marginally "suboptimal" provides an overall advantageous technical solution to minimizing the time to complete reconstruction within the constraint of throughput and erasure on the channel linking the transmitter and receiver.

Another advantage of using a block-based approach is that, for example, when a block within the batch, say the $m^{th}$ block of M blocks of the batch has an erasure, the repair packet that is sent from the transmitter depends only on the N original packets of the $m^{th}$ block. Therefore, as soon as the repair packet arrives, and the available (i.e., not erased) N−1 packets of the block arrive, the receiver has the information necessary to repair the block. Therefore, by constructing the repair packet without contribution of packets in later blocks of the batch, the latency of the reconstruction of the block is reduced. Furthermore, by having the repair packets depend on only N original packets, the computation required to reconstruct the packets of the block is less than if the repair packets depend on more packets.

It should be understood that even in the block based transmission of a batch of packets, the blocks are not necessarily uniform in size, and are not necessarily disjoint. For example, blocks may overlap (e.g., by 50%, 75%, etc.) thereby maintaining at least some of the advantages of reduced complexity in reconstruction and reduced buffering requirements as compared to treating the batch as one block. An advantage of such overlapping blocks may be a reduced latency in reconstruction because repair packets may be sent that do not require waiting for original packets at the receiver prior to reconstruction. Furthermore, non-uniform blocks may be beneficial, for example, to increase the effectiveness of forward error correction for later block in a batch by using longer blocks near the end of a batch as compared to near the beginning of a batch.

In applications in which the entire batch is needed by the destination application before use, low latency of reconstruction may be desirable to reduce buffering requirements in the PC-TCP module at the receiver (and at the transmitter). For example, all packets that may contribute to a later received repair packet are buffered for their potential future use. In the block based approach, once a block is fully reconstructed, then the PC-TCP module can deliver and discard those packets because they will not affect future packet reconstruction.

Although described as an approach to delivery of a batch of packets, the formation of these batches may be internal to the PC-TCP modules, whether or not such batches are formed at the software application level. For example, the PC-TCP module at the transmitter may receive the original data units that are used to form the original packets via a software interface from the source application. The packets are segmented into blocks of N packets as described above, and the packets queued for transmission. In one embodiment, as long as the source application provides data units sufficiently quickly to keep the queue from emptying (or from emptying for a threshold amount of time), the PC-TCP module stays in the first mode (i.e., prior to sending forward error correction packets) sending repair packets as needed based on feedback information from the receiver. When there is a lull in the source application providing data units, then the PC-TCP module declares that a batch has been completed, and enters the forward error correction phase described above. In some examples, the batch formed by the PC-TCP module may, in fact, correspond to a batch of data units generated by the source application as a result of a lull in the source application providing data units to the PC-TCP module while it computes data units for a next batch, thereby inherently synchronizing the batch processing by the source application and the PC-TCP modules.

In one such embodiment, the PC-TCP module remains in the forward error correction mode for the declared batch until that entire batch has been successfully reconstructed at the receiver. In another embodiment, if the source application begins providing new data units before the receiver has provided feedback that the previous batch has been successfully reconstructed, the transmitter PC-TCP module begins sending original packets for the next batch at a lower priority than repair or forward error correction packets for the previous batch. Such an embodiment may reduce the time to the beginning of transmission of the next batch, and therefore reduces the time to successful delivery of the next batch.

In the embodiments in which the source application does not necessarily provide the data in explicit batches, the receiver PC-TCP module provides the data units in order to the destination application without necessarily identifying the block or batch boundaries introduced at the transmitter PC-TCP module. That is, in at least some implementations, the transmitter and receiver PC-TCP modules provide a reliable channel for the application data units without exposing the block and batch structure to the applications.

As described above for certain embodiments, the transmitter PC-TCP module reacts to missing packet feedback from the receiver PC-TCP module to send repair packets. Therefore, it should be evident that the mechanism by which the receiver sends such feedback may affect the overall behavior of the protocol. For example, in one example, the receiver PC-TCP module sends a negative acknowledgment as soon as it observes a missing packet. Such an approach may provide the lowest latency for reconstruction of the block. However, as introduced above, missing packets may be the result of out-of-order delivery. Therefore, a less aggressive generation of missing packet feedback, for example, by delay in transmission of a negative acknowledgment, may reduce the transmission of unnecessary repair packets with only a minimal increase in latency in reconstruction of that block. However, such delay in sending negative acknowledgments may have an overall positive impact on the time to successfully reconstruct the entire block because later blocks are not delayed by unnecessary repair packets. Alternative approaches to generation of acknowledgments are described below.

In some embodiments, at least some of the determination of when to send repair packets is performed at the transmitter PC-TCP. For example, the receiver PC-TCP module may not delay the transmission of missing packet feedback, and it is the transmitter PC-TCP module that delays the transmission of a repair packet based on its weighing of the possibility of the missing packet feedback being based on out-of-order delivery as opposed to erasure.

3.5 Protocol Parameters

Communication between two PC-TCP endpoints operates according to parameters, some of which are maintained in common by the endpoints, and some of which are local to the sending and/or the receiving endpoint. Some of these parameters relate primarily to forward error correction aspects of the operation. For example, such parameters include the degree of redundancy that is introduced through the coding process. As discussed below, further parameters related to such coding relate to the selection of packets for use in the combinations. A simple example of such selection is segmentation of the sequence of input data units into "frames" that are then independently encoded. In addition to the number of such packets for combination (e.g., frame length), other parameters may relate to overlapping and/or interleaving of such frames of data units and/or linear combinations of such data units.

Further parameters relate generally to transport layer characteristics of the communication approach. For example, some parameters relate to congestion avoidance, for example, representing a size of a window of unacknowledged packets, transmission rate, or other characteristics related to the timing or number of packets sent from the sender to the receiver of the PC-TCP communication.

As discussed further below, communication parameters (e.g., coding parameters, transport parameters) may be set in various ways. For example, parameters may be initialized upon establishing a session between two PC-TCP endpoints. Strategies for setting those parameters may be based on various sources of information, for example, according to knowledge of the communication path linking the sender and receiver (e.g., according to a classification of path type, such as 3G wireless versus cable modem), or experienced communication characteristics in other sessions (e.g., concurrent or prior sessions involving the same sender, receiver, communication links, intermediate nodes, etc.). Communication parameters may be adapted during the course of a communication session, for example, in response to observed communication characteristics (e.g., congestion, packet loss, round-trip time, etc.)

3.6 Transmission Control

Some aspects of the PC-TCP approaches relate to control of transmission of packets from a sender to a receiver. These aspects are generally separate from aspects of the approach that determine what is sent in the packets, for example, to accomplish forward error correction, retransmission, or the order in which the packets are sent (e.g., relative priority of forward error correction packets version retransmission packets). Given a queue of packets that are ready for transmission from the sender to the receiver, these transmission aspects generally relate to flow and/or congestion control.

3.6.1 Congestion Control

Current variants of TCP, including binary increase congestion control (BIC) and cubic-TCP, have been proposed to address the inefficiencies of classical TCP in networks with high losses, large bandwidths and long round-trip times.

BIC-TCP and CUBIC algorithms have been used because of their stability. After a backoff, BIC increases the congestion window linearly then logarithmically to the window size just before backoff (denoted by $W_{max}$) and subsequently increases the window in an anti-symmetric fashion exponentially then linearly. CUBIC increases the congestion window following backoff according to a cubic function with inflection point at $W_{max}$. These increase functions cause the congestion window to grow slowly when it is close to $W_{max}$, promoting stability. On the other hand, other variants such as HTCP and FAST TCP have the advantage of being able to partially distinguish congestion and non-congestion losses through the use of delay as a congestion signal.

An alternative congestion control approach is used in at least some embodiments. In some such embodiments, we identify a concave portion of the window increase function as $W_{concave}(t)=W_{max}+c_1(t-k)^3$ and a convex portion of the window increase function as $W_{convex}(t)=W_{max}+c_2(t-k)^3$ where $c_1$ and $c_2$ are positive tunable parameters and $$k = \sqrt[3]{((W\_max - W)/c_1)}$$

and W is the window size just after backoff.

This alternative congestion control approach can be flexibly tuned for different scenarios. For example, a larger value of $c_1$ causes the congestion window to increase more rapidly up to $W_{max}$ and a large value of $c_2$ causes the congestion window to increase more rapidly beyond $W_{max}$.

Optionally, delay is used as an indicator to exit slow start and move to the more conservative congestion avoidance phase, e.g. when a smoothed estimate of RTT exceeds a configured threshold relative to the minimum observed RTT for the connection. We can also optionally combine the increase function of CUBIC or other TCP variants with the delay-based backoff function of HTCP.

In some embodiments, backoff is smoothed by allowing a lower rate of transmission until the number of packets in flight decreases to the new window size. For instance, a threshold, n, is set such that once n packets have been acknowledged following a backoff, then one packet is allowed to be sent for every two acknowledged packets, which is roughly half of the previous sending rate. This is akin to a hybrid window and rate control scheme.

3.6.2 Transmission Rate Control
3.6.2.1 Pacing Control by Sender

In at least some embodiments, pacing is used to regulate and/or spread out packet transmissions, making the transmission rate less bursty. While pacing can help to reduce packet loss from buffer overflows, previous implementations of pacing algorithms have not shown clear advantages when comparing paced TCP implementations to non-paced TCP implementations. However, in embodiments where the data packets are coded packets as described above, the combination of packet coding and pacing may have advantages. For example, since one coded packet may be used to recover multiple possible lost packets, we can use coding to more efficiently recover from any spread out packet losses that may result from pacing. In embodiments, the combination of packet coding and pacing may have advantages compared to uncoded TCP with selective acknowledgments (SACK).

Classical TCP implements end-to-end congestion control based on acknowledgments. Variants of TCP designed for high-bandwidth connections increase the congestion window (and consequently the sending rate) quickly to probe for available bandwidth but this can result in bursts of packet losses when it overshoots, if there is insufficient buffering in the network.

A number of variants of TCP use acknowledgment feedback to determine round-trip time and/or estimate available bandwidth, and they differ in the mechanisms with which this information is used to control the congestion window and/or sending rate. Different variants have scenarios in which they work better or worse than others.

In one general approach used in one or more embodiments, a communication protocol may use smoothed statistics of intervals between acknowledgments of transmitted packets (e.g., a smoothed "ack interval") to guide a transmission of packets, for example, by controlling intervals (e.g., an average interval or equivalently an average transmission rate) between packet transmissions. Broadly, this guiding of transmission intervals is referred to herein as "pacing".

In some examples, the pacing approach is used in conjunction with a window-based congestion control algorithm. Generally, the congestion window controls the number of unacknowledged packets that can be sent, in some examples using window control approaches that are the same or similar to those used in known variants of the Transmission Control Protocol (TCP). In embodiments, the window control approach is based on the novel congestion control algorithms described herein.

A general advantage of one or more aspects is to improve functioning of a communication system, for instance, as measured by total throughput, or delay and/or variation in delay. These aspects address a technical problem of congestion, and with it packet loss, in a network by using "pacing" to reduce that congestion.

An advantage of this aspect is that the separate control of pacing can prevent packets in the congestion window from being transmitted too rapidly compared to the rate at which they are getting through to the other side. Without separate pacing control, at least some conventional TCP approaches would permit bursts of overly rapid transmission of packets, which might result in packet loss at an intermediate node on the communication path. These packet losses may be effectively interpreted by the protocol as resulting from congestion, resulting in the protocol reducing the window size. However, the window size may be appropriate, for example, for the available bandwidth and delay of the path, and therefore reducing the window size may not be necessary. On the other hand, reducing the peak transmission rate can have the effect of avoiding packet loss, for example, by avoiding overflow of intermediate buffers on the path.

Another advantage of at least some implementations is prevention of large bursts of packet losses under convex window increase functions for high-bandwidth scenarios, by providing an additional finer level of control over the transmission process.

At least some implementations of the approach can leverage the advantages of existing high-bandwidth variants of TCP such as H-TCP and CUBIC, while preventing large bursts of packet losses under their convex window increase functions and providing a more precise level of control. For example, pacing control may be implemented to pace the rate of providing packets from the existing TCP procedure to the channel, with the existing TCP procedure typically further or separately limiting the presentation of packets to the communication channel based, for instance, on its window-based congestion control procedure.

In practice, a particular example in which separating pacing from window control has been observed to significantly outperform conventional TCP on 4G LTE.

Figure 22:
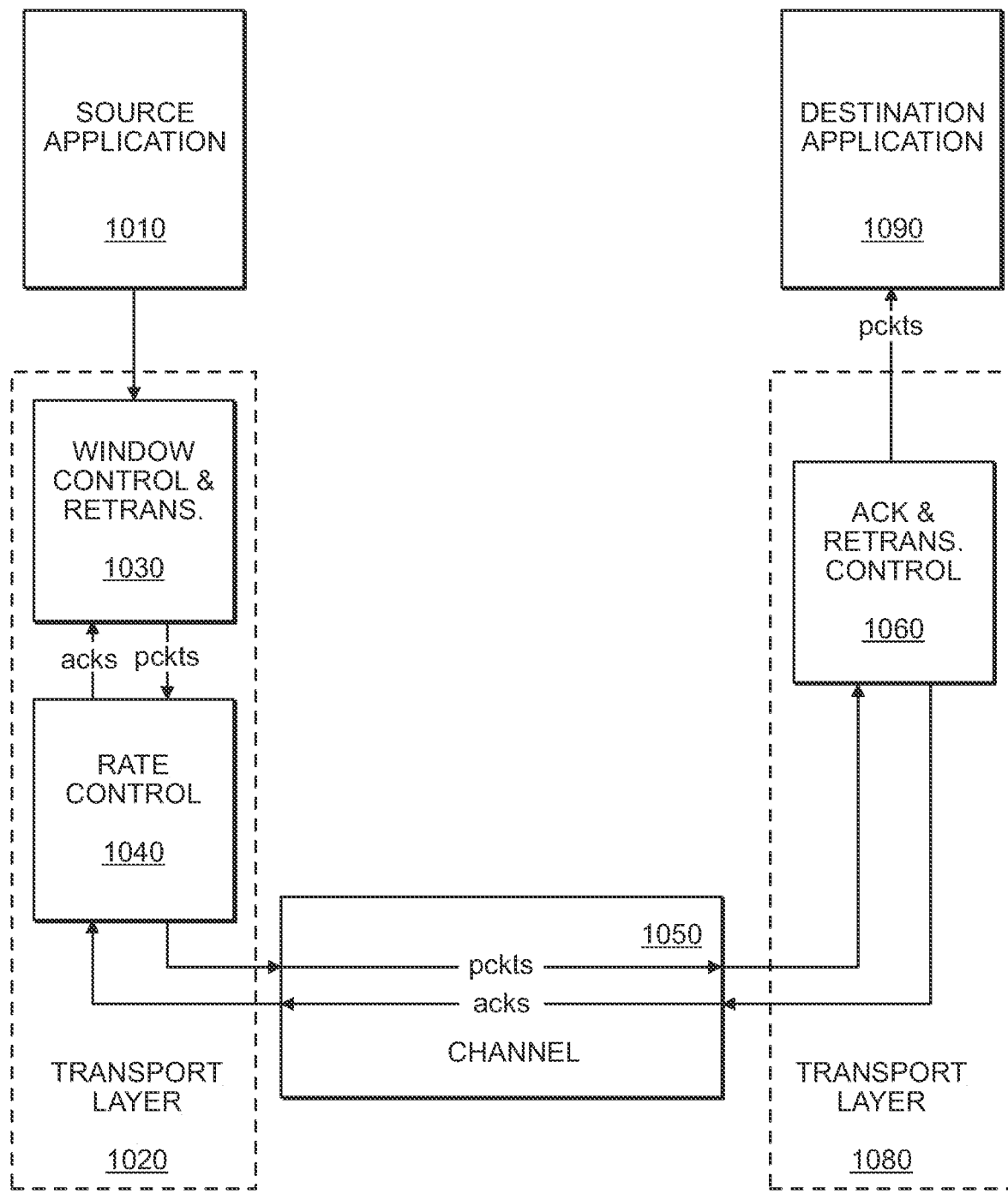
FIG. 22 is a block diagram of PC-TCP communication approach that includes window and rate control modules.

Referring to FIG. 22, in one example, a source application 1010 passes data to a destination application 1090 over a communication channel 1050. Communication from the source application 1010 passes to a transport layer 1020, which maintains a communication session with a corresponding transport layer 1080 linked to the destination application 1090. In general, the transport layers may be implemented as software that executes on the same computer as their corresponding applications, however, it should be recognized that, for instance, through the use of proxy approaches, the applications and the transport layer elements that are shown may be split over separate coupled computers. In embodiments, when a proxy is running on a separate machine or device from the application, the application may use the transport layer on its machine to communicate with the proxy layer.

In FIG. 22, the transport layer 1020 at the source application includes a window control and retransmission element 1030. In some implementations, this element implements a conventional Transport Control Protocol (TCP) approach, for instance, implementing H-TCP or CUBIC approaches. In other implementations, this element implements the novel congestion control algorithms described herein. The transport layer 1080 at the destination may implement a corresponding element 1060, which may provide acknowledgments of packets to the window control and retransmission element 1030 at the source. In general, element 1030 may implement a window-based congestion control approach based on acknowledgments that are received at the destination, however, it should be understood that no particular approach to window control is essential, and in some implementations, element 1030 can be substituted with another element that implements congestion control using approaches other than window control.

Functionally, one may consider two elements of the protocol as being loss recovery and rate/congestion control. Loss recovery can be implemented either using conventional retransmissions or using coding or as a combination of retransmission and coding. Rate/congestion control may aim to avoid overrunning the receiver and/or the available channel capacity, and may be implemented using window control with or without pacing, or direct rate control.

The channel 1050 coupling the transport layers, in general, may include lower layer protocol software at the source and destination, and a series of communication links coupling computers and other network nodes on a path from the source to the destination.

As compared to conventional approaches, as shown in FIG. 10, a rate control element 1040 may be on the path between the window control and retransmission element 1030 and the channel 1050. This rate control element may monitor acknowledgments that are received from the destination, and may pass them on to the window control and retransmission element 1030, generally without delay. The rate control element 1040 receives packets for transmission on the channel 1050 from the window control and retransmission element 1030, and either passes them directly to the channel 1050, or buffers them to limit a rate of transmission onto the channel. For example, the rate control element 1040 may require a minimum interval between successive packets, or may control an average rate over multiple packets.

In embodiments, the acks that are transmitted on a return channel, from the destination to the source, may also be paced, and may also utilize coding to recover from erasures and bursty losses. In embodiments, packet coding and transmission control of the acks may be especially useful if there is congestion on the return channel.

In one implementation, the rate control element 1040 may maintain an average (i.e., smoothed) inter-packet delivery interval, estimated based on the acknowledgment intervals (accounting for the number of packets acknowledged in each ack). In some implementations this averaging may be computed as a decaying average of past sample inter-arrival times. This can be refined by incorporating logic for discarding large sample values based on the determination of whether they are likely to have resulted from a gap in the sending times or losses in the packet stream, and by setting configurable upper and lower limits on the estimated interval commensurate with particular characteristics of different known networks. The rate control element 1040 may then use this smoothed inter-acknowledgment time to set a minimum inter-transmission time, for example, as a fraction of the inter-acknowledgment time. This fraction can be increased with packet loss and with rate of increase of RTT (which may be indicators that the current sending rate may be too high), and decreased with rate of decrease of RTT under low loss, e.g. using a control algorithm such as proportional control whose parameters can be adjusted to tradeoff between stability and responsiveness to change. Upper and lower limits on this fraction can be made configurable parameters, say 0.2 and 0.95. Transmission packets are then limited to be presented to the channel 1050 with inter-transmission times of at least this set minimum. In other implementations, inter-transmission intervals are controlled to maintain a smoothed average interval or rate based on a smoothed inter-acknowledgment interval or rate.

In addition to the short timescale adjustments of the pacing interval with estimated delivery interval, packet loss rate and RTT described above, there can also be a longer timescale control loop that modulates the overall aggressiveness of the pacing algorithm based on a smoothed loss rate calculated over a longer timescale, with, a higher loss rate indicating that pacing may be too aggressive. The longer timescale adjustment can be applied across short duration connections by having the client maintain state across successive connections and include initializing information in subsequent connection requests. This longer timescale control may be useful for improving adaptation to diverse network scenarios that change dynamically on different timescales.

Figure 23:
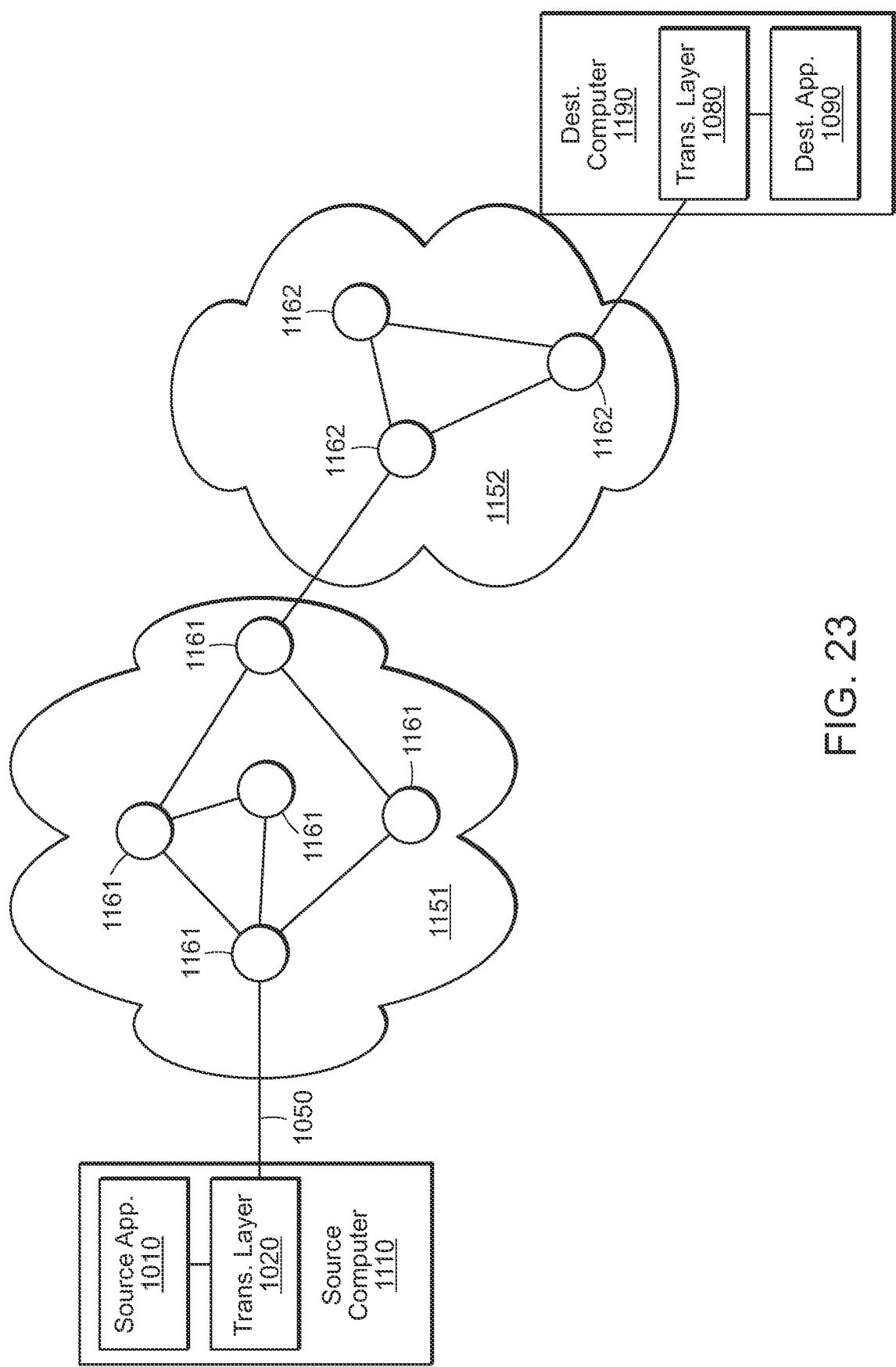
FIG. 23 is a schematic of a data network.

Referring to FIG. 23, in some implementations, the communication channel 1050 spans multiple nodes 1161, 1162 in one or an interconnection of communication networks 1151, 1152. In FIG. 11, the source application 1010 is illustrated as co-resident with the transport layer 1020 on a source computer 1110, and similarly, the transport layer 1080 is illustrated as co-resident on a destination computer 1190 with the destination application 1090.

It should be recognized that although the description above focuses on a single direction of communication, in general, a bidirectional implementation would include a corresponding path from the destination application to the source application. In some implementations, both directions include corresponding rate control elements 1040, while in other applications, only one direction (e.g., from the source to the destination application) may implement the rate control. For example, introduction of the rate control element 1040 at a server, or another device or network node on the path between the source application and the transport layer 1080 at the destination, may not require modification of the software at the destination.

3.6.2.2 Pacing by Receiver

As described above, the sender can use acks to estimate the rate/interval with which packets are reaching the receiver, the loss rate and the rate of change of RTT, and adjust the pacing interval accordingly. However, this estimated information may be noisy if acks are lost or delayed. On the other hand, such information can be estimated more accurately at the receiver with OWTT in place of RTT. By basing the pacing interval on the rate of change of OWTT rather than its actual value, the need for synchronized clocks on sender and receiver may be obviated. The pacing interval can be fed back to the sender by including it as an additional field in the acks. The choice as to whether the pacing calculations are done at the sender or the receiver, or done every n packets rather than upon every packet reception, may also be affected by considerations of sender/receiver CPU/load.

3.7 Error Control

Classical TCP performs poorly on networks with packet losses. Congestion control can be combined with coding such that coded packets are sent both for forward error correction (FEC) to provide protection against an anticipated level of packet loss, as well as for recovering from actual losses indicated by feedback from the receiver.

While the simple combination of packet coding and congestion control has been suggested previously, the prior art does not adequately account for differences between congestion-related losses, bursty and/or random packet losses. Since congestion-related loss may occur as relatively infrequent bursts, it may be inefficient to protect against this type of loss using FEC.

In at least some embodiments, the rates at which loss events occur are estimated. A loss event may be defined as either an isolated packet loss or a burst of consecutive packet losses. In some examples, the source PC-TCP may send FEC packets at the estimated rate of loss events, rather than the estimated rate of packet loss. This embodiment is an efficient way to reduce non-useful FEC packets, since it may not be disproportionately affected by congestion-related loss.

In an exemplary embodiment, the code rate and/or packet transmission rate of FEC can be made tunable in order to trade-off between the useful throughput seen at the application layer (also referred to as goodput) and recovery delay. For instance, the ratio of the FEC rate to the estimated rate of loss events can be made a tunable parameter that is set with a priori knowledge of the underlying communications paths or dynamically adjusted by making certain measurements of the underlying communications paths.

In another exemplary embodiment, the rate at which loss bursts of up to a certain length occur may be estimated, and appropriate burst error correcting codes for FEC, or codes that correct combinations of burst and isolated errors, may be used.

In another exemplary embodiment, the FEC for different blocks can be interleaved to be more effective against bursty loss.

In other exemplary embodiments, data packets can be sent preferentially over FEC packets. For instance, FEC packets can be sent at a configured rate or estimated loss rate when there are no data packets to be sent, and either not sent or sent at a reduced rate when there are data packets to be sent. In one implementation, FEC packets are placed in a separate queue which is cleared when there are data packets to be sent.

In other exemplary embodiments, the code rate/amount of FEC in each block and/or the FEC packet transmission rate can be made a tunable function of the block number and/or the number of packets in flight relative to the number of unacknowledged degrees of freedom of the block, in addition to the estimated loss rate. FEC packets for later blocks can be sent preferentially over FEC for earlier blocks, so as to minimize recovery delay at the end of a connection, e.g., the number of FEC packets sent from each block can be a tunable function of the number of blocks from the latest block that has not been fully acknowledged. The sending interval between FEC packets can be an increasing function of the number of packets in flight relative to the number of unacknowledged degrees of freedom of the corresponding block, so as to trade-off between sending delay and probability of losing FEC packets in scenarios where packet loss probability increases with transmission rate.

In other exemplary embodiments, a variable randomly chosen fraction of the coding coefficients of a coded packet can be set to 1 or 0 in order to reduce encoding complexity without substantially affecting erasure correction performance. In a systematic code, introducing 0 coefficients only after one or more densely coded packets (i.e. no or few 0 coefficients) may be important for erasure correction performance. For instance, an initial FEC packet in a block could have each coefficient set to 1 with probability 0.5 and to a uniformly random value from the coding field with probability 0.5. Subsequent FEC packets in the block could have each coefficient set to 0 with probability 0.5 and to uniformly random value with probability 0.5.

3.7.1 Packet Reordering

As introduced above, packets may be received out of order on some networks, for example, due to packets traversing multiple paths, parallel processing in some networking equipment, reconfiguration of a path (e.g., handoff in cellular networks). Generally, conventional TCP reacts to out of order packets by backing off the size of the congestion window. Such a back-off may unnecessarily hurt performance if there is no congestion necessitating a back-off.

In some embodiments, in an approach to handling packet reordering that does not result from congestions, a receiver observing a gap in the sequence numbers of its received packets may delay sending an acknowledgment for a limited time. When a packet is missing, the receiver does not immediately know if the packet has been lost (erased), or merely reordered. The receiver delays sending an acknowledgment that indicates the gap to see if the gap is filled by subsequent packet arrivals. In some examples, upon observing a gap, the receiver starts a first timer for a configurable "reordering detection" time interval, e.g. 20 ms. If a packet from the gap is subsequently received within this time interval, the receiver starts a second timer for a configurable "gap filling" time interval, e.g. 30 ms. If the first timer or the second timer expire prior to the gap being filled, an acknowledgment that indicates the gap is sent to the source.

Upon receiving the acknowledgment that indicates the gap in received packets the source, in at least some embodiments, the sender determines whether a repair packet should be sent to compensate for the gap in the received packets, for example, if a sufficient number of FEC packets have not already been sent.

In another aspect, a sender may store relevant congestion control state information (including the congestion window) prior to back-off, and a record of recent packet losses. If the sender receives an ack reporting a gap/loss and then subsequently one or more other acks reporting that the gap has been filled by out of order packet receptions, any back-off caused by the earlier ack can be reverted by restoring the stored state from before back-off.

In another aspect, a sender observing a gap in the sequence numbers of its received acks may delay congestion window back-off for a limited time. When an ack is missing, the sender does not immediately know if a packet has been lost or if the ack is merely reordered. The sender delays backing off its congestion window to see if the gap is filled by subsequent ack arrivals. In some examples, upon observing a gap, the sender starts a first timer for a configurable "reordering detection" time interval, e.g. 20 ms. If an ack from the gap is subsequently received within this time interval, the sender starts a second timer for a configurable "gap filling" time interval, e.g. 30 ms. If the first timer or the second timer expire prior to the gap being filled, congestion window back-off occurs In some examples, instead of using time intervals, packet sequence numbers are used. For example, sending of an ack can be delayed until a packet which is a specified number of sequence numbers ahead of the reference lost packet is received. Similarly, backing off can be delayed until an acknowledgment of a packet which is a specified number of sequence numbers ahead of the reference lost packet is received. In some examples, these approaches have the advantage of being able to take into account subsequently received/acknowledged reordered packets by shifting the sequence number of the reference lost packet as holes in the packet sequence get filled.

These methods for correcting packet reordering may be especially useful for multipath versions of the protocol, where there may be a large amount of reordering.

3.7.2 Acknowledgments
3.7.2.1 Delayed Acknowledgments

In at least some implementations, conventional TCP sends one acknowledgment for every two data packets received. Such delayed acking reduces ack traffic compared to sending an acknowledgment for every data packet. This reduction in ack traffic is particularly beneficial when there is contention on the return channel, such as in Wi-Fi networks, where both data and ack transmissions contend for the same channel.

It is possible to reduce ack traffic further by increasing the ack interval to a value n>2, i.e. sending one acknowledgment for every n data packets. However, reducing the frequency with which acks are received by the sender can cause delays in transmission (when the congestion window is full) or back-off (if feedback on losses is delayed), which can hurt performance.

In one aspect, the sender can determine whether, or to what extent, delayed acking should be allowed based in part on its remaining congestion window (i.e. its congestion window minus the number of unacknowledged packets in flight), and/or its remaining data to be sent. For example, delayed acking can be disallowed if there is any packet loss, or if the remaining congestion window is below some (possibly tunable) threshold. Alternatively, the ack interval can be reduced with the remaining congestion window. As another example, delayed acking can be allowed if the amount of remaining data to be sent is smaller than the remaining congestion window, but disallowed for the last remaining data packet so that there is no delay in acknowledging the last data packet. This information can be sent in the data packets as a flag indicating whether delayed acking is allowed, or for example, as an integer indicating the allowed ack interval.

Using relevant state information at the sender to influence delayed acking may allow an increase in the ack interval beyond the conventional value of 2, while mitigating the drawbacks described above that a larger ack interval across the board might have.

To additionally limit the ack delay, each time an ack is sent, a delayed ack timer can be set to expire with a configured delay, say 25 ms. Upon expiration of the timer, any data packets received since the last ack may be acknowledged, even if fewer packets than the ack interval n have arrived. If no packets have been received since the last ack, an ack may be sent upon receipt of the next data packet.

3.8 Parameter Control
3.8.1 Initialization

In some embodiments, to establish a session parameters for the PC-TCP modules are set to a predefined set of default parameters. In other embodiments, approaches that attempt to select better initial parameters are used. Approaches include use of parameter values from other concurrent or prior PC-TCP sessions, parameters determined from characteristics of the communication channel, for example, selected from stored parameters associated with different types of channels, or parameters determined by the source or destination application according to the nature of the data to be transported (e.g., batch versus stream).

3.8.2 Tunable Coding

Figure 24:
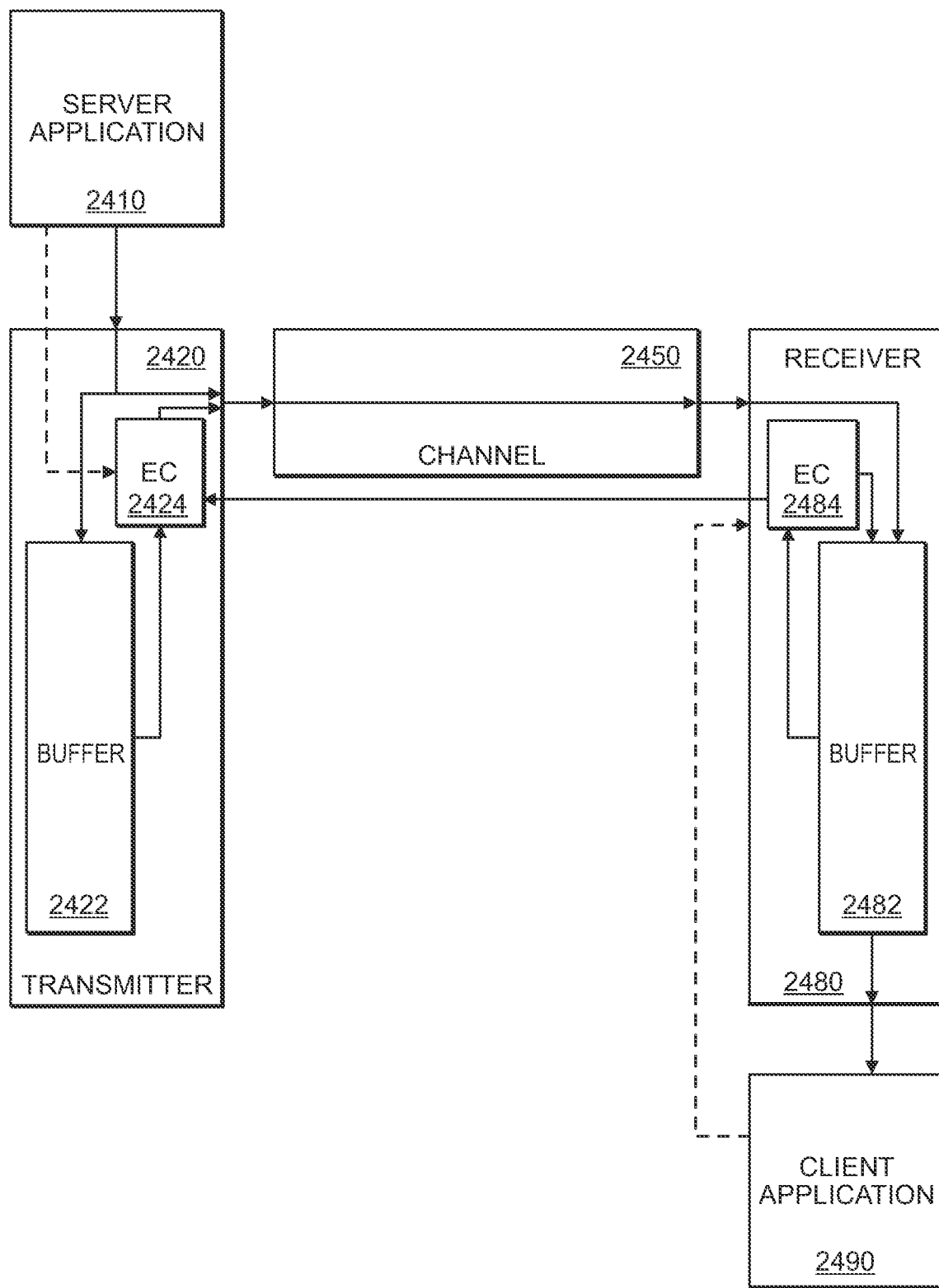
FIGS. 24-27 are block diagrams illustrating an embodiment PC-TCP communication approach that is configured according to a number of tunable parameters.

Referring to FIG. 24, in an embodiment in which parameters are "tuned" (e.g., through feedback from a receiver or on other considerations) a server application 2410 is in communication with a client application 2490 via a communication channel 2450. In one example, the server application 2410 may provide a data stream encoding multimedia content (e.g., a video) that is accepted by the client application 2490, for example, for presentation to a user of the device on which the client application is executing. The channel 2450 may represent what is typically a series of network links, for example including links of one or more types, including:
 a link traversing private links on a server local area network,
 a link traversing the public Internet,
 a link traversing a fixed (i.e., wireline) portion of a cellular telephone network,
 and a link traversing a wireless radio channel to the user's device (e.g., a cellular telephone channel or satellite link or wireless LAN).

The channel 2450 may be treated as carrying a series of data units, which may but do not necessarily correspond directly to Internet Protocol (IP) packets. For example, in some implementations multiple data units are concatenated into an IP packet, while in other implementations, each data unit uses a separate IP packet or only part of an IP packet. It should be understood that in yet other implementations, the Internet Protocol is not used—the techniques described below do not depend on the method of passing the data units over the channel 2450.

A transmitter 2420 couples the server application 2410 to the channel 2450, and a receiver 2480 couples the channel 2450 to the client application 2490. Generally, the transmitter 2420 accepts input data units from the server application 2480. In general, these data units are passed over the channel 2450, as well as retained for a period of time in a buffer 2422. From time to time, an error control (EC) component 2424 may compute a redundancy data unit from a subset of the retained input data units in the buffer 2422, and may pass that redundancy data unit over the channel 2450. The receiver 2480 accepts data units from the channel 2450. In general, the channel 2450 may erase and reorder the data units. Erasures may correspond to "dropped" data units that are never received at the receiver, as well as corrupted data units that are received, but are known to have irrecoverable errors, and therefore are treated for the most part as dropped units. The receiver may retain a history of received input data units and redundancy data units in a buffer 2482. An error control component 2484 at the receiver 2480 may use the received redundancy data units to reconstruct erased input data units that may be missing in the sequence received over the channel. The receiver 2480 may pass the received and reconstructed input data units to the client application. In general, the receiver may pass these input data units to the client application in the order they were received at the transmitter.

In general, if the channel has no erasures or reordering, the receiver can provide the input data units to the client application with delay and delay variation that may result from traversal characteristics of the channel. When data units are erased in the channel 2450, the receiver 2480 may make use of the redundancy units in its buffer 2482 to reconstruct the erased units. In order to do so, the receiver may have to wait for the arrival of the redundancy units that may be useful for the reconstruction. The way the transmitter computes and introduces the redundancy data units generally affects the delay that may be introduced to perform the reconstruction.

The way the transmitter computes and introduces the redundancy data units as part of its forward error correction function can also affect the complexity of the reconstruction process at the receiver, and the utilization of the channel. Furthermore, regardless of the nature of the way the transmitter introduces the redundancy data units onto the channel, statistically, there may be erased data units for which there is insufficient information in the redundancy data units to reconstruct the erased unit. In such cases, the error control component 2484 may request a retransmission of information from the error control component 2424 of the transmitter 2420. In general, this retransmitted information may take the form of further redundancy information that depends on the erased unit. This retransmission process introduces a delay before the erased unit is available to the receiver. Therefore, the way the transmitter introduces the redundancy information also affects the statistics such as how often retransmission of information needs to be requested, and with it the delay in reconstructing the erased unit that cannot be reconstructed using the normally introduced redundancy information.

In some embodiments, the error control component 2484 may provide information to the error control component 2424 to affect the way the transmitter introduces the redundancy information. In general, this information may be based on one or more of the rate of (or more generally the pattern of) erasures on units on the channel, rate of (or more generally timing pattern of) and the state of the available units in the buffer 2482 and/or the state of unused data in the client application 2490. For example, the client application may provide a "play-out time" (e.g., in milliseconds) of the data units that the receiver has already provided to the client application such that if the receiver were to not send any more units, the client application would be "starved" for input units at that time. Note that in other embodiments, rather than or in addition to receiving information from the receiver, the error control component 2424 at the transmitter may get feedback from other places, for example, from instrumented nodes in the network that pass back congestion information.

Figure 25:
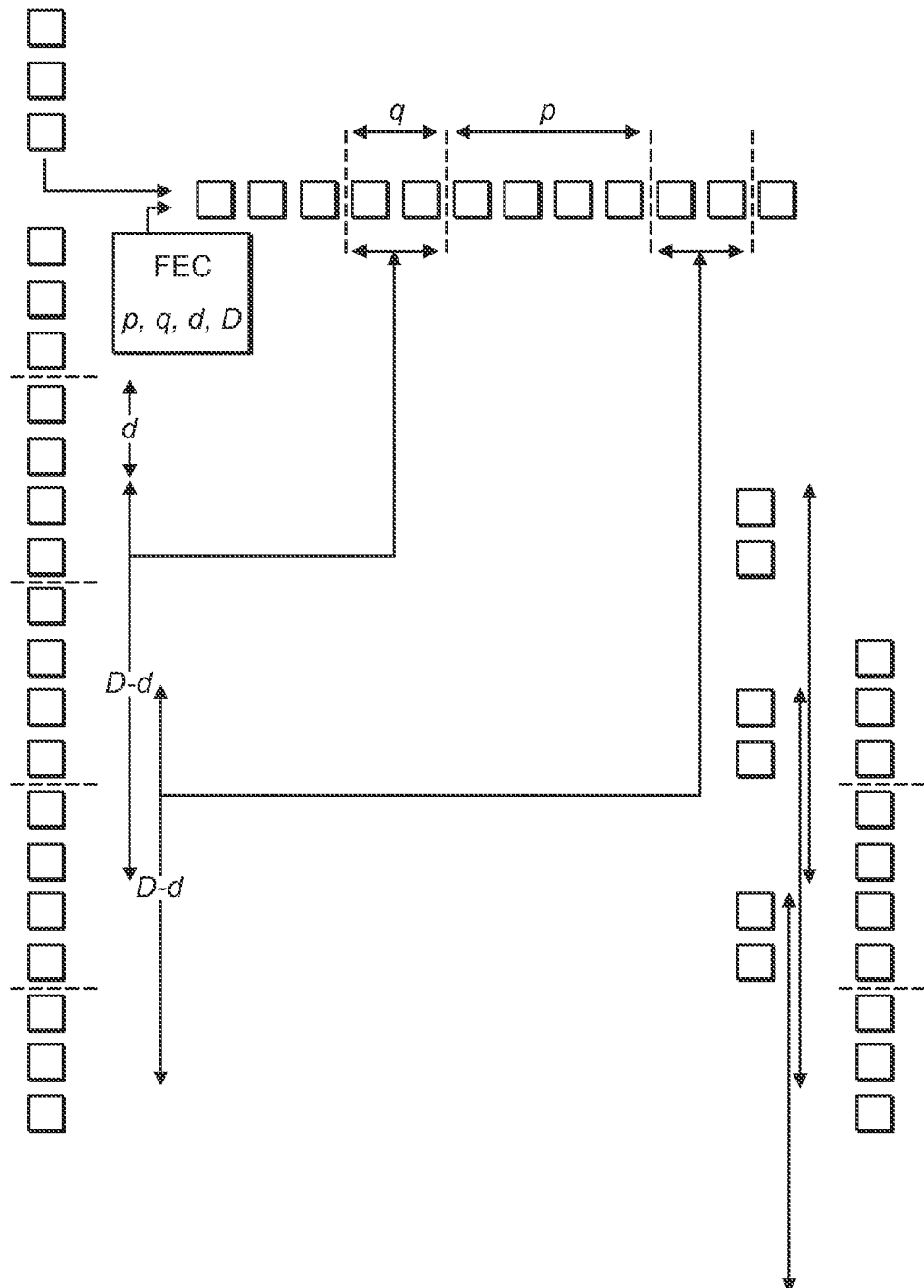

Referring to FIG. 25, a set of exemplary ways that the transmitter introduces the redundancy data units into the stream of units passed over the channel makes use of alternating runs of input data units and redundancy data units. In FIG. 25, the data units that are "in flight" on the channel 2450 are illustrated passing from left to right in the figure. The transmitter introduces the units onto the channel as sequences of p input units alternating with sequences of q redundancy units. Assuming that the data units are the same sizes, this corresponds to a rate $R=p/(p+q)$ code. In an example with $p=4$ and $q=2$ and the code has rate $R=2/3$.

In a number of embodiments, the redundancy units are computed as random linear combinations of past input units. Although the description below focuses on such approaches, it should be understood that the overall approach is applicable to other computations of redundancy information, for example, using low density parity check (LDPC) codes and other error correction codes. In the approach shown in FIG. 25, each run of q redundancy units is computed as a function of the previous D input units, wherein general but not necessarily $D>p$. In some cases, the most recent d data units transmitted are not used, and therefore the redundancy data units are computed from a window of D−d input data units. In FIG. 25, $d=2$, $D=10$, and $D-d=8$. Note that because $D-d>p$, the windows of input data units used for computation of the successive runs of redundancy units overlap, such that any particular input data unit will, in general, contribute to redundancy data units in more than one of the runs of q units on the channel.

In FIG. 25, as well as in FIGS. 26-27 discussed below, buffered input data units (i.e., in buffer 2422 shown in FIG. 24) are shown on the left with time running from the bottom (past) to the top (future), with each set of D−d units used to compute a run of q redundant units illustrated with arrows. The sequence of transmitted units, consisting of runs of input data units alternating with runs of redundant units, is shown with time running from right to left (i.e., later packets on the left). Data units that have been received and buffered at the receiver are shown on the right (oldest on the bottom), redundant units computed from runs of D-d input units indicated next to arrows representing the ranges of input data units used to compute those data units. Data units and ranges of input data units that have not yet been received are illustrated using dashed lines.

Figure 26:
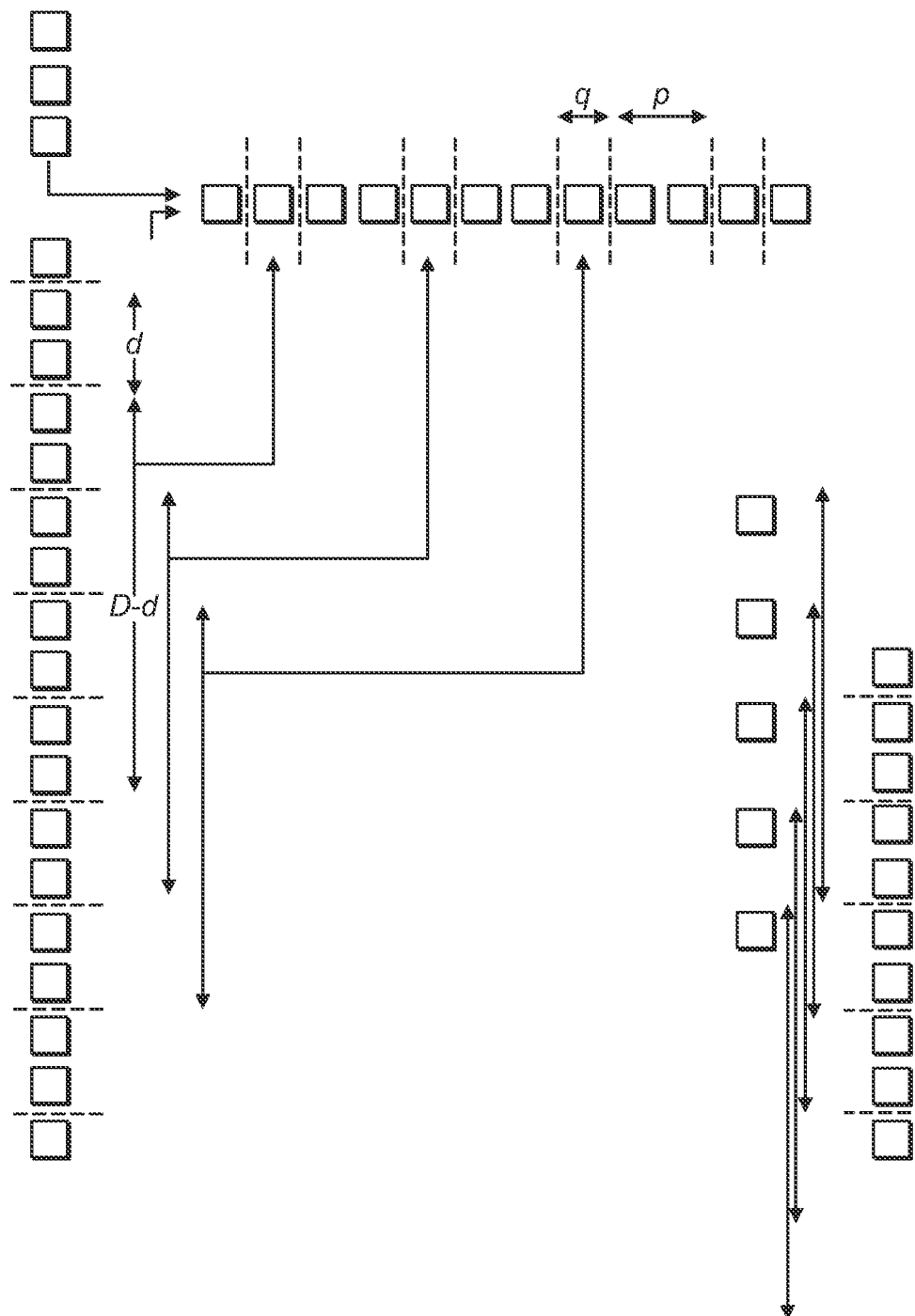
Figure 27:
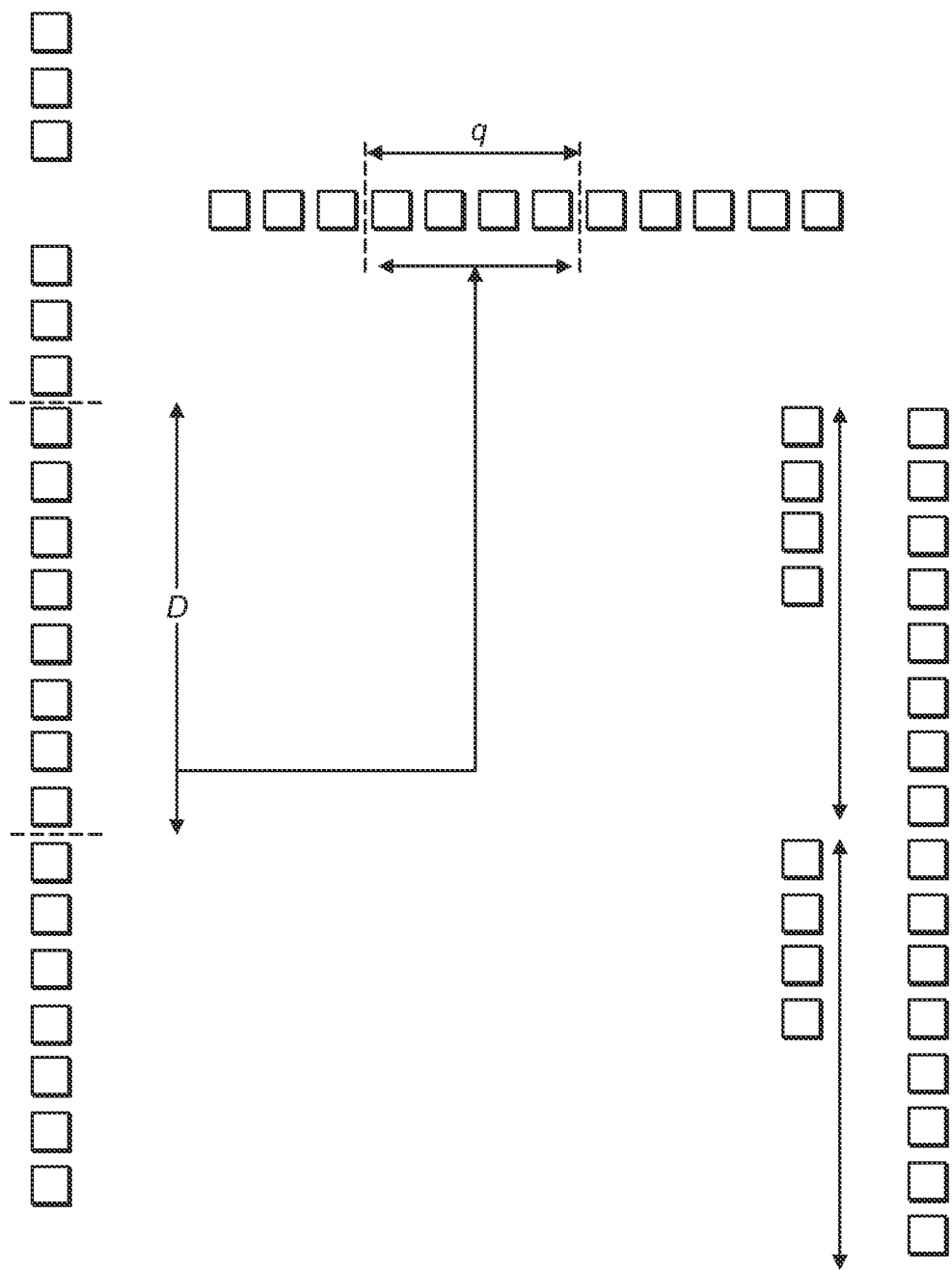

FIGS. 26 and 27 show different selections of parameters. In FIG. 26, $p=2$ and $q=1$ and the code has a rate $R=2/3$, which is the same rate at the selection of parameters in FIG. 25. Also as in the FIG. 52 selection, $d=2$, $D=10$, and $D-d=8$. Therefore, a difference between FIG. 25 and FIG. 26 is not necessarily a degree of forward error protection (although the effect of burst erasures may be somewhat different in the two cases). More importantly, the arrangement in FIG. 26 generally provides a lower delay from the time of an erased data unit to the arrival of redundancy information to reconstruct that unit, as compared to the arrangement in FIG. 25. On the other hand, the complexity of processing at the receiver may be greater in the arrangement of FIG. 26 as compared to the arrangement of FIG. 24, in part because redundancy units information uses multiple different subsets of the input data units, which may require more computation when reconstructing an erased data unit. Turning to FIG. 27, at another extreme, a selection of parameters uses longer blocks with a selection $D=8$ and $q=4$. Again, this code has a rate $R=2/3$. In general, this selection of parameters will incur greater delay in reconstruction of an erased data unit as compared to the selections of parameters shown in FIGS. 25 and 26. On the other hand, reconstruction of up to four erasures per block of $D=8$ input data units is relatively less complex than would be required by the selections shown in FIGS. 25 and 26.

For a particular rate of code (e.g., rate $R=2/3$), in an example, feedback received may result in changes of the parameters, for example, between (p,q)=(2,1) or (4,2) or (8,4) depending on of the amount of data buffered at the receiver, and therefore depending on the tolerance of the receiver to reconstruction delay.

Note that it is not required that q=p(1−R)/R is an integer, as it is in the examples shown in FIGS. 25-27. In some embodiments, the length of the run of redundant units varies between q=⌈p(1−R)/R⌉ and q=⌊P(1−R)/R⌋ so that the average is ave(q)=p(1−R)/R.

In a variant of the approach described above, different input data units have different "priorities" or "importances" such that they are protected to different degrees than other input data units. For example, in video coding, data units representing an independently coded video frame may be more important than data units representing a differentially encoded video frame. For example, if the priority levels are indexed i=1, 2, . . . , then a proportion $\rho_i \leq 1$, where $\Sigma_i \rho_i = 1$, of the redundancy data units may be computed using data units with priority≤i. For example, for a rate R code, with blocks of input data units of length p, on average $\rho_i$ p(1−R)/R redundancy data units per block are computed from input data units with priority≤i.

The value of D should generally be no more than the target playout delay of the streaming application minus an appropriate margin for communication delay variability. The playout delay is the delay between the time a message packet is transmitted and the time it should be available at the receiver to produce the streaming application output. It can be expressed in units of time, or in terms of the number of packets transmitted in that interval. D can be initially set based on the typical or desired playout delay of the streaming application, and adapted with additional information from the receiver/application. Furthermore, choosing a smaller value reduces the memory and complexity at the expense of erasure correction capability.

The parameter d specifies the minimum separation between a message packet and a parity involving that message packet. Since a parity involving a message packet that has not yet been received is not useful for recovering earlier message packets involved in that parity, setting a minimum parity delay can improve decoding delay when packet reordering is expected/observed to occur, depending partly also on the parity interval.

Figure 28:
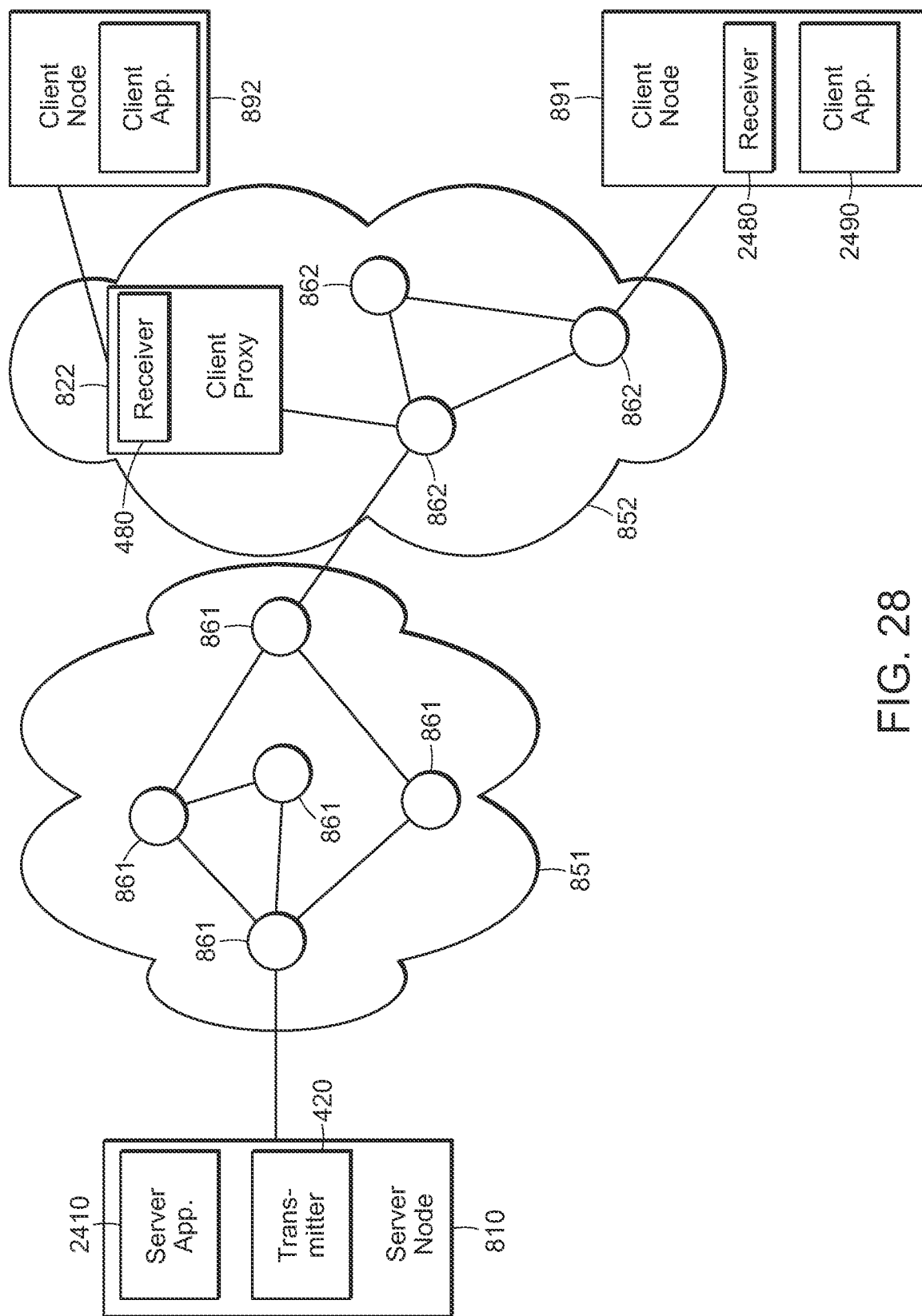
FIG. 28 is a diagram showing a network communication system using the approach of FIGS. 24-27.

Referring to FIG. 28, in an example implementation making use of the approaches described above, the server application 2410 is hosted with the transmitter 2420 at a server node 810, and the client application 2490 is hosted at one or a number of client nodes 891 and 892. Although a wide variety of types of data may be transported using the approaches described above, one example is streaming of encoded multimedia (e.g., video and audio) data. The communication channel 2450 (see FIG. 24) is made up in this illustration as a path through one or more networks 851-852 via nodes 861-862 in those respective networks. In some implementations, the receiver is hosted at a client node 891 being hosted on the same device as the client application 490.

3.8.3 Cross-Session Parameter Control

In some embodiments, the control of transport layer sessions uses information across connections, for example, across concurrent sessions or across sessions occurring at different times.

Standard TCP implements end-to-end congestion control based on acknowledgments. A new TCP connection that has started up but not yet received any acknowledgments uses initial configurable values for the congestion window and retransmission timeout. These values may be tuned for different types of network settings.

Some applications, for instance web browser applications, may use multiple connections between a client application (e.g., the browser) and a server application (e.g., a particular web server application at a particular server computer). Conventionally, when accessing the information to render a single web "page", the client application may make many separate TCP sessions between the client and server computers, and using conventional TCP control, each session is controlled substantially independently. This independent control includes separate congestion control.

One approach to addressing technical problems that are introduced by having such multiple sessions is the SPDY Protocol (see, e.g., SPDY Protocol—Draft 3.1, accessible at http://www.chromium.org/spdy/spdy-protocol/spdy-protocol-draft3-1). The SPDY protocol is an application layer protocol that manipulates HTTP traffic, with particular goals of reducing web page load latency and improving web security. Generally, SPDY effectively provides a tunnel for the HTTP and HTTPS protocols. When sent over SPDY, HTTP requests are processed, tokenized, simplified and compressed. The resulting traffic is then sent over a single TCP session, thereby avoiding problems and inefficiencies involved in use of multiple concurrent TCP sessions between a particular client and server computer.

In a general aspect, a communication system maintains information related to communication between computers or network nodes. For example, the maintained information can include bandwidth to and/or from the other computer, current or past congestion window sizes, pacing intervals, packet loss rates, round-trip time, timing variability, etc. The information can include information for currently active sessions and/or information about past sessions. One use of the maintained information may be to initialize protocol parameters for a new session between computers for which information has been maintained. For example, the congestion window size or a pacing rate for a new TCP or UDP session may be initialized based on the congestion window size, pacing interval, round-trip time and loss rate of other concurrent or past sessions.

Figure 29:
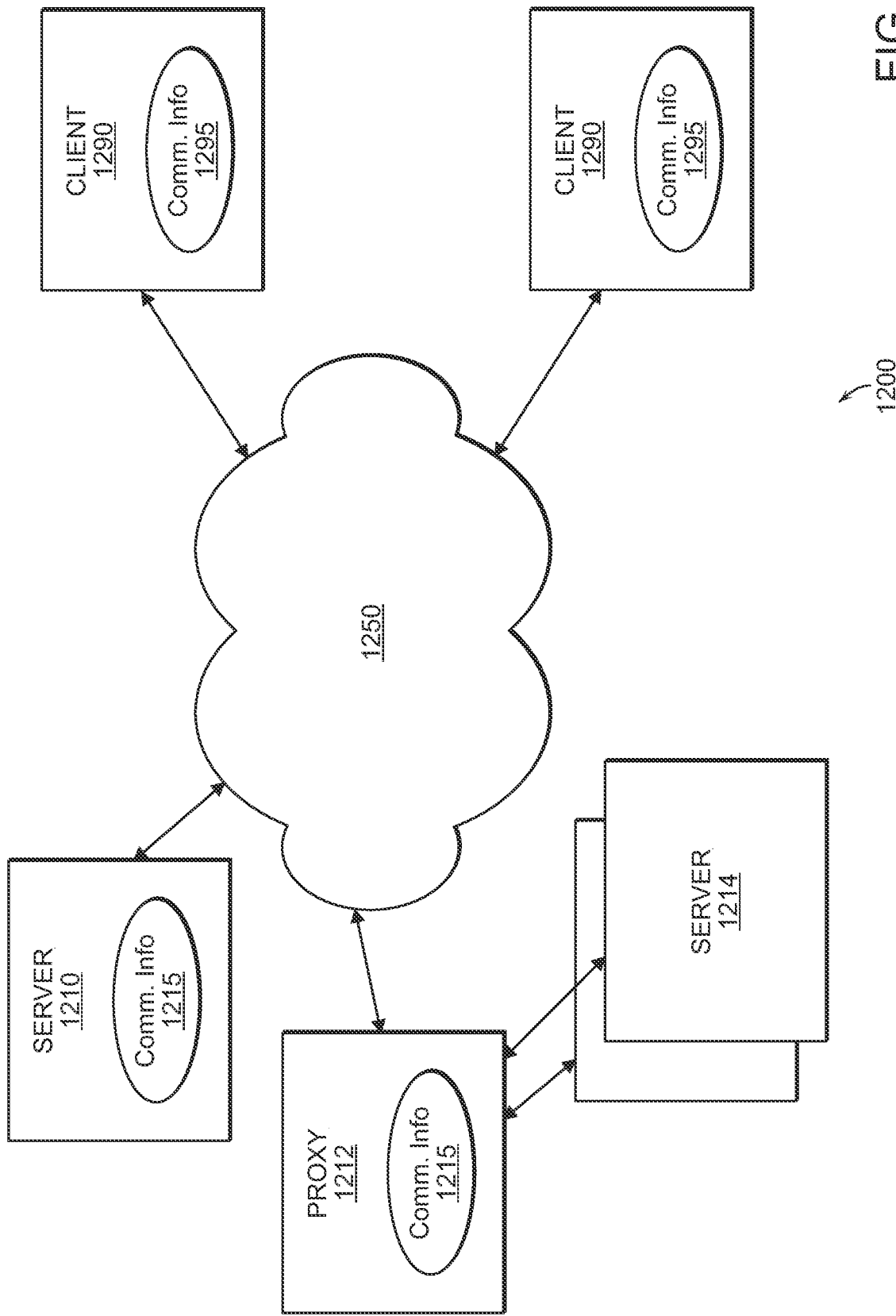
FIG. 29 is a schematic diagram illustrating use of stored communication parameters.

Referring to FIG. 29, communication system 1200 maintains information regarding communication sessions between endpoints. For example, these communication sessions pass via a network 1250, and may pass between a server 1210, or a proxy 1212 serving one or more servers 1214, and a client 1290. In various embodiments, this information may be saved in various locations. In some implementations, a client 1290 maintains information about current or past connections. This information may be specific to a particular server 1210 or proxy 1212. This information may also include aggregated information. For example, in the case of a smartphone on a cellular telephone network, some of the information may be generic to connections from multiple servers and may represent characteristics imposed by the cellular network rather than a particular path to a server 1210. In some implementations, a server 1210 or proxy 1212 may maintain the information based on its past communication with particular clients 1290. In some examples, the clients and servers may exchange the information such that is it distributed throughout the system 1200. In some implementations, the information may be maintained in databases that are not themselves endpoints for the communication sessions. For instance, it may be beneficial for a client without relevant stored information to retrieve information from an external database.

In one use scenario, when a client 1290 seeks to establish a communication session (e.g., a transport layer protocol session), it consults its communication information 1295 to see if it has current information that is relevant to the session it seeks to establish. For example, the client may have other concurrent sessions with a server with which it wants to communicate, or with which it may have recently had such sessions. As another example, the client 1290 may use information about other concurrent or past sessions with other servers. When the client 1290 sends a request to a server 1210 or a proxy 1212 to establish a session, relevant information for that session is also made available to one or both of the endpoints establishing the session. There are various ways in which the information may be made available to the server. For example, the information may be included with the request itself. As another example, the server may request the information if it does not already hold the information in its communication information 1215. As another example, the server may request the information from a remote or third party database, which has been populated with information from the client or from servers that have communicated with the client. In any case, the communication session between the client and the server is established using parameters that are determined at least in part by the communication information available at the client and/or server.

In some examples, the communication session may be established using initial values of packet pacing interval, congestion window, retransmission timeout and forward error correction. Initial values suitable for different types of networks (e.g. Wi-Fi, 4G), network operators and signal strength can be prespecified, and/or initial values for successive connections can be derived from measured statistics of earlier connections between the same endpoints in the same direction. For example:

- The initial congestion window can be increased from its default value if the packet throughput of the previous connection is sufficiently larger than the ratio of the default initial congestion window to the minimum round-trip time of the previous connection. The congestion window can subsequently be adjusted downwards if the initially received acks from the new connection indicate that the available rate has decreased compared to the previous connection.
- The initial pacing interval can be set e.g. as MAX (k1*congestion window/previous round-trip time, k2/previous packet throughput), where k1 and k2 are configurable parameters, or, with receiver pacing, as k* previous pacing interval, where k increases with the loss rate of the previous connection.
- Forward error correction parameters such as code rate can be set as k*previous loss rate, where k is a configurable parameter. The initial retransmission timeout can be increased from its default value if the minimum round-trip time of the previous connection is larger.

3.9 Multi-Path

Figure 30:
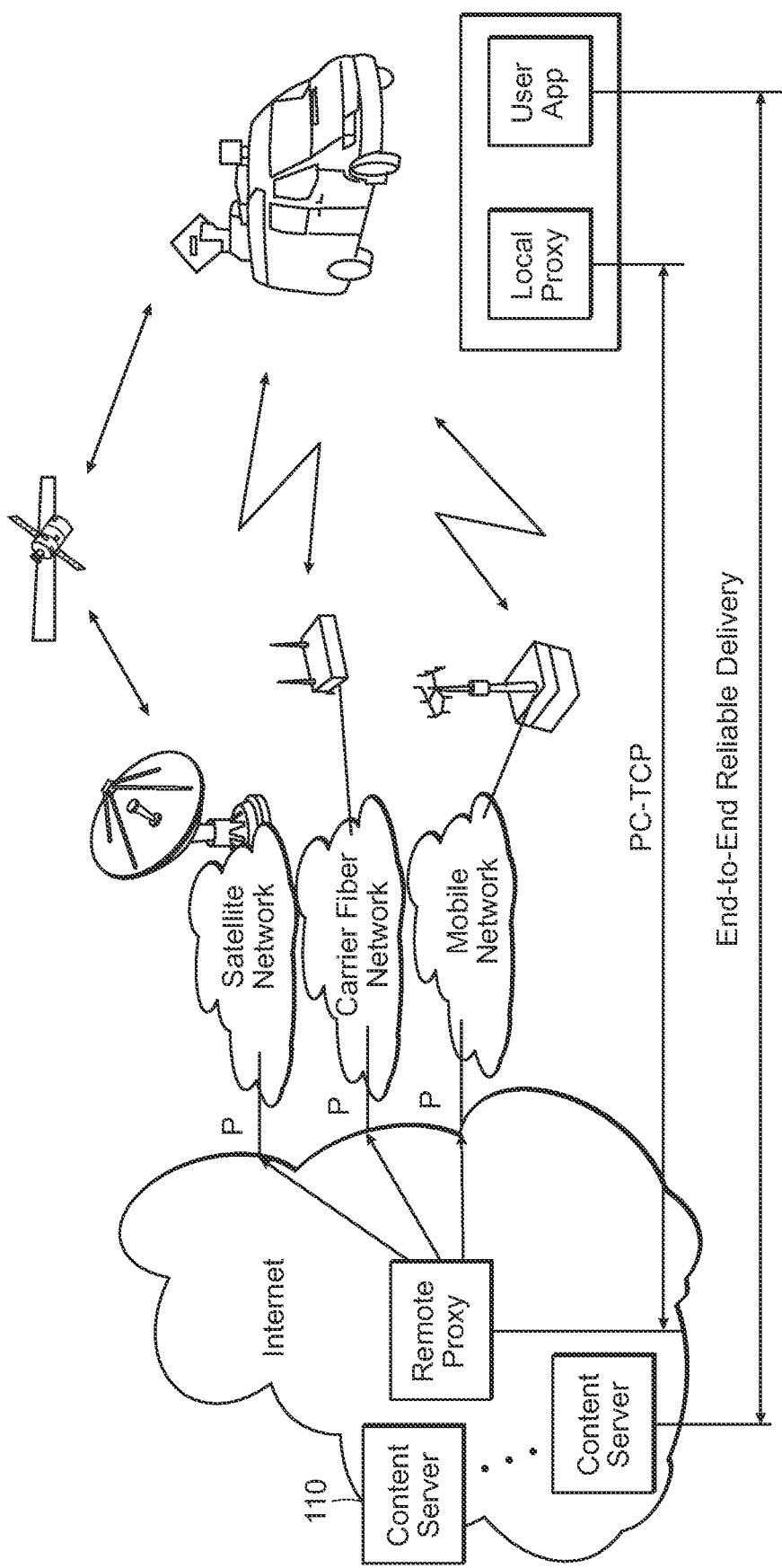
FIG. 30 is a schematic diagram illustrating a first embodiment of multi-path content delivery.

FIG. 30 shows the use of multiple paths between the server and client to deliver the packet information. These multiple paths may be over similar or different network technologies with similar or different average bandwidth, round trip delay, packet jitter rate, packet loss rate and cost. Examples of multiple paths include wired/fiber networks, geostationary, medium and low earth orbit satellites, WiFi, and cellular networks. In this example, the transmission control layer can utilize a single session to distribute the N packets in the block being transmitted over the multiple paths according to a variety of metrics (average bandwidth of each path, round trip delay of each path, packet jitter rate, packet loss rate of each path, and cost). The N packets to be transmitted in each block can be spread across each path in a manner that optimizes the overall end-to-end throughput and costs between server and client. The number of packets sent on each path can be dynamically controlled such that the average relative proportions of packets sent on each path are in accordance with the average relative available bandwidths of the paths, e.g. using back pressure-type control whereby packets are scheduled so as to approximately equalize queue lengths associated with the different paths.

For each path, the algorithms described above that embody transmission and congestion control, forward error correction, sender based pacing, receiver based pacing, stream based parameter tuning, detection and correction for missing and out of order packets, use of information across multiple TCP connections, fast connection start and stop, TCP/UDP fallback, cascaded coding, recoding by intermediate nodes, and coding of the ACKs can be employed to improve the overall end-to-end throughput over the multiple paths between the source node and destination node. When losses are detected and FEC is used, the extra coded packets can be sent over any or all of the paths. For instance, coded packets sent to repair losses can be sent preferentially over lower latency paths to reduce recovery delay. The destination node will decode any N of packets that are received over all of the paths and assemble them into a block of N original packets by recreating any missing packets from the ones received. If less than N different coded packets are received across all paths, then the destination node will request the number of missing packets x where x=N−number of packets received be retransmitted. Any set of x different coded packet can be retransmitted over any path and then used to reconstruct the missing packets in the block of N.

When there are networks with large differences in round trip time (RTT) latencies, the packets received over the lower RTT latencies will need to be buffered at the receiver in order to be combined with the higher RTT latency packets. The choice of packets sent on each path can be controlled so as to reduce the extent of reordering and associated buffering on the receiver side, e.g. among the packets available to be sent, earlier packets can be sent preferentially on higher latency paths and later packets can be sent preferentially on lower latency paths.

Individual congestion control loops may be employed on each path to adapt to the available bandwidth and congestion on the path. An additional overall congestion control loop may be employed to control the total sending window or rate across all the paths of a multi-path connection, for fairness with single-path connections.

Figure 31A:
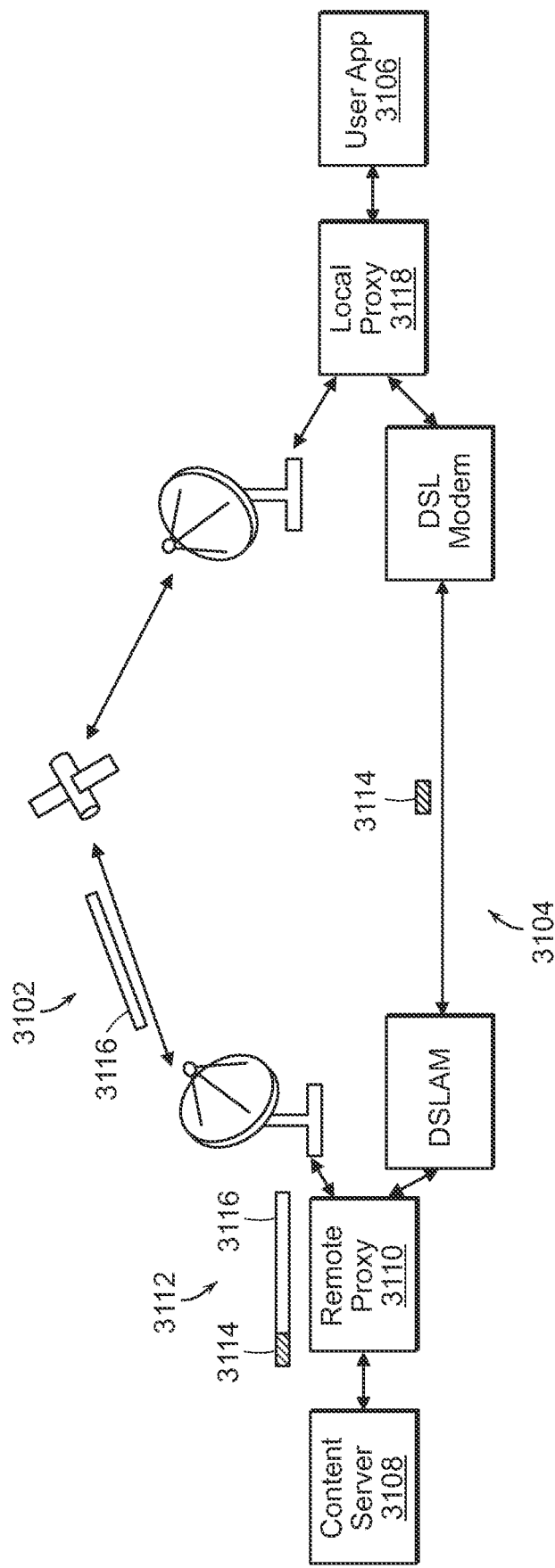
FIG. 31A, FIG. 31B, and FIG. 31C are schematic diagrams illustrating a second embodiment of multi-path content delivery.

Referring to FIG. 31a, a communication system utilizes a first, satellite data path 3102 having a relatively high round trip time latency and a second, DSL data path 3104 having a relatively low round trip time latency. When a user application 3106 sends a request to stream video content, a content server 3108 (e.g., video streaming service) provides some or all of the requested video content to a remote proxy 3110 which generates encoded video content 3112 for transmission to the user application 3106. Based on the RTT latencies of the first data path 3102 and the second data path 3104, the remote proxy 3110 splits the encoded video content 3112 into an initial portion 3114 (e.g., the first 5 seconds of video content) and a subsequent portion 3116 (e.g., the remaining video content). The remote proxy 3110 then causes transmission of the initial portion 3114 over the second, low latency data path 3104 and transmission of the subsequent portion 3116 over the first, high latency data path 3102.

Figure 31B:
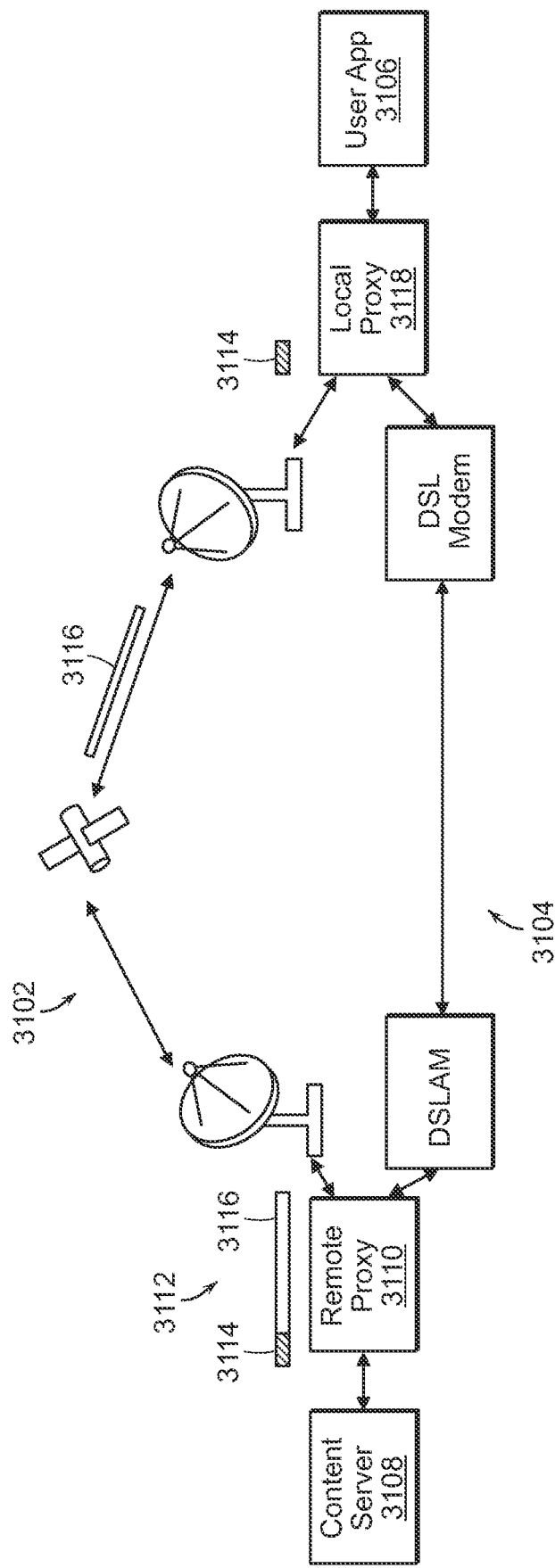

Referring to FIG. 31B, due to the lower latency of the second data path 3104, the initial portion 3114 of the video content arrives at the local proxy 3118 quickly, where it is decoded and sent to the user application 3106 for presentation to a viewer. The subsequent portion 3116 of the video content is still traversing the first, high latency data path 3102 at the time that presentation of the initial portion 3114 of the video content to the viewer commences.

Figure 31C:
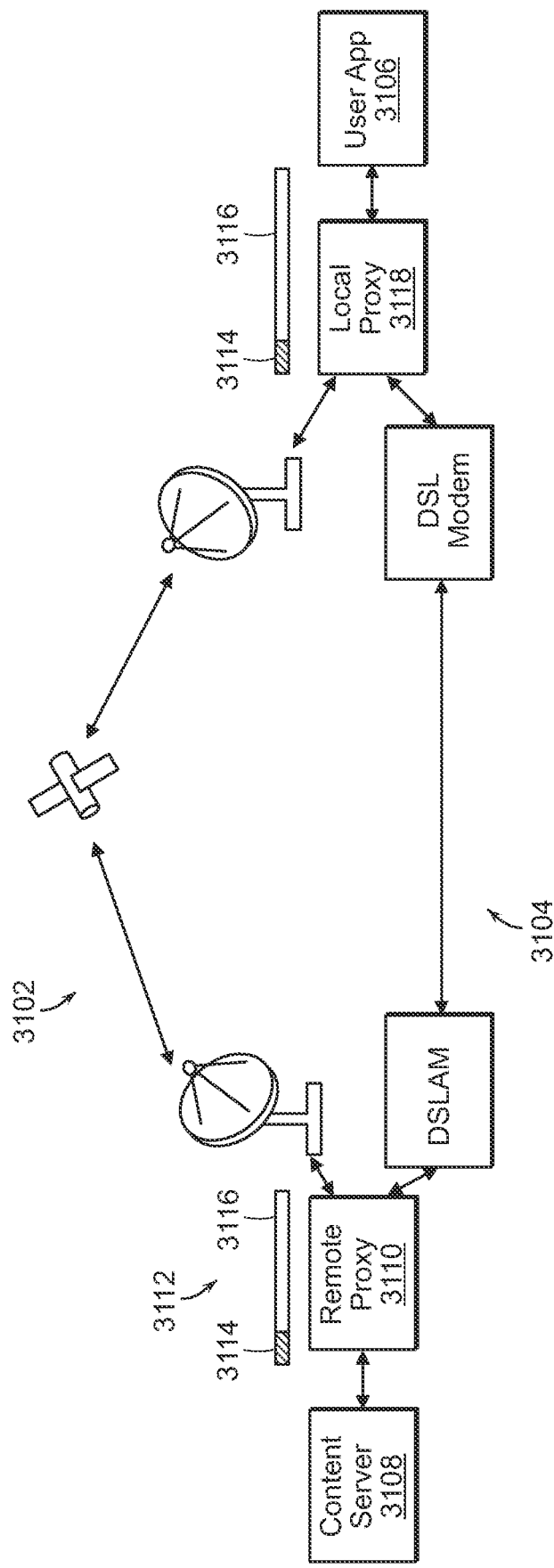

Referring to FIG. 31C, during presentation of the decoded initial portion 3114 of video content to the viewer, the subsequent portion 3116 of the video content arrives at the local proxy 3118 where it is decoded and sent to the user application 3106 before presentation of the initial portion 3114 of the video content to the viewer is complete. In some examples, sending the initial portion 3114 of the video content over the low latency data path 3104 and sending a subsequent portion 3116 of the video content over the high latency data path 3102 avoids lengthy wait times between when a user requests a video and when the user sees the video (as would be the case if using satellite only communication) while minimizing data usage over the low latency data path (which may be more costly to use).

In some examples, other types of messages may be preferentially sent over the low latency data path. For example, acknowledgment messages, retransmission messages, and/or other time critical messages may be transmitted over the low latency data path while other data messages are transmitted over the higher latency data path.

In some examples, additional data paths with different characteristics (e.g., latencies) can also be included in the communication system, with messages being balanced over any of a number of data paths based on characteristics of the messages (e.g., message type) and characteristics of the data paths.

In some examples, the initial portion of the messages and the subsequent portion of the messages are determined based on messages that are currently available at the transmitter. As additional messages become available to the transmitter, the initial portion and the subsequent portion of the messages can dynamically change based on the additional messages being divided between the two portions. For example, at a first transmission opportunity, packets 1-10 are available for transmission. The system decides to transmit packet 1 over a first data path and packet 10 over a second data path. By a second transmission opportunity, packets 11-12 have become available for transmission. Packet 2 is sent on the first data path and packet 12 on the second.

Some examples of high latency data paths include medium earth orbit satellite data paths and geosynchronous orbit satellite data paths. Some examples of low latency data paths include digital subscriber line (DSL) data paths, cable internet based data paths, fiber optic data paths, and cellular data paths.

4 Alternatives and Implementations

In the document above, certain features of the packet coding and transmission control protocols are described individually, or in isolation, but it should be understood that there are certain advantages that may be gained by combining multiple features together. Preferred embodiments for the packet coding and transmission control protocols described may depend on whether the transmission links and network nodes traversed between communication session end-points belong to certain fiber or cellular carriers (e.g. AT&T, T-Mobile, Sprint, Verizon, Level 3) and/or end-user Internet Service Providers (ISPs) (e.g. AT&T, Verizon, Comcast, Time Warner, Century Link, Charter, Cox) or are over certain wired (e.g. DSL, cable, fiber-to-the-curb/home (FTTx)) or wireless (e.g. WiFi, cellular, satellite) links. In embodiments, probe transmissions may be used to characterize the types of network nodes and transmission links communication signals are traversing and the packet coding and transmission control protocol may be adjusted to achieve certain performance. In some embodiments, data transmissions may be monitored to characterize the types of network nodes and transmission links communication signals are traversing and the packet coding and transmission control protocol may be adjusted to achieve certain performance. In at least some embodiments, quantities such as round-trip-time (RTT), one-way transmission times (OWTT), congestion window, pacing rate, packet loss rate, number of overhead packets, and the like may be monitored continuously, intermittently, in response to a trigger signal or event, and the like. In at least some embodiments, combinations of probe transmissions and data transmissions may be used to characterize network and communication session performance in real time.

In at least some embodiments, network and communication parameters may be stored in the end-devices of communication sessions and/or they may be stored in network resources such as servers, switches, nodes, computers, databases and the like. These network and communication parameters may be used by the packet coding and transmission control protocol to determine initial parameter settings for the protocol to reduce the time it may take to adjust protocol parameters to achieve adequate performance. In embodiments, the network and communication parameters may be tagged and/or associated with certain geographical locations, network nodes, network paths, equipment types, carrier networks, service providers, types of transmission paths and the like. In embodiments, the end-devices may be configured to automatically record and/or report protocol parameter settings and to associate those settings with certain locations determined using GPS-type location identification capabilities resident in those devices. In embodiments, the end-devices may be configured to automatically record and/or report protocol parameters settings and to associate those settings with certain carrier networks, ISP equipment traversed, types of wired and/or wireless links and the like.

In at least some embodiments, a packet coding and transmission control protocol as described above may adjust more than one parameter to achieve adequate or improved network performance. Improved network performance may be characterized by less delay in delivering data packets, less delay in completing file transfers, higher quality audio and video signal delivery, more efficient use of network resources, less power consumed by the end-users, more end-users supported by existing hardware resources and the like.

In at least some embodiments, certain modules or features of the packet coding and transmission control protocol may be turned on or off depending on the data's path through a network. In some embodiments, the order in which certain features are implemented or controlled may be adjusted depending on the data's path through a network. In some embodiments, the probe transmissions and/or data transmissions may be used in open-loop or closed-loop control algorithms to adjust the adjustable parameters and/or the sequence of feature implementation in the packet coding and transmission control protocol.

It should be understood that examples that involve monitoring to control the protocol can, in general, involve aspects that are implemented at the source, the destination, or at a combination of the source and the destination. Therefore, it should be evident that although embodiments are described above in which features are described as being implemented at particular endpoints, alternative embodiments involve implementation of those features at different endpoints. Also, as described above, monitoring to control the protocol can, in general, involve aspects that are implemented intermediate nodes or points in the network. Therefore, it should be evident that although embodiments are described above in which features are described as being implemented at particular endpoints, alternative embodiments involve implementation of those features at different nodes, including intermediate nodes, throughout the network.

In addition to the use of monitored parameters for control of the protocols, the data may be used for other purposes. For example, the data may support network analytics that are used, for example, to control or provision the network as a whole.

The PC-TCP approaches may be adapted to enhance existing protocols and procedures, and in particular protocols and procedures used in content delivery, for example, as used in coordinated content delivery networks. For instance, monitored parameters may be used to direct a client to the server or servers that can deliver an entire unit of content as soon as possible rather than merely direct the client to a least loaded server or to server accessible over a least congested path. A difference in such a new approach is that getting an entire file as fast as possible may require packets to be sent from multiple servers and/or servers that are not geographically the closest, over multiple links, and using new acknowledgment protocols that coordinate the incoming data while requiring a minimum of retransmissions or FEC overhead. Coordinating may include waiting for gaps in strings of packets (out-of-order packets) to be filled in by later arriving packets and/or by coded packets. In addition, the PC-TCP approaches may improve the performance of wireless, cellular, and satellite links, significantly improving the end-to-end network performance.

Some current systems use "adaptive bit rates" to try to preserve video transmission through dynamic and/or poorly performing links. In some instances, the PC-TCP approaches described above replace adaptive bit rate schemes and may be able to present a very high data rate to a user for a long period of time. In other instances, the PC-TCP approaches are used in conjunction with currently-available adaptive bit rate schemes to support higher data rates on average than could be supported by adaptive bit rate schemes alone. In some instances, the PC-TCP approaches may include integrated bit rate adjustments as part of its feature set and may use any and/or all of the previously identified adjustable parameters and/or monitored parameters to improve the performance of a combined PC-TCP and bit-rate adaptive solution.

Implementations of approaches described above may include software implementations, which use software instructions stored on non-transitory machine-readable media. The procedures and protocols as described above in the text and figures are sufficient for one skilled in the art to implement them in such software implementations. In some examples, the software may execute on a client node (e.g., a smartphone) using a general-purpose processor that implements a variety of functions on the client node. Software that executes on end nodes or intermediate network nodes may use processors that are dedicated to processing network traffic, for example, being embedded in network processing devices. In some implementations, certain functions may be implemented in hardware, for example, using Application-Specific Integrated Circuits (ASICs), and/or Field Programmable Gate Arrays (FPGAs), thereby reducing the load on a general purpose processor.

Note that in some diagrams and figures in this disclosure, networks such as the internet, carrier networks, internet service provider networks, local area networks (LANs), metro area networks (MANs), wide area networks (WANs), storage area networks (SANs), backhaul networks, cellular networks, satellite networks and the like, may be depicted as clouds. Also note, that certain processes may be referred to as taking place in the cloud and devices may be described as accessing the cloud. In these types of descriptions, the cloud should be understood to be some type of network comprising networking equipment and wireless and/or wired links.

The description above may refer to a client device communicating with a server, but it should be understood that the technology and techniques described herein are not limited to those exemplary devices as the end-points of communication connections or sessions. The end-points may also be referred to as, or may be, senders, transmitters, transceivers, receivers, servers, video servers, content servers, proxy servers, cloud storage units, caches, routers, switches, buffers, mobile devices, tablets, smart phones, handsets, computers, set-top boxes, modems, gaming systems, nodes, satellites, base stations, gateways, satellite ground stations, wireless access points, and the like. The devices at any of the end-points or intermediate nodes of communication connections or sessions may be commercial media streaming boxes such as those implementing Apple TV, Roku, Chromecast, Amazon Fire, Slingbox, and the like, or they may be custom media streaming boxes. The devices at the any of the end-points or intermediate nodes of communication connections or sessions may be smart televisions and/or displays, smart appliances such as hubs, refrigerators, security systems, power panels and the like, smart vehicles such as cars, boats, busses, trains, planes, carts, and the like, and may be any device on the Internet of Things (IoT). The devices at any of the end-points or intermediate nodes of communication connections or sessions may be single-board computers and/or purpose built computing engines comprising processors such as ARM processors, video processors, system-on-a-chip (SoC), and/or memory such as random access memory (RAM), read only memory (ROM), or any kind of electronic memory components.

Communication connections or sessions may exist between two routers, two clients, two network nodes, two servers, two mobile devices, and the like, or any combination of potential nodes and/or end-point devices. In many cases, communication sessions are bi-directional so that both end-point devices may have the ability to send and receive data. While these variations may not be stated explicitly in every description and exemplary embodiment in this disclosure, it should be understood that the technology and techniques we describe herein are intended to be applied to all types of known end-devices, network nodes and equipment and transmission links, as well as to future end-devices, network nodes and equipment and transmission links with similar or improved performance.

In embodiments, methods and systems are provided for data collection in or relating to one or more machines deployed in an industrial environment using self-organized network coding for network transmission of sensor data in a network. In embodiments, network coding may be used to specify and manage the manner in which packets (including streams of packets as noted in various embodiments disclosed throughout this disclosure and the documents incorporated by reference) are relayed from a sender (e.g., a data collector, instrumentation system, computer, or the like in an industrial environment where data is collected, such as from sensors or instruments on, in or proximal to industrial machines or from data storage in the environment) to a receiver (e.g., another data collector (such as in a swarm or coordinated group), instrumentation system, computer, storage, or the like in the industrial environment, or to a remote computer, server, cloud platform, database, data pool, data marketplace, mobile device (e.g., mobile phone, personal computer, tablet, or the like), or other network-connected device of system), such as via one or more network infrastructure elements (referred to in some cases herein as nodes), such as access points, switches, routers, servers, gateways, bridges, connectors, physical interfaces and the like, using one or more network protocols, such as IP-based protocols, TCP/IP, UDP, HTTP, Bluetooth, Bluetooth Low Energy, cellular protocols, LTE, 2G, 3G, 4G, 5G, CDMA, TDSM, packet-based protocols, streaming protocols, file transfer protocols, broadcast protocols, multi-cast protocols, unicast protocols, and others. For situations involving bi-directional communication, any of the above-referenced devices or systems, or others mentioned throughout this disclosure, may play the role of sender or receiver, or both. Network coding may account for availability of networks, including the availability of multiple alternative networks, such that a transmission may be delivered across different networks, either separated into different components or sending the same components redundantly. Network coding may account for bandwidth and spectrum availability; for example, a given spectrum may be divided (such as with sub-dividing spectrum by frequency, by time-division multiplexing, and other techniques). Networks or components thereof may be virtualized, such as for purposes of provisioning of network resources, specification of network coding for a virtualized network, or the like. Network coding may include a wide variety of approaches as described herein and shown in the figures.

In embodiments, one or more network coding systems or methods of the present disclosure may use self-organization, such as to configure network coding parameters for one or more transmissions over one or more networks using an expert system, which may comprise a model-based system (such as automatically selecting network coding parameters or configuration based on one or more defined or measured parameters relating to a transmission, such as parameters of the data or content to be transmitted, the sender, the receiver, the available network infrastructure components, the conditions of the network infrastructure, the conditions of the industrial environment, or the like). A model may, for example, account for parameters relating to file size, numbers of packets, size of a stream, criticality of a data packet or stream, value of a packet or stream, cost of transmission, reliability of a transmission, quality of service, quality of transmission, quality of user experience, financial yield, availability of spectrum, input/output speed, storage availability, storage reliability, and many others as noted throughout this disclosure. In embodiments, the expert system may comprise a rule-based system, where one or more rules is executed based on detection of a condition or parameter, calculation of a variable, or the like, such as based on any of the above-noted parameters. In embodiments, the expert system may comprise a machine learning system, such as a deep learning system, such as based on a neural network, a self-organizing map, or other artificial intelligence approach (including any noted throughout this disclosure or the documents incorporated by reference). A machine learning system in any of the embodiments of this disclosure may configure one or more inputs, weights, connections, functions (including functions of individual neurons or groups of neurons in a neural net) or other parameters of an artificial intelligence system. Such configuration may occur with iteration and feedback, optionally involving human supervision, such as by feeding back various metrics of success or failure. In the case of network coding, configuration may involve setting one or more coding parameters for a network coding specification or plan, such as parameters for selection of a network, selection one or more nodes, selection of data path, configuration of timers or timing parameters, configuration of redundancy parameters, configuration of coding types (including use of regenerating codes, such as for use of network coding for distributed storage, such as in peer-to-peer networks, such as a peer-to-peer network of data collectors, or a storage network for a distributed ledger, as noted elsewhere in this disclosure), coefficients for coding (including linear algebraic coefficients), parameters for random or near-random linear network coding (including generation of near random coefficients for coding), session configuration parameters, or other parameters noted in the network coding embodiments described below, throughout this disclosure, and in the documents incorporated herein by reference. For example, a machine learning system may configure the selection of a protocol for a transmission, the selection of what network(s) will be used, the selection of one or more senders, the selection of one or more routes, the configuration of one or more network infrastructure nodes, the selection of a destination receiver, the configuration of a receiver, and the like. In embodiments, each one of these may be configured by an individual machine learning system, or the same system may configure an overall configuration by adjusting various parameters of one or more of the above under iteration, through a series of trials, optionally seeded by a training set, which may be based on human configuration of parameters, or by model-based and/or rule-based configuration. Feedback to a machine learning system may comprise various measures, including transmission success or failure, reliability, efficiency (including cost-based, energy-based and other measures of efficiency, such as measuring energy per bit transmitted, energy per bit stored, or the like), quality of transmission, quality of service, financial yield, operational effectiveness, success at prediction, success at classification, and others. In embodiments, a machine learning system may configure network coding parameters by predicting network behavior or characteristics and may learn to improve prediction using any of the techniques noted above. In embodiments, a machine learning system may configure network coding parameters by classification of one or more network elements and/or one or more network behaviors and may learn to improve classification, such as by training and iteration over time. Such machine-based prediction and/or classification may be used for self-organization, including by model-based, rule-based, and machine learning-based configuration. Thus, self-organization of network coding may use or comprise various combinations or permutations of model-based systems, rule-based systems, and a variety of different machine-learning systems (including classification systems, prediction systems, and deep learning systems, among others).

As described in US patent application 2017/0013065, entitled "Cross-session network communication configuration," network coding may involve methods and systems for data communication over a data channel on a data path between a first node and a second node and may include maintaining data characterizing one or more current or previous data communication connections traversing the data channel and initiating a new data communication connection between the first node and the second node including configuring the new data communication connection at least in part according to the maintained data. The maintained data may characterize one or more data channels on one or more data paths between the first node and the second node over which said one or more current or previous data communication connections pass. The maintained data may characterize an error rate of the one or more data channels. The maintained data may characterize a bandwidth of the one or more data channels. The maintained data may characterize a round trip time of the one or more data channels. The maintained data may characterize communication protocol parameters of the one or more current or previous data communication connections.

The communication protocol parameters may include one or more of a congestion window size, a block size, an interleaving factor, a port number, a pacing interval, a round trip time, and a timing variability. The communication protocol parameters may include two or more of a congestion window size, a block size, an interleaving factor, a port number, a pacing interval, a round trip time, and a timing variability.

The maintained data may characterize forward error correction parameters associated with the one or more current or previous data communication connections. The forward error correction parameters may include a code rate. Initiating the new data communication connection may include configuring the new data communication connection according to first data of the maintained data, the first data is maintained at the first node, and initiating the new data communication connection includes providing the first data from the first node to the second node for configuring the new data communication connection.

Initiating the new data communication connection may include configuring the new data communication connection according to first data of the maintained data, the first data is maintained at the first node, and initiating the new data communication connection includes accessing first data at the first node for configuring the new data communication connection. Any one of these elements of maintained data, including various parameters of communication protocol, error correction parameters, connection parameters, and others, may be provided to the expert system for supporting self-organization of network coding, including for execution of rules to set network coding parameters based on the maintained data, for population of a model, or for configuration of parameters of a neural net or other artificial intelligence system.

Initiating the new data communication connection may include configuring the new data communication connection according to first data of the maintained data, the first data being maintained at the first node, and initiating the new data communication connection includes accepting a request from the first node for establishing the new data communication connection between the first node and the second node, including receiving, at the second node, at least one message from the first node comprising the first data for configuring said connection. The method may include maintaining the new data communication connection between the first node and the second node, including maintaining communication parameters, including initializing said communication parameters according the first data received in the at least one message from the first node.

Maintaining the new data communication connection may include adapting the communication parameters according to feedback from the first node. The feedback from the first node may include feedback messages received from the first node. The feedback may include feedback derived from a plurality of feedback messages received from the first node. Feedback may relate to any of the types of feedback noted above, and may be used for self-organizing the data communication connection using the expert system.

In some examples, one or more training communication connections over a data channel on a data path are employed prior to establishment of data communication connections over the data channel on the data path. The training communication connections are used to collect information about the data channel which is then used when establishing the data communication connections. In other examples, no training communication connections are employed and information about the data channel is obtained from one or more previous or current data communication connection over the data channel on the data path.

In embodiments, a method for data communication over a data channel on a data path between a first node and a second node includes maintaining data characterizing one or more current or previous data communication connections traversing the data channel; and initiating a new data communication connection between the first node and the second node including configuring the new data communication connection at least in part according to the maintained data, wherein the configuration of the new data communication connection is configured by an expert system.

In embodiments, the expert system uses at least one of a rule and a model to set a parameter of the configuration.

In embodiments, the expert system is a machine learning system that iteratively configures at least one of a set of inputs, a set of weights, and a set of functions based on feedback relating to the data channel.

In embodiments, the expert system takes a plurality of inputs from a data collector that accepts data about a machine operating in an industrial environment.

As described in US patent application 2017/0012861, entitled "Multi-path network communication," self-organized network coding under control of an expert system may involve methods and systems for data communication between a first node and a second node over a number of data paths coupling the first node and the second node and may include transmitting messages between the first node and the second node over the number of data paths, including transmitting a first subset of the messages over a first data path of the number of data paths and transmitting a second subset of the messages over a second data path of the number of data paths. In situations where the first data path has a first latency and the second data path has a second latency substantially larger than the first latency, and messages of the first subset of the messages are chosen to have first message characteristics and messages of the second subset are chosen to have second message characteristics, different from the first message characteristics.

Messages having the first message characteristics, targeted for data paths of lower latency, may include time critical messages; for example, in an industrial environment, messages relating to a critical fault condition of a machine (e.g., overheating, excessive vibration, or any of the other fault conditions described throughout this disclosure) or relating to a safety hazard, or a time-critical operational step on which other processes depend (e.g., completion of a catalytic reaction, completion of a sub-assembly, or the like in a high-value, high-speed manufacturing process, a refining process, or the like) may be designated as time critical (such as by a rule that can be parsed or processed by a rules engine) or may be learned to be time-critical by the expert system, such as based on feedback regarding outcomes over time, including outcomes for similar machines having similar data in similar industrial environments. The first subset of the messages and the second subset of the messages may be determined from a portion of the messages available at the first node at a time of transmission. At a subsequent time of transmission, additional messages made available to the first node may be divided into the first subset and the second subset based on message characteristics associated with the additional messages. Division into subsets and selection of what subsets are targeted to what data path may be undertaken by an expert system. Messages having the first message characteristics may be associated with an initial subset of a data set and messages having the second message characteristics may be associated with a subsequent subset of the data set. The methods and systems described herein for selecting inputs for data collection and for multiplexing data may be organized, such as by an expert system, to configure inputs for the alternative channels, such as by providing streaming elements that have real-time significance to the first data path and providing other elements, such as for long-term, predictive maintenance, to the other data path. In embodiments, the messages of the second subset may include messages that are at most n messages ahead of a last acknowledged message in a sequential transmission order associated with the messages, wherein n is determined based on a buffer size at one of the first and second nodes.

Messages having the first message characteristics may include acknowledgment messages and messages having the second message characteristics may include data messages. Messages having the first message characteristics may include supplemental data messages. The supplemental data messages may include redundancy data and messages having the second message characteristics may include original data messages. The first data path may include a terrestrial data path and the second data path may include a satellite data path. The terrestrial data path may include one or more of a cellular data path, a digital subscriber line (DSL) data path, a fiber optic data path, a cable internet based data path, and a wireless local area network data path. The satellite data path may include one or more of a low earth orbit satellite data path, a medium earth orbit satellite data path, and a geostationary earth orbit satellite data path. The first data path may include a medium earth orbit satellite data path or a low earth orbit satellite data path and the second data path may include a geostationary orbit satellite data path.

The method may further include, for each path of the number of data paths, maintaining an indication of successful and unsuccessful delivery of the messages over the data path and adjusting a congestion window for the data path based on the indication, which may occur under control of an expert system, including based on feedback of outcomes of a set of transmissions. The method may further include, for each path of the number of data paths, maintaining, at the first node, an indication of whether a number of messages received at the second node is sufficient to decode data associated with the messages, wherein the indication is based on feedback received at the first node over the number of data paths.

In another general aspect, a system for data communication between a number of nodes over a number of data paths coupling the number of nodes includes a first node configured to transmit messages to a second node over the number of data paths including transmitting a first subset of the messages over a first data path of the number of data paths, and transmitting a second subset of the messages over a second data path of the number of data paths.

In embodiments, the first subset of the messages and the second subset of the messages for the respective data paths may be determined from a portion of the messages available at a first node at a time of transmission. At a subsequent time of transmission, additional messages made available to the first node may be divided into a first subset and a second subset based on message characteristics associated with the additional messages. Messages having the first message characteristics may be associated with an initial subset of a data set and messages having the second message characteristics may be associated with a subsequent subset of the data set.

In embodiments, the messages of the second subset may include messages that are at most n messages ahead of a last acknowledged message in a sequential transmission order associated with the messages, wherein n is determined based on a receive buffer size at the second node. Messages having the first message characteristics may include acknowledgment messages and messages having the second message characteristics may include data messages. Messages having the first message characteristics may include supplemental data messages. The supplemental data messages may include data messages including redundancy data and messages having the second message characteristics may include original data messages.

The first node may be further configured to, for each path of the number of data paths, maintain an indication of successful and unsuccessful delivery of the messages over the data path and adjust a congestion window for the data path based on the indication. The first node may be further configured to maintain an aggregate indication of whether a number of messages received at the second node over the number of data paths is sufficient to decode data associated with the messages and to transmit supplemental messages based on the aggregate indication, wherein the aggregate indication is based on feedback from the second node received at the first node over the number of data paths.

In embodiments, a method for data communication between a first node and a second node over a plurality of data paths coupling the first node and the second node includes transmitting messages between the first node and the second node over the plurality of data paths including transmitting a first subset of the messages over a first data path of the plurality of data paths, and transmitting a second subset of the messages over a second data path of the plurality of data paths; wherein the first data path has a first latency and the second data path has a second latency substantially larger than the first latency, and messages of the first subset of the messages are chosen to have first message characteristics and messages of the second subset are chosen to have second message characteristics, different from the first message characteristics, wherein the selection of the first and second subset of message characteristics is performed automatically under control of an expert system.

In embodiments, the expert system uses at least one of a rule and a model to set a parameter of the selection.

In embodiments, the expert system is a machine learning system that iteratively configures at least one of a set of inputs, a set of weights, and a set of functions based on feedback relating to at least one of the data paths. In embodiments, the expert system takes a plurality of inputs from a data collector that accepts data about a machine operating in an industrial environment.

As described in US patent application 2017/0012868, entitled "Multiple protocol network communication," self-organized network coding under control of an expert system may involve methods and systems for data communication between a first node and a second node over one or more data paths coupling the first node and the second node and may include transmitting messages between the first node and the second node over the data paths, including transmitting at least some of the messages over a first data path using a first communication protocol, transmitting at least some of the messages over a second data path using a second communication protocol, determining that the first data path is altering a flow of messages over the first data path due to the messages being transmitted using the first communication protocol, and in response to the determining, adjusting a number of messages sent over the data paths, including decreasing a number of the messages transmitted over the first data path and increasing a number of messages transmitted over the second data path. Determination that the first data path is altering a flow of messages and/or adjusting the number of messages sent over the data paths may occur under control of an expert system, such as a rule-based system, a model-based system, a machine learning system (including deep learning) or a hybrid of any of those, where the expert system takes inputs relating to one or more of the data paths, the nodes, the communication protocols used, or the like. The data paths may be among devices and systems in an industrial environment, such as instrumentation systems of industrial machines, one or more mobile data collectors (optionally coordinated in a swarm), data storage systems (including network-attached storage), servers and other information technology elements, any of which may have or be associated with one or more network nodes. The data paths may be among any such devices and systems and devices and systems in a network of any kind (such as switches, routers, and the like) or between those and ones located in a remote environment, such as in an enterprise's information technology system, in a cloud platform, or the like.

Determining that the first data path is altering the flow of messages over the first data path may include determining that the first data path is limiting a rate of messages transmitted using the first communication protocol. Determining that the first data path is altering the flow of messages over the first data path may include determining that the first data path is dropping messages transmitted using the first communication protocol at a higher rate than a rate at which the second data path is dropping messages transmitted using the second communication protocol. The first communication protocol may be the User Datagram Protocol (UDP), and the second communication protocol may be the Transmission Control Protocol (TCP), or vice versa. Other protocols as described throughout this disclosure may be used.

The messages may be initially equally divided or divided according to some predetermined allocation (such as by type, as noted in connection with other embodiments) across the first data path and the second data path, such as using a load balancing technique. The messages may be initially divided across the first data path and the second data path according to a division of the messages across the first data path and the second data path in one or more prior data communication connections. The messages may be initially divided across the first data path and the second data path based on a probability that the first data path will alter a flow of messages over the first data path due to the messages being transmitted using the first communication protocol.

The messages may be divided across the first data path and the second data path based on message type. The message type may include one or more of acknowledgment messages, forward error correction messages, retransmission messages, and original data messages. Decreasing a number of the messages transmitted over the first data path and increasing a number of messages transmitted over the second data path may include sending all of the messages over the second path and sending none of the messages over the first path.

At least some of the number of data paths may share a common physical data path. The first data path and the second data path may share a common physical data path. The adjusting of the number of messages sent over the number of data paths may occur during an initial phase of the transmission of the messages. The adjusting of the number of messages sent over the number of data paths may repeatedly occur over a duration of the transmission of the messages. The adjusting of the number of messages sent over the number of data paths may include increasing a number of the messages transmitted over the first data path and decreasing a number of messages transmitted over the second data path.

In some examples, the parallel transmission over TCP and UDP is handled differently from conventional load balancing techniques, because TCP and UDP both share a low-level data path and nevertheless have very different protocol characteristics.

In some examples, approaches respond to instantaneous network behavior and learn the network's data handling policy and state by probing for changes. In an industrial environment, this may include learning policies relating to authorization to use aspects of a network; for example, a SCADA system may allow a data path to be used only by a limited set of authorized users, services, or applications, because of the sensitivity of underlying machines or processes that are under control (including remote control) via the SCADA system and concern over potential for cyberattacks. Unlike conventional load-balancers which assume each data path is unique and does not affect the other, approaches may recognize that TCP and UDP share a low-level data path and directly affect each other. Additionally, TCP provides in-order delivery and retransmits data (along with flow control, congestion control, etc.) whereas UDP does not. This uniqueness requires additional logic provided by the methods and systems disclosed herein that may include mapping specific message types to each communication protocol, such as based at least in part on the different properties of the protocols (e.g., expect longer jitter over TCP, expect out-of-order delivery on UDP). For example, the system may refrain from coding over packets sent through TCP, since it is reliable, but may send forward error correction over UDP to add redundancy and save bandwidth. In some examples, a larger ACK interval is used for ACKing TCP data.

By employing the techniques described herein, approaches distribute data over TCP and UDP data paths to achieve optimal or near-optimal throughput, such as in situations where a network provider's policies treat UDP unfairly (as compared to conventional systems that simply use UDP if possible and fall back to TCP if not).

In embodiments, a method for data communication between a first node and a second node over a plurality of data paths coupling the first node and the second node includes transmitting messages between the first node and the second node over the plurality of data paths including transmitting at least some of the messages over a first data path of the plurality of data paths using a first communication protocol, and transmitting at least some of the messages over a second data path of the plurality of data paths using a second communication protocol; determining that the first data path is altering a flow of messages over the first data path due to the messages being transmitted using the first communication protocol, and in response to the determining, adjusting a number of messages sent over the plurality of data paths including decreasing a number of the messages transmitted over the first data path and increasing a number of messages transmitted over the second data path, wherein altering the flow of messages is performed automatically under control of an expert system.

In embodiments, the expert system uses at least one of a rule and a model to set a parameter of the alteration of the flow.

In embodiments, the expert system is a machine learning system that iteratively configures at least one of a set of inputs, a set of weights, and a set of functions based on feedback relating to at least one of the data paths. In embodiments, the expert system takes a plurality of inputs from a data collector that accepts data about a machine operating in an industrial environment.

In embodiments, the first communication protocol is User Datagram Protocol (UDP).

In embodiments, the second communication protocol is Transmission Control Protocol (TCP).

In embodiments, the messages are initially divided across the first data path and the second data path using a load balancing technique.

In embodiments, the messages are initially divided across the first data path and the second data path according to a division of the messages across the first data path and the second data path in one or more prior data communication connections.

In embodiments, the messages are initially divided across the first data path and the second data path based on a probability that the first data path will alter a flow of messages over the first data path due to the messages being transmitted using the first communication protocol. In embodiments, the probability is determined by an expert system.

As described in US patent application 2017/0012884, entitled "Message reordering timers," self-organized network coding under control of an expert system may involve methods and systems for data communication from a first node to a second node over a data channel coupling the first node and the second node and may include receiving data messages at the second node, the messages belonging to a set of data messages transmitted in a sequential order from the first node, sending feedback messages from the second node to the first node, the feedback messages characterizing a delivery status of the set of data messages at the second node, including maintaining a set of one or more timers according to occurrences of a number of delivery order events, the maintaining including modifying a status of one or more timers of the set of timers based on occurrences of the number of delivery order events, and deferring sending of said feedback messages until expiry of one or more of the set of one or more timers. The data channels may be among devices and systems in an industrial environment, such as instrumentation systems of industrial machines, one or more mobile data collectors (optionally coordinated in a swarm), data storage systems (including network-attached storage), servers and other information technology elements, any of which may have or be associated with one or more network nodes. The data channels may be among any such devices and systems and devices and systems in a network of any kind (such as switches, routers, and the like) or between those and ones located in a remote environment, such as in an enterprise's information technology system, in a cloud platform, or the like. Determination that that timers are required, configuration of timers, and initiation of the user of timers may occur under control of an expert system, such as a rule-based system, a model-based system, a machine learning system (including deep learning) or a hybrid of any of those, where the expert system takes inputs relating to one or more of the types of communications occurring, the data channels, the nodes, the communication protocols used, or the like.

The set of one or more timers may include a first timer and the first timer may be started upon detection of a first delivery order event, the first delivery order event being associated with receipt of a first data message associated with a first position in the sequential order prior to receipt of one or more missing messages associated with positions preceding the first position in the sequential order. The method may include sending the feedback messages indicating a successful delivery of the set of data messages at the second node upon detection of a second delivery order event, the second delivery order event being associated with receipt of the one or more missing messages prior to expiry of the first timer. The method may include sending said feedback messages indicating an unsuccessful delivery of the set of data messages at the second node upon expiry of the first timer prior to any of the one or more missing messages being received. The set of one or more timers may include a second timer and the second timer is started upon detection of a second delivery order event, the second delivery order event being associated with receipt of some but not all of the missing messages prior to expiry of the first timer. The method may include sending feedback messages indicating an unsuccessful delivery of the set of data messages at the second node upon expiry of the second timer prior to receipt of the missing messages. The method may include sending feedback messages indicating a successful delivery of the set of data messages at the second node upon detection of a third delivery order event, the third delivery order event being associated with receipt of the missing messages prior to expiry of the second timer.

In another general aspect, a method for data communication from a first node to a second node over a data channel coupling the first node and the second node includes receiving, at the first node, feedback messages indicative of a delivery status of a set of data messages transmitted in a sequential order to the second node from the second node, maintaining a size of a congestion window at the first node including maintaining a set of one or more timers according to occurrences of a number of feedback events, the maintaining including modifying a status of one or more timers of the set of timers based on occurrences of the number of feedback events, and delaying modification of the size of the congestion window until expiry of one or more of the set of one or more timers.

The set of one or more timers may include a first timer and the first timer may be started upon detection of a first feedback event, the first feedback event being associated with receipt of a first feedback message indicating successful delivery of a first data message having first position in the sequential order prior to receipt of one or more feedback messages indicating successful delivery of one or more other data messages having positions preceding the first position in the sequential order. The method may include cancelling modification of the congestion window upon detection of a second feedback event, the second feedback event being associated with receipt of one or more feedback messages indicating successful delivery of the one or more other data messages prior to expiry of the first timer. The method may include modifying the congestion window upon expiry of the first timer prior to receipt of any feedback message indicating successful delivery of the one or more other data messages.

The set of one or more timers may include a second timer and the second timer may be started upon detection of a third feedback event, the third feedback event being associated with receipt of one or more feedback messages indicating successful delivery of some but not all of the one or more other data messages prior to expiry of the first timer. The method may include modifying the size of the congestion window upon expiry of the second timer prior to receipt of one or more feedback messages indicating successful delivery of the one or more other data messages. The method may include cancelling modification of the size of the congestion window upon detection of a fourth feedback event, the fourth feedback event being associated with receipt one or more feedback messages indicating successful delivery of the one or more other data messages prior to expiry of the second timer.

In another general aspect, a system for data communication between a number of nodes over a data channel coupling the number of nodes includes a first node of the number of nodes configured to receive, at the first node, feedback messages indicative of a delivery status of a set of data messages transmitted in a sequential order to the second node from the second node, maintain a size of a congestion window at the first node including maintaining a set of one or more timers according to occurrences of a number of feedback events, the maintaining including modifying a status of one or more timers of the set of timers based on occurrences of the number of feedback events, and delaying modification of the size of the congestion window until expiry of one or more of the set of one or more timers.

In embodiments, a method for data communication from a first node to a second node over a data channel coupling the first node and the second node including determining, using an expert system, based on at least one condition of the data channel, whether one or more timers will used to manage the data communication and, upon such determination: receiving data messages at the second node, the messages belonging to a set of data messages transmitted in a sequential order from the first node; sending feedback messages from the second node to the first node, the feedback messages characterizing a delivery status of the set of data messages at the second node, including maintaining a set of one or more timers according to occurrences of a plurality of delivery order events, the maintaining including modifying a status of one or more timers of the set of timers based on occurrences of the plurality of delivery order events, and deferring sending of said feedback messages until expiry of one or more of the set of one or more timers.

In embodiments, the expert system uses at least one of a rule and a model to set a parameter of the determination whether to use one or more timers.

In embodiments, the expert system is a machine learning system that iteratively configures at least one of a set of inputs, a set of weights, and a set of functions based on feedback relating to at least one of the data paths. In embodiments, the expert system takes a plurality of inputs from a data collector that accepts data about a machine operating in an industrial environment.

In embodiments, the set of one or more timers includes a first timer and the first timer is started upon detection of a first delivery order event, the first delivery order event being associated with receipt of a first data message associated with a first position in the sequential order prior to receipt of one or more missing messages associated with positions preceding the first position in the sequential order.

As described in US patent application 2017/0012885, entitled "Network communication recoding node," self-organized network coding under control of an expert system may involve methods and systems for modifying redundancy information associated with encoded data passing from a first node to a second node over data paths and may include receiving first encoded data including first redundancy information at an intermediate node from the first node via a first channel connecting the first node and the intermediate node, the first channel having first channel characteristics, and transmitting second encoded data including second redundancy information from the intermediate node to the second node via a second channel connecting the intermediate node and the second node, the second channel having second channel characteristics. A degree of redundancy associated with the second redundancy information may be determined by modifying the first redundancy information based on one or both of the first channel characteristics and the second channel characteristics without decoding the first encoded data. The data paths may be among devices and systems in an industrial environment (each acting as one or more nodes for sending, receiving, or transmitting data), such as instrumentation systems of industrial machines, one or more mobile data collectors (optionally coordinated in a swarm), data storage systems (including network-attached storage), servers and other information technology elements, any of which may have or be associated with one or more network nodes. The data paths may be among any such devices and systems and devices and systems in a network of any kind (such as switches, routers, and the like) or between those and ones located in a remote environment, such as in an enterprise's information technology system, in a cloud platform, or the like. Modifying the redundancy information may occur by or under control of an expert system, such as a rule-based system, a model-based system, a machine learning system (including deep learning) or a hybrid of any of those, where the expert system takes inputs relating to one or more of the data paths, the nodes, the communication protocols used, or the like. Redundancy may result from (and may be identified at least in part based on), the combination or multiplexing of data from a set of data inputs, such as described throughout this disclosure.

Modifying the first redundancy information may include adding redundancy information to the first redundancy information. Modifying the first redundancy information may include removing redundancy information from the first redundancy information. The second redundancy information may be further formed by modifying the first redundancy information based on feedback from the second node indicative of successful or unsuccessful delivery of the encoded data to the second node. The first encoded data and the second encoded data may be encoded, such as using a random linear network code or a substantially random linear network code. Modifying the first redundancy information based on one or both of the first channel characteristics and the second channel characteristics may include modifying the first redundancy information based on one or more of a block size, a congestion window size, and a pacing rate associated with the first channel characteristics and/or the second channel characteristics.

The method may include sending a feedback message from the intermediate node to the first node acknowledging receipt of one or more messages at the intermediate node. The method may include receiving a feedback message from the second node at the intermediate node and, in response to receiving the feedback message, transmitting additional redundancy information to the second node.

In another general aspect, a system for modifying redundancy information associated with encoded data passing from a first node to a second node over a number of data paths includes an intermediate node configured to receive first encoded data including first redundancy information from the first node via a first channel connecting the first node and the intermediate node, the first channel having first channel characteristics and transmit second encoded data including second redundancy information from the intermediate node to the second node via a second channel connecting the intermediate node and the second node, the second channel having second channel characteristics. A degree of redundancy associated with the second redundancy information is determined by modifying the first redundancy information based on one or both of the first channel characteristics and the second channel characteristics without decoding the first encoded data.

In embodiments, a method for modifying redundancy information associated with encoded data passing from a first node to a second node over a plurality of data paths, the method comprising: receiving first encoded data including first redundancy information at an intermediate node from the first node via a first channel connecting the first node and the intermediate node, the first channel having first channel characteristics; transmitting second encoded data including second redundancy information from the intermediate node to the second node via a second channel connecting the intermediate node and the second node, the second channel having second channel characteristics; wherein a degree of redundancy associated with the second redundancy information is determined by modifying the first redundancy information based on one or both of the first channel characteristics and the second channel characteristics without decoding the first encoded data, including modifying the first redundancy information based on one or more of a block size, a congestion window size, and a pacing rate associated with the first channel characteristics and/or the second channel characteristics, wherein modifying the first redundancy information occurs under control of an expert system.

In embodiments, the expert system uses at least one of a rule and a model to set a parameter of the modification of the redundancy information.

In embodiments, the expert system is a machine learning system that iteratively configures at least one of a set of inputs, a set of weights, and a set of functions based on feedback relating to at least one of the data paths. In embodiments, the expert system takes a plurality of inputs from a data collector that accepts data about a machine operating in an industrial environment.

In embodiments, modifying the first redundancy information includes adding redundancy information to the first redundancy information.

In embodiments, modifying the first redundancy information includes removing redundancy information from the first redundancy information.

In embodiments, the second redundancy information is further formed by modifying the first redundancy information based on feedback from the second node indicative of successful or unsuccessful delivery of the encoded data to the second node.

In embodiments, the first encoded data and the second encoded data are encoded using a random linear network code.

As described in US patent application 2017/0012905, entitled "Error correction optimization," self-organized network coding under control of an expert system may involve methods and systems for data communication between a first node and a second node over a data path coupling the first node and the second node and may include transmitting a segment of data from the first node to the second node over the data path as a number of messages, the number of messages being transmitted according to a transmission order. A degree of redundancy associated with each message of the number of messages is determined based on a position of said message in the transmission order. The data paths may be among devices and systems in an industrial environment (each acting as one or more nodes for sending, receiving, or transmitting data), such as instrumentation systems of industrial machines, one or more mobile data collectors (optionally coordinated in a swarm), data storage systems (including network-attached storage), servers and other information technology elements, any of which may have or be associated with one or more network nodes. The data paths may be among any such devices and systems and devices and systems in a network of any kind (such as switches, routers, and the like) or between those and ones located in a remote environment, such as in an enterprise's information technology system, in a cloud platform, or the like. Determining a transmission order may occur by or under control of an expert system, such as a rule-based system, a model-based system, a machine learning system (including deep learning) or a hybrid of any of those, where the expert system takes inputs relating to one or more of the data paths, the nodes, the communication protocols used, or the like. Redundancy may result from (and may be identified at least in part based on), the combination or multiplexing of data from a set of data inputs, such as described throughout this disclosure.

The degree of redundancy associated with each message of the number of messages may increase as the position of the message in the transmission order is non-decreasing. Determining the degree of redundancy associated with each message of the number of messages based on the position (i) of the message in the transmission order is further based on one or more of delay requirements for an application at the second node, a round trip time associated with the data path, a smoothed loss rate (P) associated with the channel, a size (N) of the data associated with the number of messages, a number (ai) of acknowledgment messages received from the second node corresponding to messages from the number of messages, a number (fi) of in-flight messages of the number of messages, and an increasing function (g(i)) based on the index of the data associated with the number of messages.

The degree of redundancy associated with each message of the number of messages may be defined as: $(N+g(i)-ai)/(1-p)-fi$. $g(i)$ may be defined as a maximum of a parameter m and N−i. $g(i)$ may be defined as $N-p(i)$ where p is a polynomial, with integer rounding as needed. The method may include receiving, at the first node, a feedback message from the second node indicating a missing message at the second node and, in response to receiving the feedback message, sending a redundancy message to the second node to increase a degree of redundancy associated with the missing message. The method may include maintaining, at the first node, a queue of preemptively computed redundancy messages and, in response to receiving the feedback message, removing some or all of the preemptively computed redundancy messages from the queue and adding the redundancy message to the queue for transmission. The redundancy message may be generated and sent on-the-fly in response to receipt of the feedback message.

The method may include maintaining, at the first node, a queue of preemptively computed redundancy messages for the number of messages and, in response to receiving a feedback message indicating successful delivery of the number of messages, removing any preemptively computed redundancy messages associated with the number of messages from the queue of preemptively computed redundancy messages. The degree of redundancy associated with each of the messages may characterize a probability of the correctability of an erasure of the message. The probability of correctability may depend on a comparison of between the degree of redundancy and a loss probability.

In embodiments, method for data communication between a first node and a second node over a data path coupling the first node and the second node, the method comprising: transmitting a segment of data from the first node to the second node over the data path as a plurality of messages, the plurality of messages being transmitted according to a transmission order; wherein a degree of redundancy associated with each message of the plurality of messages is determined based on a position of said message in the transmission order, wherein the transmission order is determined under control of an expert system.

In embodiments, the expert system uses at least one of a rule and a model to set a parameter of the transmission order.

In embodiments, the expert system is a machine learning system that iteratively configures at least one of a set of inputs, a set of weights, and a set of functions based on feedback relating to at least one of the data paths. In embodiments, the expert system takes a plurality of inputs from a data collector that accepts data about a machine operating in an industrial environment.

In embodiments, the degree of redundancy associated with each message of the plurality of messages increases as the position of the message in the transmission order is non-decreasing.

In embodiments, determining the degree of redundancy associated with each message of the plurality of messages based on the position (i) of the message in the transmission order is further based on one or more of: application delay requirements; a round trip time associated with the data path, a smoothed loss rate (P) associated with the channel, a size (N) of the data associated with the plurality of messages, a number (ai) of acknowledgment messages received from the second node corresponding to messages from the plurality of messages, a number (fi) of in-flight messages of the plurality of messages, and an increasing function (g(i)) based on the index of the data associated with the plurality of messages.

As described in U.S. patent application Ser. No. 14/935,885, entitled, "Packet Coding Based Network Communication," self-organized network coding under control of an expert system may involve methods and systems for data communication between a first node and a second node over a path and may include estimating a rate at which loss events occur, where a loss event is either an unsuccessful delivery of a single packet to the second data node or an unsuccessful delivery of a plurality of consecutively transmitted packets to the second data node, and sending redundancy messages at the estimated rate at which loss events occur. An expert system may be used to estimate the rate at which loss events occur.

A method for data communication from a first node to a second node over a data channel coupling the first node and the second node such as in an industrial environment, includes receiving messages at the first node, from the second node, including receiving messages comprising data that depend at least in part of characteristics of the channel coupling the first node and the second node, transmitting messages from the first node to the second node, including applying forward error correction according to parameters determined from the received messages, the parameters determined from the received messages including at least two of a block size, an interleaving factor, and a code rate. The method may occur under control of an expert system.

In embodiments, method for data communication from a first node in an industrial environment to a second node over a data channel coupling the first node and the second node, the method comprising: receiving messages at the first node from the second node, including receiving messages comprising data that depend at least in part of characteristics of the channel coupling the first node and the second node; transmitting messages from the first node to the second node, including applying error correction according to parameters determined from the received messages, the parameters determined from the received messages including at least two of a block size, an interleaving factor, and a code rate, wherein applying the error correction occurs under control of an expert system.

In embodiments, the expert system uses at least one of a rule and a model to set a parameter of the error correction.

In embodiments, the expert system is a machine learning system that iteratively configures at least one of a set of inputs, a set of weights, and a set of functions based on feedback relating to at least one of the data paths. In embodiments, the expert system takes a plurality of inputs from a data collector that accepts data about a machine operating in an industrial environment.

In embodiments, provided herein is a system for data communication between nodes having the ability to maintain a first and second transmission limit based on received rate of arrival and success of delivery feedback messages, and limiting transmission of messages based on the transmission limits. In embodiments, provided herein is a system for data communication between nodes having the ability to maintain a first and second transmission limit based on received rate of arrival and success of delivery feedback messages, and limiting transmission of messages based on the transmission limits and having the ability to limit transmission of further messages not yet acknowledged as successfully delivered according to the window size. In embodiments, provided herein is a system for data communication between nodes having the ability to maintain a first and second transmission limit based on received rate of arrival and success of delivery feedback messages, and limiting transmission of messages based on the transmission limits and having the ability to maintain an estimate of a rate of loss events and use it to adjust the rate of redundancy messages. In embodiments, provided herein is a system for data communication between nodes having the ability to maintain a first and second transmission limit based on received rate of arrival and success of delivery feedback messages, and limiting transmission of messages based on the transmission limits and having an estimated rate of loss events where the error correction code used to determine redundancy messages chosen is based on the estimated rate of loss events. In embodiments, provided herein is a system for data communication between nodes having the ability to maintain a first and second transmission limit based on received rate of arrival and success of delivery feedback messages, and limiting transmission of messages based on the transmission limits and having the ability to apply forward error correction based on messages received describing channel characteristics. In embodiments, provided herein is a system for data communication between nodes having the ability to maintain a first and second transmission limit based on received rate of arrival and success of delivery feedback messages, and limiting transmission of messages based on the transmission limits and having the ability to maintain/set timers based on occurrences of delivery order events and delaying transmission of feedback messages using timers. In embodiments, provided herein is a system for data communication between nodes having the ability to maintain a first and second transmission limit based on received rate of arrival and success of delivery feedback messages, and limiting transmission of messages based on the transmission limits and having the ability to maintain/set timers based on occurrences of delivery order events and delaying modification of congestion window size based on timers. In embodiments, provided herein is a system for data communication between nodes having the ability to maintain a first and second transmission limit based on received rate of arrival and success of delivery feedback messages, and limiting transmission of messages based on the transmission limits and having the ability to maintain/set timers based on occurrences of delivery order events, delaying modification of congestion window size based on timers, and cancelling modification of congestion window size when receiving a feedback message indicating successful delivery. In embodiments, provided herein is a system for data communication between nodes having the ability to maintain a first and second transmission limit based on received rate of arrival and success of delivery feedback messages, and limiting transmission of messages based on the transmission limits and having the ability to configure a new connection using maintained data characterizing a current/previous connection. In embodiments, provided herein is a system for data communication between nodes having the ability to maintain a first and second transmission limit based on received rate of arrival and success of delivery feedback messages, and limiting transmission of messages based on the transmission limits and having the ability to configure a new connection using maintained data characterizing an error rate of a current/previous connection. In embodiments, provided herein is a system for data communication between nodes having the ability to maintain a first and second transmission limit based on received rate of arrival and success of delivery feedback messages, and limiting transmission of messages based on the transmission limits and having the ability to configure a new connection using maintained data characterizing a timing variability of a current/previous connection. In embodiments, provided herein is a system for data communication between nodes having the ability to maintain a first and second transmission limit based on received rate of arrival and success of delivery feedback messages, and limiting transmission of messages based on the transmission limits and having the ability to configure a new connection using maintained data characterizing bandwidth of a current/previous connection. In embodiments, provided herein is a system for data communication between nodes having the ability to maintain a first and second transmission limit based on received rate of arrival and success of delivery feedback messages, and limiting transmission of messages based on the transmission limits and having the ability to configure a new connection using maintained data characterizing round trip time of a current/previous connection. In embodiments, provided herein is a system for data communication between nodes having the ability to maintain a first and second transmission limit based on received rate of arrival and success of delivery feedback messages, and limiting transmission of messages based on the transmission limits and having the ability to configure a new connection using maintained data characterizing communication control parameters of a current/previous connection. In embodiments, provided herein is a system for data communication between nodes having the ability to maintain a first and second transmission limit based on received rate of arrival and success of delivery feedback messages, and limiting transmission of messages based on the transmission limits and having the ability to configure new connection using maintained data characterizing forward error correction parameters of a current/previous connection. In embodiments, provided herein is a system for data communication between nodes having the ability to maintain a first and second transmission limit based on received rate of arrival and success of delivery feedback messages, and limiting transmission of messages based on the transmission limits and having a data store for maintaining data characterizing one or more current or previous data communication connections and a connection initiation module for initiating new data communication connections based on maintained data. In embodiments, provided herein is a system for data communication between nodes having the ability to maintain a first and second transmission limit based on received rate of arrival and success of delivery feedback messages, and limiting transmission of messages based on the transmission limits and having the ability to transmit a first subset of data messages over a lower latency data path and a second subset of messages over a higher latency data path. In embodiments, provided herein is a system for data communication between nodes having the ability to maintain a first and second transmission limit based on received rate of arrival and success of delivery feedback messages, and limiting transmission of messages based on the transmission limits and having the ability to transmit a first subset of data messages that are time critical over a lower latency data path and a second subset of messages over a higher latency data path. In embodiments, provided herein is a system for data communication between nodes having the ability to maintain a first and second transmission limit based on received rate of arrival and success of delivery feedback messages, and limiting transmission of messages based on the transmission limits and having the ability to transmit a first initial subset of data messages over a lower latency data path and a second subset of messages that are subsequently available over a higher latency data path. In embodiments, provided herein is a system for data communication between nodes having the ability to maintain a first and second transmission limit based on received rate of arrival and success of delivery feedback messages, and limiting transmission of messages based on the transmission limits and having the ability to transmit a first subset of acknowledgment messages over a lower latency data path and a second subset of data messages over a higher latency data path. In embodiments, provided herein is a system for data communication between nodes having the ability to maintain a first and second transmission limit based on received rate of arrival and success of delivery feedback messages, and limiting transmission of messages based on the transmission limits and having the ability to transmit a first subset of supplemental/redundancy data messages over a lower latency data path and a second subset of data messages over a higher latency data path. In embodiments, provided herein is a system for data communication between nodes having the ability to maintain a first and second transmission limit based on received rate of arrival and success of delivery feedback messages, and limiting transmission of messages based on the transmission limits and having a degree of redundancy associated with each message that is based on message position in the transmission order. In embodiments, provided herein is a system for data communication between nodes having the ability to maintain a first and second transmission limit based on received rate of arrival and success of delivery feedback messages, and limiting transmission of messages based on the transmission limits and having a degree of redundancy associated with each message that increases as the position of the messages is non-decreasing. In embodiments, provided herein is a system for data communication between nodes having the ability to maintain a first and second transmission limit based on received rate of arrival and success of delivery feedback messages, and limiting transmission of messages based on the transmission limits and having a degree of redundancy associated with each message that is based on message position in the transmission order and in response to receiving feedback messages. In embodiments, provided herein is a system for data communication between nodes having the ability to maintain a first and second transmission limit based on received rate of arrival and success of delivery feedback messages, and limiting transmission of messages based on the transmission limits and having a degree of redundancy associated with each message that is based on message position in the transmission order and in response to receiving feedback messages, and adding or removing redundancy messages from the queue based on the feedback messages. In embodiments, provided herein is a system for data communication between nodes having the ability to maintain a first and second transmission limit based on received rate of arrival and success of delivery feedback messages, and limiting transmission of messages based on the transmission limits and having the ability to adjust the number of messages sent over each of multiple different data paths with different communication protocols if it is determined that a data path is altering flow of messages. In embodiments, provided herein is a system for data communication between nodes having the ability to maintain a first and second transmission limit based on received rate of arrival and success of delivery feedback messages, and limiting transmission of messages based on the transmission limits and having the ability to adjust the number of messages sent over each of multiple different data paths with different communication protocols if it is determined that a data path is altering flow of messages initial division based on previous communication connections. In embodiments, provided herein is a system for data communication between nodes having the ability to maintain a first and second transmission limit based on received rate of arrival and success of delivery feedback messages, and limiting transmission of messages based on the transmission limits and having the ability to modify/add/remove redundancy information associated with encoded data as it travels from node to node via channels based on channel characteristics. In embodiments, provided herein is a system for data communication between nodes having the ability to maintain a first and second transmission limit based on received rate of arrival and success of delivery feedback messages, and limiting transmission of messages based on the transmission limits and having the ability to send FEC packets at an estimated rate of loss events (isolated packet loss or burst of consecutive packets). In embodiments, provided herein is a system for data communication between nodes having the ability to maintain a first and second transmission limit based on received rate of arrival and success of delivery feedback messages, and limiting transmission of messages based on the transmission limits and having combined coding, TCP, and pacing of packet transmissions. In embodiments, provided herein is a system for data communication between nodes having the ability to maintain a first and second transmission limit based on received rate of arrival and success of delivery feedback messages, and limiting transmission of messages based on the transmission limits and having a forward error correction code construction that interleaves groups of message packets and parity packets and has coding across overlapping groups of message packets. In embodiments, provided herein is a system for data communication between nodes having the ability to maintain a first and second transmission limit based on received rate of arrival and success of delivery feedback messages, and limiting transmission of messages based on the transmission limits and having a variant of TCP that combines delay-based back off with a stable window increase function.

In embodiments, provided herein is a system for data communication between nodes having the ability to limit transmission of further messages not yet acknowledged as successfully delivered according to the window size. In embodiments, provided herein is a system for data communication between nodes having the ability to limit transmission of further messages not yet acknowledged as successfully delivered according to the window size and having the ability to maintain an estimate of a rate of loss events and use it to adjust the rate of redundancy messages. In embodiments, provided herein is a system for data communication between nodes having the ability to limit transmission of further messages not yet acknowledged as successfully delivered according to the window size and having an estimated rate of loss events where the error correction code used to determine redundancy messages chosen is based on the estimated rate of loss events. In embodiments, provided herein is a system for data communication between nodes having the ability to limit transmission of further messages not yet acknowledged as successfully delivered according to the window size and having the ability to apply forward error correction based on messages received describing channel characteristics. In embodiments, provided herein is a system for data communication between nodes having the ability to limit transmission of further messages not yet acknowledged as successfully delivered according to the window size and having the ability to maintain/set timers based on occurrences of delivery order events and delaying transmission of feedback messages using timers. In embodiments, provided herein is a system for data communication between nodes having the ability to limit transmission of further messages not yet acknowledged as successfully delivered according to the window size and having the ability to maintain/set timers based on occurrences of delivery order events and delaying modification of congestion window size based on timers. In embodiments, provided herein is a system for data communication between nodes having the ability to limit transmission of further messages not yet acknowledged as successfully delivered according to the window size and having the ability to maintain/set timers based on occurrences of delivery order events, delaying modification of congestion window size based on timers, and cancelling modification of congestion window size when receiving a feedback message indicating successful delivery. In embodiments, provided herein is a system for data communication between nodes having the ability to limit transmission of further messages not yet acknowledged as successfully delivered according to the window size and having the ability to configure a new connection using maintained data characterizing a current/previous connection. In embodiments, provided herein is a system for data communication between nodes having the ability to limit transmission of further messages not yet acknowledged as successfully delivered according to the window size and having the ability to configure a new connection using maintained data characterizing an error rate of a current/previous connection. In embodiments, provided herein is a system for data communication between nodes having the ability to limit transmission of further messages not yet acknowledged as successfully delivered according to the window size and having the ability to configure a new connection using maintained data characterizing a timing variability of a current/previous connection. In embodiments, provided herein is a system for data communication between nodes having the ability to limit transmission of further messages not yet acknowledged as successfully delivered according to the window size and having the ability to configure a new connection using maintained data characterizing bandwidth of a current/previous connection. In embodiments, provided herein is a system for data communication between nodes having the ability to limit transmission of further messages not yet acknowledged as successfully delivered according to the window size and having the ability to configure a new connection using maintained data characterizing round trip time of a current/previous connection. In embodiments, provided herein is a system for data communication between nodes having the ability to limit transmission of further messages not yet acknowledged as successfully delivered according to the window size and having the ability to configure a new connection using maintained data characterizing communication control parameters of a current/previous connection. In embodiments, provided herein is a system for data communication between nodes having the ability to limit transmission of further messages not yet acknowledged as successfully delivered according to the window size and having the ability to configure new connection using maintained data characterizing forward error correction parameters of a current/previous connection. In embodiments, provided herein is a system for data communication between nodes having the ability to limit transmission of further messages not yet acknowledged as successfully delivered according to the window size and having a data store for maintaining data characterizing one or more current or previous data communication connections and a connection initiation module for initiating new data communication connections based on maintained data. In embodiments, provided herein is a system for data communication between nodes having the ability to limit transmission of further messages not yet acknowledged as successfully delivered according to the window size and having the ability to transmit a first subset of data messages over a lower latency data path and a second subset of messages over a higher latency data path. In embodiments, provided herein is a system for data communication between nodes having the ability to limit transmission of further messages not yet acknowledged as successfully delivered according to the window size and having the ability to transmit a first subset of data messages that are time critical over a lower latency data path and a second subset of messages over a higher latency data path. In embodiments, provided herein is a system for data communication between nodes having the ability to limit transmission of further messages not yet acknowledged as successfully delivered according to the window size and having the ability to transmit a first initial subset of data messages over a lower latency data path and a second subset of messages that are subsequently available over a higher latency data path. In embodiments, provided herein is a system for data communication between nodes having the ability to limit transmission of further messages not yet acknowledged as successfully delivered according to the window size and having the ability to transmit a first subset of acknowledgment messages over a lower latency data path and a second subset of data messages over a higher latency data path. In embodiments, provided herein is a system for data communication between nodes having the ability to limit transmission of further messages not yet acknowledged as successfully delivered according to the window size and having the ability to transmit a first subset of supplemental/redundancy data messages over a lower latency data path and a second subset of data messages over a higher latency data path. In embodiments, provided herein is a system for data communication between nodes having the ability to limit transmission of further messages not yet acknowledged as successfully delivered according to the window size and having a degree of redundancy associated with each message that is based on message position in the transmission order. In embodiments, provided herein is a system for data communication between nodes having the ability to limit transmission of further messages not yet acknowledged as successfully delivered according to the window size and having a degree of redundancy associated with each message that increases as the position of the messages is non-decreasing. In embodiments, provided herein is a system for data communication between nodes having the ability to limit transmission of further messages not yet acknowledged as successfully delivered according to the window size and having a degree of redundancy associated with each message that is based on message position in the transmission order and in response to receiving feedback messages. In embodiments, provided herein is a system for data communication between nodes having the ability to limit transmission of further messages not yet acknowledged as successfully delivered according to the window size and having a degree of redundancy associated with each message that is based on message position in the transmission order and in response to receiving feedback messages, and adding or removing redundancy messages from the queue based on the feedback messages. In embodiments, provided herein is a system for data communication between nodes having the ability to limit transmission of further messages not yet acknowledged as successfully delivered according to the window size and having the ability to adjust the number of messages sent over each of multiple different data paths with different communication protocols if it is determined that a data path is altering flow of messages. In embodiments, provided herein is a system for data communication between nodes having the ability to limit transmission of further messages not yet acknowledged as successfully delivered according to the window size and having the ability to adjust the number of messages sent over each of multiple different data paths with different communication protocols if it is determined that a data path is altering flow of messages initial division based on previous communication connections. In embodiments, provided herein is a system for data communication between nodes having the ability to limit transmission of further messages not yet acknowledged as successfully delivered according to the window size and having the ability to modify/add/remove redundancy information associated with encoded data as it travels from node to node via channels based on channel characteristics. In embodiments, provided herein is a system for data communication between nodes having the ability to limit transmission of further messages not yet acknowledged as successfully delivered according to the window size and having the ability to send FEC packets at an estimated rate of loss events (isolated packet loss or burst of consecutive packets). In embodiments, provided herein is a system for data communication between nodes having the ability to limit transmission of further messages not yet acknowledged as successfully delivered according to the window size and having combined coding, TCP, and pacing of packet transmissions. In embodiments, provided herein is a system for data communication between nodes having the ability to limit transmission of further messages not yet acknowledged as successfully delivered according to the window size and having a forward error correction code construction that interleaves groups of message packets and parity packets and has coding across overlapping groups of message packets. In embodiments, provided herein is a system for data communication between nodes having the ability to limit transmission of further messages not yet acknowledged as successfully delivered according to the window size and having a variant of TCP that combines delay-based back off with a stable window increase function.

In embodiments, provided herein is a system for data communication between nodes having the ability to maintain an estimate of a rate of loss events and use it to adjust the rate of redundancy messages. In embodiments, provided herein is a system for data communication between nodes having the ability to maintain an estimate of a rate of loss events and use it to adjust the rate of redundancy messages and having an estimated rate of loss events where the error correction code used to determine redundancy messages chosen is based on the estimated rate of loss events. In embodiments, provided herein is a system for data communication between nodes having the ability to maintain an estimate of a rate of loss events and use it to adjust the rate of redundancy messages and having the ability to apply forward error correction based on messages received describing channel characteristics. In embodiments, provided herein is a system for data communication between nodes having the ability to maintain an estimate of a rate of loss events and use it to adjust the rate of redundancy messages and having the ability to maintain/set timers based on occurrences of delivery order events and delaying transmission of feedback messages using timers. In embodiments, provided herein is a system for data communication between nodes having the ability to maintain an estimate of a rate of loss events and use it to adjust the rate of redundancy messages and having the ability to maintain/set timers based on occurrences of delivery order events and delaying modification of congestion window size based on timers. In embodiments, provided herein is a system for data communication between nodes having the ability to maintain an estimate of a rate of loss events and use it to adjust the rate of redundancy messages and having the ability to maintain/set timers based on occurrences of delivery order events, delaying modification of congestion window size based on timers, and cancelling modification of congestion window size when receiving a feedback message indicating successful delivery. In embodiments, provided herein is a system for data communication between nodes having the ability to maintain an estimate of a rate of loss events and use it to adjust the rate of redundancy messages and having the ability to configure a new connection using maintained data characterizing a current/previous connection. In embodiments, provided herein is a system for data communication between nodes having the ability to maintain an estimate of a rate of loss events and use it to adjust the rate of redundancy messages and having the ability to configure a new connection using maintained data characterizing an error rate of a current/previous connection. In embodiments, provided herein is a system for data communication between nodes having the ability to maintain an estimate of a rate of loss events and use it to adjust the rate of redundancy messages and having the ability to configure a new connection using maintained data characterizing a timing variability of a current/previous connection. In embodiments, provided herein is a system for data communication between nodes having the ability to maintain an estimate of a rate of loss events and use it to adjust the rate of redundancy messages and having the ability to configure a new connection using maintained data characterizing bandwidth of a current/previous connection. In embodiments, provided herein is a system for data communication between nodes having the ability to maintain an estimate of a rate of loss events and use it to adjust the rate of redundancy messages and having the ability to configure a new connection using maintained data characterizing round trip time of a current/previous connection. In embodiments, provided herein is a system for data communication between nodes having the ability to maintain an estimate of a rate of loss events and use it to adjust the rate of redundancy messages and having the ability to configure a new connection using maintained data characterizing communication control parameters of a current/previous connection. In embodiments, provided herein is a system for data communication between nodes having the ability to maintain an estimate of a rate of loss events and use it to adjust the rate of redundancy messages and having the ability to configure new connection using maintained data characterizing forward error correction parameters of a current/previous connection. In embodiments, provided herein is a system for data communication between nodes having the ability to maintain an estimate of a rate of loss events and use it to adjust the rate of redundancy messages and having a data store for maintaining data characterizing one or more current or previous data communication connections and a connection initiation module for initiating new data communication connections based on maintained data. In embodiments, provided herein is a system for data communication between nodes having the ability to maintain an estimate of a rate of loss events and use it to adjust the rate of redundancy messages and having the ability to transmit a first subset of data messages over a lower latency data path and a second subset of messages over a higher latency data path. In embodiments, provided herein is a system for data communication between nodes having the ability to maintain an estimate of a rate of loss events and use it to adjust the rate of redundancy messages and having the ability to transmit a first subset of data messages that are time critical over a lower latency data path and a second subset of messages over a higher latency data path. In embodiments, provided herein is a system for data communication between nodes having the ability to maintain an estimate of a rate of loss events and use it to adjust the rate of redundancy messages and having the ability to transmit a first initial subset of data messages over a lower latency data path and a second subset of messages that are subsequently available over a higher latency data path. In embodiments, provided herein is a system for data communication between nodes having the ability to maintain an estimate of a rate of loss events and use it to adjust the rate of redundancy messages and having the ability to transmit a first subset of acknowledgment messages over a lower latency data path and a second subset of data messages over a higher latency data path. In embodiments, provided herein is a system for data communication between nodes having the ability to maintain an estimate of a rate of loss events and use it to adjust the rate of redundancy messages and having the ability to transmit a first subset of supplemental/redundancy data messages over a lower latency data path and a second subset of data messages over a higher latency data path. In embodiments, provided herein is a system for data communication between nodes having the ability to maintain an estimate of a rate of loss events and use it to adjust the rate of redundancy messages and having a degree of redundancy associated with each message that is based on message position in the transmission order. In embodiments, provided herein is a system for data communication between nodes having the ability to maintain an estimate of a rate of loss events and use it to adjust the rate of redundancy messages and having a degree of redundancy associated with each message that increases as the position of the messages is non-decreasing. In embodiments, provided herein is a system for data communication between nodes having the ability to maintain an estimate of a rate of loss events and use it to adjust the rate of redundancy messages and having a degree of redundancy associated with each message that is based on message position in the transmission order and in response to receiving feedback messages. In embodiments, provided herein is a system for data communication between nodes having the ability to maintain an estimate of a rate of loss events and use it to adjust the rate of redundancy messages and having a degree of redundancy associated with each message that is based on message position in the transmission order and in response to receiving feedback messages, and adding or removing redundancy messages from the queue based on the feedback messages. In embodiments, provided herein is a system for data communication between nodes having the ability to maintain an estimate of a rate of loss events and use it to adjust the rate of redundancy messages and having the ability to adjust the number of messages sent over each of multiple different data paths with different communication protocols if it is determined that a data path is altering flow of messages. In embodiments, provided herein is a system for data communication between nodes having the ability to maintain an estimate of a rate of loss events and use it to adjust the rate of redundancy messages and having the ability to adjust the number of messages sent over each of multiple different data paths with different communication protocols if it is determined that a data path is altering flow of messages initial division based on previous communication connections. In embodiments, provided herein is a system for data communication between nodes having the ability to maintain an estimate of a rate of loss events and use it to adjust the rate of redundancy messages and having the ability to modify/add/remove redundancy information associated with encoded data as it travels from node to node via channels based on channel characteristics. In embodiments, provided herein is a system for data communication between nodes having the ability to maintain an estimate of a rate of loss events and use it to adjust the rate of redundancy messages and having the ability to send FEC packets at an estimated rate of loss events (isolated packet loss or burst of consecutive packets). In embodiments, provided herein is a system for data communication between nodes having the ability to maintain an estimate of a rate of loss events and use it to adjust the rate of redundancy messages and having combined coding, TCP, and pacing of packet transmissions. In embodiments, provided herein is a system for data communication between nodes having the ability to maintain an estimate of a rate of loss events and use it to adjust the rate of redundancy messages and having a forward error correction code construction that interleaves groups of message packets and parity packets and has coding across overlapping groups of message packets. In embodiments, provided herein is a system for data communication between nodes having the ability to maintain an estimate of a rate of loss events and use it to adjust the rate of redundancy messages and having a variant of TCP that combines delay-based back off with a stable window increase function.

In embodiments, provided herein is a system for data communication between nodes having an estimated rate of loss events where the error correction code used to determine redundancy messages chosen is based on the estimated rate of loss events. In embodiments, provided herein is a system for data communication between nodes having an estimated rate of loss events where the error correction code used to determine redundancy messages chosen is based on the estimated rate of loss events and having the ability to apply forward error correction based on messages received describing channel characteristics. In embodiments, provided herein is a system for data communication between nodes having an estimated rate of loss events where the error correction code used to determine redundancy messages chosen is based on the estimated rate of loss events and having the ability to maintain/set timers based on occurrences of delivery order events and delaying transmission of feedback messages using timers. In embodiments, provided herein is a system for data communication between nodes having an estimated rate of loss events where the error correction code used to determine redundancy messages chosen is based on the estimated rate of loss events and having the ability to maintain/set timers based on occurrences of delivery order events and delaying modification of congestion window size based on timers. In embodiments, provided herein is a system for data communication between nodes having an estimated rate of loss events where the error correction code used to determine redundancy messages chosen is based on the estimated rate of loss events and having the ability to maintain/set timers based on occurrences of delivery order events, delaying modification of congestion window size based on timers, and cancelling modification of congestion window size when receiving a feedback message indicating successful delivery. In embodiments, provided herein is a system for data communication between nodes having an estimated rate of loss events where the error correction code used to determine redundancy messages chosen is based on the estimated rate of loss events and having the ability to configure a new connection using maintained data characterizing a current/previous connection. In embodiments, provided herein is a system for data communication between nodes having an estimated rate of loss events where the error correction code used to determine redundancy messages chosen is based on the estimated rate of loss events and having the ability to configure a new connection using maintained data characterizing an error rate of a current/previous connection. In embodiments, provided herein is a system for data communication between nodes having an estimated rate of loss events where the error correction code used to determine redundancy messages chosen is based on the estimated rate of loss events and having the ability to configure a new connection using maintained data characterizing a timing variability of a current/previous connection. In embodiments, provided herein is a system for data communication between nodes having an estimated rate of loss events where the error correction code used to determine redundancy messages chosen is based on the estimated rate of loss events and having the ability to configure a new connection using maintained data characterizing bandwidth of a current/previous connection. In embodiments, provided herein is a system for data communication between nodes having an estimated rate of loss events where the error correction code used to determine redundancy messages chosen is based on the estimated rate of loss events and having the ability to configure a new connection using maintained data characterizing round trip time of a current/previous connection. In embodiments, provided herein is a system for data communication between nodes having an estimated rate of loss events where the error correction code used to determine redundancy messages chosen is based on the estimated rate of loss events and having the ability to configure a new connection using maintained data characterizing communication control parameters of a current/previous connection. In embodiments, provided herein is a system for data communication between nodes having an estimated rate of loss events where the error correction code used to determine redundancy messages chosen is based on the estimated rate of loss events and having the ability to configure new connection using maintained data characterizing forward error correction parameters of a current/previous connection. In embodiments, provided herein is a system for data communication between nodes having an estimated rate of loss events where the error correction code used to determine redundancy messages chosen is based on the estimated rate of loss events and having a data store for maintaining data characterizing one or more current or previous data communication connections and a connection initiation module for initiating new data communication connections based on maintained data. In embodiments, provided herein is a system for data communication between nodes having an estimated rate of loss events where the error correction code used to determine redundancy messages chosen is based on the estimated rate of loss events and having the ability to transmit a first subset of data messages over a lower latency data path and a second subset of messages over a higher latency data path. In embodiments, provided herein is a system for data communication between nodes having an estimated rate of loss events where the error correction code used to determine redundancy messages chosen is based on the estimated rate of loss events and having the ability to transmit a first subset of data messages that are time critical over a lower latency data path and a second subset of messages over a higher latency data path. In embodiments, provided herein is a system for data communication between nodes having an estimated rate of loss events where the error correction code used to determine redundancy messages chosen is based on the estimated rate of loss events and having the ability to transmit a first initial subset of data messages over a lower latency data path and a second subset of messages that are subsequently available over a higher latency data path. In embodiments, provided herein is a system for data communication between nodes having an estimated rate of loss events where the error correction code used to determine redundancy messages chosen is based on the estimated rate of loss events and having the ability to transmit a first subset of acknowledgment messages over a lower latency data path and a second subset of data messages over a higher latency data path. In embodiments, provided herein is a system for data communication between nodes having an estimated rate of loss events where the error correction code used to determine redundancy messages chosen is based on the estimated rate of loss events and having the ability to transmit a first subset of supplemental/redundancy data messages over a lower latency data path and a second subset of data messages over a higher latency data path. In embodiments, provided herein is a system for data communication between nodes having an estimated rate of loss events where the error correction code used to determine redundancy messages chosen is based on the estimated rate of loss events and having a degree of redundancy associated with each message that is based on message position in the transmission order. In embodiments, provided herein is a system for data communication between nodes having an estimated rate of loss events where the error correction code used to determine redundancy messages chosen is based on the estimated rate of loss events and having a degree of redundancy associated with each message that increases as the position of the messages is non-decreasing. In embodiments, provided herein is a system for data communication between nodes having an estimated rate of loss events where the error correction code used to determine redundancy messages chosen is based on the estimated rate of loss events and having a degree of redundancy associated with each message that is based on message position in the transmission order and in response to receiving feedback messages. In embodiments, provided herein is a system for data communication between nodes having an estimated rate of loss events where the error correction code used to determine redundancy messages chosen is based on the estimated rate of loss events and having a degree of redundancy associated with each message that is based on message position in the transmission order and in response to receiving feedback messages, and adding or removing redundancy messages from the queue based on the feedback messages. In embodiments, provided herein is a system for data communication between nodes having an estimated rate of loss events where the error correction code used to determine redundancy messages chosen is based on the estimated rate of loss events and having the ability to adjust the number of messages sent over each of multiple different data paths with different communication protocols if it is determined that a data path is altering flow of messages. In embodiments, provided herein is a system for data communication between nodes having an estimated rate of loss events where the error correction code used to determine redundancy messages chosen is based on the estimated rate of loss events and having the ability to adjust the number of messages sent over each of multiple different data paths with different communication protocols if it is determined that a data path is altering flow of messages initial division based on previous communication connections. In embodiments, provided herein is a system for data communication between nodes having an estimated rate of loss events where the error correction code used to determine redundancy messages chosen is based on the estimated rate of loss events and having the ability to modify/add/remove redundancy information associated with encoded data as it travels from node to node via channels based on channel characteristics. In embodiments, provided herein is a system for data communication between nodes having an estimated rate of loss events where the error correction code used to determine redundancy messages chosen is based on the estimated rate of loss events and having the ability to send FEC packets at an estimated rate of loss events (isolated packet loss or burst of consecutive packets). In embodiments, provided herein is a system for data communication between nodes having an estimated rate of loss events where the error correction code used to determine redundancy messages chosen is based on the estimated rate of loss events and having combined coding, TCP, and pacing of packet transmissions. In embodiments, provided herein is a system for data communication between nodes having an estimated rate of loss events where the error correction code used to determine redundancy messages chosen is based on the estimated rate of loss events and having a forward error correction code construction that interleaves groups of message packets and parity packets and has coding across overlapping groups of message packets. In embodiments, provided herein is a system for data communication between nodes having an estimated rate of loss events where the error correction code used to determine redundancy messages chosen is based on the estimated rate of loss events and having a variant of TCP that combines delay-based back off with a stable window increase function.

In embodiments, provided herein is a system for data communication between nodes having the ability to apply forward error correction based on messages received describing channel characteristics. In embodiments, provided herein is a system for data communication between nodes having the ability to apply forward error correction based on messages received describing channel characteristics and having the ability to maintain/set timers based on occurrences of delivery order events and delaying transmission of feedback messages using timers. In embodiments, provided herein is a system for data communication between nodes having the ability to apply forward error correction based on messages received describing channel characteristics and having the ability to maintain/set timers based on occurrences of delivery order events and delaying modification of congestion window size based on timers. In embodiments, provided herein is a system for data communication between nodes having the ability to apply forward error correction based on messages received describing channel characteristics and having the ability to maintain/set timers based on occurrences of delivery order events, delaying modification of congestion window size based on timers, and cancelling modification of congestion window size when receiving a feedback message indicating successful delivery. In embodiments, provided herein is a system for data communication between nodes having the ability to apply forward error correction based on messages received describing channel characteristics and having the ability to configure a new connection using maintained data characterizing a current/previous connection. In embodiments, provided herein is a system for data communication between nodes having the ability to apply forward error correction based on messages received describing channel characteristics and having the ability to configure a new connection using maintained data characterizing an error rate of a current/previous connection. In embodiments, provided herein is a system for data communication between nodes having the ability to apply forward error correction based on messages received describing channel characteristics and having the ability to configure a new connection using maintained data characterizing a timing variability of a current/previous connection. In embodiments, provided herein is a system for data communication between nodes having the ability to apply forward error correction based on messages received describing channel characteristics and having the ability to configure a new connection using maintained data characterizing bandwidth of a current/previous connection. In embodiments, provided herein is a system for data communication between nodes having the ability to apply forward error correction based on messages received describing channel characteristics and having the ability to configure a new connection using maintained data characterizing round trip time of a current/previous connection. In embodiments, provided herein is a system for data communication between nodes having the ability to apply forward error correction based on messages received describing channel characteristics and having the ability to configure a new connection using maintained data characterizing communication control parameters of a current/previous connection. In embodiments, provided herein is a system for data communication between nodes having the ability to apply forward error correction based on messages received describing channel characteristics and having the ability to configure new connection using maintained data characterizing forward error correction parameters of a current/previous connection. In embodiments, provided herein is a system for data communication between nodes having the ability to apply forward error correction based on messages received describing channel characteristics and having a data store for maintaining data characterizing one or more current or previous data communication connections and a connection initiation module for initiating new data communication connections based on maintained data. In embodiments, provided herein is a system for data communication between nodes having the ability to apply forward error correction based on messages received describing channel characteristics and having the ability to transmit a first subset of data messages over a lower latency data path and a second subset of messages over a higher latency data path. In embodiments, provided herein is a system for data communication between nodes having the ability to apply forward error correction based on messages received describing channel characteristics and having the ability to transmit a first subset of data messages that are time critical over a lower latency data path and a second subset of messages over a higher latency data path. In embodiments, provided herein is a system for data communication between nodes having the ability to apply forward error correction based on messages received describing channel characteristics and having the ability to transmit a first initial subset of data messages over a lower latency data path and a second subset of messages that are subsequently available over a higher latency data path. In embodiments, provided herein is a system for data communication between nodes having the ability to apply forward error correction based on messages received describing channel characteristics and having the ability to transmit a first subset of acknowledgment messages over a lower latency data path and a second subset of data messages over a higher latency data path. In embodiments, provided herein is a system for data communication between nodes having the ability to apply forward error correction based on messages received describing channel characteristics and having the ability to transmit a first subset of supplemental/redundancy data messages over a lower latency data path and a second subset of data messages over a higher latency data path. In embodiments, provided herein is a system for data communication between nodes having the ability to apply forward error correction based on messages received describing channel characteristics and having a degree of redundancy associated with each message that is based on message position in the transmission order. In embodiments, provided herein is a system for data communication between nodes having the ability to apply forward error correction based on messages received describing channel characteristics and having a degree of redundancy associated with each message that increases as the position of the messages is non-decreasing. In embodiments, provided herein is a system for data communication between nodes having the ability to apply forward error correction based on messages received describing channel characteristics and having a degree of redundancy associated with each message that is based on message position in the transmission order and in response to receiving feedback messages. In embodiments, provided herein is a system for data communication between nodes having the ability to apply forward error correction based on messages received describing channel characteristics and having a degree of redundancy associated with each message that is based on message position in the transmission order and in response to receiving feedback messages, and adding or removing redundancy messages from the queue based on the feedback messages. In embodiments, provided herein is a system for data communication between nodes having the ability to apply forward error correction based on messages received describing channel characteristics and having the ability to adjust the number of messages sent over each of multiple different data paths with different communication protocols if it is determined that a data path is altering flow of messages. In embodiments, provided herein is a system for data communication between nodes having the ability to apply forward error correction based on messages received describing channel characteristics and having the ability to adjust the number of messages sent over each of multiple different data paths with different communication protocols if it is determined that a data path is altering flow of messages initial division based on previous communication connections. In embodiments, provided herein is a system for data communication between nodes having the ability to apply forward error correction based on messages received describing channel characteristics and having the ability to modify/add/remove redundancy information associated with encoded data as it travels from node to node via channels based on channel characteristics. In embodiments, provided herein is a system for data communication between nodes having the ability to apply forward error correction based on messages received describing channel characteristics and having the ability to send FEC packets at an estimated rate of loss events (isolated packet loss or burst of consecutive packets). In embodiments, provided herein is a system for data communication between nodes having the ability to apply forward error correction based on messages received describing channel characteristics and having combined coding, TCP, and pacing of packet transmissions. In embodiments, provided herein is a system for data communication between nodes having the ability to apply forward error correction based on messages received describing channel characteristics and having a forward error correction code construction that interleaves groups of message packets and parity packets and has coding across overlapping groups of message packets. In embodiments, provided herein is a system for data communication between nodes having the ability to apply forward error correction based on messages received describing channel characteristics and having a variant of TCP that combines delay-based back off with a stable window increase function.

In embodiments, provided herein is a system for data communication between nodes having the ability to maintain/set timers based on occurrences of delivery order events and delaying transmission of feedback messages using timers. In embodiments, provided herein is a system for data communication between nodes having the ability to maintain/set timers based on occurrences of delivery order events and delaying transmission of feedback messages using timers and having the ability to maintain/set timers based on occurrences of delivery order events and delaying modification of congestion window size based on timers. In embodiments, provided herein is a system for data communication between nodes having the ability to maintain/set timers based on occurrences of delivery order events and delaying transmission of feedback messages using timers and having the ability to maintain/set timers based on occurrences of delivery order events, delaying modification of congestion window size based on timers, and cancelling modification of congestion window size when receiving a feedback message indicating successful delivery. In embodiments, provided herein is a system for data communication between nodes having the ability to maintain/set timers based on occurrences of delivery order events and delaying transmission of feedback messages using timers and having the ability to configure a new connection using maintained data characterizing a current/previous connection. In embodiments, provided herein is a system for data communication between nodes having the ability to maintain/set timers based on occurrences of delivery order events and delaying transmission of feedback messages using timers and having the ability to configure a new connection using maintained data characterizing an error rate of a current/previous connection. In embodiments, provided herein is a system for data communication between nodes having the ability to maintain/set timers based on occurrences of delivery order events and delaying transmission of feedback messages using timers and having the ability to configure a new connection using maintained data characterizing a timing variability of a current/previous connection. In embodiments, provided herein is a system for data communication between nodes having the ability to maintain/set timers based on occurrences of delivery order events and delaying transmission of feedback messages using timers and having the ability to configure a new connection using maintained data characterizing bandwidth of a current/previous connection. In embodiments, provided herein is a system for data communication between nodes having the ability to maintain/set timers based on occurrences of delivery order events and delaying transmission of feedback messages using timers and having the ability to configure a new connection using maintained data characterizing round trip time of a current/previous connection. In embodiments, provided herein is a system for data communication between nodes having the ability to maintain/set timers based on occurrences of delivery order events and delaying transmission of feedback messages using timers and having the ability to configure a new connection using maintained data characterizing communication control parameters of a current/previous connection. In embodiments, provided herein is a system for data communication between nodes having the ability to maintain/set timers based on occurrences of delivery order events and delaying transmission of feedback messages using timers and having the ability to configure new connection using maintained data characterizing forward error correction parameters of a current/previous connection. In embodiments, provided herein is a system for data communication between nodes having the ability to maintain/set timers based on occurrences of delivery order events and delaying transmission of feedback messages using timers and having a data store for maintaining data characterizing one or more current or previous data communication connections and a connection initiation module for initiating new data communication connections based on maintained data. In embodiments, provided herein is a system for data communication between nodes having the ability to maintain/set timers based on occurrences of delivery order events and delaying transmission of feedback messages using timers and having the ability to transmit a first subset of data messages over a lower latency data path and a second subset of messages over a higher latency data path. In embodiments, provided herein is a system for data communication between nodes having the ability to maintain/set timers based on occurrences of delivery order events and delaying transmission of feedback messages using timers and having the ability to transmit a first subset of data messages that are time critical over a lower latency data path and a second subset of messages over a higher latency data path. In embodiments, provided herein is a system for data communication between nodes having the ability to maintain/set timers based on occurrences of delivery order events and delaying transmission of feedback messages using timers and having the ability to transmit a first initial subset of data messages over a lower latency data path and a second subset of messages that are subsequently available over a higher latency data path. In embodiments, provided herein is a system for data communication between nodes having the ability to maintain/set timers based on occurrences of delivery order events and delaying transmission of feedback messages using timers and having the ability to transmit a first subset of acknowledgment messages over a lower latency data path and a second subset of data messages over a higher latency data path. In embodiments, provided herein is a system for data communication between nodes having the ability to maintain/set timers based on occurrences of delivery order events and delaying transmission of feedback messages using timers and having the ability to transmit a first subset of supplemental/redundancy data messages over a lower latency data path and a second subset of data messages over a higher latency data path. In embodiments, provided herein is a system for data communication between nodes having the ability to maintain/set timers based on occurrences of delivery order events and delaying transmission of feedback messages using timers and having a degree of redundancy associated with each message that is based on message position in the transmission order. In embodiments, provided herein is a system for data communication between nodes having the ability to maintain/set timers based on occurrences of delivery order events and delaying transmission of feedback messages using timers and having a degree of redundancy associated with each message that increases as the position of the messages is non-decreasing. In embodiments, provided herein is a system for data communication between nodes having the ability to maintain/set timers based on occurrences of delivery order events and delaying transmission of feedback messages using timers and having a degree of redundancy associated with each message that is based on message position in the transmission order and in response to receiving feedback messages. In embodiments, provided herein is a system for data communication between nodes having the ability to maintain/set timers based on occurrences of delivery order events and delaying transmission of feedback messages using timers and having a degree of redundancy associated with each message that is based on message position in the transmission order and in response to receiving feedback messages, and adding or removing redundancy messages from the queue based on the feedback messages. In embodiments, provided herein is a system for data communication between nodes having the ability to maintain/set timers based on occurrences of delivery order events and delaying transmission of feedback messages using timers and having the ability to adjust the number of messages sent over each of multiple different data paths with different communication protocols if it is determined that a data path is altering flow of messages. In embodiments, provided herein is a system for data communication between nodes having the ability to maintain/set timers based on occurrences of delivery order events and delaying transmission of feedback messages using timers and having the ability to adjust the number of messages sent over each of multiple different data paths with different communication protocols if it is determined that a data path is altering flow of messages initial division based on previous communication connections. In embodiments, provided herein is a system for data communication between nodes having the ability to maintain/set timers based on occurrences of delivery order events and delaying transmission of feedback messages using timers and having the ability to modify/add/remove redundancy information associated with encoded data as it travels from node to node via channels based on channel characteristics. In embodiments, provided herein is a system for data communication between nodes having the ability to maintain/set timers based on occurrences of delivery order events and delaying transmission of feedback messages using timers and having the ability to send FEC packets at an estimated rate of loss events (isolated packet loss or burst of consecutive packets). In embodiments, provided herein is a system for data communication between nodes having the ability to maintain/set timers based on occurrences of delivery order events and delaying transmission of feedback messages using timers and having combined coding, TCP, and pacing of packet transmissions. In embodiments, provided herein is a system for data communication between nodes having the ability to maintain/set timers based on occurrences of delivery order events and delaying transmission of feedback messages using timers and having a forward error correction code construction that interleaves groups of message packets and parity packets and has coding across overlapping groups of message packets. In embodiments, provided herein is a system for data communication between nodes having the ability to maintain/set timers based on occurrences of delivery order events and delaying transmission of feedback messages using timers and having a variant of TCP that combines delay-based back off with a stable window increase function.

In embodiments, provided herein is a system for data communication between nodes having the ability to maintain/set timers based on occurrences of delivery order events and delaying modification of congestion window size based on timers. In embodiments, provided herein is a system for data communication between nodes having the ability to maintain/set timers based on occurrences of delivery order events and delaying modification of congestion window size based on timers and having the ability to maintain/set timers based on occurrences of delivery order events, delaying modification of congestion window size based on timers, and cancelling modification of congestion window size when receiving a feedback message indicating successful delivery. In embodiments, provided herein is a system for data communication between nodes having the ability to maintain/set timers based on occurrences of delivery order events and delaying modification of congestion window size based on timers and having the ability to configure a new connection using maintained data characterizing a current/previous connection. In embodiments, provided herein is a system for data communication between nodes having the ability to maintain/set timers based on occurrences of delivery order events and delaying modification of congestion window size based on timers and having the ability to configure a new connection using maintained data characterizing an error rate of a current/previous connection. In embodiments, provided herein is a system for data communication between nodes having the ability to maintain/set timers based on occurrences of delivery order events and delaying modification of congestion window size based on timers and having the ability to configure a new connection using maintained data characterizing a timing variability of a current/previous connection. In embodiments, provided herein is a system for data communication between nodes having the ability to maintain/set timers based on occurrences of delivery order events and delaying modification of congestion window size based on timers and having the ability to configure a new connection using maintained data characterizing bandwidth of a current/previous connection. In embodiments, provided herein is a system for data communication between nodes having the ability to maintain/set timers based on occurrences of delivery order events and delaying modification of congestion window size based on timers and having the ability to configure a new connection using maintained data characterizing round trip time of a current/previous connection. In embodiments, provided herein is a system for data communication between nodes having the ability to maintain/set timers based on occurrences of delivery order events and delaying modification of congestion window size based on timers and having the ability to configure a new connection using maintained data characterizing communication control parameters of a current/previous connection. In embodiments, provided herein is a system for data communication between nodes having the ability to maintain/set timers based on occurrences of delivery order events and delaying modification of congestion window size based on timers and having the ability to configure new connection using maintained data characterizing forward error correction parameters of a current/previous connection. In embodiments, provided herein is a system for data communication between nodes having the ability to maintain/set timers based on occurrences of delivery order events and delaying modification of congestion window size based on timers and having a data store for maintaining data characterizing one or more current or previous data communication connections and a connection initiation module for initiating new data communication connections based on maintained data. In embodiments, provided herein is a system for data communication between nodes having the ability to maintain/set timers based on occurrences of delivery order events and delaying modification of congestion window size based on timers and having the ability to transmit a first subset of data messages over a lower latency data path and a second subset of messages over a higher latency data path. In embodiments, provided herein is a system for data communication between nodes having the ability to maintain/set timers based on occurrences of delivery order events and delaying modification of congestion window size based on timers and having the ability to transmit a first subset of data messages that are time critical over a lower latency data path and a second subset of messages over a higher latency data path. In embodiments, provided herein is a system for data communication between nodes having the ability to maintain/set timers based on occurrences of delivery order events and delaying modification of congestion window size based on timers and having the ability to transmit a first initial subset of data messages over a lower latency data path and a second subset of messages that are subsequently available over a higher latency data path. In embodiments, provided herein is a system for data communication between nodes having the ability to maintain/set timers based on occurrences of delivery order events and delaying modification of congestion window size based on timers and having the ability to transmit a first subset of acknowledgment messages over a lower latency data path and a second subset of data messages over a higher latency data path. In embodiments, provided herein is a system for data communication between nodes having the ability to maintain/set timers based on occurrences of delivery order events and delaying modification of congestion window size based on timers and having the ability to transmit a first subset of supplemental/redundancy data messages over a lower latency data path and a second subset of data messages over a higher latency data path. In embodiments, provided herein is a system for data communication between nodes having the ability to maintain/set timers based on occurrences of delivery order events and delaying modification of congestion window size based on timers and having a degree of redundancy associated with each message that is based on message position in the transmission order. In embodiments, provided herein is a system for data communication between nodes having the ability to maintain/set timers based on occurrences of delivery order events and delaying modification of congestion window size based on timers and having a degree of redundancy associated with each message that increases as the position of the messages is non-decreasing. In embodiments, provided herein is a system for data communication between nodes having the ability to maintain/set timers based on occurrences of delivery order events and delaying modification of congestion window size based on timers and having a degree of redundancy associated with each message that is based on message position in the transmission order and in response to receiving feedback messages. In embodiments, provided herein is a system for data communication between nodes having the ability to maintain/set timers based on occurrences of delivery order events and delaying modification of congestion window size based on timers and having a degree of redundancy associated with each message that is based on message position in the transmission order and in response to receiving feedback messages, and adding or removing redundancy messages from the queue based on the feedback messages. In embodiments, provided herein is a system for data communication between nodes having the ability to maintain/set timers based on occurrences of delivery order events and delaying modification of congestion window size based on timers and having the ability to adjust the number of messages sent over each of multiple different data paths with different communication protocols if it is determined that a data path is altering flow of messages. In embodiments, provided herein is a system for data communication between nodes having the ability to maintain/set timers based on occurrences of delivery order events and delaying modification of congestion window size based on timers and having the ability to adjust the number of messages sent over each of multiple different data paths with different communication protocols if it is determined that a data path is altering flow of messages initial division based on previous communication connections. In embodiments, provided herein is a system for data communication between nodes having the ability to maintain/set timers based on occurrences of delivery order events and delaying modification of congestion window size based on timers and having the ability to modify/add/remove redundancy information associated with encoded data as it travels from node to node via channels based on channel characteristics. In embodiments, provided herein is a system for data communication between nodes having the ability to maintain/set timers based on occurrences of delivery order events and delaying modification of congestion window size based on timers and having the ability to send FEC packets at an estimated rate of loss events (isolated packet loss or burst of consecutive packets). In embodiments, provided herein is a system for data communication between nodes having the ability to maintain/set timers based on occurrences of delivery order events and delaying modification of congestion window size based on timers and having combined coding, TCP, and pacing of packet transmissions. In embodiments, provided herein is a system for data communication between nodes having the ability to maintain/set timers based on occurrences of delivery order events and delaying modification of congestion window size based on timers and having a forward error correction code construction that interleaves groups of message packets and parity packets and has coding across overlapping groups of message packets. In embodiments, provided herein is a system for data communication between nodes having the ability to maintain/set timers based on occurrences of delivery order events and delaying modification of congestion window size based on timers and having a variant of TCP that combines delay-based back off with a stable window increase function.

In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery. In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having the ability to configure a new connection using maintained data characterizing a current/previous connection. In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having the ability to configure a new connection using maintained data characterizing an error rate of a current/previous connection. In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having the ability to configure a new connection using maintained data characterizing a timing variability of a current/previous connection. In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having the ability to configure a new connection using maintained data characterizing bandwidth of a current/previous connection. In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having the ability to configure a new connection using maintained data characterizing round trip time of a current/previous connection. In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having the ability to configure a new connection using maintained data characterizing communication control parameters of a current/previous connection. In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having the ability to configure new connection using maintained data characterizing forward error correction parameters of a current/previous connection. In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having a data store for maintaining data characterizing one or more current or previous data communication connections and a connection initiation module for initiating new data communication connections based on maintained data. In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having the ability to transmit a first subset of data messages over a lower latency data path and a second subset of messages over a higher latency data path. In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having the ability to transmit a first subset of data messages that are time critical over a lower latency data path and a second subset of messages over a higher latency data path. In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having the ability to transmit a first initial subset of data messages over a lower latency data path and a second subset of messages that are subsequently available over a higher latency data path. In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having the ability to transmit a first subset of acknowledgment messages over a lower latency data path and a second subset of data messages over a higher latency data path. In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having the ability to transmit a first subset of supplemental/redundancy data messages over a lower latency data path and a second subset of data messages over a higher latency data path. In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having a degree of redundancy associated with each message that is based on message position in the transmission order. In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having a degree of redundancy associated with each message that increases as the position of the messages is non-decreasing. In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having a degree of redundancy associated with each message that is based on message position in the transmission order and in response to receiving feedback messages. In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having a degree of redundancy associated with each message that is based on message position in the transmission order and in response to receiving feedback messages, and adding or removing redundancy messages from the queue based on the feedback messages. In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having the ability to adjust the number of messages sent over each of multiple different data paths with different communication protocols if it is determined that a data path is altering flow of messages. In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having the ability to adjust the number of messages sent over each of multiple different data paths with different communication protocols if it is determined that a data path is altering flow of messages initial division based on previous communication connections. In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having the ability to modify/add/remove redundancy information associated with encoded data as it travels from node to node via channels based on channel characteristics. In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having the ability to send FEC packets at an estimated rate of loss events (isolated packet loss or burst of consecutive packets). In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having combined coding, TCP, and pacing of packet transmissions. In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having a forward error correction code construction that interleaves groups of message packets and parity packets and has coding across overlapping groups of message packets. In embodiments, provided herein is a system for data communication between nodes having the ability to maintain/set timers based on occurrences of delivery order events, delaying modification of congestion window size based on timers, and cancelling modification of congestion window size when receiving a feedback message indicating successful delivery and having a variant of TCP that combines delay-based back off with a stable window increase function.

In embodiments, provided herein is a system for data communication between nodes having the ability to configure a new connection using maintained data characterizing a current/previous connection. In embodiments, provided herein is a system for data communication between nodes having the ability to configure a new connection using maintained data characterizing a current/previous connection and having the ability to configure a new connection using maintained data characterizing an error rate of a current/previous connection. In embodiments, provided herein is a system for data communication between nodes having the ability to configure a new connection using maintained data characterizing a current/previous connection and having the ability to configure a new connection using maintained data characterizing a timing variability of a current/previous connection. In embodiments, provided herein is a system for data communication between nodes having the ability to configure a new connection using maintained data characterizing a current/previous connection and having the ability to configure a new connection using maintained data characterizing bandwidth of a current/previous connection. In embodiments, provided herein is a system for data communication between nodes having the ability to configure a new connection using maintained data characterizing a current/previous connection and having the ability to configure a new connection using maintained data characterizing round trip time of a current/previous connection. In embodiments, provided herein is a system for data communication between nodes having the ability to configure a new connection using maintained data characterizing a current/previous connection and having the ability to configure a new connection using maintained data characterizing communication control parameters of a current/previous connection. In embodiments, provided herein is a system for data communication between nodes having the ability to configure a new connection using maintained data characterizing a current/previous connection and having the ability to configure new connection using maintained data characterizing forward error correction parameters of a current/previous connection. In embodiments, provided herein is a system for data communication between nodes having the ability to configure a new connection using maintained data characterizing a current/previous connection and having a data store for maintaining data characterizing one or more current or previous data communication connections and a connection initiation module for initiating new data communication connections based on maintained data. In embodiments, provided herein is a system for data communication between nodes having the ability to configure a new connection using maintained data characterizing a current/previous connection and having the ability to transmit a first subset of data messages over a lower latency data path and a second subset of messages over a higher latency data path. In embodiments, provided herein is a system for data communication between nodes having the ability to configure a new connection using maintained data characterizing a current/previous connection and having the ability to transmit a first subset of data messages that are time critical over a lower latency data path and a second subset of messages over a higher latency data path. In embodiments, provided herein is a system for data communication between nodes having the ability to configure a new connection using maintained data characterizing a current/previous connection and having the ability to transmit a first initial subset of data messages over a lower latency data path and a second subset of messages that are subsequently available over a higher latency data path. In embodiments, provided herein is a system for data communication between nodes having the ability to configure a new connection using maintained data characterizing a current/previous connection and having the ability to transmit a first subset of acknowledgment messages over a lower latency data path and a second subset of data messages over a higher latency data path. In embodiments, provided herein is a system for data communication between nodes having the ability to configure a new connection using maintained data characterizing a current/previous connection and having the ability to transmit a first subset of supplemental/redundancy data messages over a lower latency data path and a second subset of data messages over a higher latency data path. In embodiments, provided herein is a system for data communication between nodes having the ability to configure a new connection using maintained data characterizing a current/previous connection and having a degree of redundancy associated with each message that is based on message position in the transmission order. In embodiments, provided herein is a system for data communication between nodes having the ability to configure a new connection using maintained data characterizing a current/previous connection and having a degree of redundancy associated with each message that increases as the position of the messages is non-decreasing. In embodiments, provided herein is a system for data communication between nodes having the ability to configure a new connection using maintained data characterizing a current/previous connection and having a degree of redundancy associated with each message that is based on message position in the transmission order and in response to receiving feedback messages. In embodiments, provided herein is a system for data communication between nodes having the ability to configure a new connection using maintained data characterizing a current/previous connection and having a degree of redundancy associated with each message that is based on message position in the transmission order and in response to receiving feedback messages, and adding or removing redundancy messages from the queue based on the feedback messages. In embodiments, provided herein is a system for data communication between nodes having the ability to configure a new connection using maintained data characterizing a current/previous connection and having the ability to adjust the number of messages sent over each of multiple different data paths with different communication protocols if it is determined that a data path is altering flow of messages. In embodiments, provided herein is a system for data communication between nodes having the ability to configure a new connection using maintained data characterizing a current/previous connection and having the ability to adjust the number of messages sent over each of multiple different data paths with different communication protocols if it is determined that a data path is altering flow of messages initial division based on previous communication connections. In embodiments, provided herein is a system for data communication between nodes having the ability to configure a new connection using maintained data characterizing a current/previous connection and having the ability to modify/add/remove redundancy information associated with encoded data as it travels from node to node via channels based on channel characteristics. In embodiments, provided herein is a system for data communication between nodes having the ability to configure a new connection using maintained data characterizing a current/previous connection and having the ability to send FEC packets at an estimated rate of loss events (isolated packet loss or burst of consecutive packets). In embodiments, provided herein is a system for data communication between nodes having the ability to configure a new connection using maintained data characterizing a current/previous connection and having combined coding, TCP, and pacing of packet transmissions. In embodiments, provided herein is a system for data communication between nodes having the ability to configure a new connection using maintained data characterizing a current/previous connection and having a forward error correction code construction that interleaves groups of message packets and parity packets and has coding across overlapping groups of message packets. In embodiments, provided herein is a system for data communication between nodes having the ability to configure a new connection using maintained data characterizing a current/previous connection and having a variant of TCP that combines delay-based back off with a stable window increase function.

In embodiments, provided herein is a system for data communication between nodes having the ability to configure a new connection using maintained data characterizing an error rate of a current/previous connection. In embodiments, provided herein is a system for data communication between nodes having the ability to configure a new connection using maintained data characterizing an error rate of a current/previous connection and having the ability to configure a new connection using maintained data characterizing a timing variability of a current/previous connection. In embodiments, provided herein is a system for data communication between nodes having the ability to configure a new connection using maintained data characterizing an error rate of a current/previous connection and having the ability to configure a new connection using maintained data characterizing bandwidth of a current/previous connection. In embodiments, provided herein is a system for data communication between nodes having the ability to configure a new connection using maintained data characterizing an error rate of a current/previous connection and having the ability to configure a new connection using maintained data characterizing round trip time of a current/previous connection. In embodiments, provided herein is a system for data communication between nodes having the ability to configure a new connection using maintained data characterizing an error rate of a current/previous connection and having the ability to configure a new connection using maintained data characterizing communication control parameters of a current/previous connection. In embodiments, provided herein is a system for data communication between nodes having the ability to configure a new connection using maintained data characterizing an error rate of a current/previous connection and having the ability to configure new connection using maintained data characterizing forward error correction parameters of a current/previous connection. In embodiments, provided herein is a system for data communication between nodes having the ability to configure a new connection using maintained data characterizing an error rate of a current/previous connection and having a data store for maintaining data characterizing one or more current or previous data communication connections and a connection initiation module for initiating new data communication connections based on maintained data. In embodiments, provided herein is a system for data communication between nodes having the ability to configure a new connection using maintained data characterizing an error rate of a current/previous connection and having the ability to transmit a first subset of data messages over a lower latency data path and a second subset of messages over a higher latency data path. In embodiments, provided herein is a system for data communication between nodes having the ability to configure a new connection using maintained data characterizing an error rate of a current/previous connection and having the ability to transmit a first subset of data messages that are time critical over a lower latency data path and a second subset of messages over a higher latency data path. In embodiments, provided herein is a system for data communication between nodes having the ability to configure a new connection using maintained data characterizing an error rate of a current/previous connection and having the ability to transmit a first initial subset of data messages over a lower latency data path and a second subset of messages that are subsequently available over a higher latency data path. In embodiments, provided herein is a system for data communication between nodes having the ability to configure a new connection using maintained data characterizing an error rate of a current/previous connection and having the ability to transmit a first subset of acknowledgment messages over a lower latency data path and a second subset of data messages over a higher latency data path. In embodiments, provided herein is a system for data communication between nodes having the ability to configure a new connection using maintained data characterizing an error rate of a current/previous connection and having the ability to transmit a first subset of supplemental/redundancy data messages over a lower latency data path and a second subset of data messages over a higher latency data path. In embodiments, provided herein is a system for data communication between nodes having the ability to configure a new connection using maintained data characterizing an error rate of a current/previous connection and having a degree of redundancy associated with each message that is based on message position in the transmission order. In embodiments, provided herein is a system for data communication between nodes having the ability to configure a new connection using maintained data characterizing an error rate of a current/previous connection and having a degree of redundancy associated with each message that increases as the position of the messages is non-decreasing. In embodiments, provided herein is a system for data communication between nodes having the ability to configure a new connection using maintained data characterizing an error rate of a current/previous connection and having a degree of redundancy associated with each message that is based on message position in the transmission order and in response to receiving feedback messages. In embodiments, provided herein is a system for data communication between nodes having the ability to configure a new connection using maintained data characterizing an error rate of a current/previous connection and having a degree of redundancy associated with each message that is based on message position in the transmission order and in response to receiving feedback messages, and adding or removing redundancy messages from the queue based on the feedback messages. In embodiments, provided herein is a system for data communication between nodes having the ability to configure a new connection using maintained data characterizing an error rate of a current/previous connection and having the ability to adjust the number of messages sent over each of multiple different data paths with different communication protocols if it is determined that a data path is altering flow of messages. In embodiments, provided herein is a system for data communication between nodes having the ability to configure a new connection using maintained data characterizing an error rate of a current/previous connection and having the ability to adjust the number of messages sent over each of multiple different data paths with different communication protocols if it is determined that a data path is altering flow of messages initial division based on previous communication connections. In embodiments, provided herein is a system for data communication between nodes having the ability to configure a new connection using maintained data characterizing an error rate of a current/previous connection and having the ability to modify/add/remove redundancy information associated with encoded data as it travels from node to node via channels based on channel characteristics. In embodiments, provided herein is a system for data communication between nodes having the ability to configure a new connection using maintained data characterizing an error rate of a current/previous connection and having the ability to send FEC packets at an estimated rate of loss events (isolated packet loss or burst of consecutive packets). In embodiments, provided herein is a system for data communication between nodes having the ability to configure a new connection using maintained data characterizing an error rate of a current/previous connection and having combined coding, TCP, and pacing of packet transmissions. In embodiments, provided herein is a system for data communication between nodes having the ability to configure a new connection using maintained data characterizing an error rate of a current/previous connection and having a forward error correction code construction that interleaves groups of message packets and parity packets and has coding across overlapping groups of message packets. In embodiments, provided herein is a system for data communication between nodes having the ability to configure a new connection using maintained data characterizing an error rate of a current/previous connection and having a variant of TCP that combines delay-based back off with a stable window increase function.

In embodiments, provided herein is a system for data communication between nodes having the ability to configure a new connection using maintained data characterizing a timing variability of a current/previous connection. In embodiments, provided herein is a system for data communication between nodes having the ability to configure a new connection using maintained data characterizing a timing variability of a current/previous connection and having the ability to configure a new connection using maintained data characterizing bandwidth of a current/previous connection. In embodiments, provided herein is a system for data communication between nodes having the ability to configure a new connection using maintained data characterizing a timing variability of a current/previous connection and having the ability to configure a new connection using maintained data characterizing round trip time of a current/previous connection. In embodiments, provided herein is a system for data communication between nodes having the ability to configure a new connection using maintained data characterizing a timing variability of a current/previous connection and having the ability to configure a new connection using maintained data characterizing communication control parameters of a current/previous connection. In embodiments, provided herein is a system for data communication between nodes having the ability to configure a new connection using maintained data characterizing a timing variability of a current/previous connection and having the ability to configure new connection using maintained data characterizing forward error correction parameters of a current/previous connection. In embodiments, provided herein is a system for data communication between nodes having the ability to configure a new connection using maintained data characterizing a timing variability of a current/previous connection and having a data store for maintaining data characterizing one or more current or previous data communication connections and a connection initiation module for initiating new data communication connections based on maintained data. In embodiments, provided herein is a system for data communication between nodes having the ability to configure a new connection using maintained data characterizing a timing variability of a current/previous connection and having the ability to transmit a first subset of data messages over a lower latency data path and a second subset of messages over a higher latency data path. In embodiments, provided herein is a system for data communication between nodes having the ability to configure a new connection using maintained data characterizing a timing variability of a current/previous connection and having the ability to transmit a first subset of data messages that are time critical over a lower latency data path and a second subset of messages over a higher latency data path. In embodiments, provided herein is a system for data communication between nodes having the ability to configure a new connection using maintained data characterizing a timing variability of a current/previous connection and having the ability to transmit a first initial subset of data messages over a lower latency data path and a second subset of messages that are subsequently available over a higher latency data path. In embodiments, provided herein is a system for data communication between nodes having the ability to configure a new connection using maintained data characterizing a timing variability of a current/previous connection and having the ability to transmit a first subset of acknowledgment messages over a lower latency data path and a second subset of data messages over a higher latency data path. In embodiments, provided herein is a system for data communication between nodes having the ability to configure a new connection using maintained data characterizing a timing variability of a current/previous connection and having the ability to transmit a first subset of supplemental/redundancy data messages over a lower latency data path and a second subset of data messages over a higher latency data path. In embodiments, provided herein is a system for data communication between nodes having the ability to configure a new connection using maintained data characterizing a timing variability of a current/previous connection and having a degree of redundancy associated with each message that is based on message position in the transmission order. In embodiments, provided herein is a system for data communication between nodes having the ability to configure a new connection using maintained data characterizing a timing variability of a current/previous connection and having a degree of redundancy associated with each message that increases as the position of the messages is non-decreasing. In embodiments, provided herein is a system for data communication between nodes having the ability to configure a new connection using maintained data characterizing a timing variability of a current/previous connection and having a degree of redundancy associated with each message that is based on message position in the transmission order and in response to receiving feedback messages. In embodiments, provided herein is a system for data communication between nodes having the ability to configure a new connection using maintained data characterizing a timing variability of a current/previous connection and having a degree of redundancy associated with each message that is based on message position in the transmission order and in response to receiving feedback messages, and adding or removing redundancy messages from the queue based on the feedback messages. In embodiments, provided herein is a system for data communication between nodes having the ability to configure a new connection using maintained data characterizing a timing variability of a current/previous connection and having the ability to adjust the number of messages sent over each of multiple different data paths with different communication protocols if it is determined that a data path is altering flow of messages. In embodiments, provided herein is a system for data communication between nodes having the ability to configure a new connection using maintained data characterizing a timing variability of a current/previous connection and having the ability to adjust the number of messages sent over each of multiple different data paths with different communication protocols if it is determined that a data path is altering flow of messages initial division based on previous communication connections. In embodiments, provided herein is a system for data communication between nodes having the ability to configure a new connection using maintained data characterizing a timing variability of a current/previous connection and having the ability to modify/add/remove redundancy information associated with encoded data as it travels from node to node via channels based on channel characteristics. In embodiments, provided herein is a system for data communication between nodes having the ability to configure a new connection using maintained data characterizing a timing variability of a current/previous connection and having the ability to send FEC packets at an estimated rate of loss events (isolated packet loss or burst of consecutive packets). In embodiments, provided herein is a system for data communication between nodes having the ability to configure a new connection using maintained data characterizing a timing variability of a current/previous connection and having combined coding, TCP, and pacing of packet transmissions. In embodiments, provided herein is a system for data communication between nodes having the ability to configure a new connection using maintained data characterizing a timing variability of a current/previous connection and having a forward error correction code construction that interleaves groups of message packets and parity packets and has coding across overlapping groups of message packets. In embodiments, provided herein is a system for data communication between nodes having the ability to configure a new connection using maintained data characterizing a timing variability of a current/previous connection and having a variant of TCP that combines delay-based back off with a stable window increase function.

In embodiments, provided herein is a system for data communication between nodes having the ability to configure a new connection using maintained data characterizing bandwidth of a current/previous connection. In embodiments, provided herein is a system for data communication between nodes having the ability to configure a new connection using maintained data characterizing bandwidth of a current/previous connection and having the ability to configure a new connection using maintained data characterizing round trip time of a current/previous connection. In embodiments, provided herein is a system for data communication between nodes having the ability to configure a new connection using maintained data characterizing bandwidth of a current/previous connection and having the ability to configure a new connection using maintained data characterizing communication control parameters of a current/previous connection. In embodiments, provided herein is a system for data communication between nodes having the ability to configure a new connection using maintained data characterizing bandwidth of a current/previous connection and having the ability to configure new connection using maintained data characterizing forward error correction parameters of a current/previous connection. In embodiments, provided herein is a system for data communication between nodes having the ability to configure a new connection using maintained data characterizing bandwidth of a current/previous connection and having a data store for maintaining data characterizing one or more current or previous data communication connections and a connection initiation module for initiating new data communication connections based on maintained data. In embodiments, provided herein is a system for data communication between nodes having the ability to configure a new connection using maintained data characterizing bandwidth of a current/previous connection and having the ability to transmit a first subset of data messages over a lower latency data path and a second subset of messages over a higher latency data path. In embodiments, provided herein is a system for data communication between nodes having the ability to configure a new connection using maintained data characterizing bandwidth of a current/previous connection and having the ability to transmit a first subset of data messages that are time critical over a lower latency data path and a second subset of messages over a higher latency data path. In embodiments, provided herein is a system for data communication between nodes having the ability to configure a new connection using maintained data characterizing bandwidth of a current/previous connection and having the ability to transmit a first initial subset of data messages over a lower latency data path and a second subset of messages that are subsequently available over a higher latency data path. In embodiments, provided herein is a system for data communication between nodes having the ability to configure a new connection using maintained data characterizing bandwidth of a current/previous connection and having the ability to transmit a first subset of acknowledgment messages over a lower latency data path and a second subset of data messages over a higher latency data path. In embodiments, provided herein is a system for data communication between nodes having the ability to configure a new connection using maintained data characterizing bandwidth of a current/previous connection and having the ability to transmit a first subset of supplemental/redundancy data messages over a lower latency data path and a second subset of data messages over a higher latency data path. In embodiments, provided herein is a system for data communication between nodes having the ability to configure a new connection using maintained data characterizing bandwidth of a current/previous connection and having a degree of redundancy associated with each message that is based on message position in the transmission order. In embodiments, provided herein is a system for data communication between nodes having the ability to configure a new connection using maintained data characterizing bandwidth of a current/previous connection and having a degree of redundancy associated with each message that increases as the position of the messages is non-decreasing. In embodiments, provided herein is a system for data communication between nodes having the ability to configure a new connection using maintained data characterizing bandwidth of a current/previous connection and having a degree of redundancy associated with each message that is based on message position in the transmission order and in response to receiving feedback messages. In embodiments, provided herein is a system for data communication between nodes having the ability to configure a new connection using maintained data characterizing bandwidth of a current/previous connection and having a degree of redundancy associated with each message that is based on message position in the transmission order and in response to receiving feedback messages, and adding or removing redundancy messages from the queue based on the feedback messages. In embodiments, provided herein is a system for data communication between nodes having the ability to configure a new connection using maintained data characterizing bandwidth of a current/previous connection and having the ability to adjust the number of messages sent over each of multiple different data paths with different communication protocols if it is determined that a data path is altering flow of messages. In embodiments, provided herein is a system for data communication between nodes having the ability to configure a new connection using maintained data characterizing bandwidth of a current/previous connection and having the ability to adjust the number of messages sent over each of multiple different data paths with different communication protocols if it is determined that a data path is altering flow of messages initial division based on previous communication connections. In embodiments, provided herein is a system for data communication between nodes having the ability to configure a new connection using maintained data characterizing bandwidth of a current/previous connection and having the ability to modify/add/remove redundancy information associated with encoded data as it travels from node to node via channels based on channel characteristics. In embodiments, provided herein is a system for data communication between nodes having the ability to configure a new connection using maintained data characterizing bandwidth of a current/previous connection and having the ability to send FEC packets at an estimated rate of loss events (isolated packet loss or burst of consecutive packets). In embodiments, provided herein is a system for data communication between nodes having the ability to configure a new connection using maintained data characterizing bandwidth of a current/previous connection and having combined coding, TCP, and pacing of packet transmissions. In embodiments, provided herein is a system for data communication between nodes having the ability to configure a new connection using maintained data characterizing bandwidth of a current/previous connection and having a forward error correction code construction that interleaves groups of message packets and parity packets and has coding across overlapping groups of message packets. In embodiments, provided herein is a system for data communication between nodes having the ability to configure a new connection using maintained data characterizing bandwidth of a current/previous connection and having a variant of TCP that combines delay-based back off with a stable window increase function.

In embodiments, provided herein is a system for data communication between nodes having the ability to configure a new connection using maintained data characterizing round trip time of a current/previous connection. In embodiments, provided herein is a system for data communication between nodes having the ability to configure a new connection using maintained data characterizing round trip time of a current/previous connection and having the ability to configure a new connection using maintained data characterizing communication control parameters of a current/previous connection. In embodiments, provided herein is a system for data communication between nodes having the ability to configure a new connection using maintained data characterizing round trip time of a current/previous connection and having the ability to configure new connection using maintained data characterizing forward error correction parameters of a current/previous connection. In embodiments, provided herein is a system for data communication between nodes having the ability to configure a new connection using maintained data characterizing round trip time of a current/previous connection and having a data store for maintaining data characterizing one or more current or previous data communication connections and a connection initiation module for initiating new data communication connections based on maintained data. In embodiments, provided herein is a system for data communication between nodes having the ability to configure a new connection using maintained data characterizing round trip time of a current/previous connection and having the ability to transmit a first subset of data messages over a lower latency data path and a second subset of messages over a higher latency data path. In embodiments, provided herein is a system for data communication between nodes having the ability to configure a new connection using maintained data characterizing round trip time of a current/previous connection and having the ability to transmit a first subset of data messages that are time critical over a lower latency data path and a second subset of messages over a higher latency data path. In embodiments, provided herein is a system for data communication between nodes having the ability to configure a new connection using maintained data characterizing round trip time of a current/previous connection and having the ability to transmit a first initial subset of data messages over a lower latency data path and a second subset of messages that are subsequently available over a higher latency data path. In embodiments, provided herein is a system for data communication between nodes having the ability to configure a new connection using maintained data characterizing round trip time of a current/previous connection and having the ability to transmit a first subset of acknowledgment messages over a lower latency data path and a second subset of data messages over a higher latency data path. In embodiments, provided herein is a system for data communication between nodes having the ability to configure a new connection using maintained data characterizing round trip time of a current/previous connection and having the ability to transmit a first subset of supplemental/redundancy data messages over a lower latency data path and a second subset of data messages over a higher latency data path. In embodiments, provided herein is a system for data communication between nodes having the ability to configure a new connection using maintained data characterizing round trip time of a current/previous connection and having a degree of redundancy associated with each message that is based on message position in the transmission order. In embodiments, provided herein is a system for data communication between nodes having the ability to configure a new connection using maintained data characterizing round trip time of a current/previous connection and having a degree of redundancy associated with each message that increases as the position of the messages is non-decreasing. In embodiments, provided herein is a system for data communication between nodes having the ability to configure a new connection using maintained data characterizing round trip time of a current/previous connection and having a degree of redundancy associated with each message that is based on message position in the transmission order and in response to receiving feedback messages. In embodiments, provided herein is a system for data communication between nodes having the ability to configure a new connection using maintained data characterizing round trip time of a current/previous connection and having a degree of redundancy associated with each message that is based on message position in the transmission order and in response to receiving feedback messages, and adding or removing redundancy messages from the queue based on the feedback messages. In embodiments, provided herein is a system for data communication between nodes having the ability to configure a new connection using maintained data characterizing round trip time of a current/previous connection and having the ability to adjust the number of messages sent over each of multiple different data paths with different communication protocols if it is determined that a data path is altering flow of messages. In embodiments, provided herein is a system for data communication between nodes having the ability to configure a new connection using maintained data characterizing round trip time of a current/previous connection and having the ability to adjust the number of messages sent over each of multiple different data paths with different communication protocols if it is determined that a data path is altering flow of messages initial division based on previous communication connections. In embodiments, provided herein is a system for data communication between nodes having the ability to configure a new connection using maintained data characterizing round trip time of a current/previous connection and having the ability to modify/add/remove redundancy information associated with encoded data as it travels from node to node via channels based on channel characteristics. In embodiments, provided herein is a system for data communication between nodes having the ability to configure a new connection using maintained data characterizing round trip time of a current/previous connection and having the ability to send FEC packets at an estimated rate of loss events (isolated packet loss or burst of consecutive packets). In embodiments, provided herein is a system for data communication between nodes having the ability to configure a new connection using maintained data characterizing round trip time of a current/previous connection and having combined coding, TCP, and pacing of packet transmissions. In embodiments, provided herein is a system for data communication between nodes having the ability to configure a new connection using maintained data characterizing round trip time of a current/previous connection and having a forward error correction code construction that interleaves groups of message packets and parity packets and has coding across overlapping groups of message packets. In embodiments, provided herein is a system for data communication between nodes having the ability to configure a new connection using maintained data characterizing round trip time of a current/previous connection and having a variant of TCP that combines delay-based back off with a stable window increase function.

In embodiments, provided herein is a system for data communication between nodes having the ability to configure a new connection using maintained data characterizing communication control parameters of a current/previous connection. In embodiments, provided herein is a system for data communication between nodes having the ability to configure a new connection using maintained data characterizing communication control parameters of a current/previous connection and having the ability to configure new connection using maintained data characterizing forward error correction parameters of a current/previous connection. In embodiments, provided herein is a system for data communication between nodes having the ability to configure a new connection using maintained data characterizing communication control parameters of a current/previous connection and having a data store for maintaining data characterizing one or more current or previous data communication connections and a connection initiation module for initiating new data communication connections based on maintained data. In embodiments, provided herein is a system for data communication between nodes having the ability to configure a new connection using maintained data characterizing communication control parameters of a current/previous connection and having the ability to transmit a first subset of data messages over a lower latency data path and a second subset of messages over a higher latency data path. In embodiments, provided herein is a system for data communication between nodes having the ability to configure a new connection using maintained data characterizing communication control parameters of a current/previous connection and having the ability to transmit a first subset of data messages that are time critical over a lower latency data path and a second subset of messages over a higher latency data path. In embodiments, provided herein is a system for data communication between nodes having the ability to configure a new connection using maintained data characterizing communication control parameters of a current/previous connection and having the ability to transmit a first initial subset of data messages over a lower latency data path and a second subset of messages that are subsequently available over a higher latency data path. In embodiments, provided herein is a system for data communication between nodes having the ability to configure a new connection using maintained data characterizing communication control parameters of a current/previous connection and having the ability to transmit a first subset of acknowledgment messages over a lower latency data path and a second subset of data messages over a higher latency data path. In embodiments, provided herein is a system for data communication between nodes having the ability to configure a new connection using maintained data characterizing communication control parameters of a current/previous connection and having the ability to transmit a first subset of supplemental/redundancy data messages over a lower latency data path and a second subset of data messages over a higher latency data path. In embodiments, provided herein is a system for data communication between nodes having the ability to configure a new connection using maintained data characterizing communication control parameters of a current/previous connection and having a degree of redundancy associated with each message that is based on message position in the transmission order. In embodiments, provided herein is a system for data communication between nodes having the ability to configure a new connection using maintained data characterizing communication control parameters of a current/previous connection and having a degree of redundancy associated with each message that increases as the position of the messages is non-decreasing. In embodiments, provided herein is a system for data communication between nodes having the ability to configure a new connection using maintained data characterizing communication control parameters of a current/previous connection and having a degree of redundancy associated with each message that is based on message position in the transmission order and in response to receiving feedback messages. In embodiments, provided herein is a system for data communication between nodes having the ability to configure a new connection using maintained data characterizing communication control parameters of a current/previous connection and having a degree of redundancy associated with each message that is based on message position in the transmission order and in response to receiving feedback messages, and adding or removing redundancy messages from the queue based on the feedback messages. In embodiments, provided herein is a system for data communication between nodes having the ability to configure a new connection using maintained data characterizing communication control parameters of a current/previous connection and having the ability to adjust the number of messages sent over each of multiple different data paths with different communication protocols if it is determined that a data path is altering flow of messages. In embodiments, provided herein is a system for data communication between nodes having the ability to configure a new connection using maintained data characterizing communication control parameters of a current/previous connection and having the ability to adjust the number of messages sent over each of multiple different data paths with different communication protocols if it is determined that a data path is altering flow of messages initial division based on previous communication connections. In embodiments, provided herein is a system for data communication between nodes having the ability to configure a new connection using maintained data characterizing communication control parameters of a current/previous connection and having the ability to modify/add/remove redundancy information associated with encoded data as it travels from node to node via channels based on channel characteristics. In embodiments, provided herein is a system for data communication between nodes having the ability to configure a new connection using maintained data characterizing communication control parameters of a current/previous connection and having the ability to send FEC packets at an estimated rate of loss events (isolated packet loss or burst of consecutive packets). In embodiments, provided herein is a system for data communication between nodes having the ability to configure a new connection using maintained data characterizing communication control parameters of a current/previous connection and having combined coding, TCP, and pacing of packet transmissions. In embodiments, provided herein is a system for data communication between nodes having the ability to configure a new connection using maintained data characterizing communication control parameters of a current/previous connection and having a forward error correction code construction that interleaves groups of message packets and parity packets and has coding across overlapping groups of message packets. In embodiments, provided herein is a system for data communication between nodes having the ability to configure a new connection using maintained data characterizing communication control parameters of a current/previous connection and having a variant of TCP that combines delay-based back off with a stable window increase function.

In embodiments, provided herein is a system for data communication between nodes having the ability to configure new connection using maintained data characterizing forward error correction parameters of a current/previous connection. In embodiments, provided herein is a system for data communication between nodes having the ability to configure new connection using maintained data characterizing forward error correction parameters of a current/previous connection and having a data store for maintaining data characterizing one or more current or previous data communication connections and a connection initiation module for initiating new data communication connections based on maintained data. In embodiments, provided herein is a system for data communication between nodes having the ability to configure new connection using maintained data characterizing forward error correction parameters of a current/previous connection and having the ability to transmit a first subset of data messages over a lower latency data path and a second subset of messages over a higher latency data path. In embodiments, provided herein is a system for data communication between nodes having the ability to configure new connection using maintained data characterizing forward error correction parameters of a current/previous connection and having the ability to transmit a first subset of data messages that are time critical over a lower latency data path and a second subset of messages over a higher latency data path. In embodiments, provided herein is a system for data communication between nodes having the ability to configure new connection using maintained data characterizing forward error correction parameters of a current/previous connection and having the ability to transmit a first initial subset of data messages over a lower latency data path and a second subset of messages that are subsequently available over a higher latency data path. In embodiments, provided herein is a system for data communication between nodes having the ability to configure new connection using maintained data characterizing forward error correction parameters of a current/previous connection and having the ability to transmit a first subset of acknowledgment messages over a lower latency data path and a second subset of data messages over a higher latency data path. In embodiments, provided herein is a system for data communication between nodes having the ability to configure new connection using maintained data characterizing forward error correction parameters of a current/previous connection and having the ability to transmit a first subset of supplemental/redundancy data messages over a lower latency data path and a second subset of data messages over a higher latency data path. In embodiments, provided herein is a system for data communication between nodes having the ability to configure new connection using maintained data characterizing forward error correction parameters of a current/previous connection and having a degree of redundancy associated with each message that is based on message position in the transmission order. In embodiments, provided herein is a system for data communication between nodes having the ability to configure new connection using maintained data characterizing forward error correction parameters of a current/previous connection and having a degree of redundancy associated with each message that increases as the position of the messages is non-decreasing. In embodiments, provided herein is a system for data communication between nodes having the ability to configure new connection using maintained data characterizing forward error correction parameters of a current/previous connection and having a degree of redundancy associated with each message that is based on message position in the transmission order and in response to receiving feedback messages. In embodiments, provided herein is a system for data communication between nodes having the ability to configure new connection using maintained data characterizing forward error correction parameters of a current/previous connection and having a degree of redundancy associated with each message that is based on message position in the transmission order and in response to receiving feedback messages, and adding or removing redundancy messages from the queue based on the feedback messages. In embodiments, provided herein is a system for data communication between nodes having the ability to configure new connection using maintained data characterizing forward error correction parameters of a current/previous connection and having the ability to adjust the number of messages sent over each of multiple different data paths with different communication protocols if it is determined that a data path is altering flow of messages. In embodiments, provided herein is a system for data communication between nodes having the ability to configure new connection using maintained data characterizing forward error correction parameters of a current/previous connection and having the ability to adjust the number of messages sent over each of multiple different data paths with different communication protocols if it is determined that a data path is altering flow of messages initial division based on previous communication connections. In embodiments, provided herein is a system for data communication between nodes having the ability to configure new connection using maintained data characterizing forward error correction parameters of a current/previous connection and having the ability to modify/add/remove redundancy information associated with encoded data as it travels from node to node via channels based on channel characteristics. In embodiments, provided herein is a system for data communication between nodes having the ability to configure new connection using maintained data characterizing forward error correction parameters of a current/previous connection and having the ability to send FEC packets at an estimated rate of loss events (isolated packet loss or burst of consecutive packets). In embodiments, provided herein is a system for data communication between nodes having the ability to configure new connection using maintained data characterizing forward error correction parameters of a current/previous connection and having combined coding, TCP, and pacing of packet transmissions. In embodiments, provided herein is a system for data communication between nodes having the ability to configure new connection using maintained data characterizing forward error correction parameters of a current/previous connection and having a forward error correction code construction that interleaves groups of message packets and parity packets and has coding across overlapping groups of message packets. In embodiments, provided herein is a system for data communication between nodes having the ability to configure new connection using maintained data characterizing forward error correction parameters of a current/previous connection and having a variant of TCP that combines delay-based back off with a stable window increase function.

In embodiments, provided herein is a system for data communication between nodes having a data store for maintaining data characterizing one or more current or previous data communication connections and a connection initiation module for initiating new data communication connections based on maintained data. In embodiments, provided herein is a system for data communication between nodes having a data store for maintaining data characterizing one or more current or previous data communication connections and a connection initiation module for initiating new data communication connections based on maintained data and having the ability to transmit a first subset of data messages over a lower latency data path and a second subset of messages over a higher latency data path. In embodiments, provided herein is a system for data communication between nodes having a data store for maintaining data characterizing one or more current or previous data communication connections and a connection initiation module for initiating new data communication connections based on maintained data and having the ability to transmit a first subset of data messages that are time critical over a lower latency data path and a second subset of messages over a higher latency data path. In embodiments, provided herein is a system for data communication between nodes having a data store for maintaining data characterizing one or more current or previous data communication connections and a connection initiation module for initiating new data communication connections based on maintained data and having the ability to transmit a first initial subset of data messages over a lower latency data path and a second subset of messages that are subsequently available over a higher latency data path. In embodiments, provided herein is a system for data communication between nodes having a data store for maintaining data characterizing one or more current or previous data communication connections and a connection initiation module for initiating new data communication connections based on maintained data and having the ability to transmit a first subset of acknowledgment messages over a lower latency data path and a second subset of data messages over a higher latency data path. In embodiments, provided herein is a system for data communication between nodes having a data store for maintaining data characterizing one or more current or previous data communication connections and a connection initiation module for initiating new data communication connections based on maintained data and having the ability to transmit a first subset of supplemental/redundancy data messages over a lower latency data path and a second subset of data messages over a higher latency data path. In embodiments, provided herein is a system for data communication between nodes having a data store for maintaining data characterizing one or more current or previous data communication connections and a connection initiation module for initiating new data communication connections based on maintained data and having a degree of redundancy associated with each message that is based on message position in the transmission order. In embodiments, provided herein is a system for data communication between nodes having a data store for maintaining data characterizing one or more current or previous data communication connections and a connection initiation module for initiating new data communication connections based on maintained data and having a degree of redundancy associated with each message that increases as the position of the messages is non-decreasing. In embodiments, provided herein is a system for data communication between nodes having a data store for maintaining data characterizing one or more current or previous data communication connections and a connection initiation module for initiating new data communication connections based on maintained data and having a degree of redundancy associated with each message that is based on message position in the transmission order and in response to receiving feedback messages. In embodiments, provided herein is a system for data communication between nodes having a data store for maintaining data characterizing one or more current or previous data communication connections and a connection initiation module for initiating new data communication connections based on maintained data and having a degree of redundancy associated with each message that is based on message position in the transmission order and in response to receiving feedback messages, and adding or removing redundancy messages from the queue based on the feedback messages. In embodiments, provided herein is a system for data communication between nodes having a data store for maintaining data characterizing one or more current or previous data communication connections and a connection initiation module for initiating new data communication connections based on maintained data and having the ability to adjust the number of messages sent over each of multiple different data paths with different communication protocols if it is determined that a data path is altering flow of messages. In embodiments, provided herein is a system for data communication between nodes having a data store for maintaining data characterizing one or more current or previous data communication connections and a connection initiation module for initiating new data communication connections based on maintained data and having the ability to adjust the number of messages sent over each of multiple different data paths with different communication protocols if it is determined that a data path is altering flow of messages initial division based on previous communication connections. In embodiments, provided herein is a system for data communication between nodes having a data store for maintaining data characterizing one or more current or previous data communication connections and a connection initiation module for initiating new data communication connections based on maintained data and having the ability to modify/add/remove redundancy information associated with encoded data as it travels from node to node via channels based on channel characteristics. In embodiments, provided herein is a system for data communication between nodes having a data store for maintaining data characterizing one or more current or previous data communication connections and a connection initiation module for initiating new data communication connections based on maintained data and having the ability to send FEC packets at an estimated rate of loss events (isolated packet loss or burst of consecutive packets). In embodiments, provided herein is a system for data communication between nodes having a data store for maintaining data characterizing one or more current or previous data communication connections and a connection initiation module for initiating new data communication connections based on maintained data and having combined coding, TCP, and pacing of packet transmissions. In embodiments, provided herein is a system for data communication between nodes having a data store for maintaining data characterizing one or more current or previous data communication connections and a connection initiation module for initiating new data communication connections based on maintained data and having a forward error correction code construction that interleaves groups of message packets and parity packets and has coding across overlapping groups of message packets. In embodiments, provided herein is a system for data communication between nodes having a data store for maintaining data characterizing one or more current or previous data communication connections and a connection initiation module for initiating new data communication connections based on maintained data and having a variant of TCP that combines delay-based back off with a stable window increase function.

In embodiments, provided herein is a system for data communication between nodes having the ability to transmit a first subset of data messages over a lower latency data path and a second subset of messages over a higher latency data path. In embodiments, provided herein is a system for data communication between nodes having the ability to transmit a first subset of data messages over a lower latency data path and a second subset of messages over a higher latency data path and having the ability to transmit a first subset of data messages that are time critical over a lower latency data path and a second subset of messages over a higher latency data path. In embodiments, provided herein is a system for data communication between nodes having the ability to transmit a first subset of data messages over a lower latency data path and a second subset of messages over a higher latency data path and having the ability to transmit a first initial subset of data messages over a lower latency data path and a second subset of messages that are subsequently available over a higher latency data path. In embodiments, provided herein is a system for data communication between nodes having the ability to transmit a first subset of data messages over a lower latency data path and a second subset of messages over a higher latency data path and having the ability to transmit a first subset of acknowledgment messages over a lower latency data path and a second subset of data messages over a higher latency data path. In embodiments, provided herein is a system for data communication between nodes having the ability to transmit a first subset of data messages over a lower latency data path and a second subset of messages over a higher latency data path and having the ability to transmit a first subset of supplemental/redundancy data messages over a lower latency data path and a second subset of data messages over a higher latency data path. In embodiments, provided herein is a system for data communication between nodes having the ability to transmit a first subset of data messages over a lower latency data path and a second subset of messages over a higher latency data path and having a degree of redundancy associated with each message that is based on message position in the transmission order. In embodiments, provided herein is a system for data communication between nodes having the ability to transmit a first subset of data messages over a lower latency data path and a second subset of messages over a higher latency data path and having a degree of redundancy associated with each message that increases as the position of the messages is non-decreasing. In embodiments, provided herein is a system for data communication between nodes having the ability to transmit a first subset of data messages over a lower latency data path and a second subset of messages over a higher latency data path and having a degree of redundancy associated with each message that is based on message position in the transmission order and in response to receiving feedback messages. In embodiments, provided herein is a system for data communication between nodes having the ability to transmit a first subset of data messages over a lower latency data path and a second subset of messages over a higher latency data path and having a degree of redundancy associated with each message that is based on message position in the transmission order and in response to receiving feedback messages, and adding or removing redundancy messages from the queue based on the feedback messages. In embodiments, provided herein is a system for data communication between nodes having the ability to transmit a first subset of data messages over a lower latency data path and a second subset of messages over a higher latency data path and having the ability to adjust the number of messages sent over each of multiple different data paths with different communication protocols if it is determined that a data path is altering flow of messages. In embodiments, provided herein is a system for data communication between nodes having the ability to transmit a first subset of data messages over a lower latency data path and a second subset of messages over a higher latency data path and having the ability to adjust the number of messages sent over each of multiple different data paths with different communication protocols if it is determined that a data path is altering flow of messages initial division based on previous communication connections. In embodiments, provided herein is a system for data communication between nodes having the ability to transmit a first subset of data messages over a lower latency data path and a second subset of messages over a higher latency data path and having the ability to modify/add/remove redundancy information associated with encoded data as it travels from node to node via channels based on channel characteristics. In embodiments, provided herein is a system for data communication between nodes having the ability to transmit a first subset of data messages over a lower latency data path and a second subset of messages over a higher latency data path and having the ability to send FEC packets at an estimated rate of loss events (isolated packet loss or burst of consecutive packets). In embodiments, provided herein is a system for data communication between nodes having the ability to transmit a first subset of data messages over a lower latency data path and a second subset of messages over a higher latency data path and having combined coding, TCP, and pacing of packet transmissions. In embodiments, provided herein is a system for data communication between nodes having the ability to transmit a first subset of data messages over a lower latency data path and a second subset of messages over a higher latency data path and having a forward error correction code construction that interleaves groups of message packets and parity packets and has coding across overlapping groups of message packets. In embodiments, provided herein is a system for data communication between nodes having the ability to transmit a first subset of data messages over a lower latency data path and a second subset of messages over a higher latency data path and having a variant of TCP that combines delay-based back off with a stable window increase function.

In embodiments, provided herein is a system for data communication between nodes having the ability to transmit a first subset of data messages that are time critical over a lower latency data path and a second subset of messages over a higher latency data path. In embodiments, provided herein is a system for data communication between nodes having the ability to transmit a first subset of data messages that are time critical over a lower latency data path and a second subset of messages over a higher latency data path and having the ability to transmit a first initial subset of data messages over a lower latency data path and a second subset of messages that are subsequently available over a higher latency data path. In embodiments, provided herein is a system for data communication between nodes having the ability to transmit a first subset of data messages that are time critical over a lower latency data path and a second subset of messages over a higher latency data path and having the ability to transmit a first subset of acknowledgment messages over a lower latency data path and a second subset of data messages over a higher latency data path. In embodiments, provided herein is a system for data communication between nodes having the ability to transmit a first subset of data messages that are time critical over a lower latency data path and a second subset of messages over a higher latency data path and having the ability to transmit a first subset of supplemental/redundancy data messages over a lower latency data path and a second subset of data messages over a higher latency data path. In embodiments, provided herein is a system for data communication between nodes having the ability to transmit a first subset of data messages that are time critical over a lower latency data path and a second subset of messages over a higher latency data path and having a degree of redundancy associated with each message that is based on message position in the transmission order. In embodiments, provided herein is a system for data communication between nodes having the ability to transmit a first subset of data messages that are time critical over a lower latency data path and a second subset of messages over a higher latency data path and having a degree of redundancy associated with each message that increases as the position of the messages is non-decreasing. In embodiments, provided herein is a system for data communication between nodes having the ability to transmit a first subset of data messages that are time critical over a lower latency data path and a second subset of messages over a higher latency data path and having a degree of redundancy associated with each message that is based on message position in the transmission order and in response to receiving feedback messages. In embodiments, provided herein is a system for data communication between nodes having the ability to transmit a first subset of data messages that are time critical over a lower latency data path and a second subset of messages over a higher latency data path and having a degree of redundancy associated with each message that is based on message position in the transmission order and in response to receiving feedback messages, and adding or removing redundancy messages from the queue based on the feedback messages. In embodiments, provided herein is a system for data communication between nodes having the ability to transmit a first subset of data messages that are time critical over a lower latency data path and a second subset of messages over a higher latency data path and having the ability to adjust the number of messages sent over each of multiple different data paths with different communication protocols if it is determined that a data path is altering flow of messages. In embodiments, provided herein is a system for data communication between nodes having the ability to transmit a first subset of data messages that are time critical over a lower latency data path and a second subset of messages over a higher latency data path and having the ability to adjust the number of messages sent over each of multiple different data paths with different communication protocols if it is determined that a data path is altering flow of messages initial division based on previous communication connections. In embodiments, provided herein is a system for data communication between nodes having the ability to transmit a first subset of data messages that are time critical over a lower latency data path and a second subset of messages over a higher latency data path and having the ability to modify/add/remove redundancy information associated with encoded data as it travels from node to node via channels based on channel characteristics. In embodiments, provided herein is a system for data communication between nodes having the ability to transmit a first subset of data messages that are time critical over a lower latency data path and a second subset of messages over a higher latency data path and having the ability to send FEC packets at an estimated rate of loss events (isolated packet loss or burst of consecutive packets). In embodiments, provided herein is a system for data communication between nodes having the ability to transmit a first subset of data messages that are time critical over a lower latency data path and a second subset of messages over a higher latency data path and having combined coding, TCP, and pacing of packet transmissions. In embodiments, provided herein is a system for data communication between nodes having the ability to transmit a first subset of data messages that are time critical over a lower latency data path and a second subset of messages over a higher latency data path and having a forward error correction code construction that interleaves groups of message packets and parity packets and has coding across overlapping groups of message packets. In embodiments, provided herein is a system for data communication between nodes having the ability to transmit a first subset of data messages that are time critical over a lower latency data path and a second subset of messages over a higher latency data path and having a variant of TCP that combines delay-based back off with a stable window increase function.

In embodiments, provided herein is a system for data communication between nodes having the ability to transmit a first initial subset of data messages over a lower latency data path and a second subset of messages that are subsequently available over a higher latency data path. In embodiments, provided herein is a system for data communication between nodes having the ability to transmit a first initial subset of data messages over a lower latency data path and a second subset of messages that are subsequently available over a higher latency data path and having the ability to transmit a first subset of acknowledgment messages over a lower latency data path and a second subset of data messages over a higher latency data path. In embodiments, provided herein is a system for data communication between nodes having the ability to transmit a first initial subset of data messages over a lower latency data path and a second subset of messages that are subsequently available over a higher latency data path and having the ability to transmit a first subset of supplemental/redundancy data messages over a lower latency data path and a second subset of data messages over a higher latency data path. In embodiments, provided herein is a system for data communication between nodes having the ability to transmit a first initial subset of data messages over a lower latency data path and a second subset of messages that are subsequently available over a higher latency data path and having a degree of redundancy associated with each message that is based on message position in the transmission order. In embodiments, provided herein is a system for data communication between nodes having the ability to transmit a first initial subset of data messages over a lower latency data path and a second subset of messages that are subsequently available over a higher latency data path and having a degree of redundancy associated with each message that increases as the position of the messages is non-decreasing. In embodiments, provided herein is a system for data communication between nodes having the ability to transmit a first initial subset of data messages over a lower latency data path and a second subset of messages that are subsequently available over a higher latency data path and having a degree of redundancy associated with each message that is based on message position in the transmission order and in response to receiving feedback messages. In embodiments, provided herein is a system for data communication between nodes having the ability to transmit a first initial subset of data messages over a lower latency data path and a second subset of messages that are subsequently available over a higher latency data path and having a degree of redundancy associated with each message that is based on message position in the transmission order and in response to receiving feedback messages, and adding or removing redundancy messages from the queue based on the feedback messages. In embodiments, provided herein is a system for data communication between nodes having the ability to transmit a first initial subset of data messages over a lower latency data path and a second subset of messages that are subsequently available over a higher latency data path and having the ability to adjust the number of messages sent over each of multiple different data paths with different communication protocols if it is determined that a data path is altering flow of messages. In embodiments, provided herein is a system for data communication between nodes having the ability to transmit a first initial subset of data messages over a lower latency data path and a second subset of messages that are subsequently available over a higher latency data path and having the ability to adjust the number of messages sent over each of multiple different data paths with different communication protocols if it is determined that a data path is altering flow of messages initial division based on previous communication connections. In embodiments, provided herein is a system for data communication between nodes having the ability to transmit a first initial subset of data messages over a lower latency data path and a second subset of messages that are subsequently available over a higher latency data path and having the ability to modify/add/remove redundancy information associated with encoded data as it travels from node to node via channels based on channel characteristics. In embodiments, provided herein is a system for data communication between nodes having the ability to transmit a first initial subset of data messages over a lower latency data path and a second subset of messages that are subsequently available over a higher latency data path and having the ability to send FEC packets at an estimated rate of loss events (isolated packet loss or burst of consecutive packets). In embodiments, provided herein is a system for data communication between nodes having the ability to transmit a first initial subset of data messages over a lower latency data path and a second subset of messages that are subsequently available over a higher latency data path and having combined coding, TCP, and pacing of packet transmissions. In embodiments, provided herein is a system for data communication between nodes having the ability to transmit a first initial subset of data messages over a lower latency data path and a second subset of messages that are subsequently available over a higher latency data path and having a forward error correction code construction that interleaves groups of message packets and parity packets and has coding across overlapping groups of message packets. In embodiments, provided herein is a system for data communication between nodes having the ability to transmit a first initial subset of data messages over a lower latency data path and a second subset of messages that are subsequently available over a higher latency data path and having a variant of TCP that combines delay-based back off with a stable window increase function.

In embodiments, provided herein is a system for data communication between nodes having the ability to transmit a first subset of acknowledgment messages over a lower latency data path and a second subset of data messages over a higher latency data path. In embodiments, provided herein is a system for data communication between nodes having the ability to transmit a first subset of acknowledgment messages over a lower latency data path and a second subset of data messages over a higher latency data path and having the ability to transmit a first subset of supplemental/redundancy data messages over a lower latency data path and a second subset of data messages over a higher latency data path. In embodiments, provided herein is a system for data communication between nodes having the ability to transmit a first subset of acknowledgment messages over a lower latency data path and a second subset of data messages over a higher latency data path and having a degree of redundancy associated with each message that is based on message position in the transmission order. In embodiments, provided herein is a system for data communication between nodes having the ability to transmit a first subset of acknowledgment messages over a lower latency data path and a second subset of data messages over a higher latency data path and having a degree of redundancy associated with each message that increases as the position of the messages is non-decreasing. In embodiments, provided herein is a system for data communication between nodes having the ability to transmit a first subset of acknowledgment messages over a lower latency data path and a second subset of data messages over a higher latency data path and having a degree of redundancy associated with each message that is based on message position in the transmission order and in response to receiving feedback messages. In embodiments, provided herein is a system for data communication between nodes having the ability to transmit a first subset of acknowledgment messages over a lower latency data path and a second subset of data messages over a higher latency data path and having a degree of redundancy associated with each message that is based on message position in the transmission order and in response to receiving feedback messages, and adding or removing redundancy messages from the queue based on the feedback messages. In embodiments, provided herein is a system for data communication between nodes having the ability to transmit a first subset of acknowledgment messages over a lower latency data path and a second subset of data messages over a higher latency data path and having the ability to adjust the number of messages sent over each of multiple different data paths with different communication protocols if it is determined that a data path is altering flow of messages. In embodiments, provided herein is a system for data communication between nodes having the ability to transmit a first subset of acknowledgment messages over a lower latency data path and a second subset of data messages over a higher latency data path and having the ability to adjust the number of messages sent over each of multiple different data paths with different communication protocols if it is determined that a data path is altering flow of messages initial division based on previous communication connections. In embodiments, provided herein is a system for data communication between nodes having the ability to transmit a first subset of acknowledgment messages over a lower latency data path and a second subset of data messages over a higher latency data path and having the ability to modify/add/remove redundancy information associated with encoded data as it travels from node to node via channels based on channel characteristics. In embodiments, provided herein is a system for data communication between nodes having the ability to transmit a first subset of acknowledgment messages over a lower latency data path and a second subset of data messages over a higher latency data path and having the ability to send FEC packets at an estimated rate of loss events (isolated packet loss or burst of consecutive packets). In embodiments, provided herein is a system for data communication between nodes having the ability to transmit a first subset of acknowledgment messages over a lower latency data path and a second subset of data messages over a higher latency data path and having combined coding, TCP, and pacing of packet transmissions. In embodiments, provided herein is a system for data communication between nodes having the ability to transmit a first subset of acknowledgment messages over a lower latency data path and a second subset of data messages over a higher latency data path and having a forward error correction code construction that interleaves groups of message packets and parity packets and has coding across overlapping groups of message packets. In embodiments, provided herein is a system for data communication between nodes having the ability to transmit a first subset of acknowledgment messages over a lower latency data path and a second subset of data messages over a higher latency data path and having a variant of TCP that combines delay-based back off with a stable window increase function.

In embodiments, provided herein is a system for data communication between nodes having the ability to transmit a first subset of supplemental/redundancy data messages over a lower latency data path and a second subset of data messages over a higher latency data path. In embodiments, provided herein is a system for data communication between nodes having the ability to transmit a first subset of supplemental/redundancy data messages over a lower latency data path and a second subset of data messages over a higher latency data path and having a degree of redundancy associated with each message that is based on message position in the transmission order. In embodiments, provided herein is a system for data communication between nodes having the ability to transmit a first subset of supplemental/redundancy data messages over a lower latency data path and a second subset of data messages over a higher latency data path and having a degree of redundancy associated with each message that increases as the position of the messages is non-decreasing. In embodiments, provided herein is a system for data communication between nodes having the ability to transmit a first subset of supplemental/redundancy data messages over a lower latency data path and a second subset of data messages over a higher latency data path and having a degree of redundancy associated with each message that is based on message position in the transmission order and in response to receiving feedback messages. In embodiments, provided herein is a system for data communication between nodes having the ability to transmit a first subset of supplemental/redundancy data messages over a lower latency data path and a second subset of data messages over a higher latency data path and having a degree of redundancy associated with each message that is based on message position in the transmission order and in response to receiving feedback messages, and adding or removing redundancy messages from the queue based on the feedback messages. In embodiments, provided herein is a system for data communication between nodes having the ability to transmit a first subset of supplemental/redundancy data messages over a lower latency data path and a second subset of data messages over a higher latency data path and having the ability to adjust the number of messages sent over each of multiple different data paths with different communication protocols if it is determined that a data path is altering flow of messages. In embodiments, provided herein is a system for data communication between nodes having the ability to transmit a first subset of supplemental/redundancy data messages over a lower latency data path and a second subset of data messages over a higher latency data path and having the ability to adjust the number of messages sent over each of multiple different data paths with different communication protocols if it is determined that a data path is altering flow of messages initial division based on previous communication connections. In embodiments, provided herein is a system for data communication between nodes having the ability to transmit a first subset of supplemental/ redundancy data messages over a lower latency data path and a second subset of data messages over a higher latency data path and having the ability to modify/add/remove redundancy information associated with encoded data as it travels from node to node via channels based on channel characteristics. In embodiments, provided herein is a system for data communication between nodes having the ability to transmit a first subset of supplemental/redundancy data messages over a lower latency data path and a second subset of data messages over a higher latency data path and having the ability to send FEC packets at an estimated rate of loss events (isolated packet loss or burst of consecutive packets). In embodiments, provided herein is a system for data communication between nodes having the ability to transmit a first subset of supplemental/redundancy data messages over a lower latency data path and a second subset of data messages over a higher latency data path and having combined coding, TCP, and pacing of packet transmissions. In embodiments, provided herein is a system for data communication between nodes having the ability to transmit a first subset of supplemental/redundancy data messages over a lower latency data path and a second subset of data messages over a higher latency data path and having a forward error correction code construction that interleaves groups of message packets and parity packets and has coding across overlapping groups of message packets. In embodiments, provided herein is a system for data communication between nodes having the ability to transmit a first subset of supplemental/redundancy data messages over a lower latency data path and a second subset of data messages over a higher latency data path and having a variant of TCP that combines delay-based back off with a stable window increase function.

In embodiments, provided herein is a system for data communication between nodes having a degree of redundancy associated with each message that is based on message position in the transmission order. In embodiments, provided herein is a system for data communication between nodes having a degree of redundancy associated with each message that is based on message position in the transmission order and having a degree of redundancy associated with each message that increases as the position of the messages is non-decreasing. In embodiments, provided herein is a system for data communication between nodes having a degree of redundancy associated with each message that is based on message position in the transmission order and having a degree of redundancy associated with each message that is based on message position in the transmission order and in response to receiving feedback messages. In embodiments, provided herein is a system for data communication between nodes having a degree of redundancy associated with each message that is based on message position in the transmission order and having a degree of redundancy associated with each message that is based on message position in the transmission order and in response to receiving feedback messages, and adding or removing redundancy messages from the queue based on the feedback messages. In embodiments, provided herein is a system for data communication between nodes having a degree of redundancy associated with each message that is based on message position in the transmission order and having the ability to adjust the number of messages sent over each of multiple different data paths with different communication protocols if it is determined that a data path is altering flow of messages. In embodiments, provided herein is a system for data communication between nodes having a degree of redundancy associated with each message that is based on message position in the transmission order and having the ability to adjust the number of messages sent over each of multiple different data paths with different communication protocols if it is determined that a data path is altering flow of messages initial division based on previous communication connections. In embodiments, provided herein is a system for data communication between nodes having a degree of redundancy associated with each message that is based on message position in the transmission order and having the ability to modify/add/remove redundancy information associated with encoded data as it travels from node to node via channels based on channel characteristics. In embodiments, provided herein is a system for data communication between nodes having a degree of redundancy associated with each message that is based on message position in the transmission order and having the ability to send FEC packets at an estimated rate of loss events (isolated packet loss or burst of consecutive packets). In embodiments, provided herein is a system for data communication between nodes having a degree of redundancy associated with each message that is based on message position in the transmission order and having combined coding, TCP, and pacing of packet transmissions. In embodiments, provided herein is a system for data communication between nodes having a degree of redundancy associated with each message that is based on message position in the transmission order and having a forward error correction code construction that interleaves groups of message packets and parity packets and has coding across overlapping groups of message packets. In embodiments, provided herein is a system for data communication between nodes having a degree of redundancy associated with each message that is based on message position in the transmission order and having a variant of TCP that combines delay-based back off with a stable window increase function.

In embodiments, provided herein is a system for data communication between nodes having a degree of redundancy associated with each message that increases as the position of the messages is non-decreasing. In embodiments, provided herein is a system for data communication between nodes having a degree of redundancy associated with each message that increases as the position of the messages is non-decreasing and having a degree of redundancy associated with each message that is based on message position in the transmission order and in response to receiving feedback messages. In embodiments, provided herein is a system for data communication between nodes having a degree of redundancy associated with each message that increases as the position of the messages is non-decreasing and having a degree of redundancy associated with each message that is based on message position in the transmission order and in response to receiving feedback messages, and adding or removing redundancy messages from the queue based on the feedback messages. In embodiments, provided herein is a system for data communication between nodes having a degree of redundancy associated with each message that increases as the position of the messages is non-decreasing and having the ability to adjust the number of messages sent over each of multiple different data paths with different communication protocols if it is determined that a data path is altering flow of messages. In embodiments, provided herein is a system for data communication between nodes having a degree of redundancy associated with each message that increases as the position of the messages is non-decreasing and having the ability to adjust the number of messages sent over each of multiple different data paths with different communication protocols if it is determined that a data path is altering flow of messages initial division based on previous communication connections. In embodiments, provided herein is a system for data communication between nodes having a degree of redundancy associated with each message that increases as the position of the messages is non-decreasing and having the ability to modify/add/remove redundancy information associated with encoded data as it travels from node to node via channels based on channel characteristics. In embodiments, provided herein is a system for data communication between nodes having a degree of redundancy associated with each message that increases as the position of the messages is non-decreasing and having the ability to send FEC packets at an estimated rate of loss events (isolated packet loss or burst of consecutive packets). In embodiments, provided herein is a system for data communication between nodes having a degree of redundancy associated with each message that increases as the position of the messages is non-decreasing and having combined coding, TCP, and pacing of packet transmissions. In embodiments, provided herein is a system for data communication between nodes having a degree of redundancy associated with each message that increases as the position of the messages is non-decreasing and having a forward error correction code construction that interleaves groups of message packets and parity packets and has coding across overlapping groups of message packets. In embodiments, provided herein is a system for data communication between nodes having a degree of redundancy associated with each message that increases as the position of the messages is non-decreasing and having a variant of TCP that combines delay-based back off with a stable window increase function.

In embodiments, provided herein is a system for data communication between nodes having a degree of redundancy associated with each message that is based on message position in the transmission order and in response to receiving feedback messages. In embodiments, provided herein is a system for data communication between nodes having a degree of redundancy associated with each message that is based on message position in the transmission order and in response to receiving feedback messages and having a degree of redundancy associated with each message that is based on message position in the transmission order and in response to receiving feedback messages, and adding or removing redundancy messages from the queue based on the feedback messages. In embodiments, provided herein is a system for data communication between nodes having a degree of redundancy associated with each message that is based on message position in the transmission order and in response to receiving feedback messages and having the ability to adjust the number of messages sent over each of multiple different data paths with different communication protocols if it is determined that a data path is altering flow of messages. In embodiments, provided herein is a system for data communication between nodes having a degree of redundancy associated with each message that is based on message position in the transmission order and in response to receiving feedback messages and having the ability to adjust the number of messages sent over each of multiple different data paths with different communication protocols if it is determined that a data path is altering flow of messages initial division based on previous communication connections. In embodiments, provided herein is a system for data communication between nodes having a degree of redundancy associated with each message that is based on message position in the transmission order and in response to receiving feedback messages and having the ability to modify/add/remove redundancy information associated with encoded data as it travels from node to node via channels based on channel characteristics. In embodiments, provided herein is a system for data communication between nodes having a degree of redundancy associated with each message that is based on message position in the transmission order and in response to receiving feedback messages and having the ability to send FEC packets at an estimated rate of loss events (isolated packet loss or burst of consecutive packets). In embodiments, provided herein is a system for data communication between nodes having a degree of redundancy associated with each message that is based on message position in the transmission order and in response to receiving feedback messages and having combined coding, TCP, and pacing of packet transmissions. In embodiments, provided herein is a system for data communication between nodes having a degree of redundancy associated with each message that is based on message position in the transmission order and in response to receiving feedback messages and having a forward error correction code construction that interleaves groups of message packets and parity packets and has coding across overlapping groups of message packets. In embodiments, provided herein is a system for data communication between nodes having a degree of redundancy associated with each message that is based on message position in the transmission order and in response to receiving feedback messages and having a variant of TCP that combines delay-based back off with a stable window increase function.

In embodiments, provided herein is a system for data communication between nodes having a degree of redundancy associated with each message that is based on message position in the transmission order and in response to receiving feedback messages, and adding or removing redundancy messages from the queue based on the feedback messages. In embodiments, provided herein is a system for data communication between nodes having a degree of redundancy associated with each message that is based on message position in the transmission order and in response to receiving feedback messages, and adding or removing redundancy messages from the queue based on the feedback messages and having the ability to adjust the number of messages sent over each of multiple different data paths with different communication protocols if it is determined that a data path is altering flow of messages. In embodiments, provided herein is a system for data communication between nodes having a degree of redundancy associated with each message that is based on message position in the transmission order and in response to receiving feedback messages, and adding or removing redundancy messages from the queue based on the feedback messages and having the ability to adjust the number of messages sent over each of multiple different data paths with different communication protocols if it is determined that a data path is altering flow of messages initial division based on previous communication connections. In embodiments, provided herein is a system for data communication between nodes having a degree of redundancy associated with each message that is based on message position in the transmission order and in response to receiving feedback messages, and adding or removing redundancy messages from the queue based on the feedback messages and having the ability to modify/add/remove redundancy information associated with encoded data as it travels from node to node via channels based on channel characteristics. In embodiments, provided herein is a system for data communication between nodes having a degree of redundancy associated with each message that is based on message position in the transmission order and in response to receiving feedback messages, and adding or removing redundancy messages from the queue based on the feedback messages and having the ability to send FEC packets at an estimated rate of loss events (isolated packet loss or burst of consecutive packets). In embodiments, provided herein is a system for data communication between nodes having a degree of redundancy associated with each message that is based on message position in the transmission order and in response to receiving feedback messages, and adding or removing redundancy messages from the queue based on the feedback messages and having combined coding, TCP, and pacing of packet transmissions. In embodiments, provided herein is a system for data communication between nodes having a degree of redundancy associated with each message that is based on message position in the transmission order and in response to receiving feedback messages, and adding or removing redundancy messages from the queue based on the feedback messages and having a forward error correction code construction that interleaves groups of message packets and parity packets and has coding across overlapping groups of message packets. In embodiments, provided herein is a system for data communication between nodes having a degree of redundancy associated with each message that is based on message position in the transmission order and in response to receiving feedback messages, and adding or removing redundancy messages from the queue based on the feedback messages and having a variant of TCP that combines delay-based back off with a stable window increase function.

In embodiments, provided herein is a system for data communication between nodes having the ability to adjust the number of messages sent over each of multiple different data paths with different communication protocols if it is determined that a data path is altering flow of messages. In embodiments, provided herein is a system for data communication between nodes having the ability to adjust the number of messages sent over each of multiple different data paths with different communication protocols if it is determined that a data path is altering flow of messages and having the ability to adjust the number of messages sent over each of multiple different data paths with different communication protocols if it is determined that a data path is altering flow of messages initial division based on previous communication connections. In embodiments, provided herein is a system for data communication between nodes having the ability to adjust the number of messages sent over each of multiple different data paths with different communication protocols if it is determined that a data path is altering flow of messages and having the ability to modify/add/remove redundancy information associated with encoded data as it travels from node to node via channels based on channel characteristics. In embodiments, provided herein is a system for data communication between nodes having the ability to adjust the number of messages sent over each of multiple different data paths with different communication protocols if it is determined that a data path is altering flow of messages and having the ability to send FEC packets at an estimated rate of loss events (isolated packet loss or burst of consecutive packets). In embodiments, provided herein is a system for data communication between nodes having the ability to adjust the number of messages sent over each of multiple different data paths with different communication protocols if it is determined that a data path is altering flow of messages and having combined coding, TCP, and pacing of packet transmissions. In embodiments, provided herein is a system for data communication between nodes having the ability to adjust the number of messages sent over each of multiple different data paths with different communication protocols if it is determined that a data path is altering flow of messages and having a forward error correction code construction that interleaves groups of message packets and parity packets and has coding across overlapping groups of message packets. In embodiments, provided herein is a system for data communication between nodes having the ability to adjust the number of messages sent over each of multiple different data paths with different communication protocols if it is determined that a data path is altering flow of messages and having a variant of TCP that combines delay-based back off with a stable window increase function.

In embodiments, provided herein is a system for data communication between nodes having the ability to adjust the number of messages sent over each of multiple different data paths with different communication protocols if it is determined that a data path is altering flow of messages initial division based on previous communication connections. In embodiments, provided herein is a system for data communication between nodes having the ability to adjust the number of messages sent over each of multiple different data paths with different communication protocols if it is determined that a data path is altering flow of messages initial division based on previous communication connections and having the ability to modify/add/remove redundancy information associated with encoded data as it travels from node to node via channels based on channel characteristics. In embodiments, provided herein is a system for data communication between nodes having the ability to adjust the number of messages sent over each of multiple different data paths with different communication protocols if it is determined that a data path is altering flow of messages initial division based on previous communication connections and having the ability to send FEC packets at an estimated rate of loss events (isolated packet loss or burst of consecutive packets). In embodiments, provided herein is a system for data communication between nodes having the ability to adjust the number of messages sent over each of multiple different data paths with different communication protocols if it is determined that a data path is altering flow of messages initial division based on previous communication connections and having combined coding, TCP, and pacing of packet transmissions. In embodiments, provided herein is a system for data communication between nodes having the ability to adjust the number of messages sent over each of multiple different data paths with different communication protocols if it is determined that a data path is altering flow of messages initial division based on previous communication connections and having a forward error correction code construction that interleaves groups of message packets and parity packets and has coding across overlapping groups of message packets. In embodiments, provided herein is a system for data communication between nodes having the ability to adjust the number of messages sent over each of multiple different data paths with different communication protocols if it is determined that a data path is altering flow of messages initial division based on previous communication connections and having a variant of TCP that combines delay-based back off with a stable window increase function.

In embodiments, provided herein is a system for data communication between nodes having the ability to modify/add/remove redundancy information associated with encoded data as it travels from node to node via channels based on channel characteristics. In embodiments, provided herein is a system for data communication between nodes having the ability to modify/add/remove redundancy information associated with encoded data as it travels from node to node via channels based on channel characteristics and having the ability to send FEC packets at an estimated rate of loss events (isolated packet loss or burst of consecutive packets). In embodiments, provided herein is a system for data communication between nodes having the ability to modify/add/remove redundancy information associated with encoded data as it travels from node to node via channels based on channel characteristics and having combined coding, TCP, and pacing of packet transmissions. In embodiments, provided herein is a system for data communication between nodes having the ability to modify/add/remove redundancy information associated with encoded data as it travels from node to node via channels based on channel characteristics and having a forward error correction code construction that interleaves groups of message packets and parity packets and has coding across overlapping groups of message packets. In embodiments, provided herein is a system for data communication between nodes having the ability to modify/add/remove redundancy information associated with encoded data as it travels from node to node via channels based on channel characteristics and having a variant of TCP that combines delay-based back off with a stable window increase function.

In embodiments, provided herein is a system for data communication between nodes having the ability to send FEC packets at an estimated rate of loss events (isolated packet loss or burst of consecutive packets). In embodiments, provided herein is a system for data communication between nodes having the ability to send FEC packets at an estimated rate of loss events (isolated packet loss or burst of consecutive packets) and having combined coding, TCP, and pacing of packet transmissions. In embodiments, provided herein is a system for data communication between nodes having the ability to send FEC packets at an estimated rate of loss events (isolated packet loss or burst of consecutive packets) and having a forward error correction code construction that interleaves groups of message packets and parity packets and has coding across overlapping groups of message packets. In embodiments, provided herein is a system for data communication between nodes having the ability to send FEC packets at an estimated rate of loss events (isolated packet loss or burst of consecutive packets) and having a variant of TCP that combines delay-based back off with a stable window increase function.

In embodiments, provided herein is a system for data communication between nodes having combined coding, TCP, and pacing of packet transmissions. In embodiments, provided herein is a system for data communication between nodes having combined coding, TCP, and pacing of packet transmissions and having a forward error correction code construction that interleaves groups of message packets and parity packets and has coding across overlapping groups of message packets. In embodiments, provided herein is a system for data communication between nodes having combined coding, TCP, and pacing of packet transmissions and having a variant of TCP that combines delay-based back off with a stable window increase function.

In embodiments, provided herein is a system for data communication between nodes having a forward error correction code construction that interleaves groups of message packets and parity packets and has coding across overlapping groups of message packets. In embodiments, provided herein is a system for data communication between nodes having a forward error correction code construction that interleaves groups of message packets and parity packets and has coding across overlapping groups of message packets and having a variant of TCP that combines delay-based back off with a stable window increase function.

In embodiments, provided herein is a system for data communication between nodes having a variant of TCP that combines delay-based back off with a stable window increase function.

While only a few embodiments of the present disclosure have been shown and described, it will be obvious to those skilled in the art that many changes and modifications may be made thereunto without departing from the spirit and scope of the present disclosure as described in the following claims. All patent applications and patents, both foreign and domestic, and all other publications referenced herein are incorporated herein in their entireties to the full extent permitted by law.

The methods and systems described herein may be deployed in part or in whole through a machine that executes computer software, program codes, and/or instructions on a processor. The present disclosure may be implemented as a method on the machine, as a system or apparatus as part of or in relation to the machine, or as a computer program product embodied in a computer readable medium executing on one or more of the machines. In embodiments, the processor may be part of a server, cloud server, client, network infrastructure, mobile computing platform, stationary computing platform, or other computing platforms. A processor may be any kind of computational or processing device capable of executing program instructions, codes, binary instructions and the like, including a central processing unit (CPU), a general processing unit (GPU), a logic board, a chip (e.g., a graphics chip, a video processing chip, a data compression chip, or the like), a chipset, a controller, a system-on-chip (e.g., an RF system on chip, an AI system on chip, a video processing system on chip, or others), an integrated circuit, an application specific integrated circuit (ASIC), a field programmable gate array (FPGA), an approximate computing processor, a quantum computing processor, a parallel computing processor, a neural network processor, or other type of processor. The processor may be or may include a signal processor, digital processor, data processor, embedded processor, microprocessor or any variant such as a co-processor (math co-processor, graphic co-processor, communication co-processor, video co-processor, AI co-processor, and the like) and the like that may directly or indirectly facilitate execution of program code or program instructions stored thereon. In addition, the processor may enable execution of multiple programs, threads, and codes. The threads may be executed simultaneously to enhance the performance of the processor and to facilitate simultaneous operations of the application. By way of implementation, methods, program codes, program instructions and the like described herein may be implemented in one or more threads. The thread may spawn other threads that may have assigned priorities associated with them; the processor may execute these threads based on priority or any other order based on instructions provided in the program code. The processor, or any machine utilizing one, may include non-transitory memory that stores methods, codes, instructions and programs as described herein and elsewhere. The processor may access a non-transitory storage medium through an interface that may store methods, codes, and instructions as described herein and elsewhere. The storage medium associated with the processor for storing methods, programs, codes, program instructions or other type of instructions capable of being executed by the computing or processing device may include but may not be limited to one or more of a CD-ROM, DVD, memory, hard disk, flash drive, RAM, ROM, cache, network-attached storage, server-based storage, and the like.

A processor may include one or more cores that may enhance speed and performance of a multiprocessor. In embodiments, the process may be a dual core processor, quad core processors, other chip-level multiprocessor and the like that combine two or more independent cores (sometimes called a die).

The methods and systems described herein may be deployed in part or in whole through a machine that executes computer software on a server, client, firewall, gateway, hub, router, switch, infrastructure-as-a-service, platform-as-a-service, or other such computer and/or networking hardware or system. The software may be associated with a server that may include a file server, print server, domain server, internet server, intranet server, cloud server, infrastructure-as-a-service server, platform-as-a-service server, web server, and other variants such as secondary server, host server, distributed server, failover server, backup server, server farm, and the like. The server may include one or more of memories, processors, computer readable media, storage media, ports (physical and virtual), communication devices, and interfaces capable of accessing other servers, clients, machines, and devices through a wired or a wireless medium, and the like. The methods, programs, or codes as described herein and elsewhere may be executed by the server. In addition, other devices required for execution of methods as described in this application may be considered as a part of the infrastructure associated with the server.

The server may provide an interface to other devices including, without limitation, clients, other servers, printers, database servers, print servers, file servers, communication servers, distributed servers, social networks, and the like. Additionally, this coupling and/or connection may facilitate remote execution of programs across the network. The networking of some or all of these devices may facilitate parallel processing of a program or method at one or more locations without deviating from the scope of the disclosure. In addition, any of the devices attached to the server through an interface may include at least one storage medium capable of storing methods, programs, code and/or instructions. A central repository may provide program instructions to be executed on different devices. In this implementation, the remote repository may act as a storage medium for program code, instructions, and programs.

The software program may be associated with a client that may include a file client, print client, domain client, internet client, intranet client and other variants such as secondary client, host client, distributed client and the like. The client may include one or more of memories, processors, computer readable media, storage media, ports (physical and virtual), communication devices, and interfaces capable of accessing other clients, servers, machines, and devices through a wired or a wireless medium, and the like. The methods, programs, or codes as described herein and elsewhere may be executed by the client. In addition, other devices required for the execution of methods as described in this application may be considered as a part of the infrastructure associated with the client.

The client may provide an interface to other devices including, without limitation, servers, other clients, printers, database servers, print servers, file servers, communication servers, distributed servers and the like. Additionally, this coupling and/or connection may facilitate remote execution of programs across the network. The networking of some or all of these devices may facilitate parallel processing of a program or method at one or more locations without deviating from the scope of the disclosure. In addition, any of the devices attached to the client through an interface may include at least one storage medium capable of storing methods, programs, applications, code and/or instructions. A central repository may provide program instructions to be executed on different devices. In this implementation, the remote repository may act as a storage medium for program code, instructions, and programs.

The methods and systems described herein may be deployed in part or in whole through network infrastructures. The network infrastructure may include elements such as computing devices, servers, routers, hubs, firewalls, clients, personal computers, communication devices, routing devices and other active and passive devices, modules and/or components as known in the art. The computing and/or non-computing device(s) associated with the network infrastructure may include, apart from other components, a storage medium such as flash memory, buffer, stack, RAM, ROM and the like. The processes, methods, program codes, instructions described herein and elsewhere may be executed by one or more of the network infrastructural elements. The methods and systems described herein may be adapted for use with any kind of private, community, or hybrid cloud computing network or cloud computing environment, including those which involve features of software as a service (SaaS), platform as a service (PaaS), and/or infrastructure as a service (IaaS).

The methods, program codes, and instructions described herein and elsewhere may be implemented on a cellular network with multiple cells. The cellular network may either be frequency division multiple access (FDMA) network or code division multiple access (CDMA) network. The cellular network may include mobile devices, cell sites, base stations, repeaters, antennas, towers, and the like. The cell network may be a GSM, GPRS, 3G, 4G, 5G, LTE, EVDO, mesh, or other network types.

The methods, program codes, and instructions described herein and elsewhere may be implemented on or through mobile devices. The mobile devices may include navigation devices, cell phones, mobile phones, mobile personal digital assistants, laptops, palmtops, netbooks, pagers, electronic book readers, music players and the like. These devices may include, apart from other components, a storage medium such as flash memory, buffer, RAM, ROM and one or more computing devices. The computing devices associated with mobile devices may be enabled to execute program codes, methods, and instructions stored thereon. Alternatively, the mobile devices may be configured to execute instructions in collaboration with other devices. The mobile devices may communicate with base stations interfaced with servers and configured to execute program codes. The mobile devices may communicate on a peer-to-peer network, mesh network, or other communications network. The program code may be stored on the storage medium associated with the server and executed by a computing device embedded within the server. The base station may include a computing device and a storage medium. The storage device may store program codes and instructions executed by the computing devices associated with the base station.

The computer software, program codes, and/or instructions may be stored and/or accessed on machine readable media that may include: computer components, devices, and recording media that retain digital data used for computing for some interval of time; semiconductor storage known as random access memory (RAM); mass storage typically for more permanent storage, such as optical discs, forms of magnetic storage like hard disks, tapes, drums, cards and other types; processor registers, cache memory, volatile memory, non-volatile memory; optical storage such as CD, DVD; removable media such as flash memory (e.g., USB sticks or keys), floppy disks, magnetic tape, paper tape, punch cards, standalone RAM disks, Zip drives, removable mass storage, off-line, and the like; other computer memory such as dynamic memory, static memory, read/write storage, mutable storage, read only, random access, sequential access, location addressable, file addressable, content addressable, network attached storage, storage area network, bar codes, magnetic ink, network-attached storage, network storage, NVME-accessible storage, PCIE connected storage, distributed storage, and the like.

The methods and systems described herein may transform physical and/or intangible items from one state to another. The methods and systems described herein may also transform data representing physical and/or intangible items from one state to another.

The elements described and depicted herein, including in flow charts and block diagrams throughout the figures, imply logical boundaries between the elements. However, according to software or hardware engineering practices, the depicted elements and the functions thereof may be implemented on machines through computer executable code using a processor capable of executing program instructions stored thereon as a monolithic software structure, as stand-alone software modules, or as modules that employ external routines, code, services, and so forth, or any combination of these, and all such implementations may be within the scope of the present disclosure. Examples of such machines may include, but may not be limited to, personal digital assistants, laptops, personal computers, mobile phones, other handheld computing devices, medical equipment, wired or wireless communication devices, transducers, chips, calculators, satellites, tablet PCs, electronic books, gadgets, electronic devices, devices, artificial intelligence, computing devices, networking equipment, servers, routers and the like. Furthermore, the elements depicted in the flow chart and block diagrams or any other logical component may be implemented on a machine capable of executing program instructions. Thus, while the foregoing drawings and descriptions set forth functional aspects of the disclosed systems, no particular arrangement of software for implementing these functional aspects should be inferred from these descriptions unless explicitly stated or otherwise clear from the context. Similarly, it will be appreciated that the various steps identified and described above may be varied, and that the order of steps may be adapted to particular applications of the techniques disclosed herein. All such variations and modifications are intended to fall within the scope of this disclosure. As such, the depiction and/or description of an order for various steps should not be understood to require a particular order of execution for those steps, unless required by a particular application, or explicitly stated or otherwise clear from the context.

The methods and/or processes described above, and steps associated therewith, may be realized in hardware, software or any combination of hardware and software suitable for a particular application. The hardware may include a general-purpose computer and/or dedicated computing device or specific computing device or particular aspect or component of a specific computing device. The processes may be realized in one or more microprocessors, microcontrollers, embedded microcontrollers, programmable digital signal processors or other programmable devices, along with internal and/or external memory. The processes may also, or instead, be embodied in an application specific integrated circuit, a programmable gate array, programmable array logic, or any other device or combination of devices that may be configured to process electronic signals. It will further be appreciated that one or more of the processes may be realized as a computer executable code capable of being executed on a machine-readable medium.

The computer executable code may be created using a structured programming language such as C, an object oriented programming language such as C++, or any other high-level or low-level programming language (including assembly languages, hardware description languages, and database programming languages and technologies) that may be stored, compiled or interpreted to run on one of the above devices, as well as heterogeneous combinations of processors, processor architectures, or combinations of different hardware and software, or any other machine capable of executing program instructions. Computer software may employ virtualization, virtual machines, containers, dock facilities, portainers, and other capabilities.

Thus, in one aspect, methods described above and combinations thereof may be embodied in computer executable code that, when executing on one or more computing devices, performs the steps thereof. In another aspect, the methods may be embodied in systems that perform the steps thereof and may be distributed across devices in a number of ways, or all of the functionality may be integrated into a dedicated, standalone device or other hardware. In another aspect, the means for performing the steps associated with the processes described above may include any of the hardware and/or software described above. All such permutations and combinations are intended to fall within the scope of the present disclosure.

While the disclosure has been disclosed in connection with the preferred embodiments shown and described in detail, various modifications and improvements thereon will become readily apparent to those skilled in the art. Accordingly, the spirit and scope of the present disclosure is not to be limited by the foregoing examples, but is to be understood in the broadest sense allowable by law.

The use of the terms "a" and "an" and "the" and similar referents in the context of describing the disclosure (especially in the context of the following claims) is to be construed to cover both the singular and the plural, unless otherwise indicated herein or clearly contradicted by context. The terms "comprising," "with," "including," and "containing" are to be construed as open-ended terms (i.e., meaning "including, but not limited to,") unless otherwise noted. Recitations of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate the disclosure and does not pose a limitation on the scope of the disclosure unless otherwise claimed. The term "set" may include a set with a single member. No language in the specification should be construed as indicating any non-claimed element as essential to the practice of the disclosure.

While the foregoing written description enables one skilled to make and use what is considered presently to be the best mode thereof, those skilled in the art will understand and appreciate the existence of variations, combinations, and equivalents of the specific embodiment, method, and examples herein. The disclosure should therefore not be limited by the above described embodiment, method, and examples, but by all embodiments and methods within the scope and spirit of the disclosure.

It is to be understood that the foregoing description is intended to illustrate and not to limit the scope of the invention, some aspects of which are defined by the scope of the appended claims. Furthermore, other embodiments are within the scope of the following claims.

All documents referenced herein are hereby incorporated by reference as if fully set forth herein.

What is claimed is:

1. A method for data communication between a first node and a second node over a data path coupling the first node and the second node, the method comprising:
forming one or more redundancy messages from data messages at the first node using an error correcting code;
transmitting first messages from the first node to the second node over the data path, the transmitted first messages including the data messages and the one or more redundancy messages;
receiving a second message at the first node from the second node, the second message including information indicating that one or more packets were not successfully received by the second node;
determining, based at least in part on the second message, a forward error correction parameter; and
transmitting additional messages from the first node to the second node, wherein the additional messages include one or more additional data messages and one or more additional redundancy messages formed from the one or more additional data messages using the error correcting code according to the determined forward error correction parameter.

2. The method of claim 1, further comprising:
receiving, at the first node from the second node, data indicative of a rate of arrival at the second node of messages transmitted from the first node;
maintaining a transmission rate limit according to the data indicative of the rate of arrival at the second node; and
limiting a transmission rate of the transmitting of the additional messages according to the maintained transmission rate limit.

3. The method of claim 1, further comprising:
receiving, at the first node from the second node, data indicative of a rate of arrival at the second node of messages transmitted from the first node;
maintaining a congestion control window size according to the second message and the data indicative of the rate of arrival at the second node; and
limiting the transmitting of the additional messages according to the congestion control window size.

4. The method of claim 3, wherein the limiting the transmitting of the additional messages according to the maintained congestion control window size includes limiting a number of the additional messages not yet acknowledged as successfully delivered to the second node according to the congestion control window size.

5. The method of claim 4, wherein the data indicative of the rate of arrival comprises acknowledgment messages transmitted from the second node to the first node.

6. The method of claim 5, wherein the rate of arrival of the acknowledgment messages includes a rate of acknowledgment of packets.

7. The method of claim 1, wherein the error correcting code is based on a linear error correcting code.

8. The method of claim 1, wherein the error correcting code is based on a nonlinear error correcting code.

9. A communication apparatus comprising a first device having an interface for passing messages to and from a second device over a data path coupling the first device to the second device, the first device further comprising a communication controller configured to:
form one or more redundancy messages from data messages at the first device using an error correcting code;
transmit first messages from the first device to the second device over the data path, the transmitted first messages including the data messages and the one or more redundancy messages;
receive a second message at the first device from the second device, the second message including information indicating that one or more packets were not successfully received by the second device;
determine, based at least in part on the second message, a forward error correction parameter;
and
transmit additional messages from the first device to the second device, wherein the additional messages include one or more additional data messages and one or more additional redundancy messages formed from the one or more additional data messages using the error correcting code according to the determined forward error correction parameter.

10. The communication apparatus of claim 9, wherein the communication controller is further configured to:
receive, from the second device, data indicative of a rate of arrival at the second device of messages transmitted from the communication controller;
maintaining a transmission rate limit according to the data indicative of the rate of arrival at the second device; and
limiting a transmission rate of the transmission of the additional messages according to the maintained transmission rate limit.

11. The communication apparatus of claim 10, wherein the communication controller is further configured to:
receive, from the second device, data indicative of a rate of arrival at the second device of messages transmitted from the communication controller; and
maintain a congestion control window size according to the second message and the data indicative of the rate of arrival at the second device; and
limit the transmission rate of the additional messages according to the congestion control window size.

12. The communication apparatus of claim 11, wherein the communication controller is configured to limit the transmission rate of the additional messages according to the maintained congestion control window size by limiting a number of the additional messages not yet acknowledged as successfully delivered to the second device according to the congestion control window size.

13. The communication apparatus of claim 12, wherein the data indicative of the rate of arrival comprises acknowledgment messages received from the second device.

14. The communication apparatus of claim 13, wherein the rate of arrival of the acknowledgment messages includes a rate of acknowledgment of packets.

15. The communication apparatus of claim 9, wherein the error correcting code is based on a linear error correcting code.

16. The communication apparatus of claim 9, wherein the error correcting code is based on a nonlinear error correcting code.

* * * * *